US006873023B2

(12) United States Patent
Asao et al.

(10) Patent No.: US 6,873,023 B2
(45) Date of Patent: Mar. 29, 2005

(54) MAGNETIC RANDOM ACCESS MEMORY

(75) Inventors: Yoshiaki Asao, Yokohama (JP); Yoshihisa Iwata, Yokohama (JP); Yoshiaki Saito, Kawasaki (JP); Hiroaki Yoda, Kawasaki (JP); Tomomasa Ueda, Yokohama (JP); Minoru Amano, Sagamihara (JP); Shigeki Takahashi, Yokohama (JP); Tatsuya Kishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/418,047

(22) Filed: Apr. 18, 2003

(65) Prior Publication Data

US 2004/0004889 A1 Jan. 8, 2004

(30) Foreign Application Priority Data

Apr. 18, 2002 (JP) ....................................... 2002-116387
Apr. 19, 2002 (JP) ....................................... 2002-118214
Apr. 19, 2002 (JP) ....................................... 2002-118215

(51) Int. Cl.[7] ................................................ H01L 43/00

(52) U.S. Cl. .......................................... 257/421; 257/30

(58) Field of Search ................................ 257/296, 421, 257/427, 30

(56) References Cited

U.S. PATENT DOCUMENTS 5,940,319 A 8/1999 Durlam et al.
6,548,849 B1 * 4/2003 Pan et al. .................. 257/296

* cited by examiner

*Primary Examiner*—Amir Zarabian
*Assistant Examiner*—Kiesha Rose
(74) *Attorney, Agent, or Firm*—Oblon, Spivak, McClelland, Maier & Neustadt, P.C.

(57) ABSTRACT

A write word line is disposed right under an MTJ element. The write word line extends in an X direction, and a lower surface of the line is coated with a yoke material which has a high permeability. A data selection line (read/write bit line) is disposed right on the MTJ element. A data selection line extends in a Y direction intersecting with the X direction, and an upper surface of the line is coated with the yoke material which has the high permeability. At a write operation time, a magnetic field generated by a write current flowing through a write word line B and data selection line functions on the MTJ element by the yoke material with good efficiency.

69 Claims, 160 Drawing Sheets

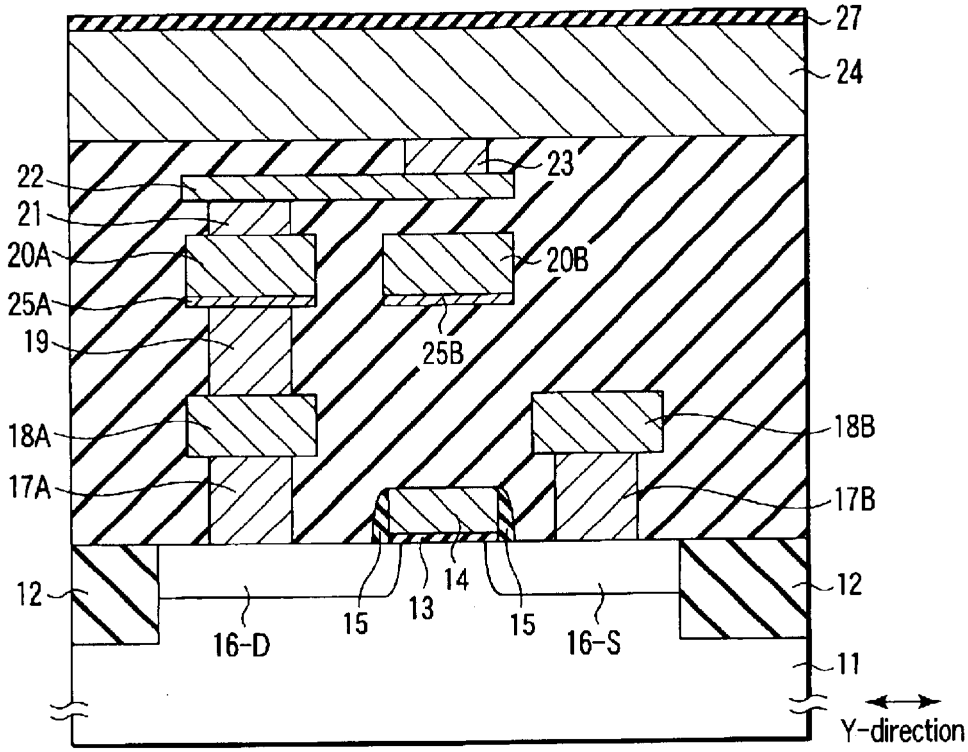
F I G. 22
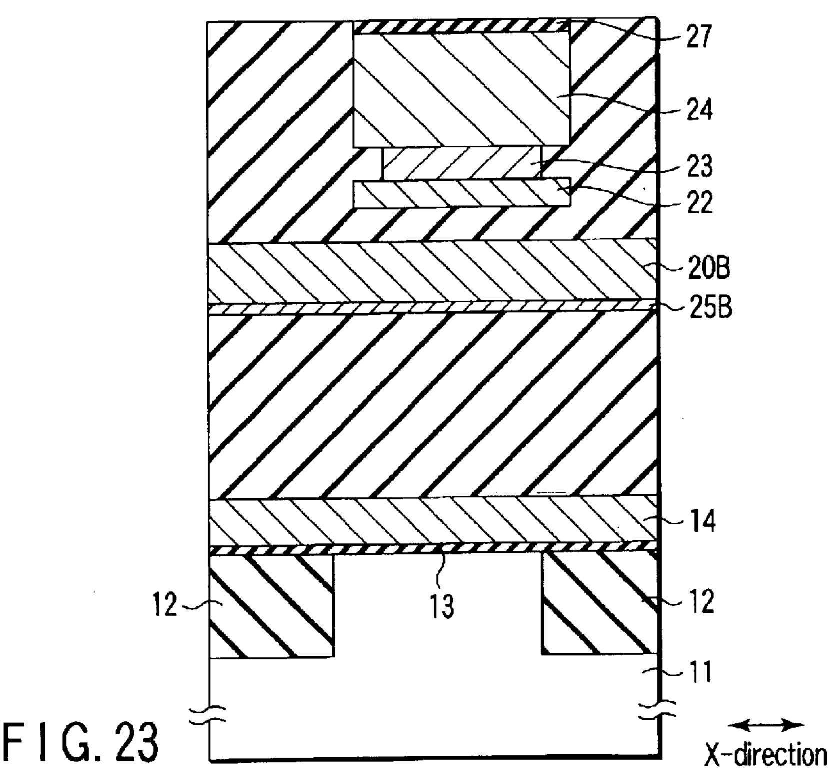
F I G. 23

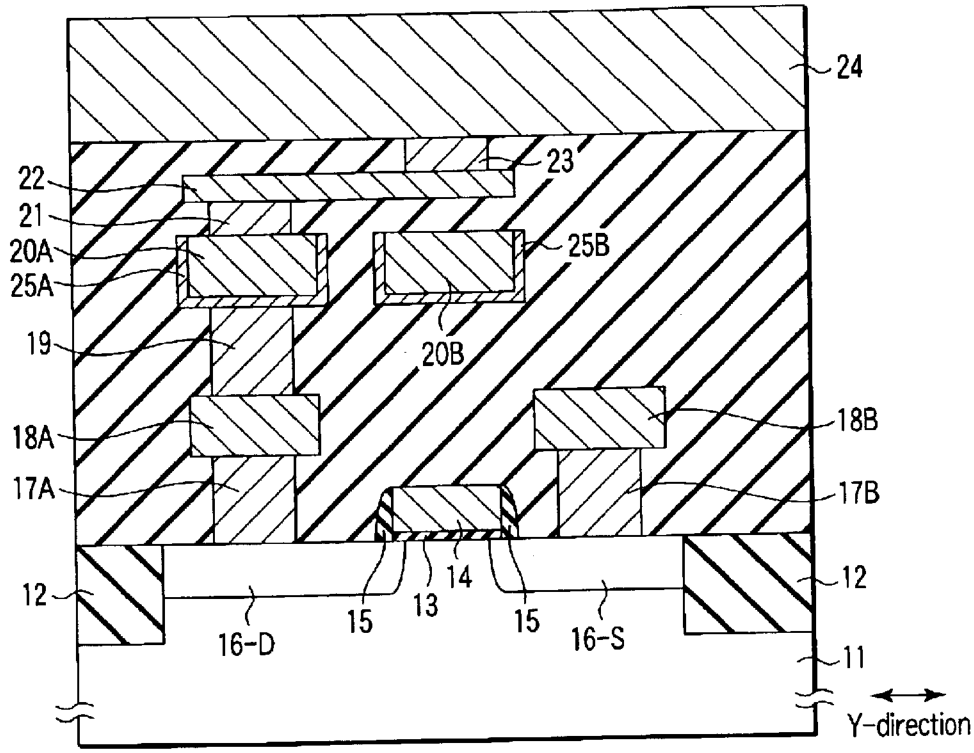
F I G. 30
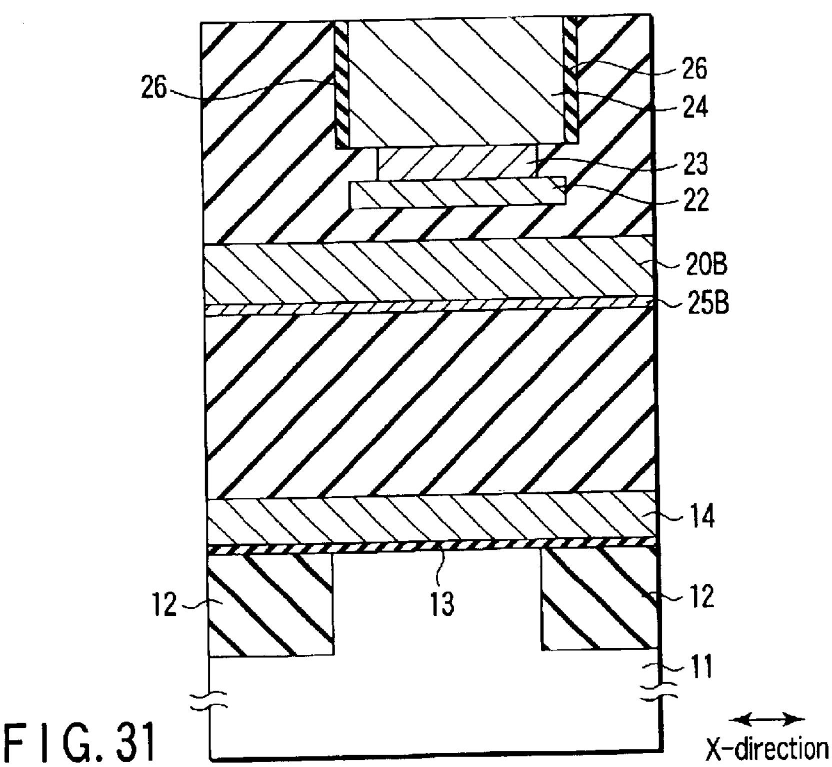
F I G. 31

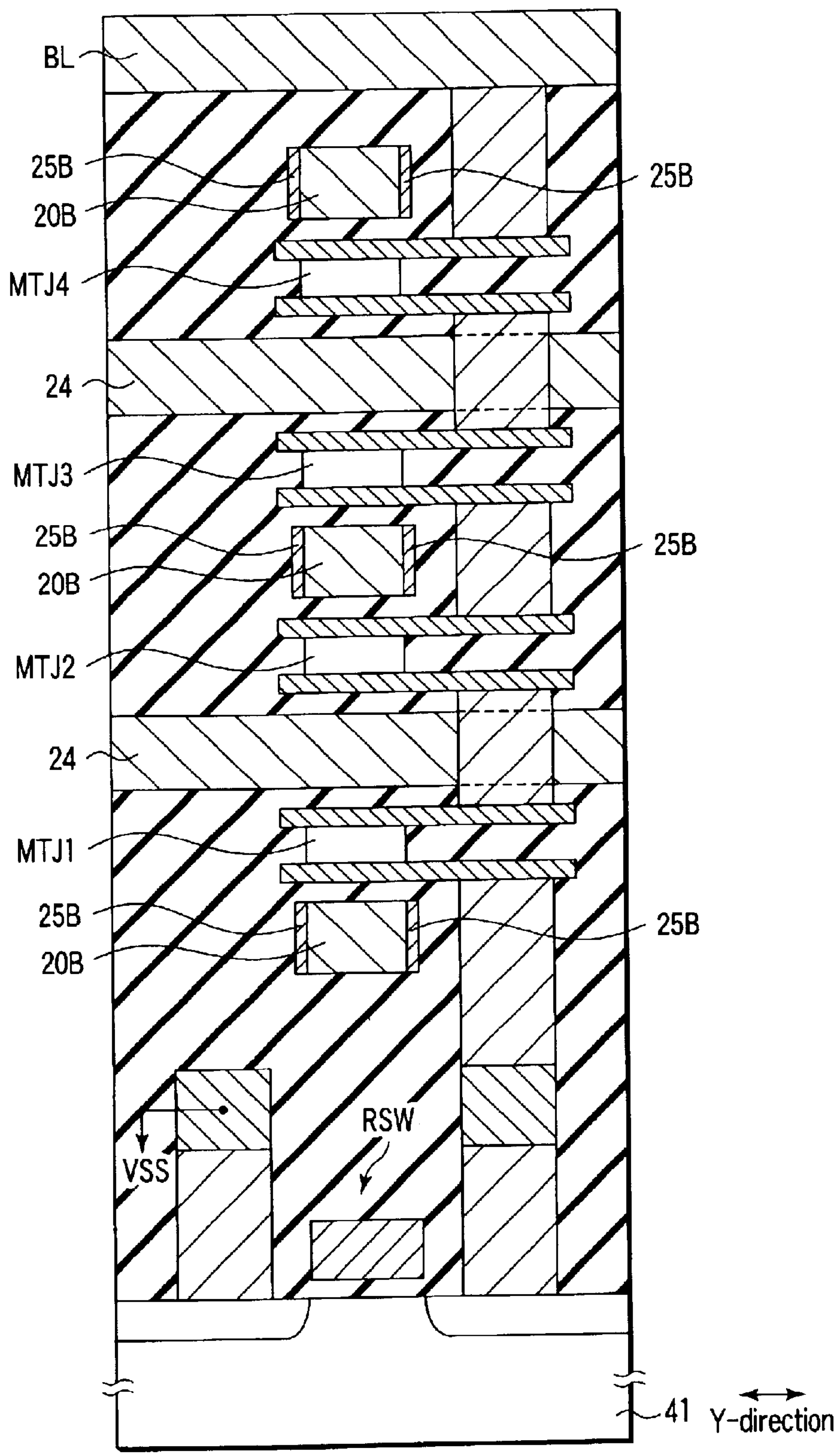
F I G. 40

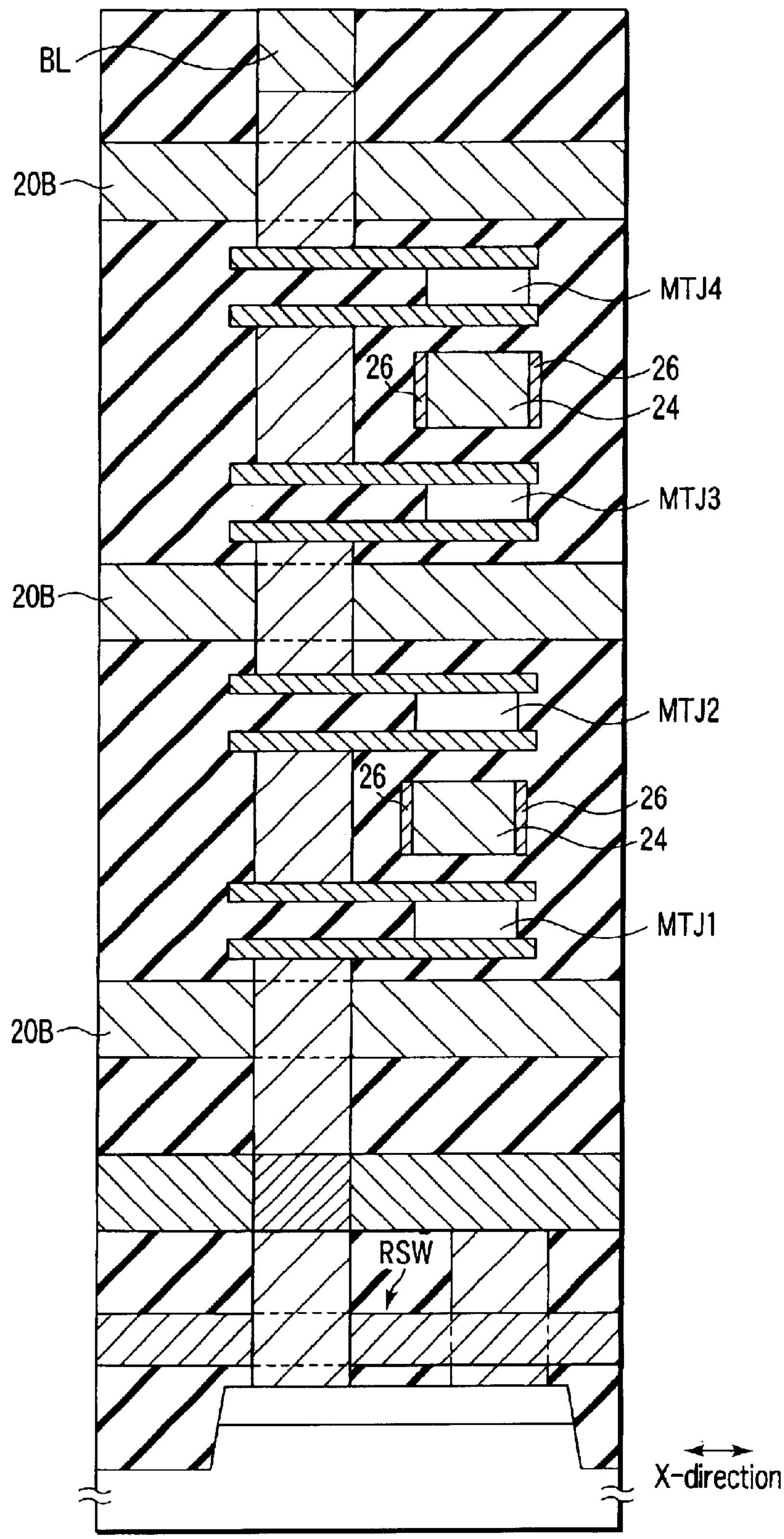
F I G. 41

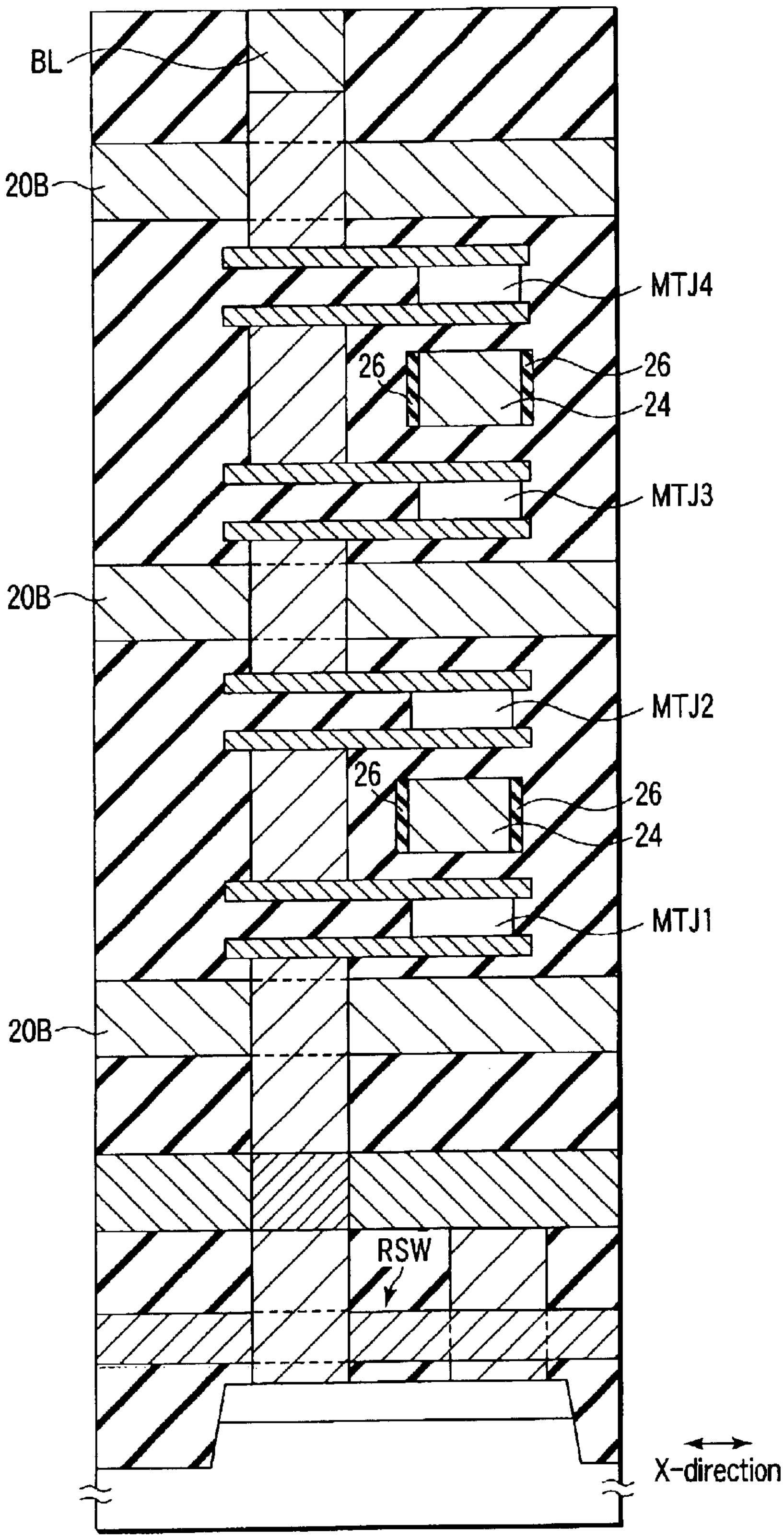
F I G. 43

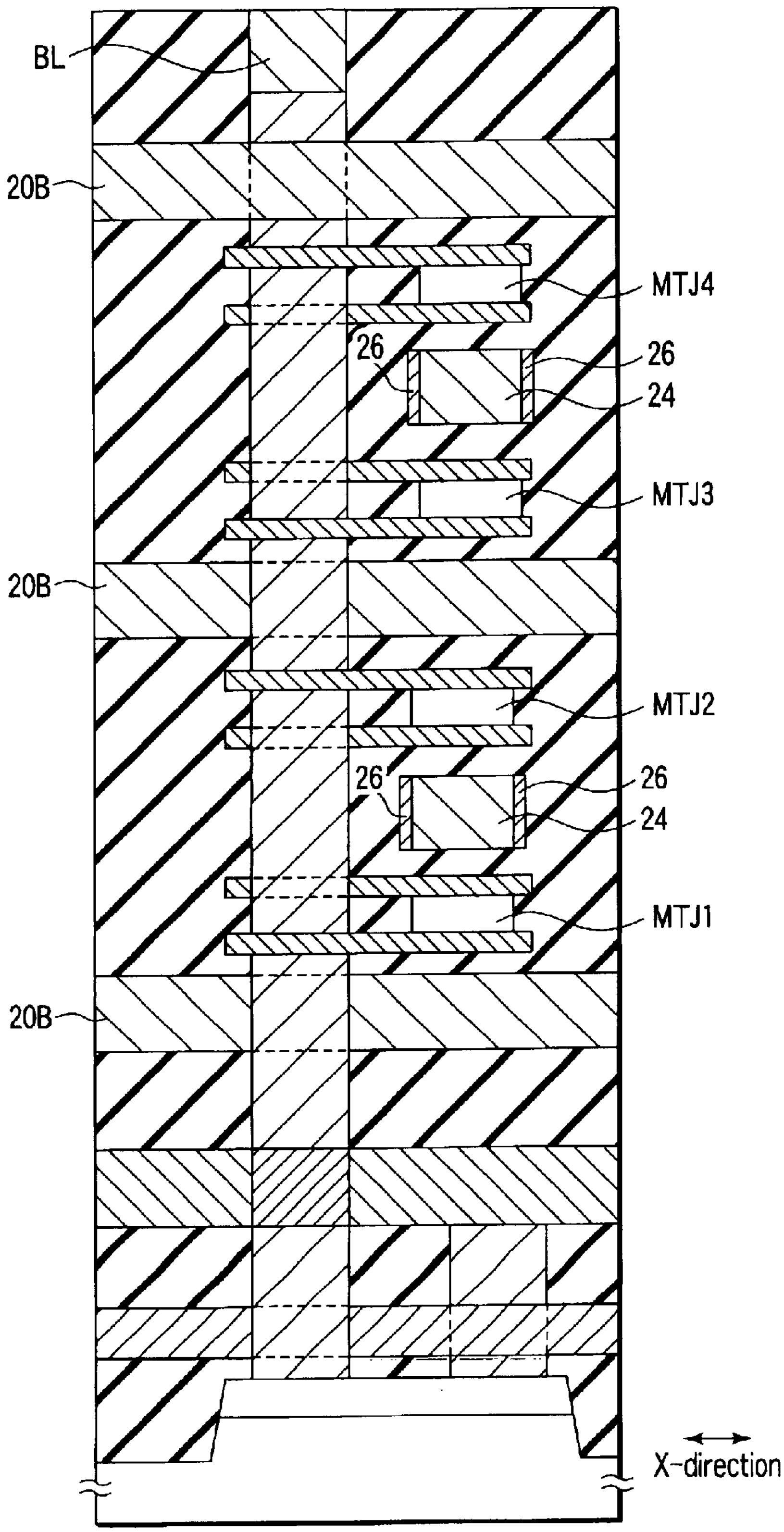
F I G. 45

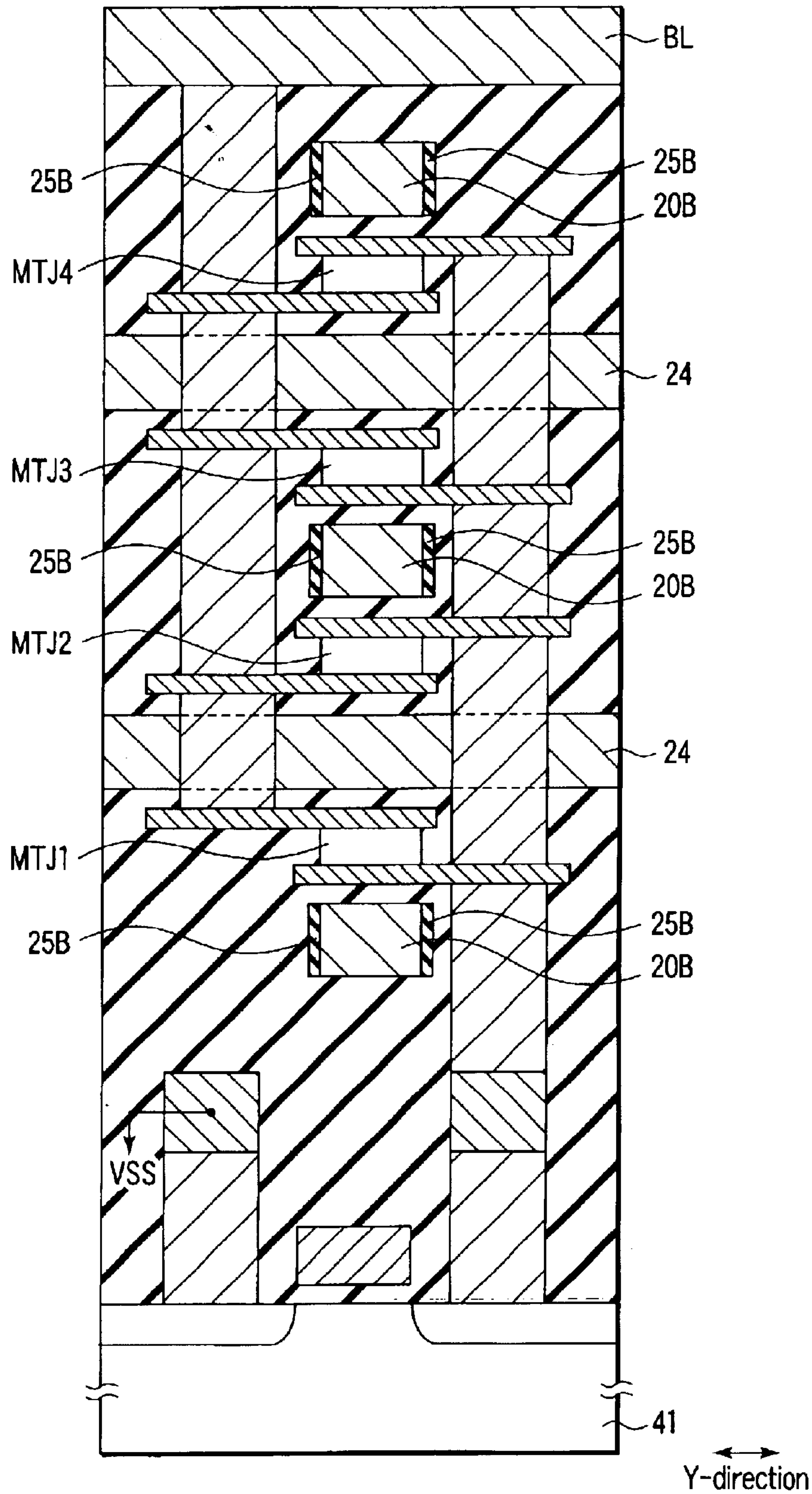
F I G. 46

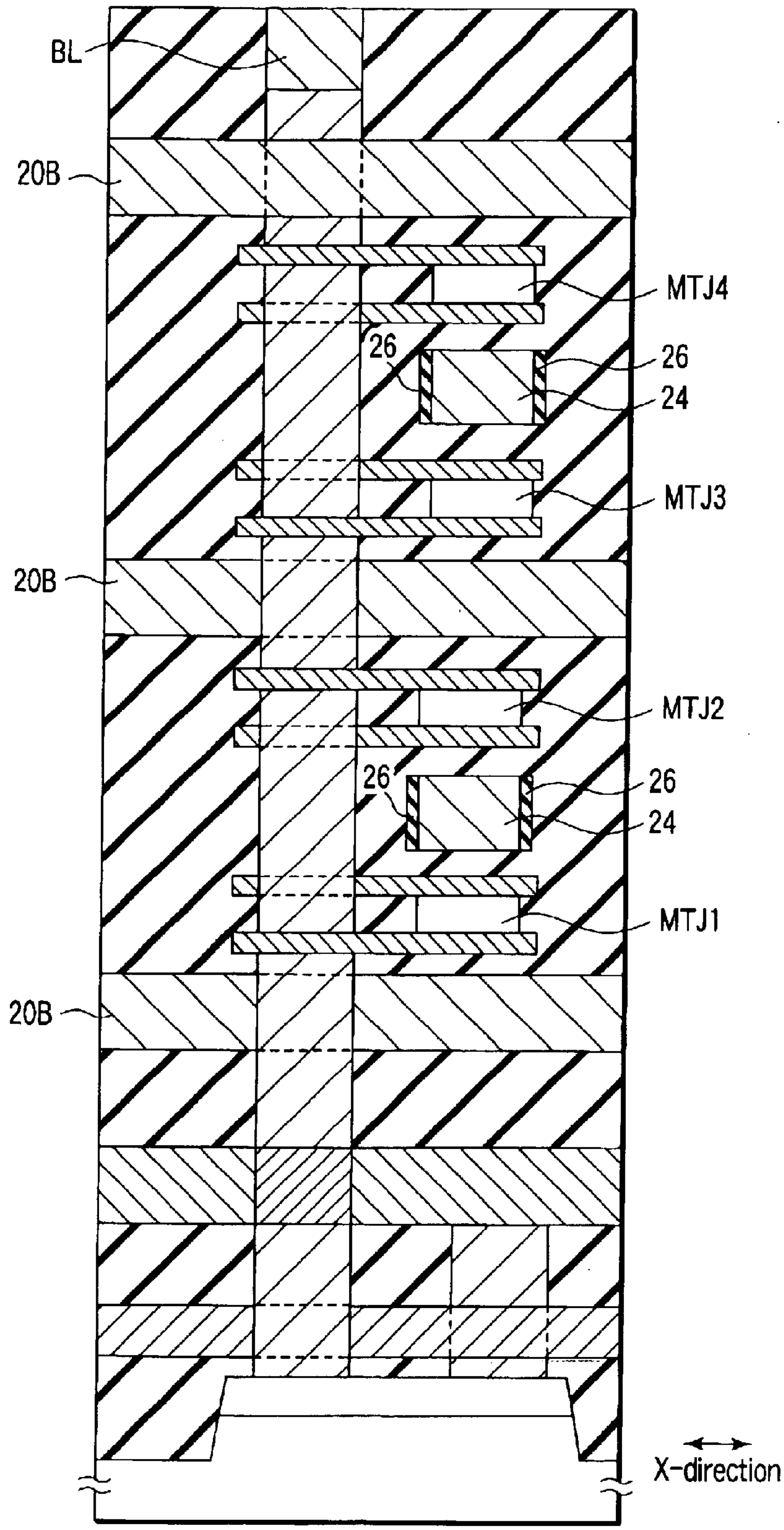
F I G. 47

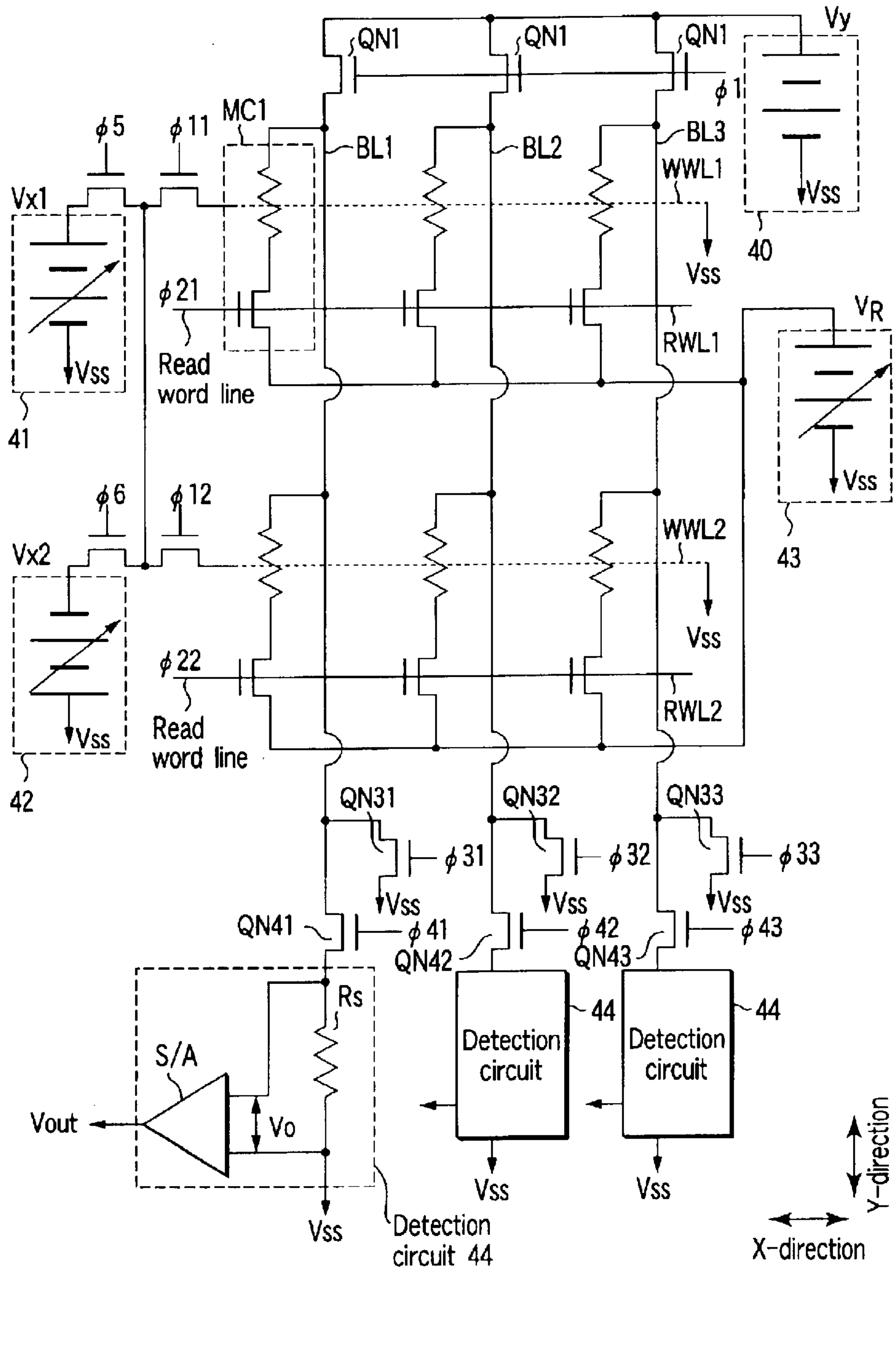
F I G. 52

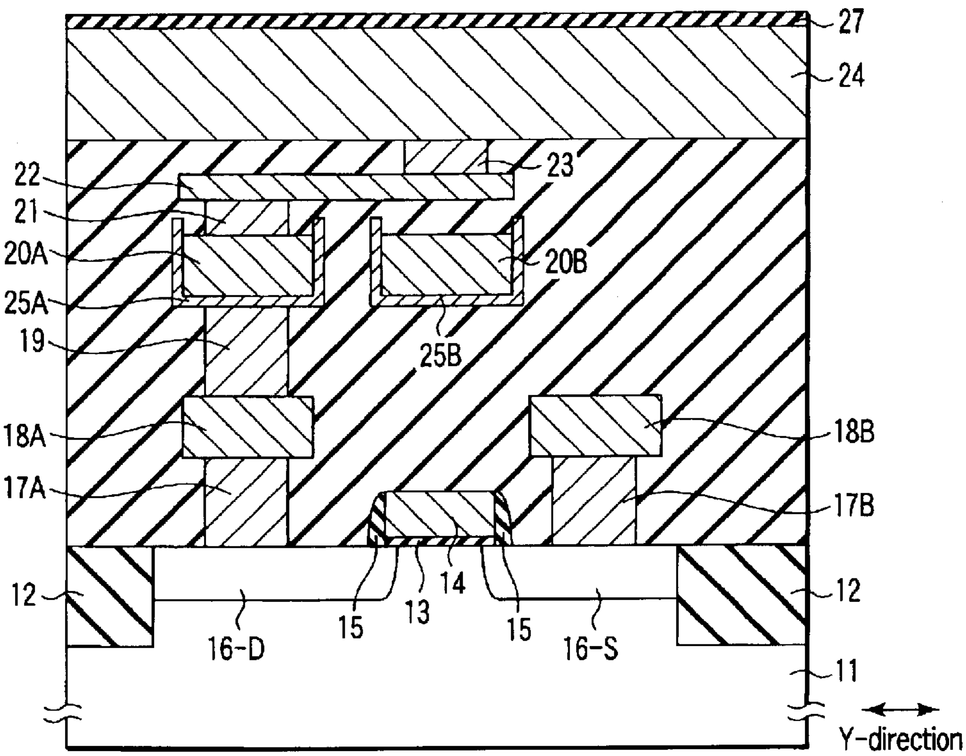
F I G. 72
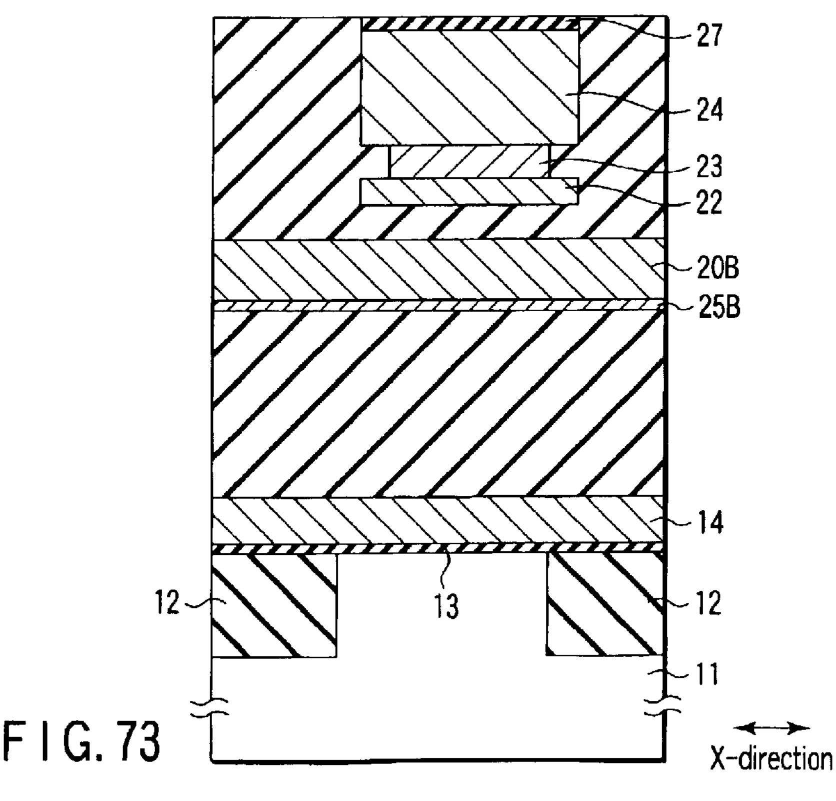
F I G. 73

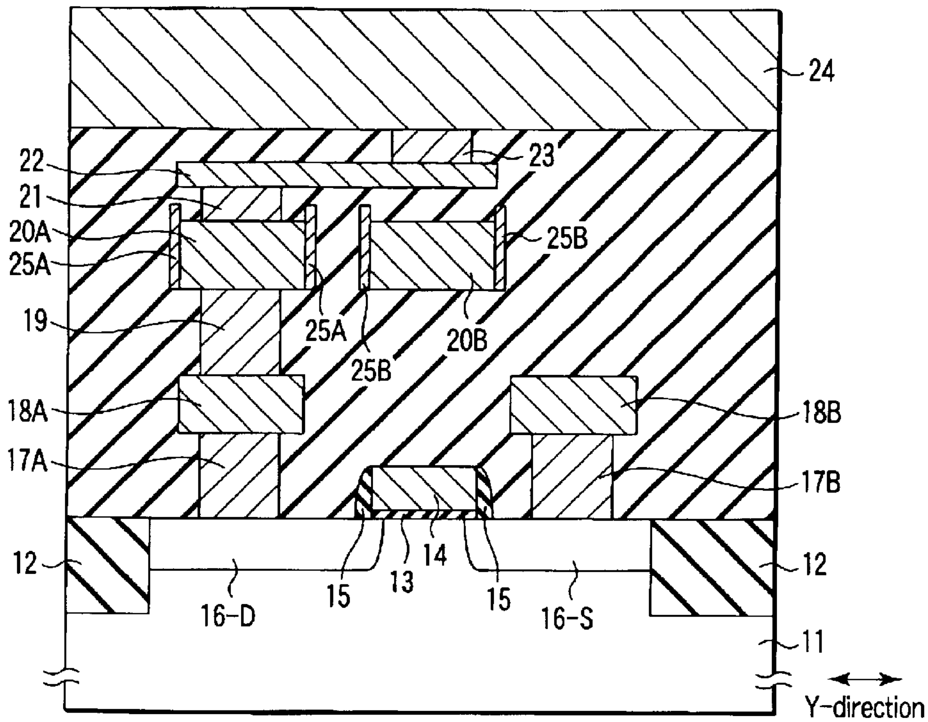
F I G. 102
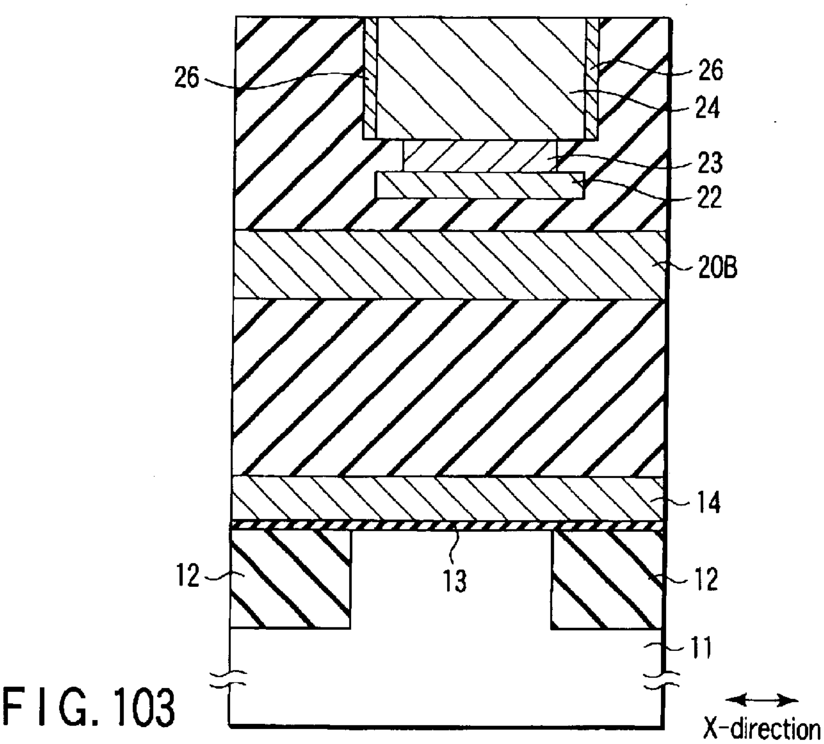
F I G. 103

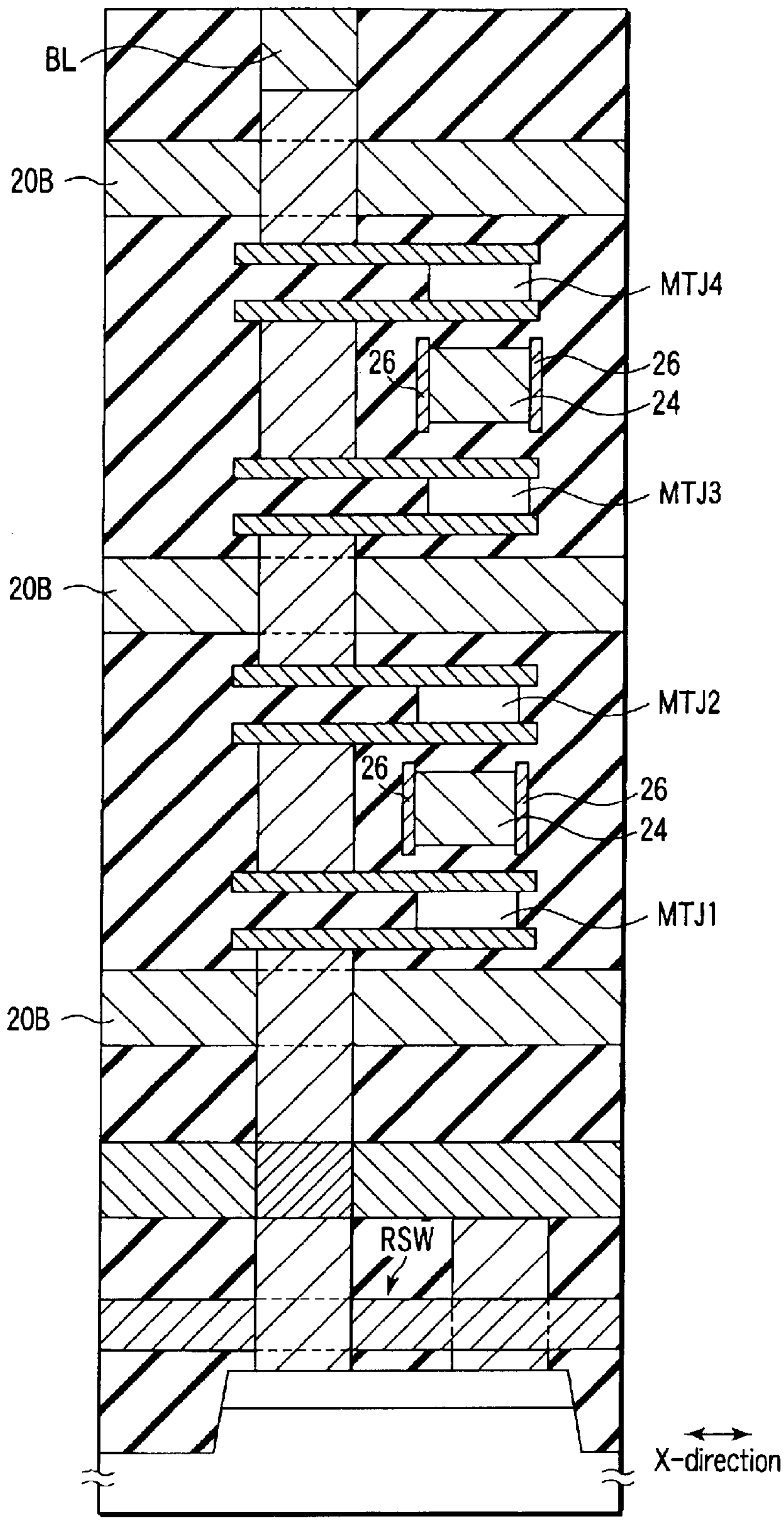
F I G. 127

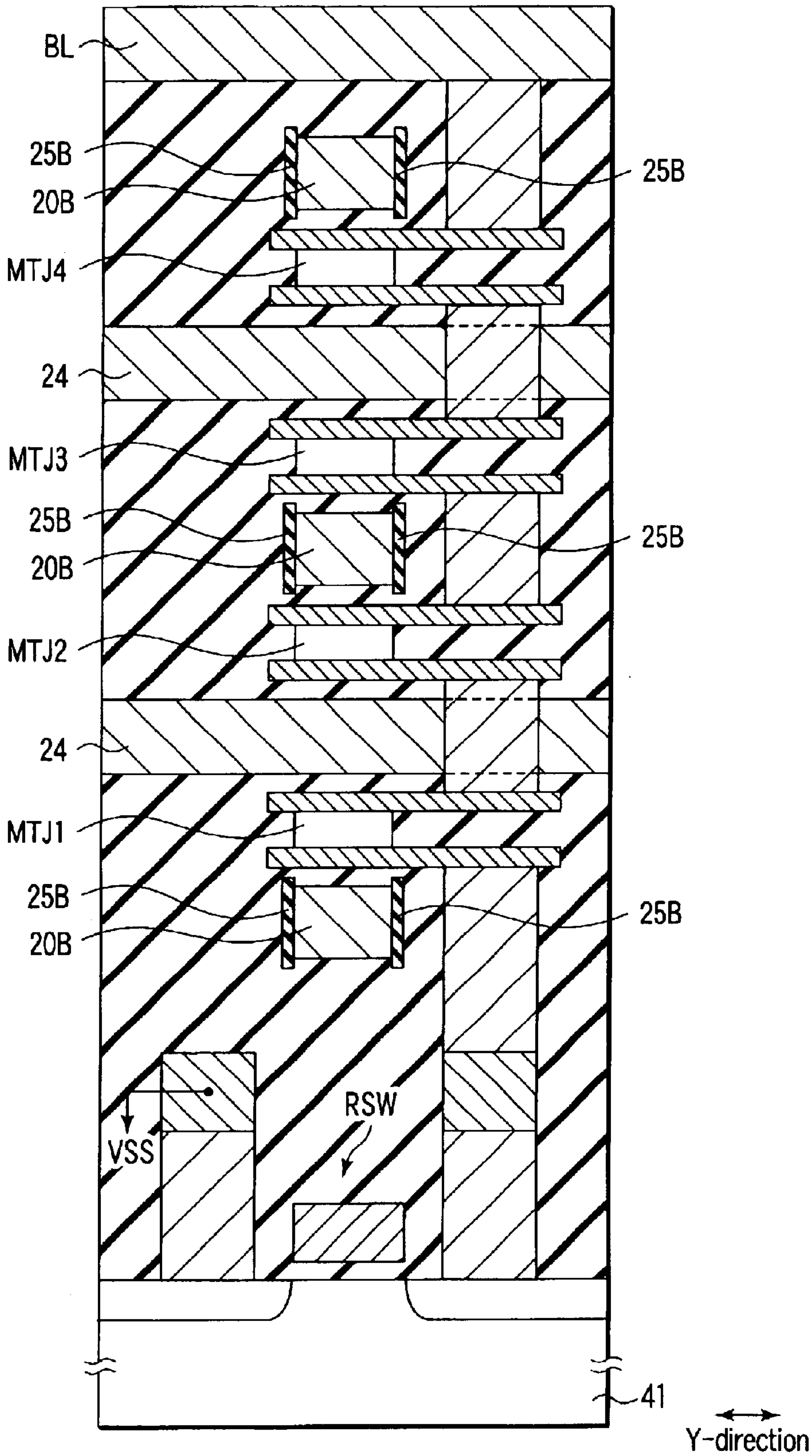
F I G. 128

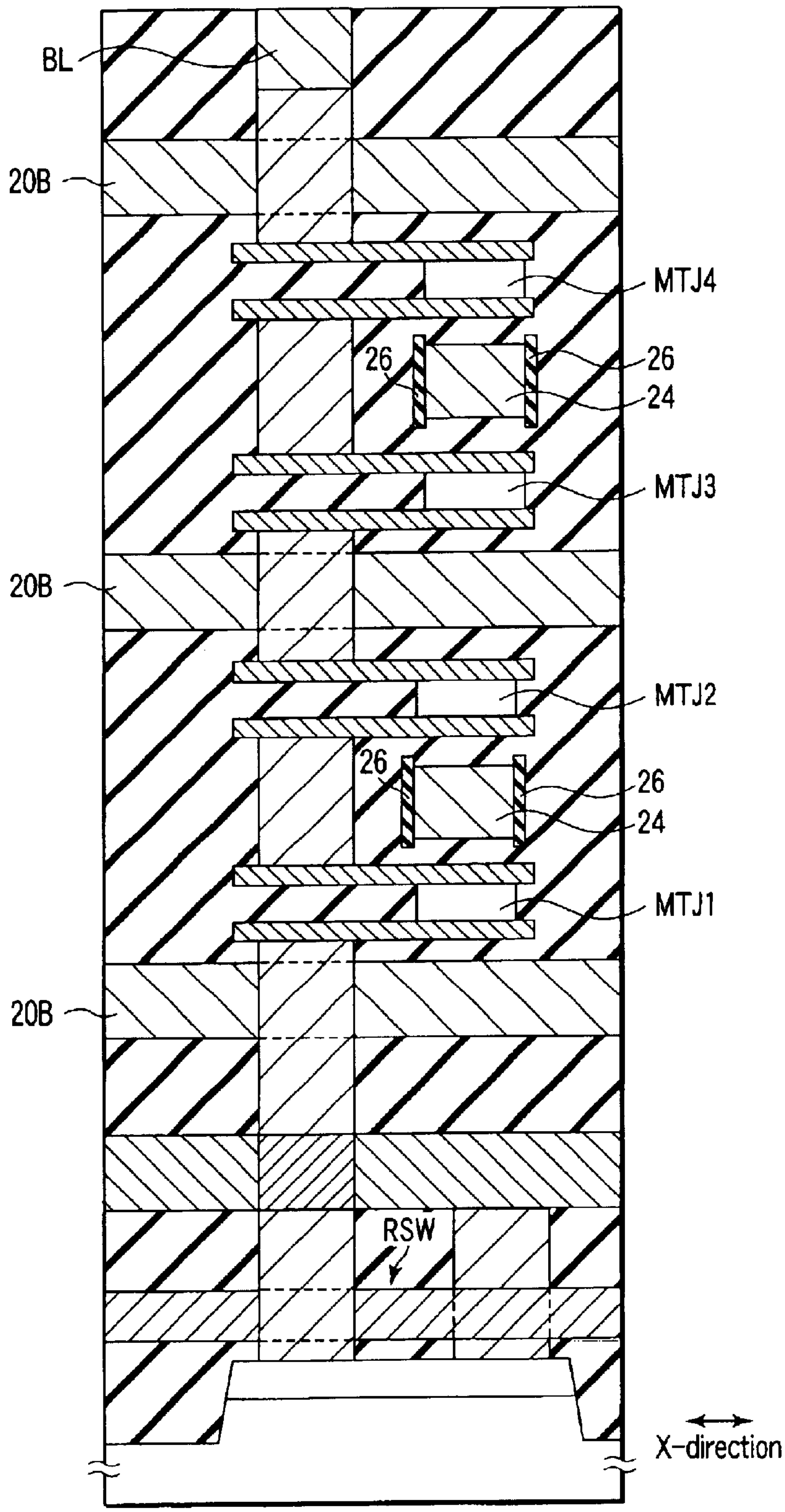
F I G. 129

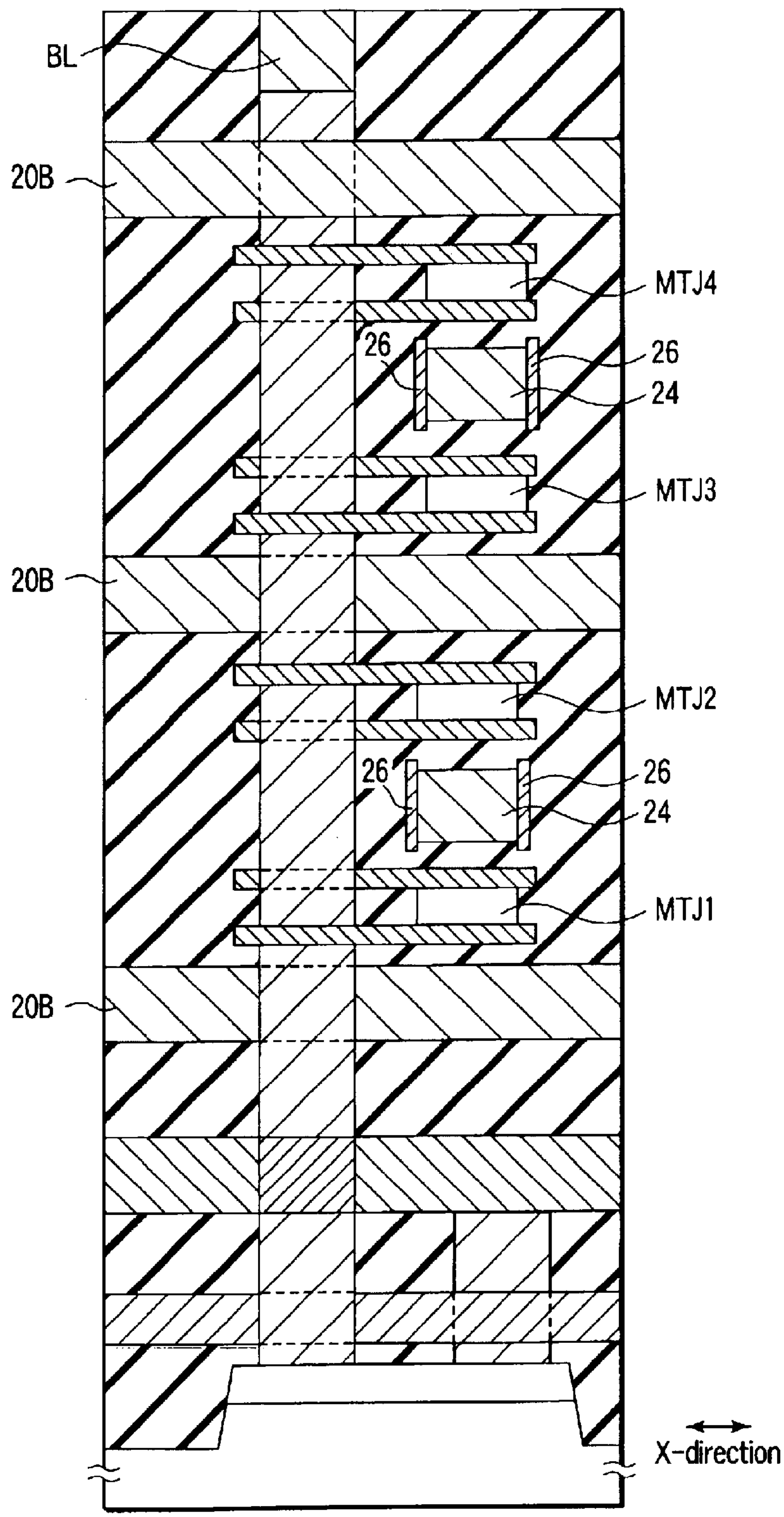
F I G. 131

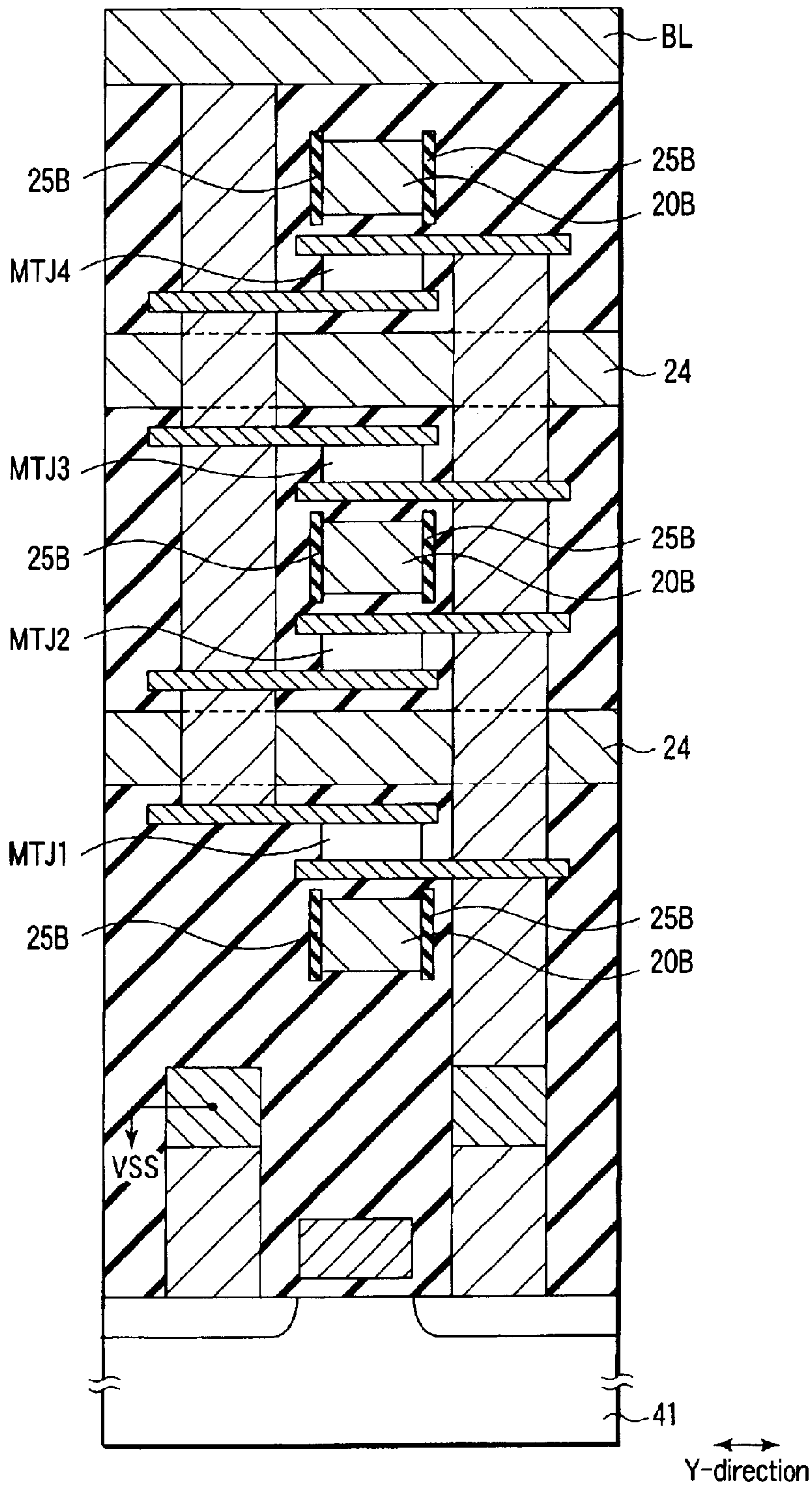
F I G. 132

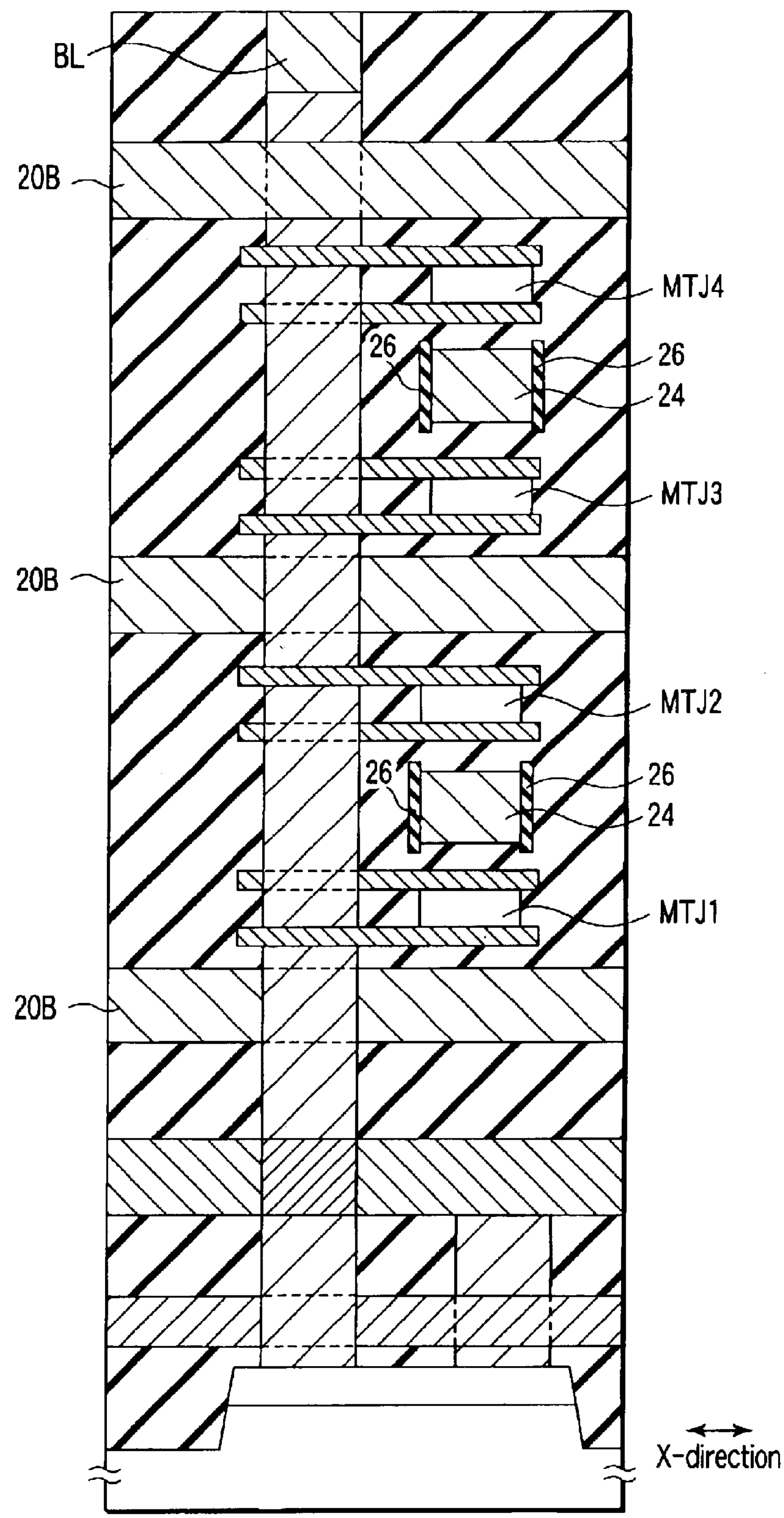
F I G. 133

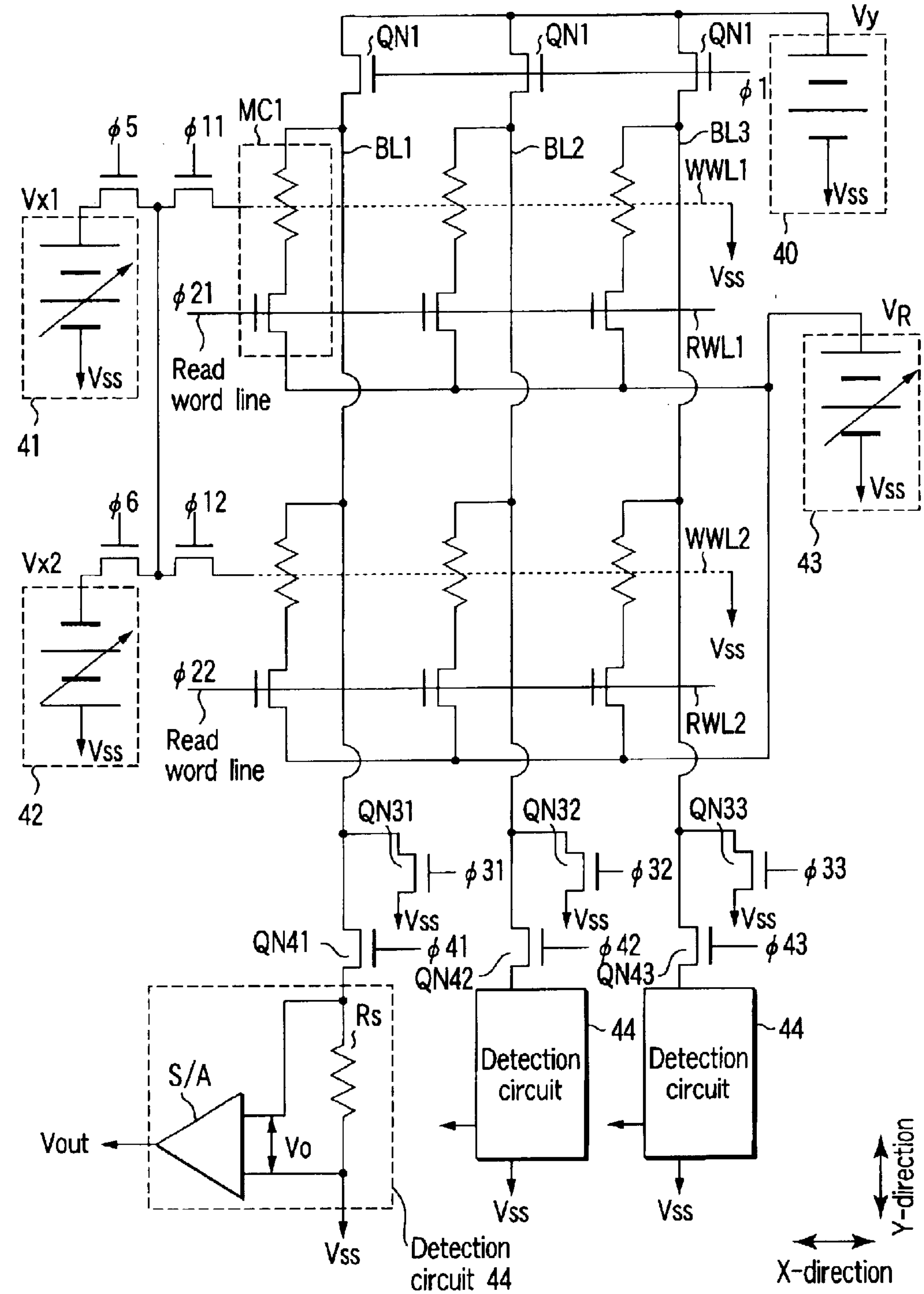
F I G. 138

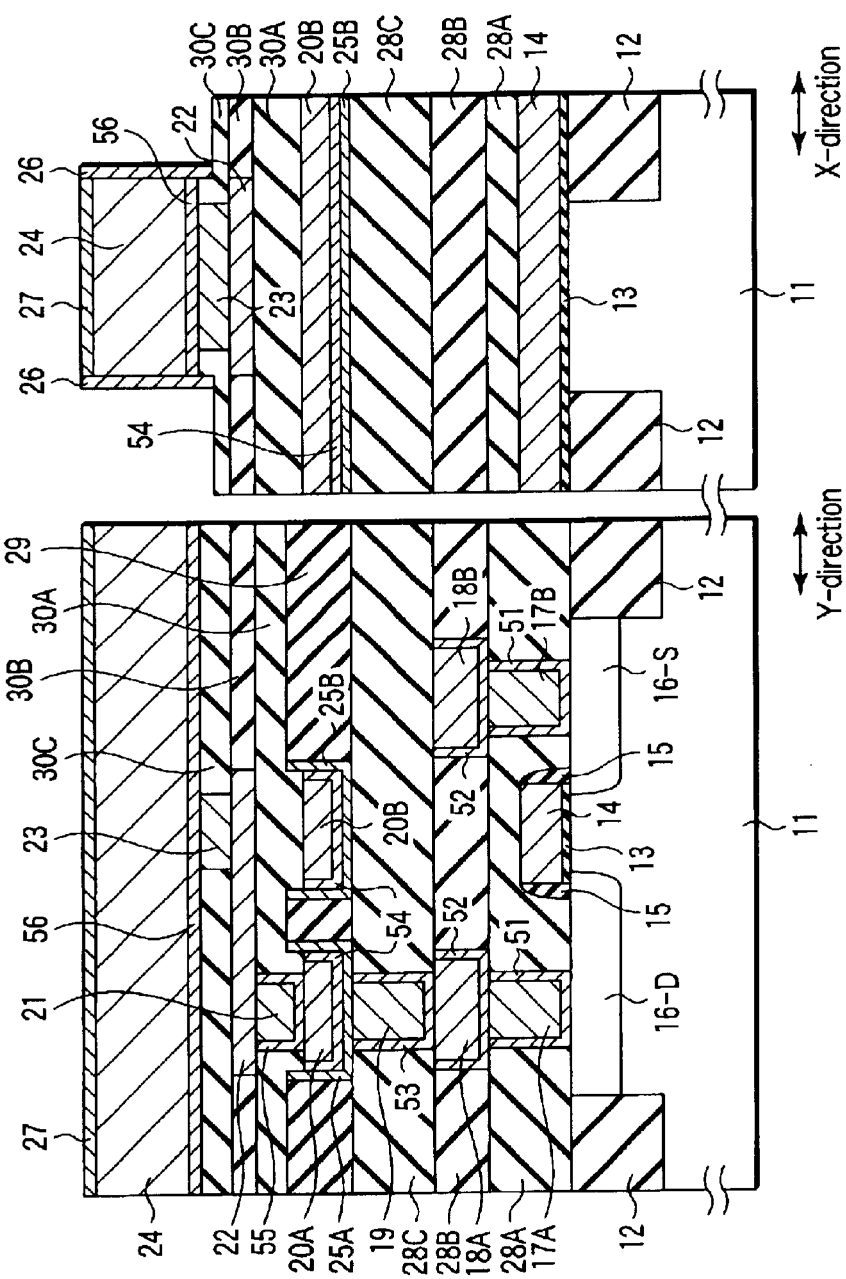
F I G. 143

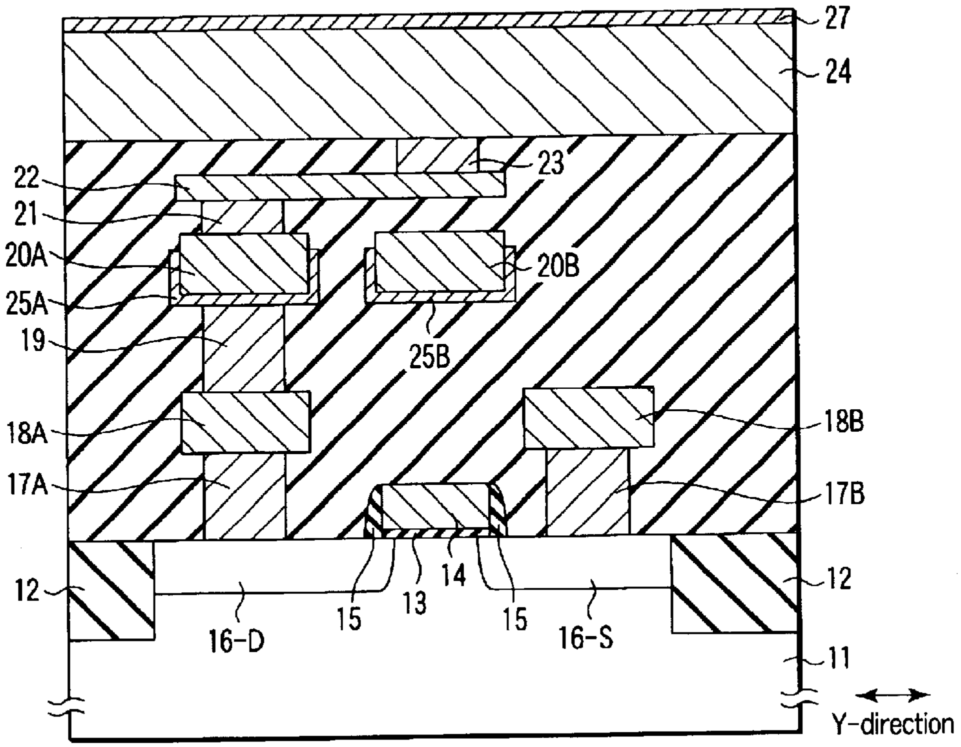
F I G. 152
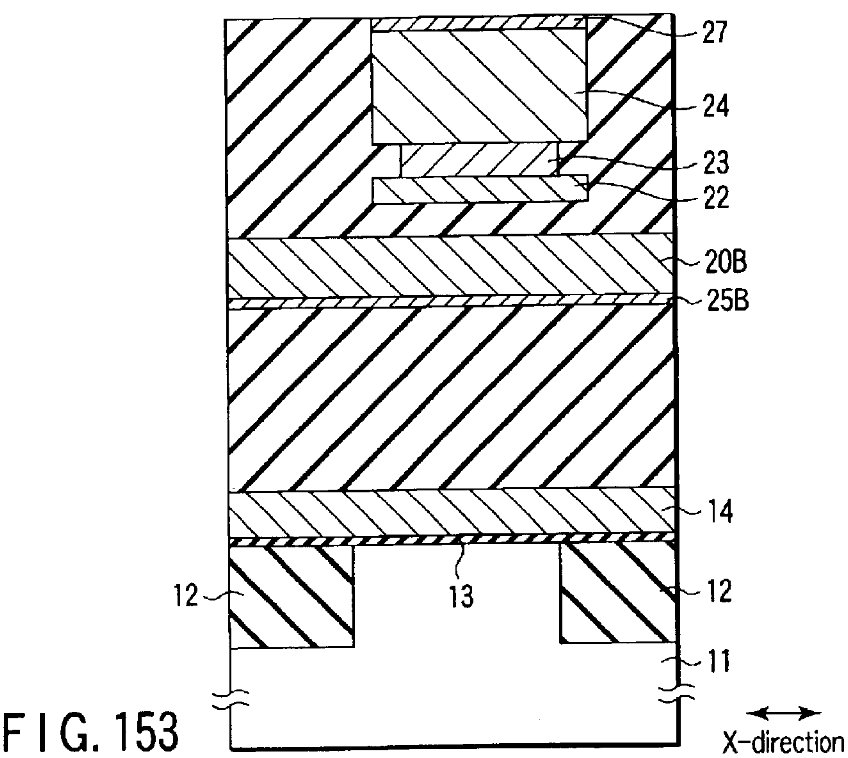
F I G. 153

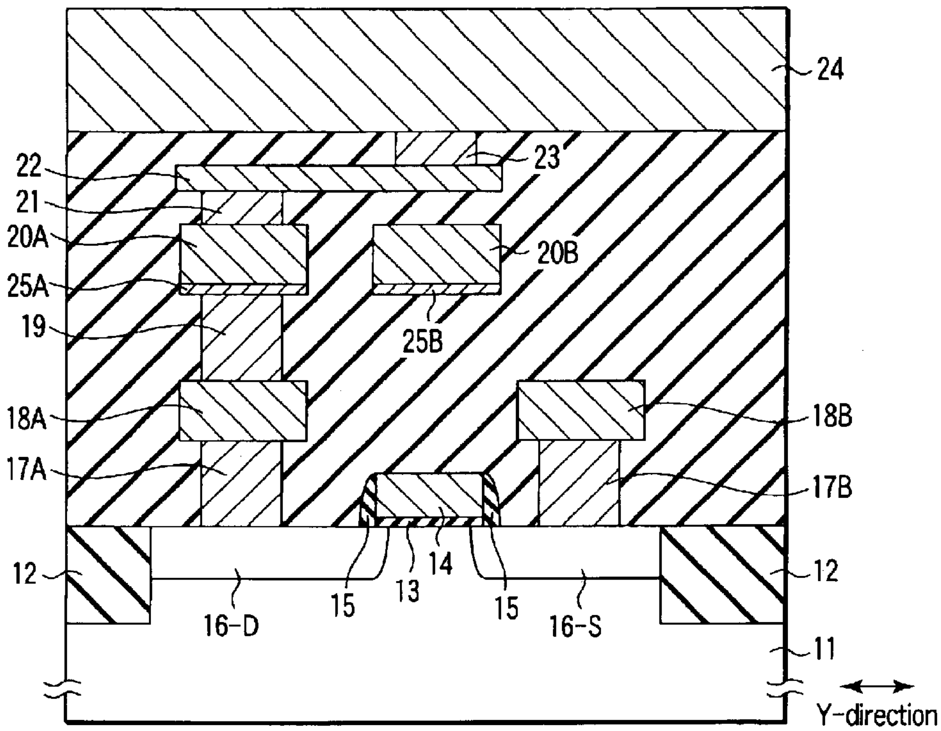
F I G. 192
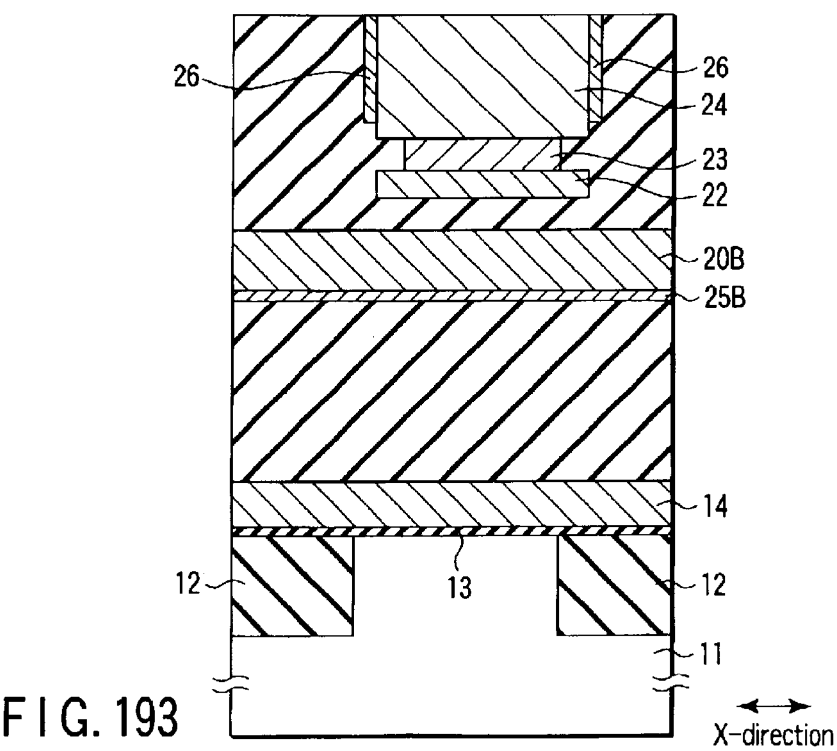
F I G. 193

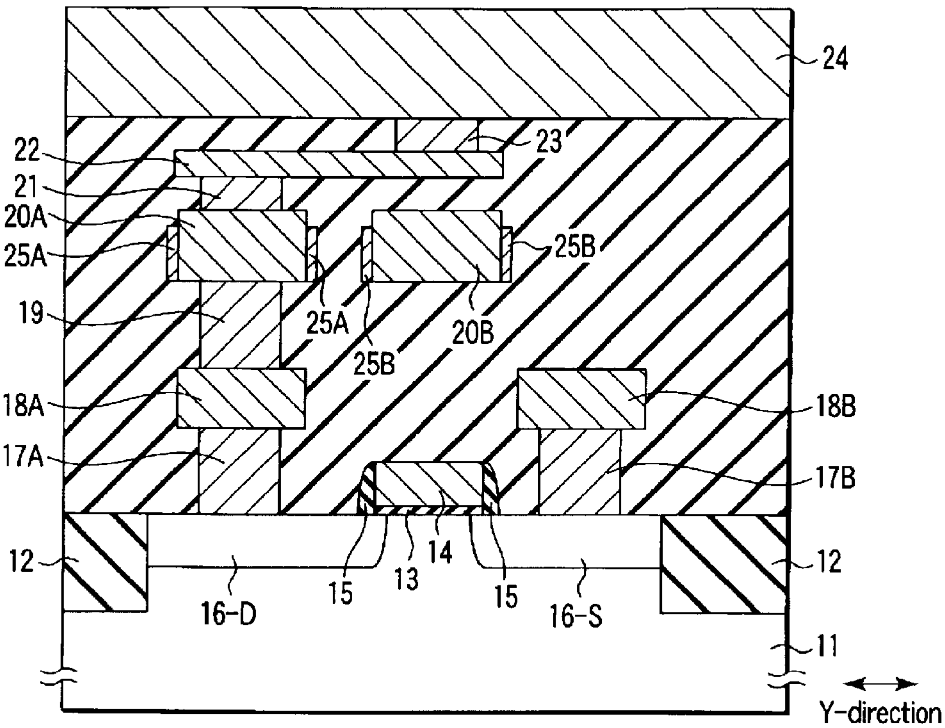
F I G. 200
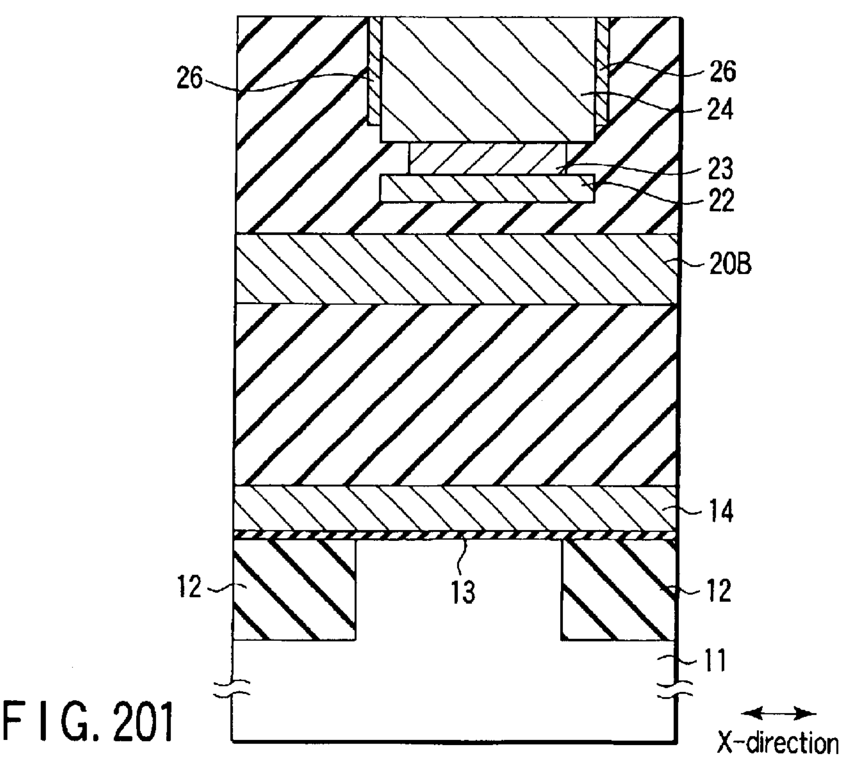
F I G. 201

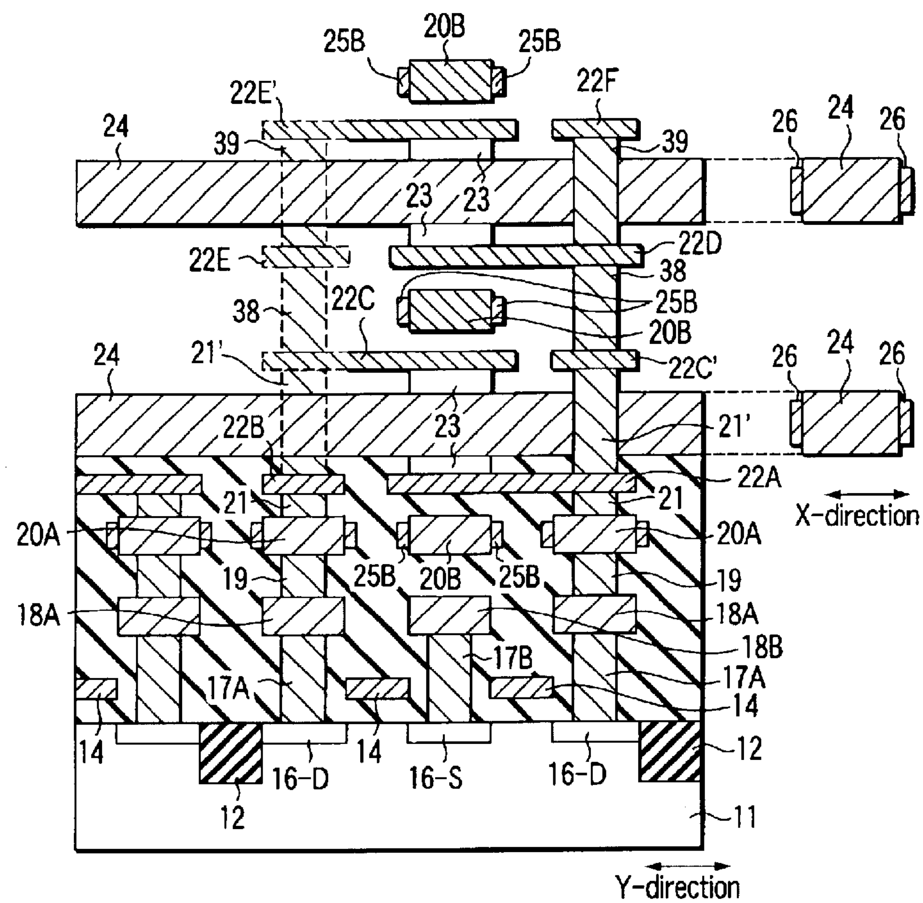
F I G. 206

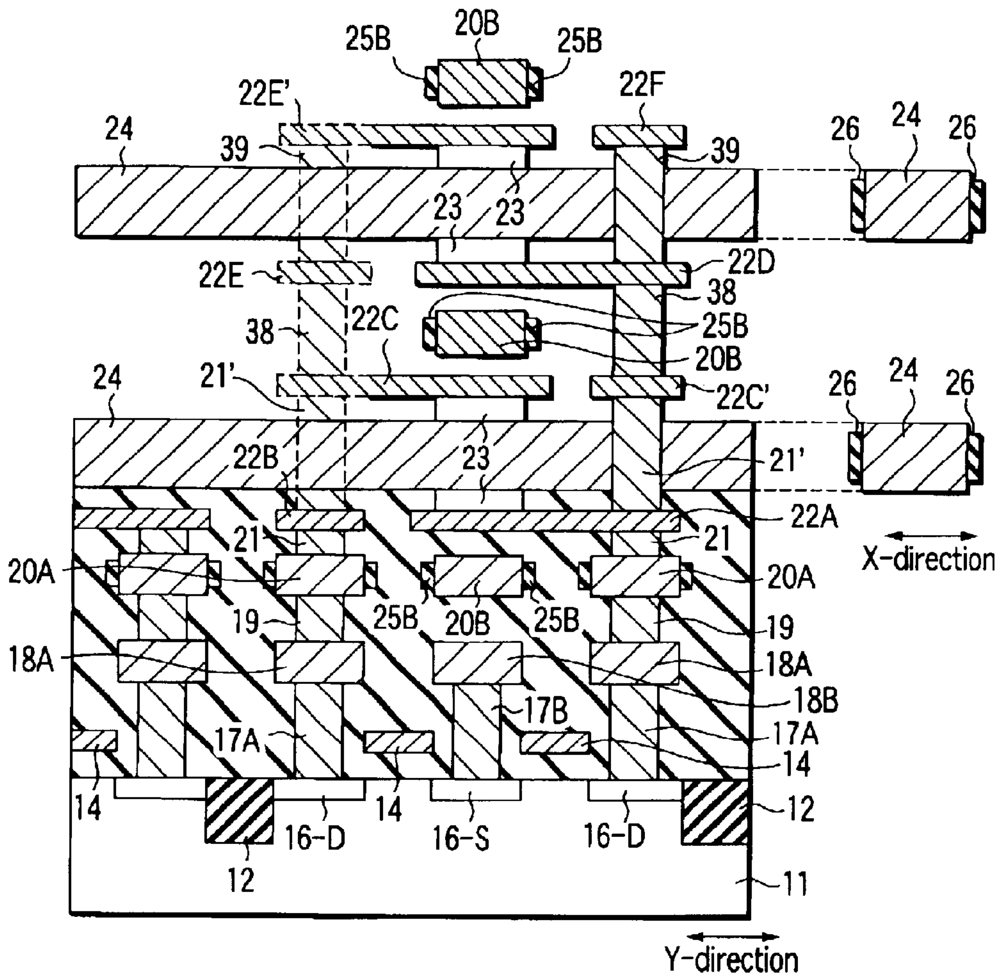
F I G. 207

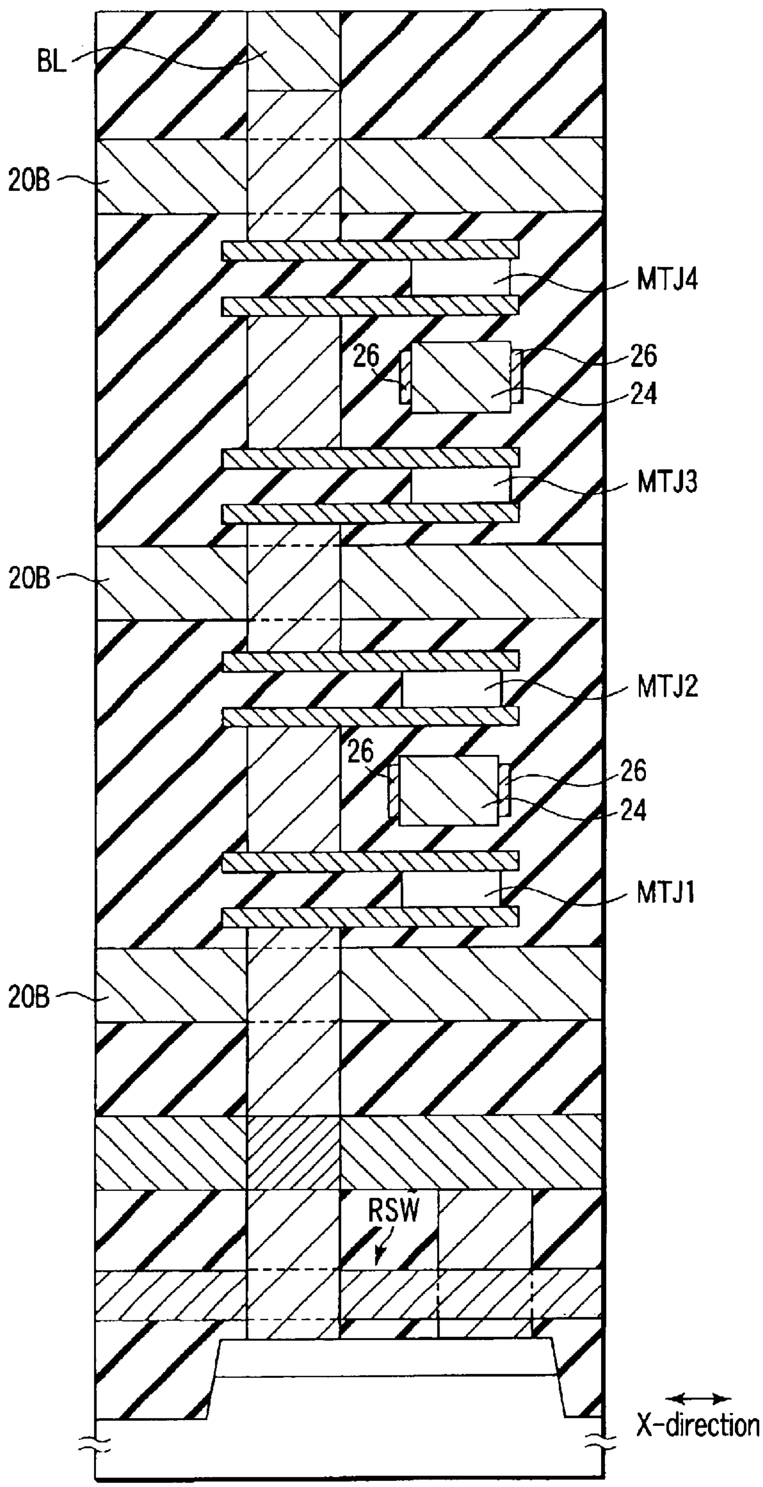
F I G. 209

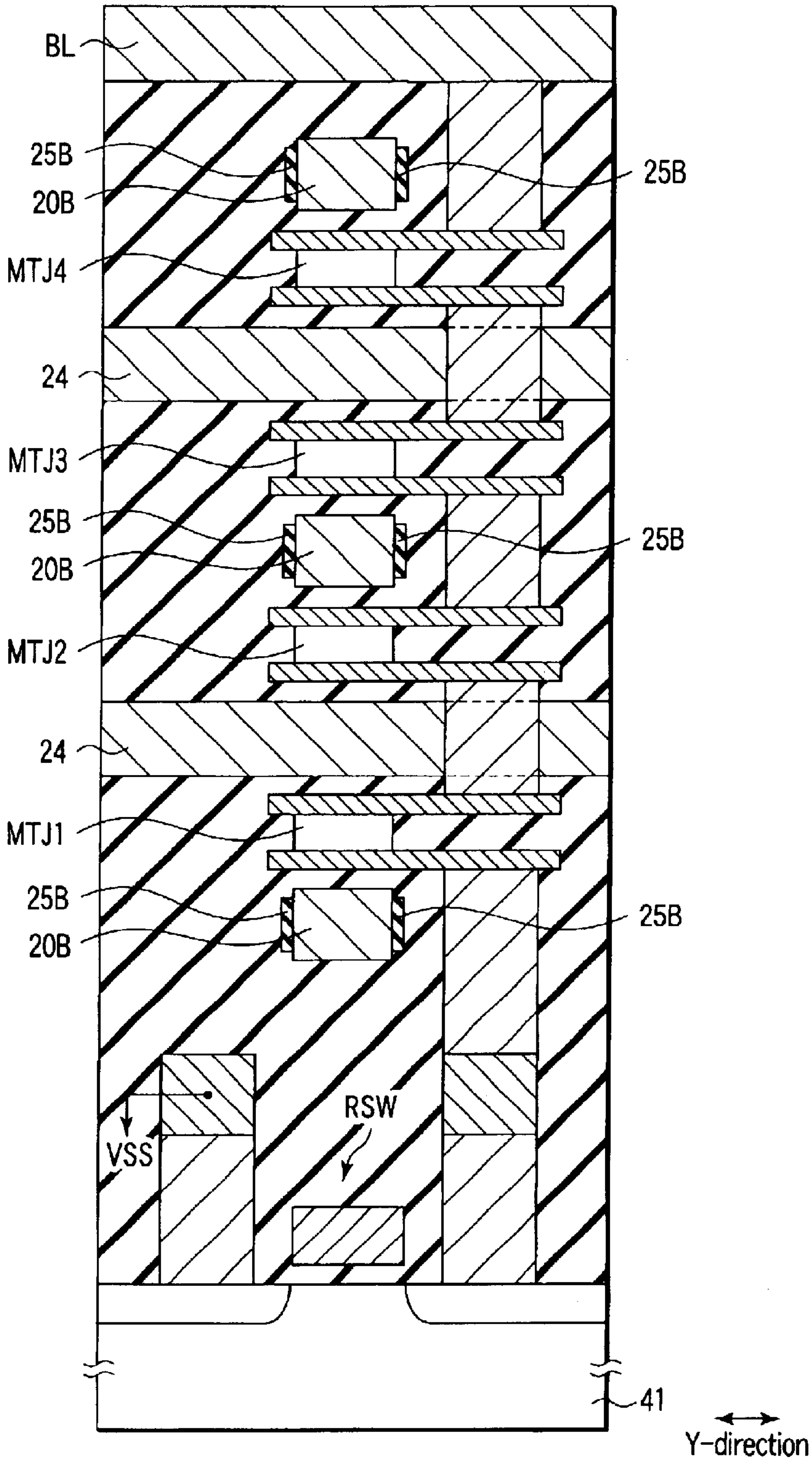
F I G. 210

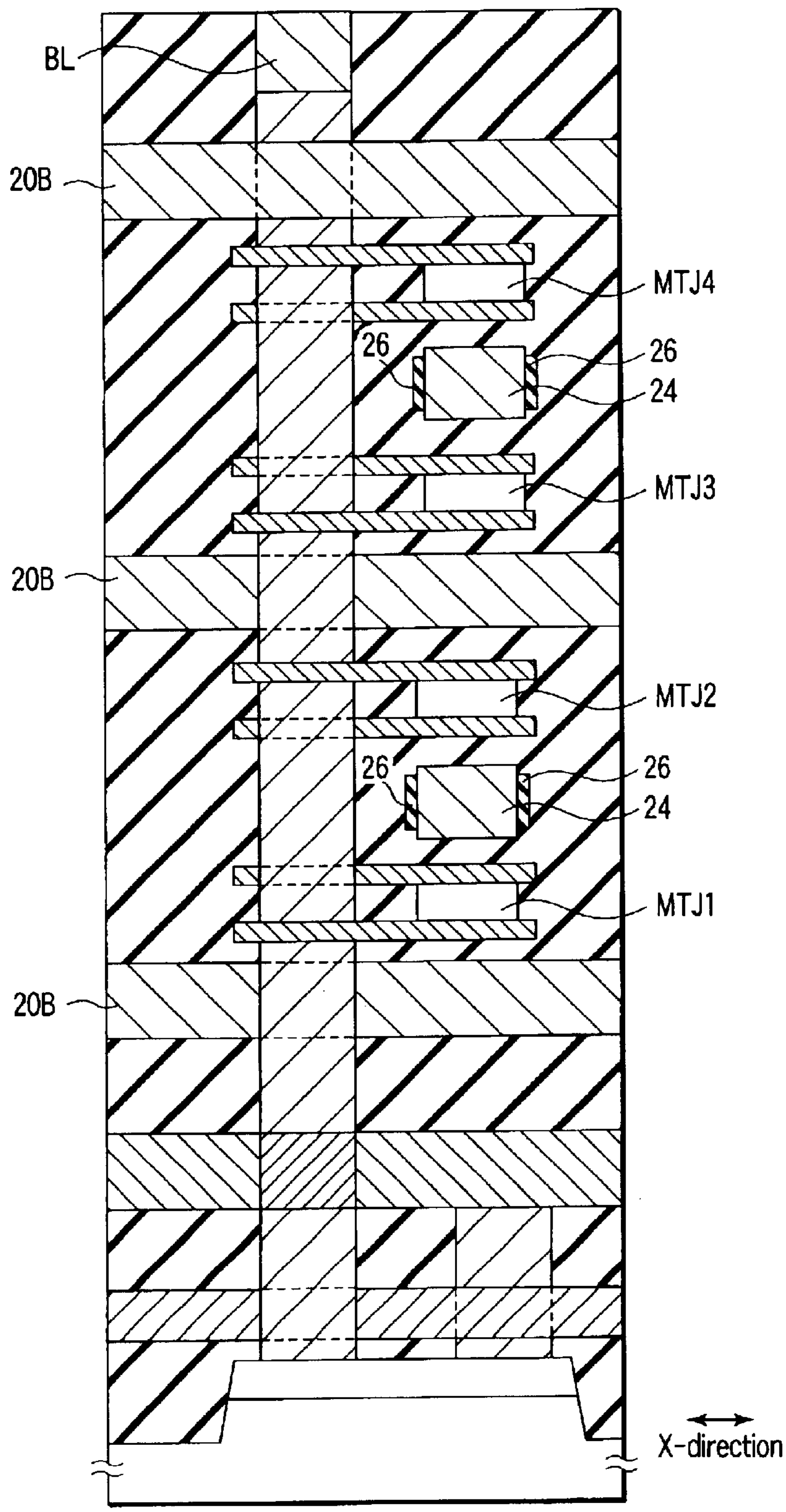
F I G. 215

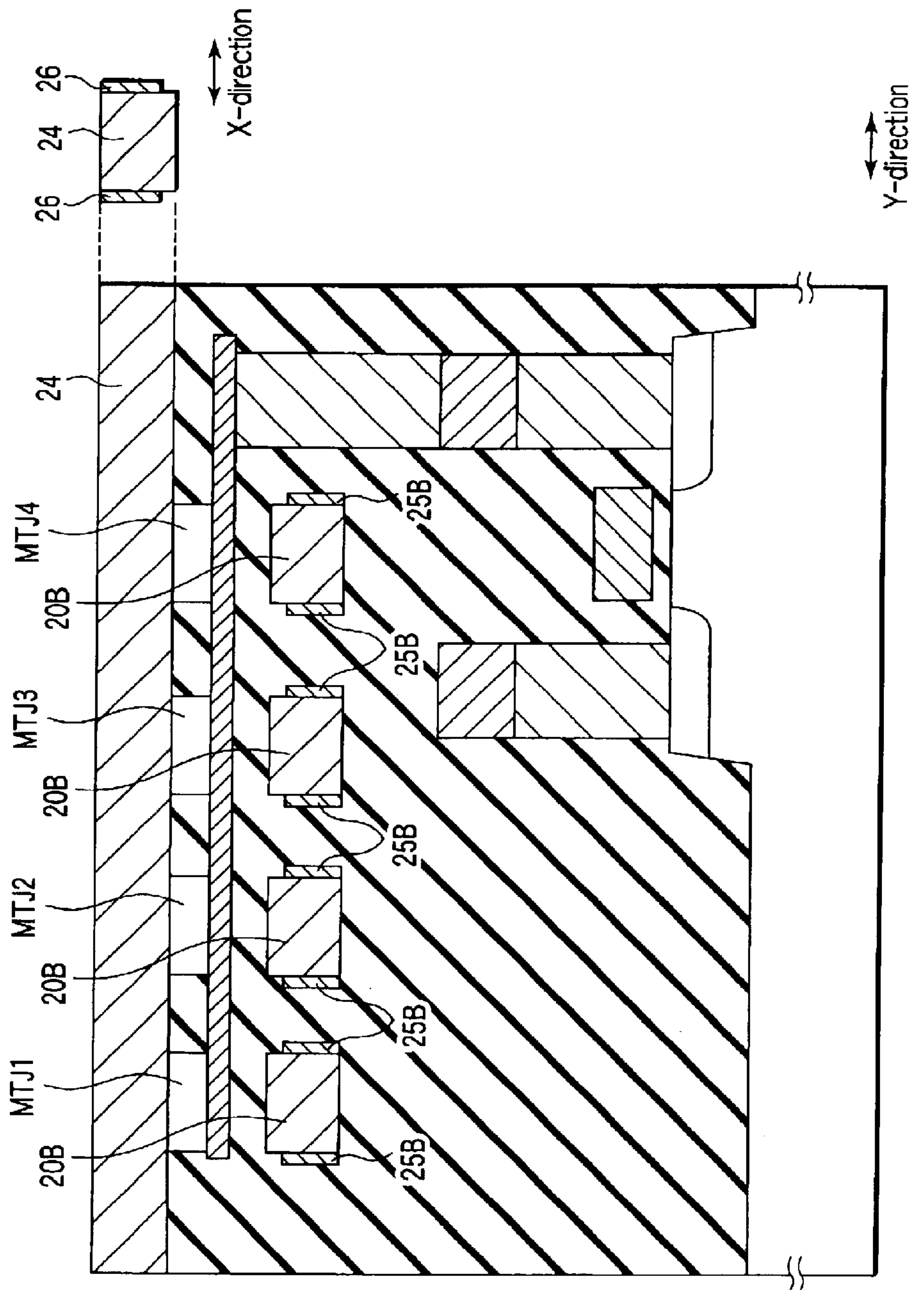
F I G. 216

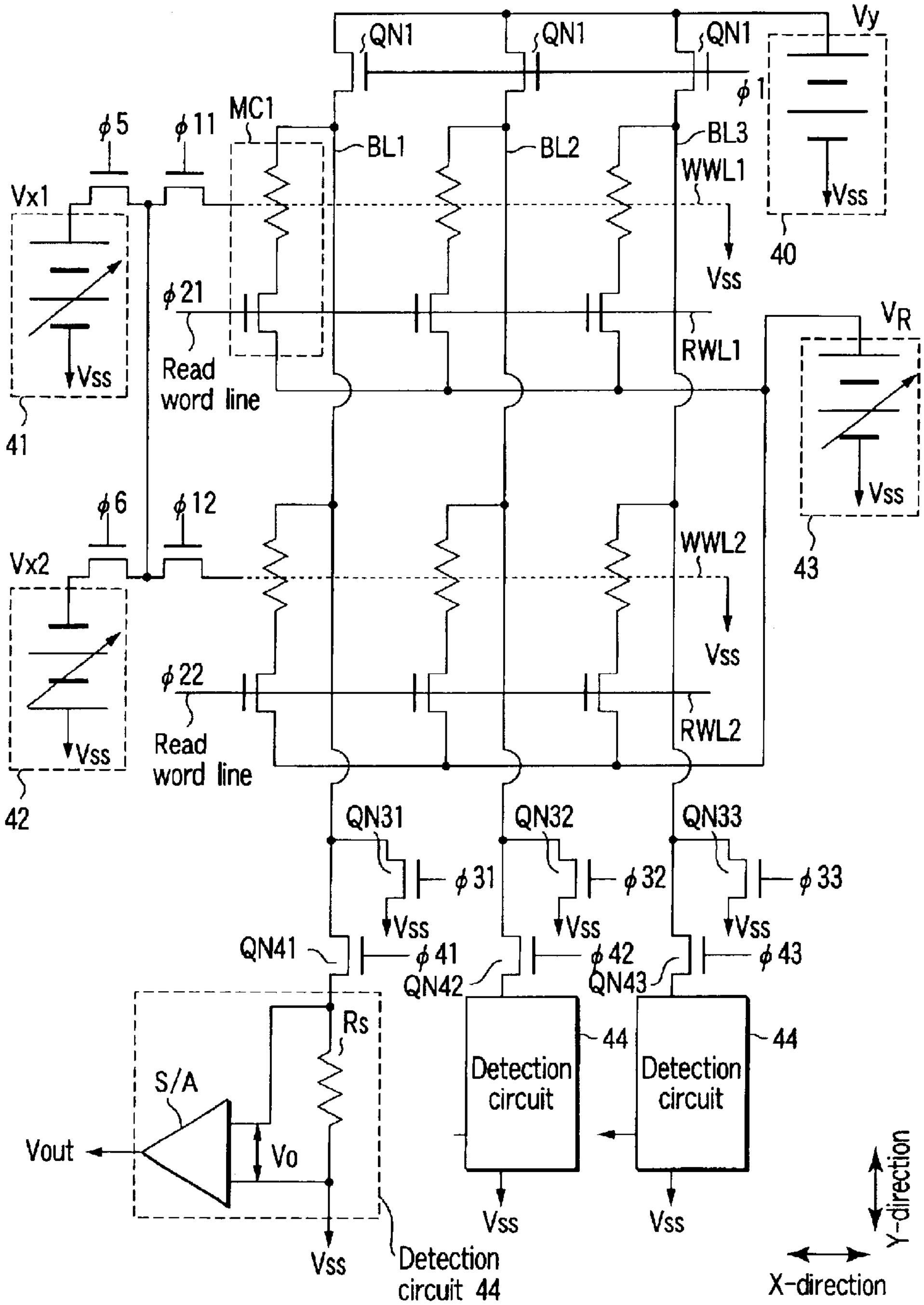
F I G. 220

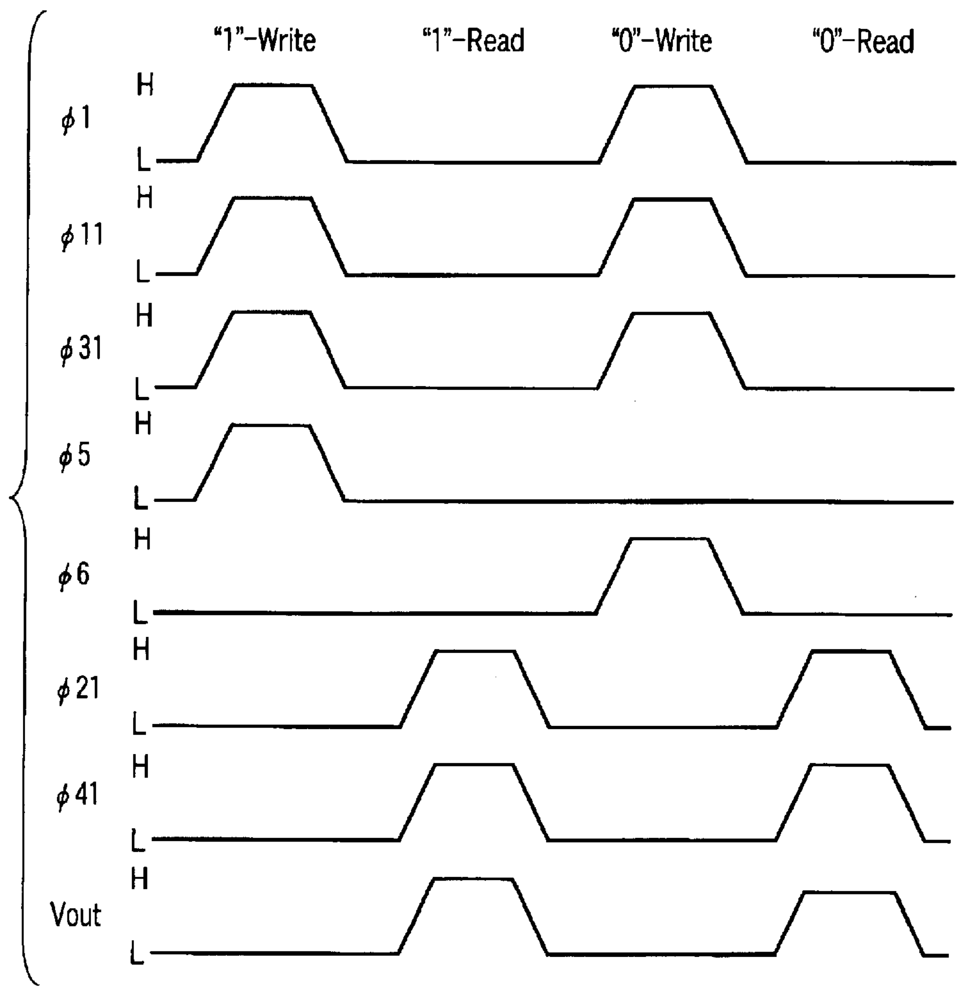
F I G. 221

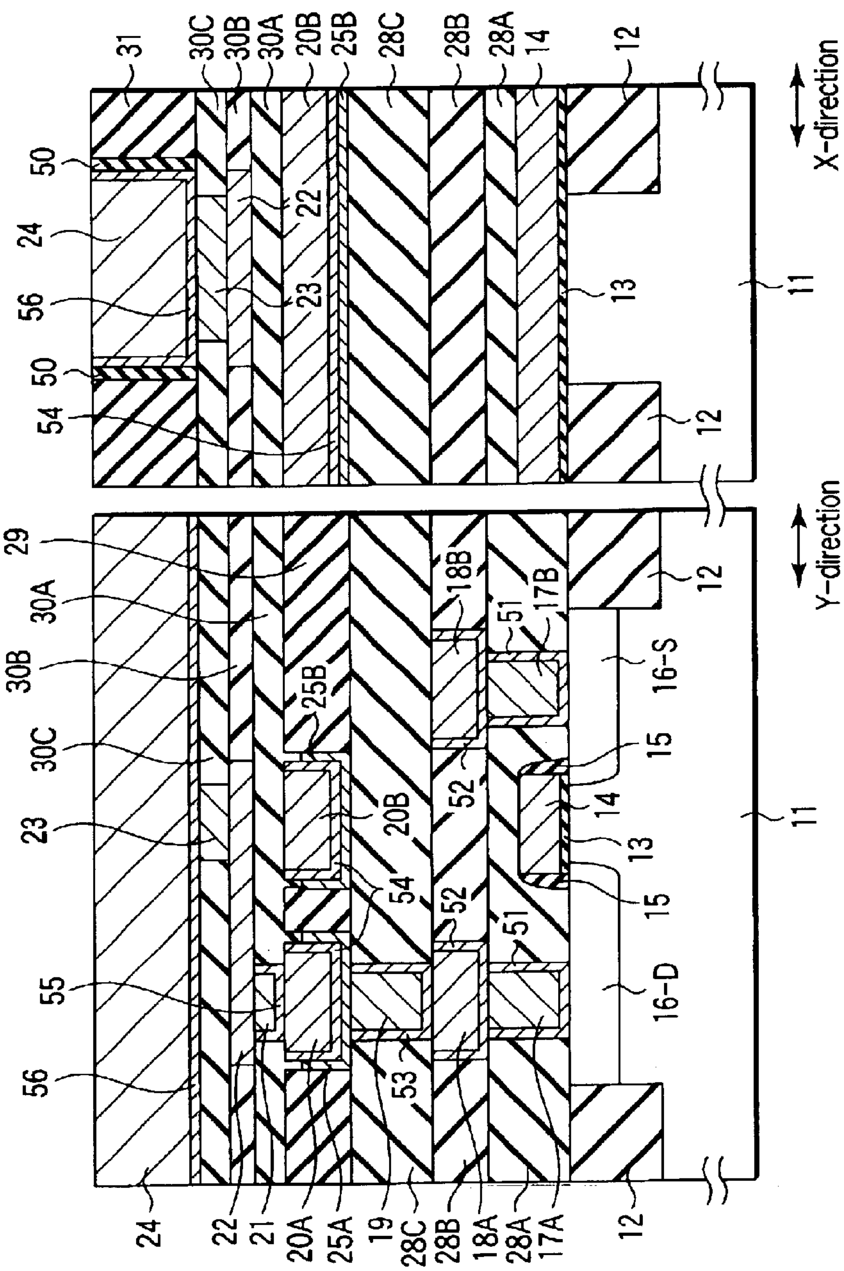
F I G. 225

MAGNETIC RANDOM ACCESS MEMORY

CROSS-REFERENCE TO RELATED APPLICATIONS

This application is based upon and claims the benefit of priority from the prior Japanese Patent Applications No. 2002-116387, filed Apr. 18, 2002; No. 2002-118214, filed Apr. 19, 2002; and No. 2002-118215, filed Apr. 19, 2002, the entire contents of all of which are incorporated herein by reference.

BACKGROUND OF THE INVENTION

1. Field of the Invention

The present invention relates to a magnetic random access memory (MRAM) in which a magnetic tunnel junction (MTJ) element for storing "1", "0"-data by a tunneling magneto resistive effect is used to constitute a memory cell.

2. Description of the Related Art

In recent years, a large number of memories in which data is stored by a new principle have been proposed, and among the memories, there is a memory which has been proposed by Roy Scheuerlein et. al. and in which a tunneling magneto resistive (hereinafter referred to as TMR) effect is used (e.g., see ISSCC2000 Technical Digest p.128 "A 10 ns Read and Write Non-Volatile Memory Array Using a Magnetic Tunnel Junction and FET Switch in each Cell").

In the magnetic random access memory, "1", "0"-data is stored by an MTJ element. As shown in FIG. 1, the MTJ element includes a structure in which an insulating layer (tunnel barrier) is held between two magnetic layers (ferromagnetic layers). The data stored in the MTJ element is judged by judging whether directions of spins of two magnetic layers are parallel or anti-parallel to each other.

Here, as shown in FIG. 2, "parallel" means that the directions of spins of two magnetic layers (magnetization directions) are the same, and "antiparallel" means that the directions of spins of two magnetic layers are opposite (the directions of arrows indicate the directions of spins).

It is to be noted that an anti-ferromagnetic layer is usually disposed in one of two magnetic layers. The anti-ferromagnetic layer is a member for fixing the direction of spins of the magnetic layer on one side and changing only the direction of spins on the other side to easily rewrite data.

The magnetic layer whose direction of spins is fixed is referred to as a fixed or pinned layer. Moreover, the magnetic layer whose direction of spins can freely be changed in accordance with write data is referred to as a free or storage layer.

As shown in FIG. 2, when the directions of spins of two magnetic layers are parallel to each other, tunnel resistance of the insulating layer (tunnel barrier) held between these two magnetic layers becomes lowest. This state is a "1"-state. Moreover, when the directions of spins of two magnetic layers are anti-parallel to each other, the tunnel resistance of the insulating layer (tunnel barrier) held between these two magnetic layers becomes highest. This state is a "0"-state.

Next, a write operation principle with respect to the MTJ element will briefly be described with reference to FIG. 3.

The MTJ element is disposed in an intersection of a write word line and data selection line (read/write bit line) which intersect with each other. Moreover, write is achieved by passing a current through the write word line and data selection line, and using a magnetic field made by the current flowing through opposite wirings to set the direction of spins of the MTJ element to be parallel or anti-parallel.

For example, a magnetization easy axis of the MTJ element corresponds to an X direction, the write word line extends in the X direction, and the data selection line extends in a Y direction crossing at right angles to the X direction. In this case, at a write time, the current flowing in one direction is passed through the write word line, and the current flowing in one or the other direction is passed through the data selection line in accordance with write data.

When the current flowing in one direction is passed through the data selection line, the direction of spins of the MTJ element becomes parallel ("1"-state). On the other hand, when the current flowing in the other direction is passed through the data selection line, the direction of spins of the MTJ element becomes anti-parallel ("0"-state).

A mechanism in which the direction of spins of the MTJ element changes is as follows.

As shown by a TMR curve of FIG. 4, when a magnetic field Hx is applied in a long-side (easy-axis) direction of the MTJ element, a resistance value of the MTJ element changes, for example, by about 17%. This change ratio, that is, a ratio of a resistance value before the change to that after the change is referred to as an MR ratio.

It is to be noted that the MR ratio changes by a property of the magnetic layer. At present, the MTJ element whose MR ratio is about 50% has also been obtained.

A synthesized magnetic field of the magnetic field Hx of the easy-axis direction and magnetic field Hy of a hard-axis direction is applied to the MTJ element. As shown by a solid line of FIG. 5, a size of the magnetic field Hx of the easy-axis direction necessary for changing the resistance value of the MTJ element also changes by the size of the magnetic field Hy of the hard-axis direction. This phenomenon can be used to write the data into only the MTJ element existing in the intersection of the selected write word line and data selection line among arrayed memory cells.

This state will further be described with reference to an asteroid curve of FIG. 5.

The asteroid curve of the MTJ element is shown, for example, by the solid line of FIG. 5. That is, when the size of the synthesized magnetic field of the magnetic field Hx of the easy-axis direction and magnetic field Hy of the hard-axis direction is outside the asteroid curve (solid line) (e.g., positions of black circles), the direction of spins of the magnetic layer can be reversed.

Conversely, when the size of the synthesized magnetic field of the magnetic field Hx of the easy-axis direction and magnetic field Hy of the hard-axis direction is inside the asteroid curve (solid line) (e.g., positions of white circles), the direction of spins of the magnetic layer cannot be reversed.

Therefore, when the sizes of the magnetic field Hx of the easy-axis direction and magnetic field Hy of the hard-axis direction are changed, and the position of the size of the synthesized magnetic field in an Hx-Hy plane is changed, the write of the data with respect to the MTJ element can be controlled.

It is to be noted that read can easily be performed by passing the current through the selected MTJ element, and detecting the resistance value of the MTJ element.

For example, switch elements are connected in series to the MTJ elements, and only the switch element connected to a selected read word line is turned on to form a current path. As a result, since the current flows only through the selected MTJ element, the data of the MTJ element can be read.

In a magnetic random access memory, as described above, the data is written by passing a write current through the write word line and data selection line (read/write bit line), and allowing the synthesized magnetic field generated in this manner to act on the MTJ element.

Therefore, in order to write the data with good efficiency, it is important to apply the synthesized magnetic field to the MTJ element with good efficiency. When the synthesized magnetic field is efficiently applied to the MTJ element, reliability of the write operation is enhanced, the write current is further reduced, and low power consumption can be realized.

However, an effective device structure for efficiently allowing the synthesized magnetic field generated by the write currents flowing through the write word line and data selection line to act on the MTJ element has not been sufficiently studied. That is, for the device structure, in actual, it is necessary to study that the synthesized magnetic field is added to the MTJ element with good efficiency and to judge whether or not the structure can easily be manufactured in a manufacturing process.

BRIEF SUMMARY OF THE INVENTION (1) First Invention

According to a first aspect of a first invention of the present application, there is provided a magnetic random access memory comprising: a memory cell which is formed on a semiconductor substrate and in which a magneto resistive effect is used to store data; a first write line which is disposed right under the memory cell and which extends in a first direction; a second write line which is disposed right on the memory cell and which extends in a second direction intersecting with the first direction; and a first yoke material with which a part of the surface of the second write line is coated.

According to a second aspect of the first invention of the present application, there is provided a magnetic random access memory comprising: a memory cell which is formed on a semiconductor substrate and in which a magneto resistive effect is used to store data; a first write line which is disposed right under the memory cell and which extends in a first direction; a second write line which is disposed right on the memory cell and which extends in a second direction intersecting with the first direction; and a first yoke material with which only a lower surface of the first write line is coated.

According to a third aspect of the first invention of the present application, there is provided a magnetic random access memory comprising: a memory cell which is formed on a semiconductor substrate and in which a magneto resistive effect is used to store data; a first write line which is disposed right under the memory cell and which extends in a first direction; a second write line which is disposed right on the memory cell and which extends in a second direction intersecting with the first direction; and a first yoke material with which only a side surface of the first write line is coated.

According to a fourth aspect of the first invention of the present application, there is provided a magnetic random access memory comprising: first and second memory cells which are stacked on a semiconductor substrate and in which a magneto resistive effect is used to store data; a first write line which is disposed between the first and second memory cells and which extends in a first direction; and a first yoke material with which only a side surface of the first write line is coated.

According to a fifth aspect of the first invention of the present application, there is provided a magnetic random access memory comprising: a plurality of memory cells which are arranged in a direction parallel to the surface of a semiconductor substrate on the semiconductor substrate and in which a magneto resistive effect is used to store data; a first write line which is shared by the plurality of memory cells and which extends in a first direction; a plurality of write lines which are individually disposed in the plurality of memory cells and which extend in a second direction intersecting with the first direction; a first yoke material with which only a side surface of the first write line is coated; and a second yoke material with which only side surfaces of the plurality of second write lines are coated.

According to a sixth aspect of the first invention of the present application, there is provided a manufacturing method of a magnetic random access memory, comprising: a step of forming an MTJ element on a semiconductor substrate; a step of forming an insulating layer on the MTJ element; a step of forming a wiring trench in the insulating layer right on the MTJ element; a step of forming a first yoke material only on a side wall portion of the wiring trench; and a step of filling only the wiring trench with a conductive material to form a write wiring.

According to a seventh aspect of the first invention of the present application, there is provided a manufacturing method of a magnetic random access memory, comprising: a step of forming an MTJ element on a semiconductor substrate; a step of forming a conductive material on the MTJ element; a step of forming a yoke material on the conductive material; and a step of etching the yoke material and conductive material to form a write line.

According to an eighth aspect of the first invention of the present application, there is provided a manufacturing method of a magnetic random access memory, comprising: a step of forming a yoke material on a semiconductor substrate; a step of forming a conductive material on the yoke material; a step of etching the conductive material and yoke material to form a write line; and a step of forming an MTJ element right on the write line.

According to a ninth aspect of the first invention of the present application, there is provided a manufacturing method of a magnetic random access memory, comprising: a step of forming an insulating layer on a semiconductor substrate; a step of forming a wiring trench in the insulating layer; a step of forming a yoke material only in a side wall portion of the wiring trench; a step of filling the wiring trench with a conductive material to form a write line; and a step of forming the MTJ element right on the write line.

(2) Second Invention

According to a first aspect of a second invention of the present application, there is provided a magnetic random access memory comprising: a memory cell which is formed on a semiconductor substrate and in which a magneto resistive effect is used to store data; a first write line which is disposed right under the memory cell and which extends in a first direction; a second write line which is disposed right on the memory cell and which extends in a second direction intersecting with the first direction; and a first yoke material with which a side surface of the first write line is coated and which projects upwards from an upper surface of the first write line.

According to a second aspect of the second invention of the present application, there is provided a magnetic random access memory comprising: a memory cell which is formed on a semiconductor substrate and in which a magneto resistive effect is used to store data; a first write line which is disposed right under the memory cell and which extends in a first direction; a second write line which is disposed right on the memory cell and which extends in a second direction intersecting with the first direction; and a first yoke material with which a side surface of the second write line is coated and which projects downwards from a lower surface of the second write line.

According to a third aspect of the second invention of the present application, there is provided a magnetic random access memory comprising: first and second memory cells which are stacked on a semiconductor substrate and in which a magneto resistive effect is used to store data; a first write line which is disposed between the first and second memory cells and which extends in a first direction; and a first yoke material with which only a side surface of the first write line is coated and which projects upwards from an upper surface of the first write line and which projects downwards from a lower surface of the first write line.

According to a fourth aspect of the second invention of the present application, there is provided a magnetic random access memory comprising: a plurality of memory cells which are arranged in a direction parallel to the surface of a semiconductor substrate on the semiconductor substrate and in which a magneto resistive effect is used to store data; a first write line which is shared by the plurality of memory cells and which extends in a first direction; a plurality of second write lines which are individually disposed in the plurality of memory cells and which extend in a second direction intersecting with the first direction; first yoke material with which only a side surface of the first write line is coated and which projects toward the plurality of memory cells from the surface of the first write line on a side of the plurality of memory cells; and a second yoke material with which only side surfaces of the plurality of second write lines are coated and which protrudes toward the plurality of memory cells from the surface of the second write line on the side of the plurality of memory cells.

According to a fifth aspect of the second invention of the present application, there is provided a manufacturing method of a magnetic random access memory, comprising: a step of forming an insulating layer on a semiconductor substrate; a step of forming a wiring trench in the insulating layer; a step of forming a yoke material in bottom and side wall portions of the wiring trench and filling the wiring trench with a conductive material existing below the surface of the insulating layer to form a write line; and a step of forming an MTJ element right on the write line.

According to a sixth aspect of the second invention of the present application, there is provided a manufacturing method of a magnetic random access memory, comprising: a step of forming an insulating layer on a semiconductor substrate; a step of forming a wiring trench in the insulating layer; a step of forming a yoke material only in a side wall portion of the wiring trench; a step of filling the wiring trench with a conductive material whose surface exists in a lower part from the surface of the insulating layer to form a write line; and a step of forming an MTJ element right on the write line.

According to a seventh aspect of the second invention of the present application, there is provided a manufacturing method of a magnetic random access memory, comprising: a step of forming an MTJ element on a semiconductor substrate; a step of forming an insulating layer with which a side surface of the MTJ element is coated and whose upper surface agrees with the upper surface of the MTJ element; a step of forming a conductive material on the MTJ element; a step of etching the conductive material to form a write line and etching a part of the upper surface of the insulating layer to form a side wall portion in the insulating layer; and a step of forming a first yoke material in a side surface of the write line and the side wall portion of the insulating layer.

(3) Third Invention

According to a first aspect of a third invention of the present application, there is provided a magnetic random access memory comprising: a memory cell which is formed on a semiconductor substrate and in which a magneto resistive effect is used to store data; a first write line which is disposed right under the memory cell and which extends in a first direction; a second write line which is disposed right on the memory cell and which extends in a second direction intersecting with the first direction; and a first yoke material with which a side surface of the first write line is coated and which is depressed in a lower part from the upper surface of the first write line.

According to a second aspect of the third invention of the present application, there is provided a magnetic random access memory comprising: a memory cell which is formed on a semiconductor substrate and in which a magneto resistive effect is used to store data; a first write line which is disposed right under the memory cell and which extends in a first direction; a second write line which is disposed right on the memory cell and which extends in a second direction intersecting with the first direction; and a first yoke material with which a side surface of the second write line is coated and which is depressed in an upper part from a lower surface of the second write line.

According to a third aspect of the third invention of the present application, there is provided a magnetic random access memory comprising: first and second memory cells which are stacked on a semiconductor substrate and in which a magneto resistive effect is used to store data; a first write line which is disposed between the first and second memory cells and which extends in a first direction; and a first yoke material with which only a side surface of the first write line is coated and which is depressed in a lower part from an upper surface of the first write line and which is depressed in an upper part from a lower surface of the first write line.

According to a fourth aspect of the third invention of the present application, there is provided a magnetic random access memory comprising: a plurality of memory cells which are arranged in a direction parallel to the surface of a semiconductor substrate on the semiconductor substrate and in which a magneto resistive effect is used to store data; a first write line which is shared by the plurality of memory cells and which extends in a first direction; a plurality of second write lines which are individually disposed in the plurality of memory cells and which extend in a second direction intersecting with the first direction; a first yoke material with which only a side surface of the first write line is coated and which is depressed on a side opposite to the plurality of memory cells from the surface of the first write line on the side of the plurality of memory cells; and a second yoke material with which only side surfaces of the plurality of second write lines are coated and which is depressed on a side opposite to the plurality of memory cells from the surface of the second write line on the side of the plurality of memory cells.

According to a fifth aspect of the third invention of the present application, there is provided a manufacturing method of a magnetic random access memory, comprising:

a step of forming an insulating layer on a semiconductor substrate; a step of forming a wiring trench in the insulating layer; a step of forming a yoke material in bottom and side wall portions of the wiring trench; a step of filling the wiring trench with a conductive material to form a write line; a step of etching a part of the yoke material to depress the yoke material in a lower part from the upper surface of the write line; and a step of forming an MTJ element right on the write line.

According to a sixth aspect of the third invention of the present application, there is provided a manufacturing method of a magnetic random access memory, comprising: a step of forming an insulating layer on a semiconductor substrate; a step of forming a wiring trench in the insulating layer; a step of forming a yoke material only in a side wall portion of the wiring trench; a step of filling the wiring trench with a conductive material to form a write line; a step of etching a part of the yoke material to depress the yoke material in a lower part from the upper surface of the write line; and a step of forming an MTJ element right on the write line.

According to a seventh aspect of the third invention of the present application, there is provided a manufacturing method of a magnetic random access memory, comprising: a step of forming an MTJ element on a semiconductor substrate; a step of forming a first insulating layer on the MTJ element; a step of forming a wiring trench in the first insulating layer on the MTJ element; a step of forming a second insulating layer only in a side wall portion of the wiring trench; a step of filling the wiring trench with a conductive material to form a write line; a step of etching a part of the second insulating layer to leave the second insulating layer only in the vicinity of a lower surface of the write line; and a step of forming a yoke material in the side wall portion of the wiring trench from which the second insulating layer has been removed.

According to an eighth aspect of the third invention of the present application, there is provided a manufacturing method of a magnetic random access memory, comprising: a step of forming an MTJ element on a semiconductor substrate; a step of forming an insulating layer on the MTJ element; a step of forming a wiring trench in the insulating layer on the MTJ element; a step of filling the wiring trench with a conductive material to form a write line; a step of etching a part of the insulating layer to leave the insulating layer only in the vicinity of a lower surface of the write line; and a step of forming a yoke material in the side surface of the write line exposed by removing the insulating layer.

BRIEF DESCRIPTION OF THE SEVERAL VIEWS OF THE DRAWING

FIG. 22 is a sectional view showing the magnetic random access memory of Example 3 of the first invention;

FIG. 23 is a sectional view showing the magnetic random access memory of Example 3 of the first invention;

FIG. 30 is a sectional view showing the magnetic random access memory of Example 5 of the first invention;

FIG. 31 is a sectional view showing the magnetic random access memory of Example 5 of the first invention;

FIG. 40 is a sectional view showing the magnetic random access memory of Example 9 of the first invention;

FIG. 41 is a sectional view showing the magnetic random access memory of Example 9 of the first invention;

FIG. 43 is a sectional view showing the magnetic random access memory of Example 9 of the first invention;

FIG. 45 is a sectional view showing the magnetic random access memory of Example 10 of the first invention;

FIG. 46 is a sectional view showing the magnetic random access memory of Example 10 of the first invention;

FIG. 47 is a sectional view showing the magnetic random access memory of Example 10 of the first invention;

FIG. 52 is a circuit diagram showing a structure of a cell array according to an example of the present invention;

FIG. 72 is a sectional view showing the modification example of Example 1 of the second invention;

FIG. 73 is a sectional view showing the modification example of Example 1 of the second invention;

FIG. 102 is a sectional view showing the modification example of Example 4 of the second invention;

FIG. 103 is a sectional view showing the modification example of Example 4 of the second invention;

FIG. 120 is a sectional view showing the magnetic random access memory of Example 6 of the second invention;

FIG. 121 is a sectional view showing the magnetic random access memory of Example 6 of the second invention;

FIG. 122 is a sectional view showing the magnetic random access memory of Example 7 of the second invention;

FIG. 123 is a sectional view showing the magnetic random access memory of Example 7 of the second invention;

FIG. 124 is a sectional view showing the magnetic random access memory of Example 8 of the second invention;

FIG. 125 is a sectional view showing the magnetic random access memory of Example 8 of the second invention;

FIG. 126 is a sectional view showing the magnetic random access memory of Example 9 of the second invention;

FIG. 127 is a sectional view showing the magnetic random access memory of Example 9 of the second invention;

FIG. 128 is a sectional view showing the magnetic random access memory of Example 9 of the second invention;

FIG. 129 is a sectional view showing the magnetic random access memory of Example 9 of the second invention;

FIG. 130 is a sectional view showing the magnetic random access memory of Example 10 of the second invention;

FIG. 131 is a sectional view showing the magnetic random access memory of Example 10 of the second invention;

Figure 134:
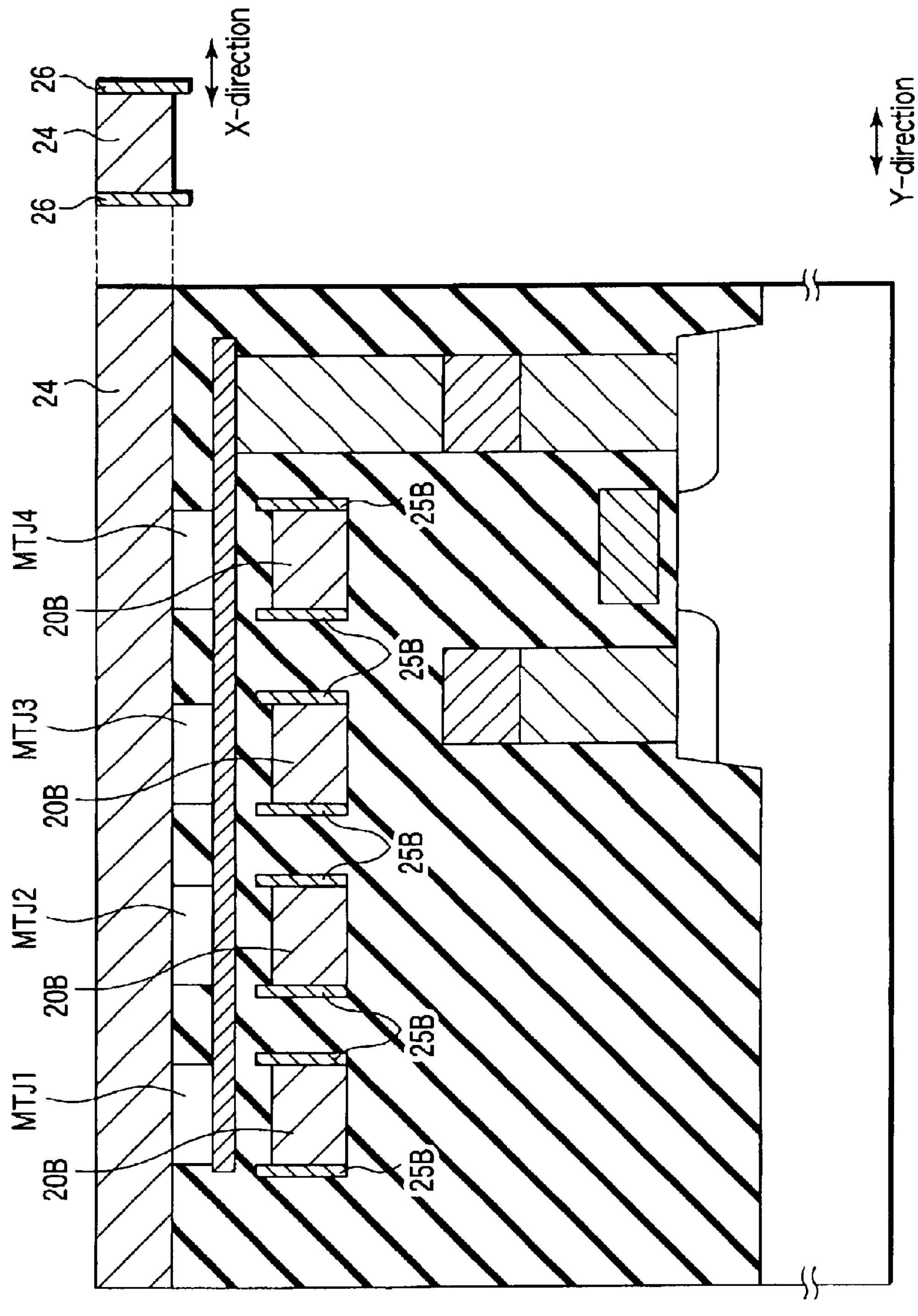
Figure 135:
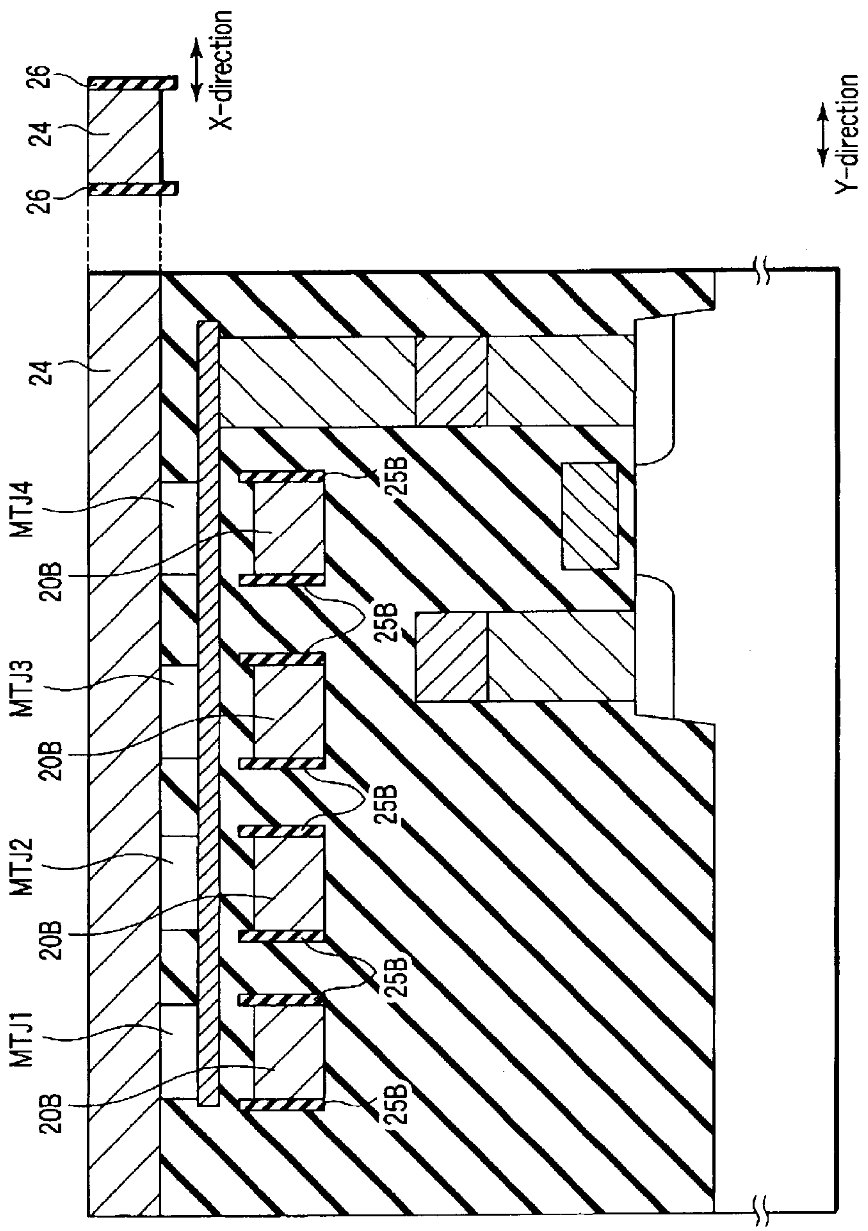
Figure 136:
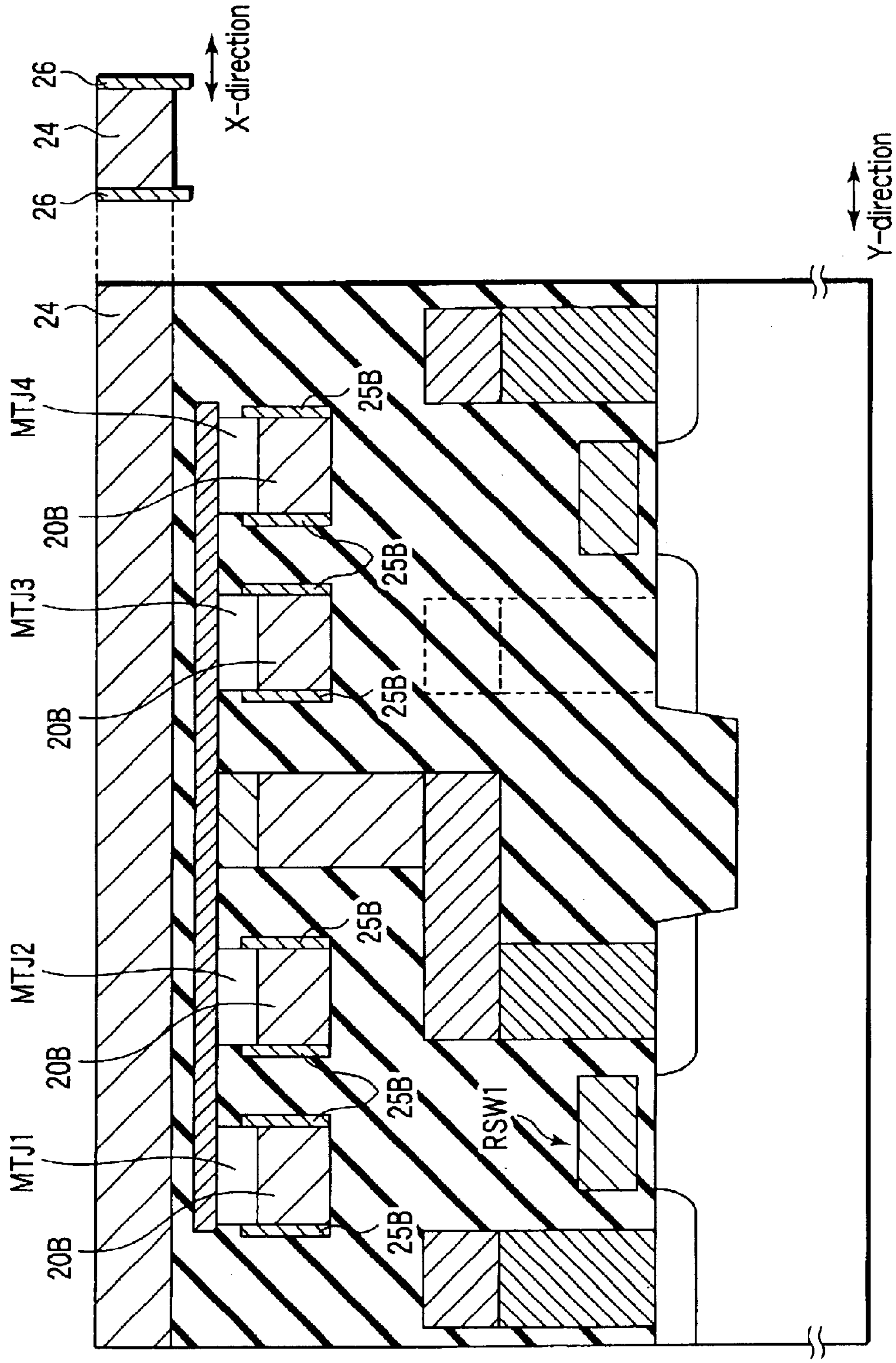
Figure 137:
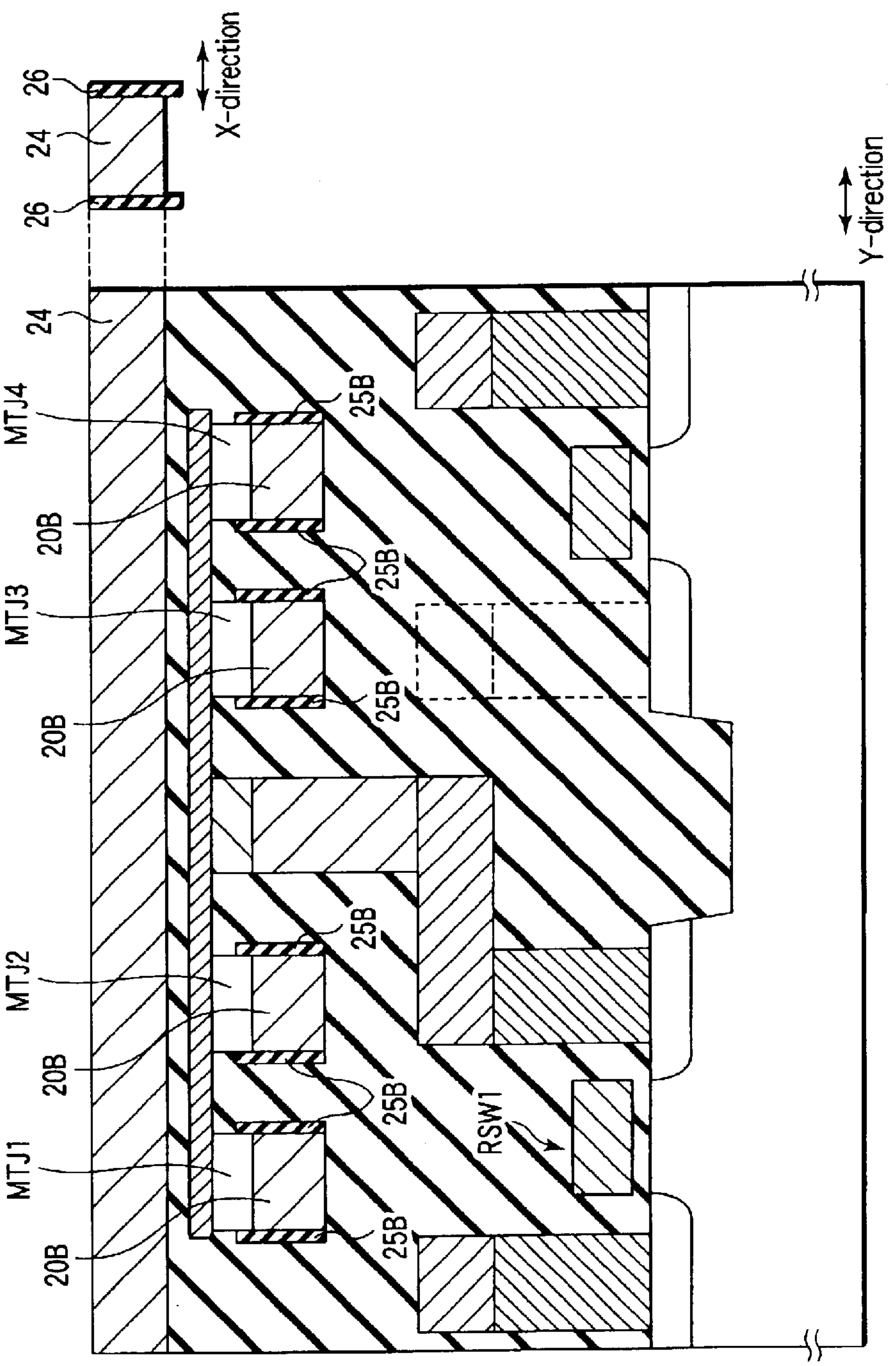
Figure 139:
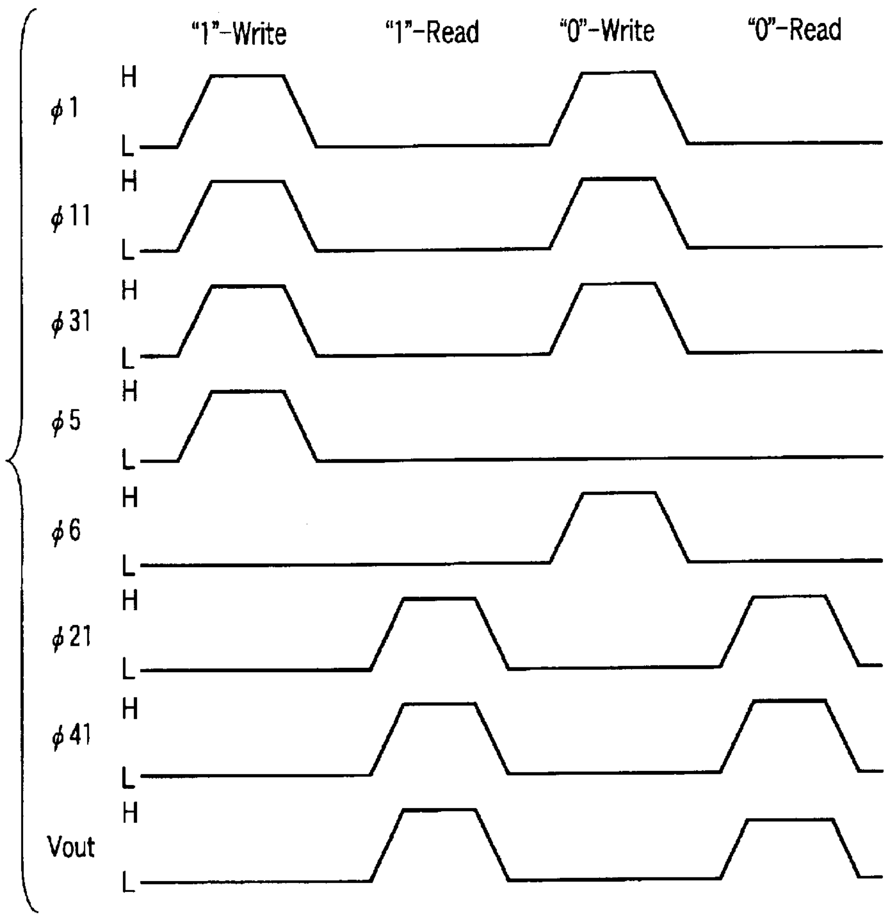
Figure 140:
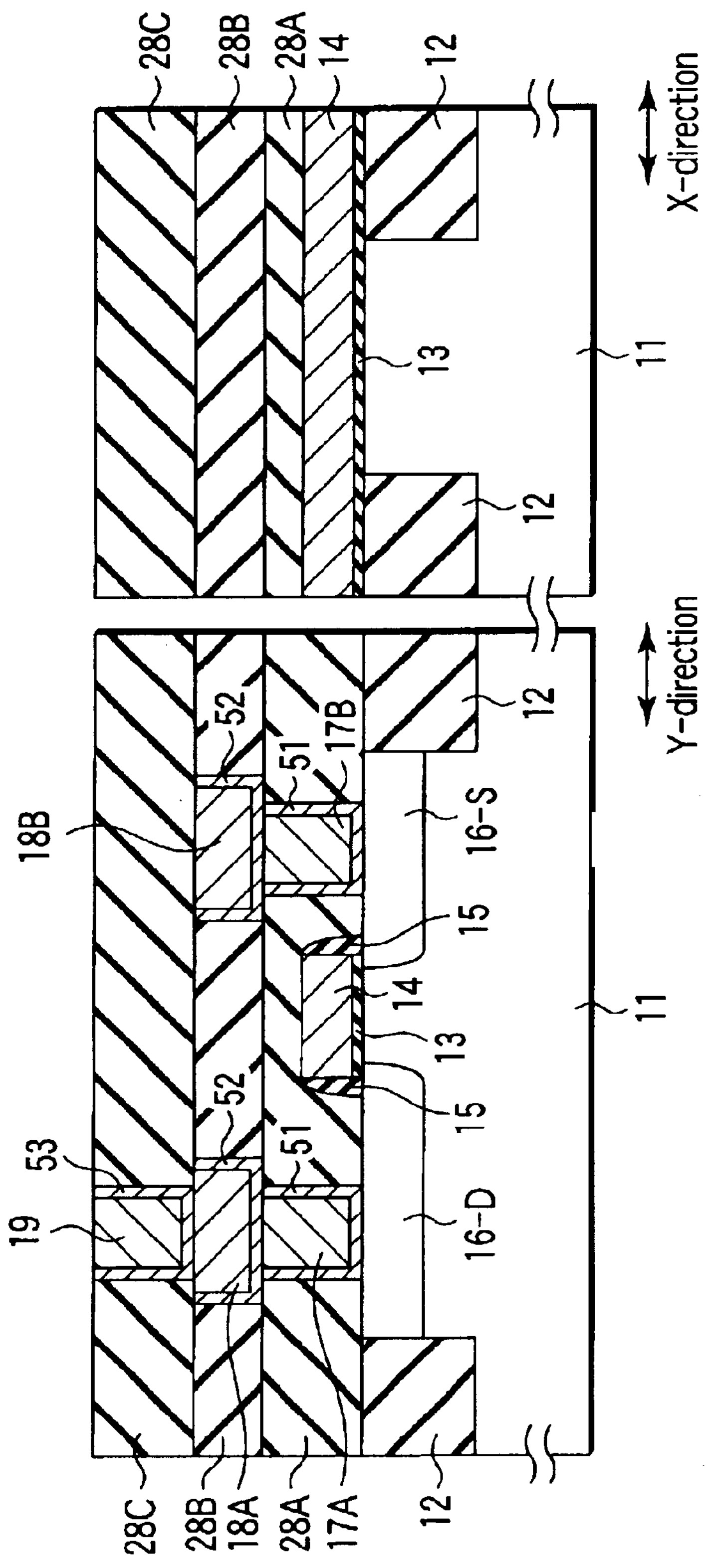
Figure 141:
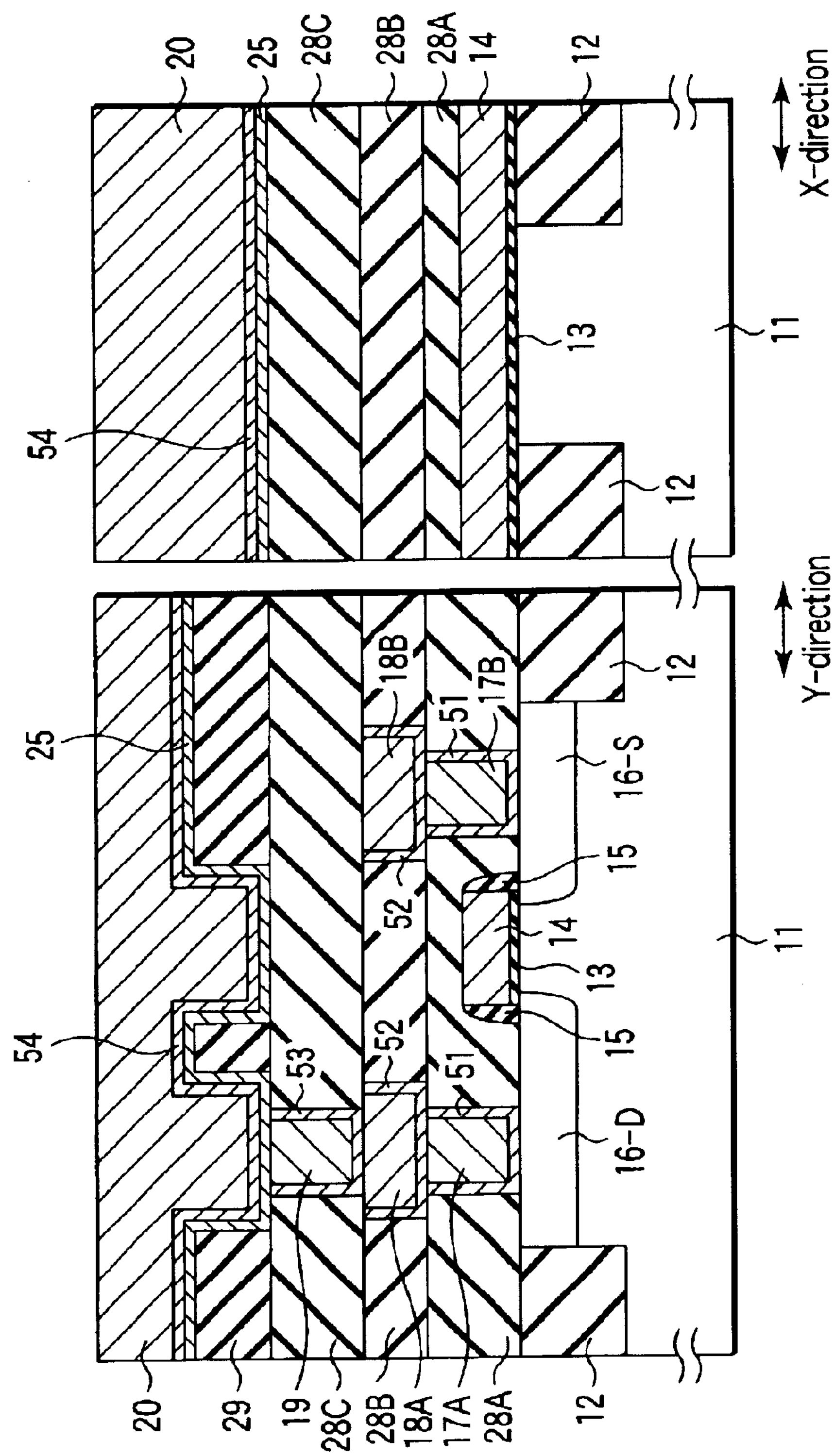
Figure 142:
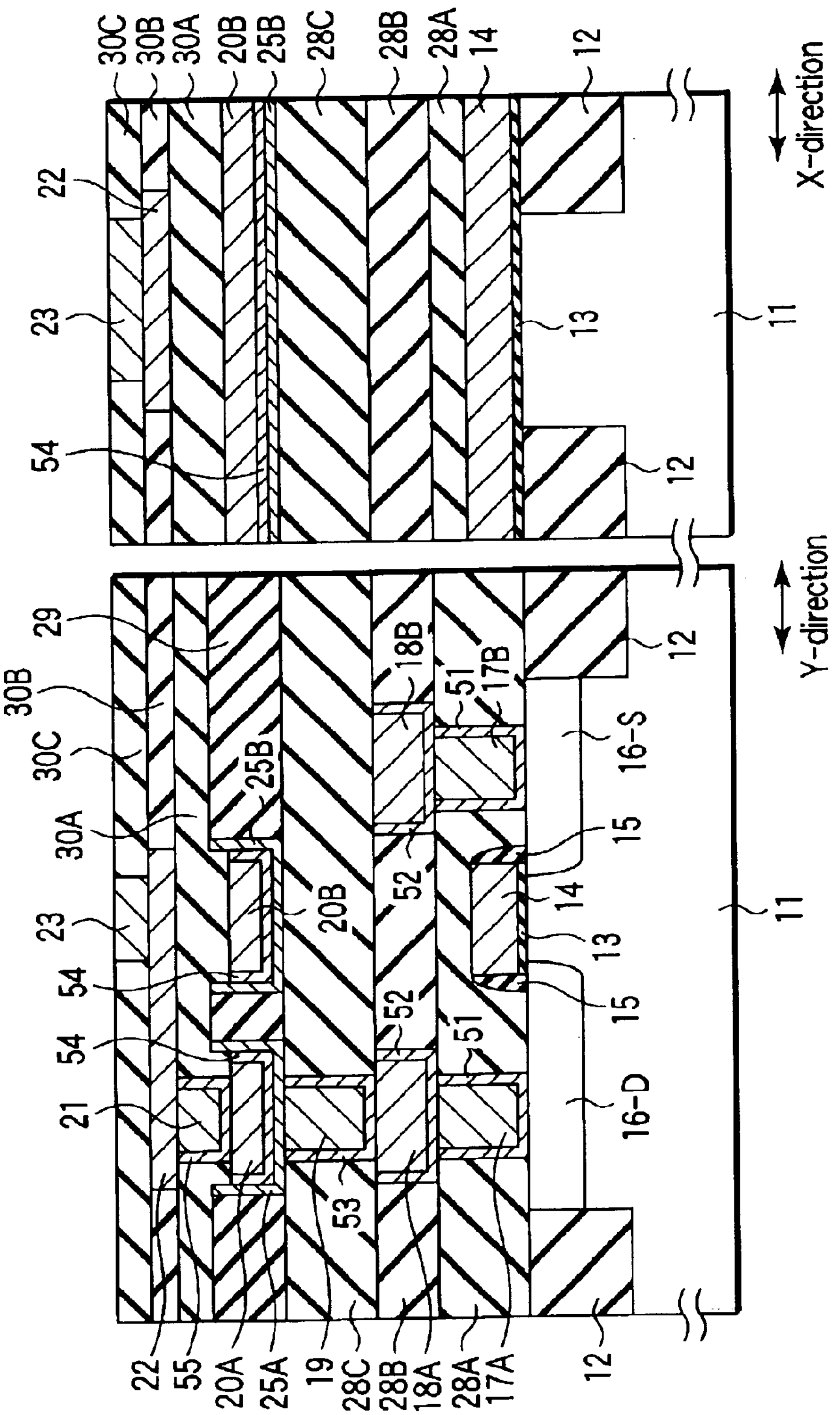
Figure 144:
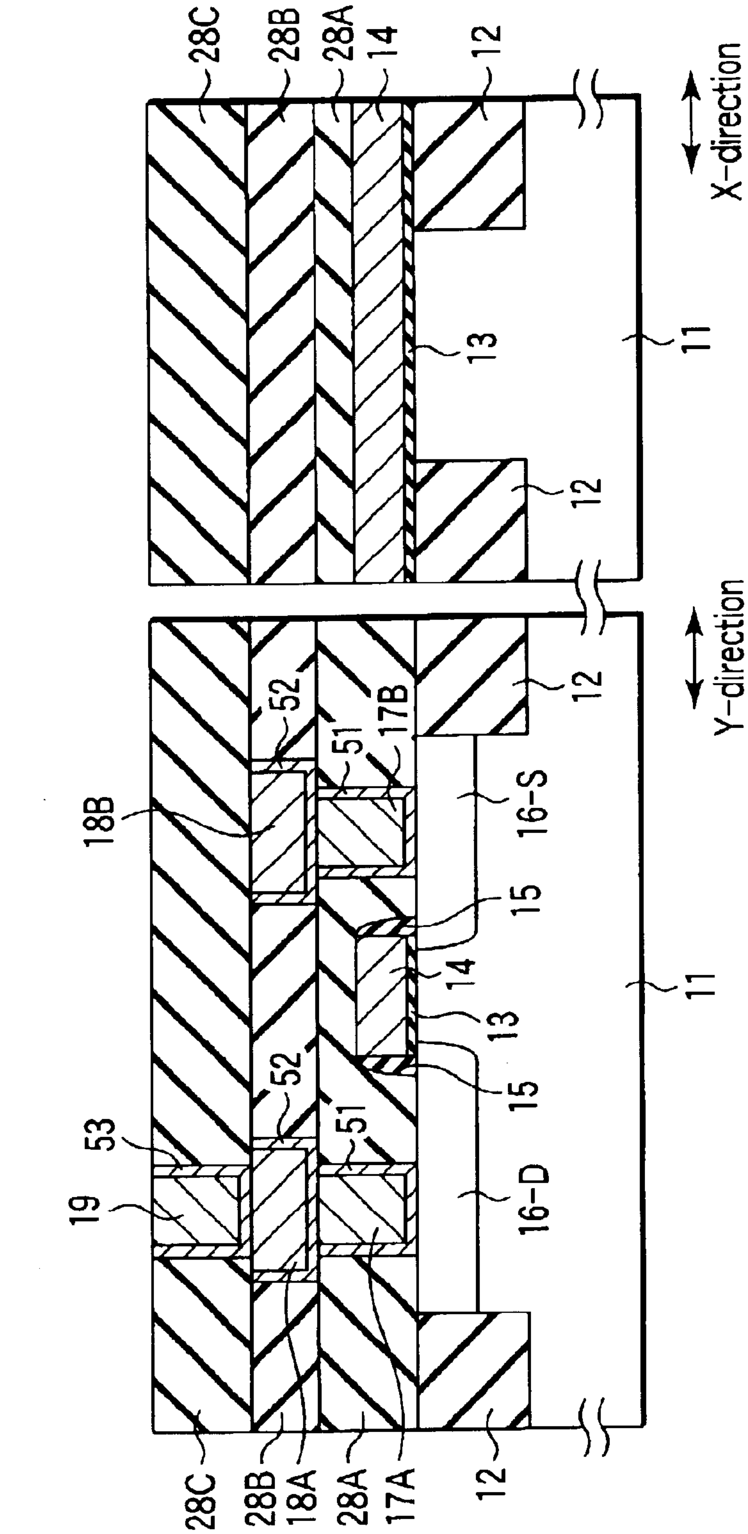
Figure 145:
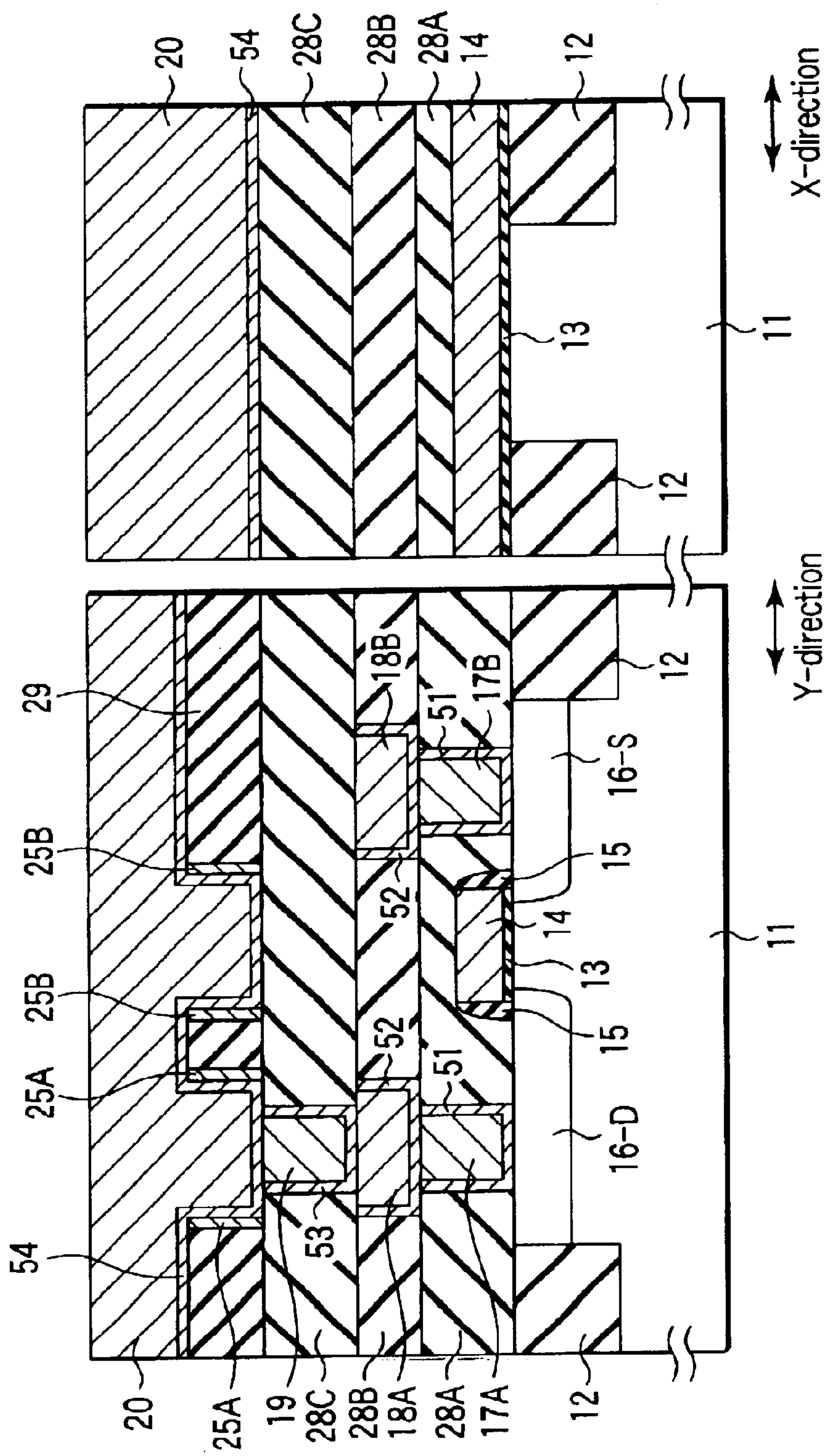
Figure 146:
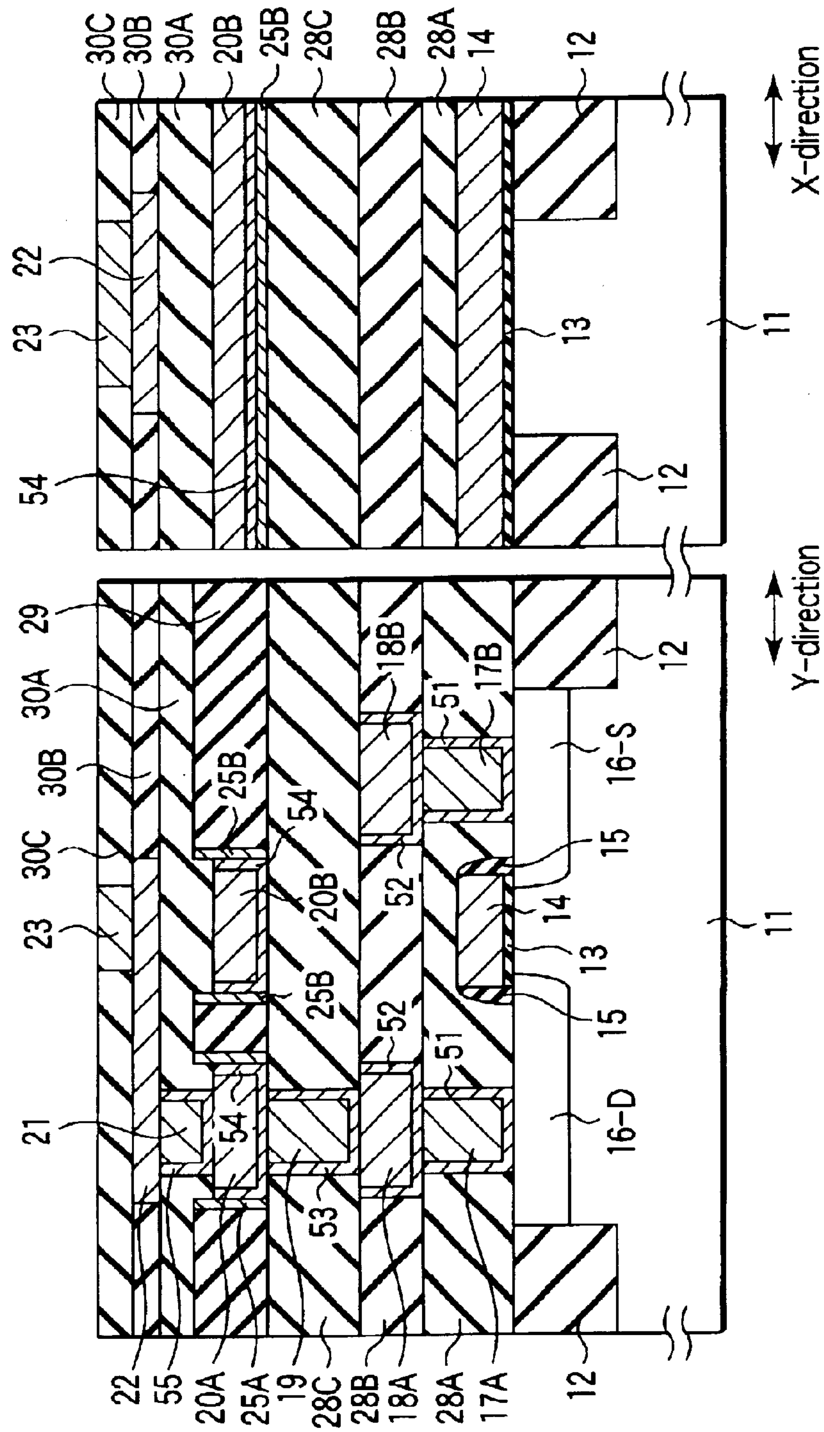
Figure 147:
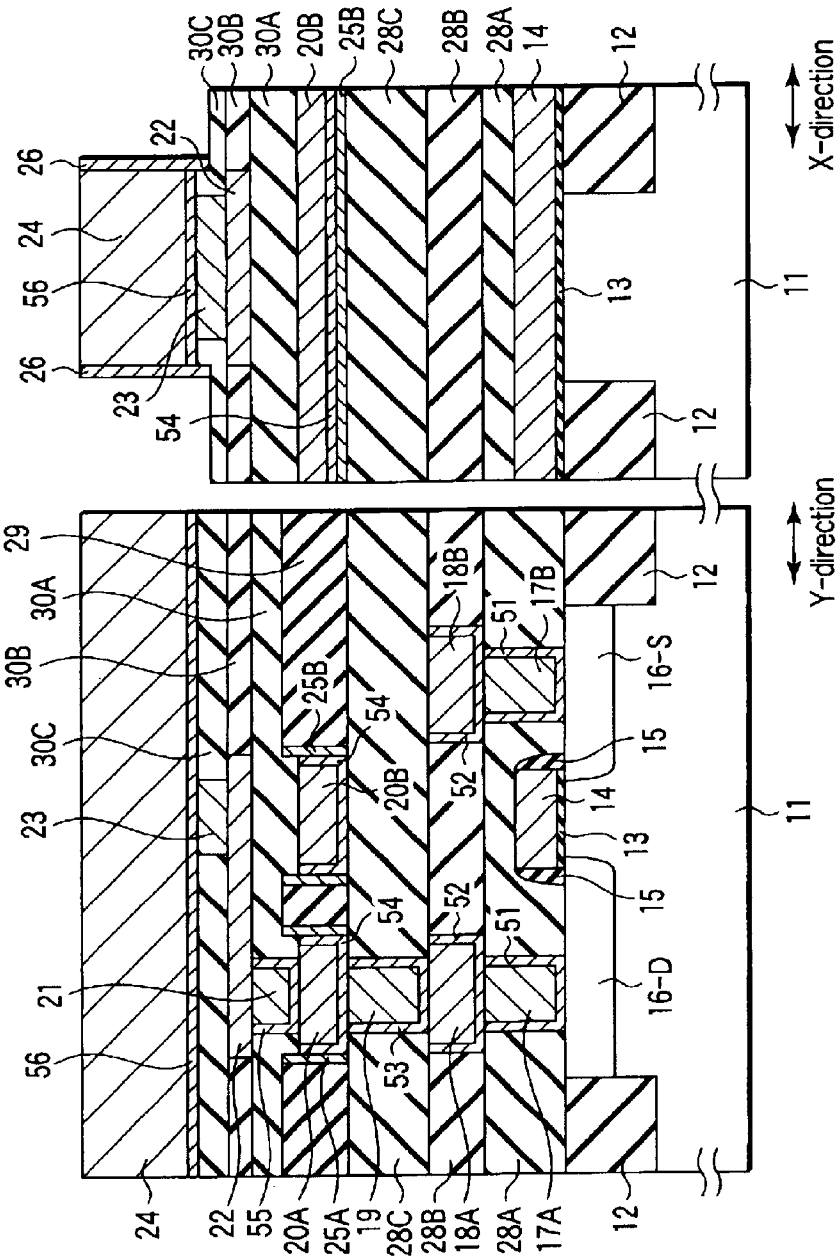
Figure 148:
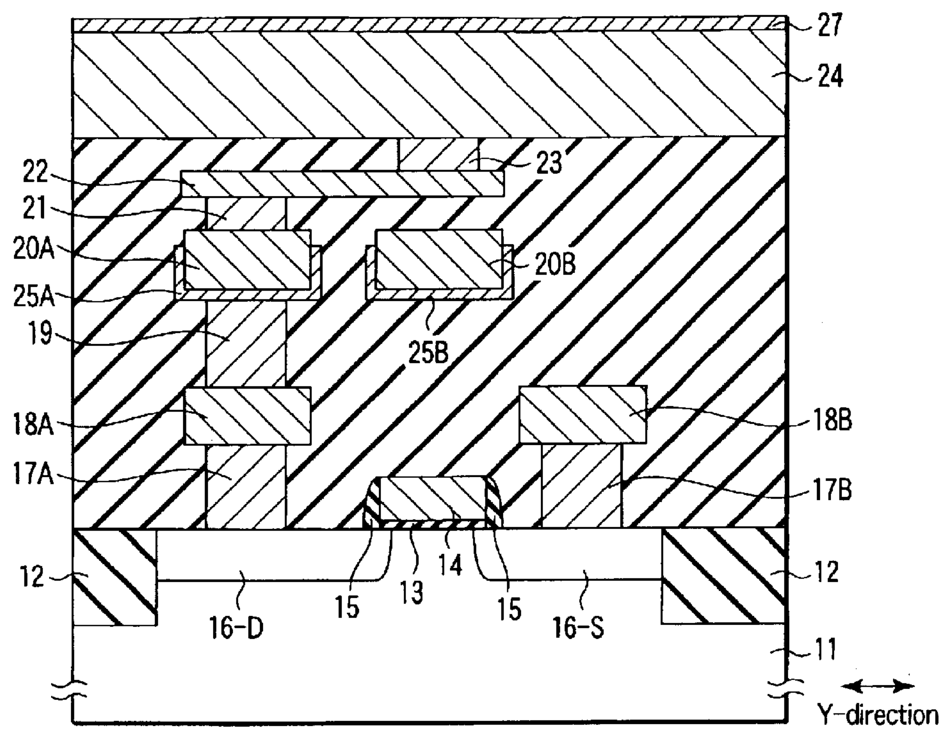
Figure 149:
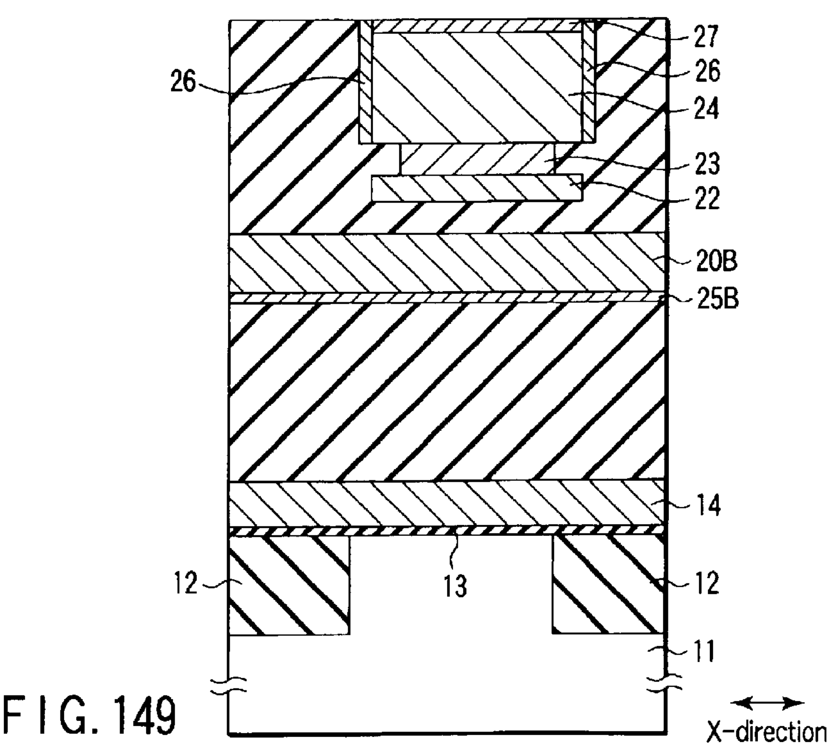
Figure 150:
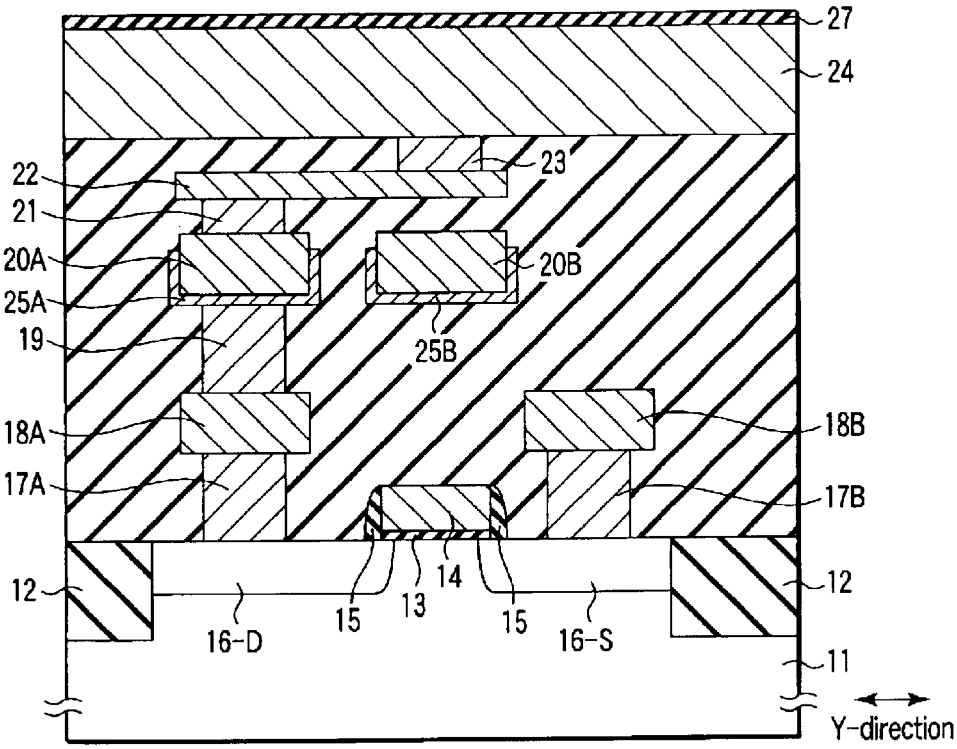
Figure 151:
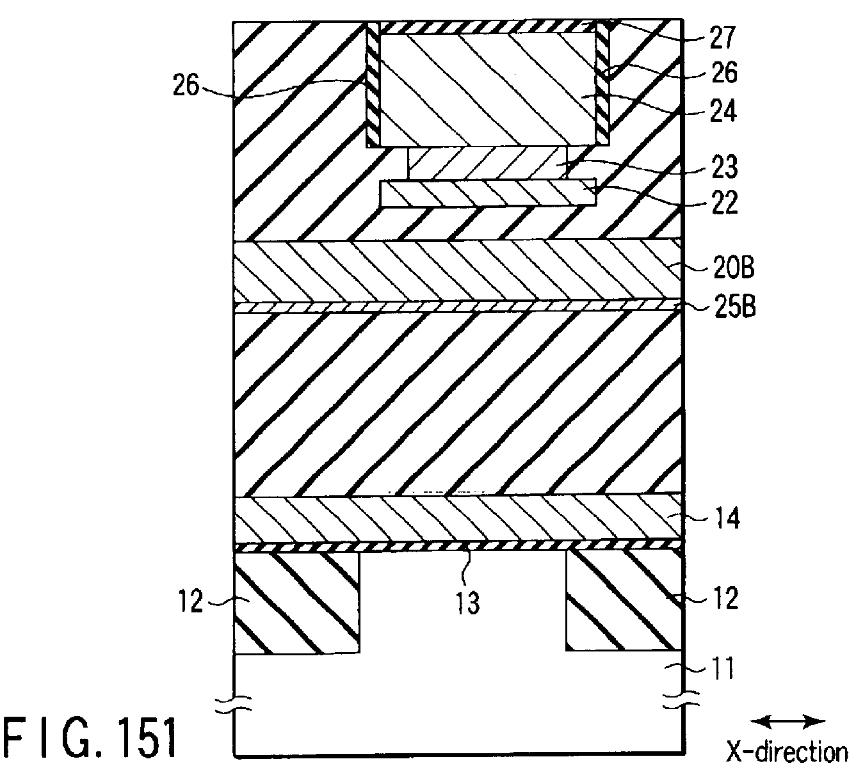
Figure 154:
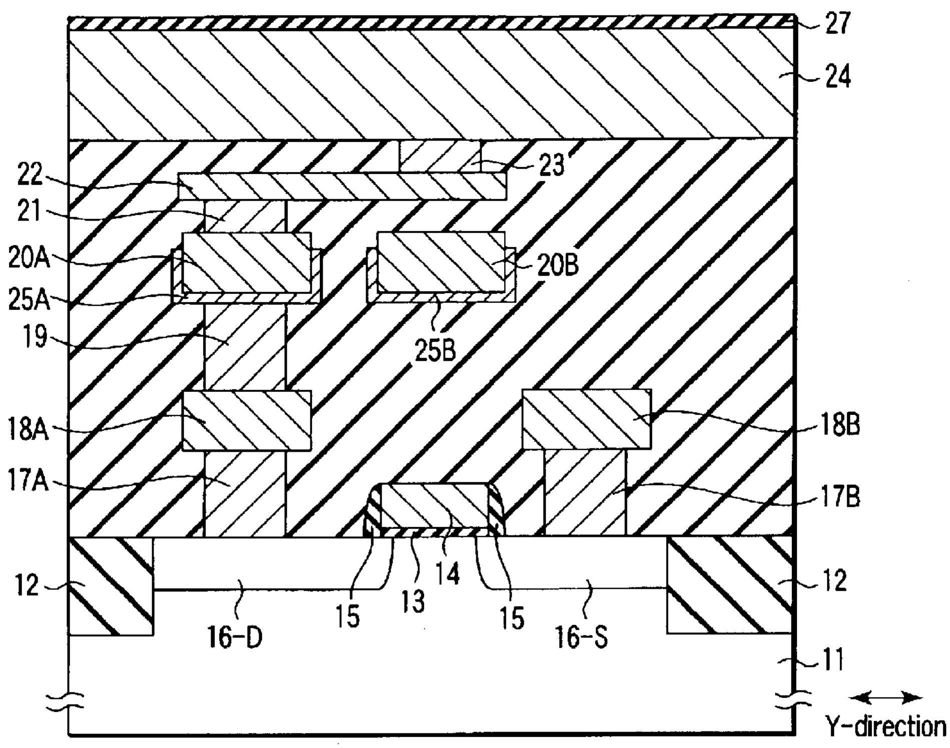
Figure 155:
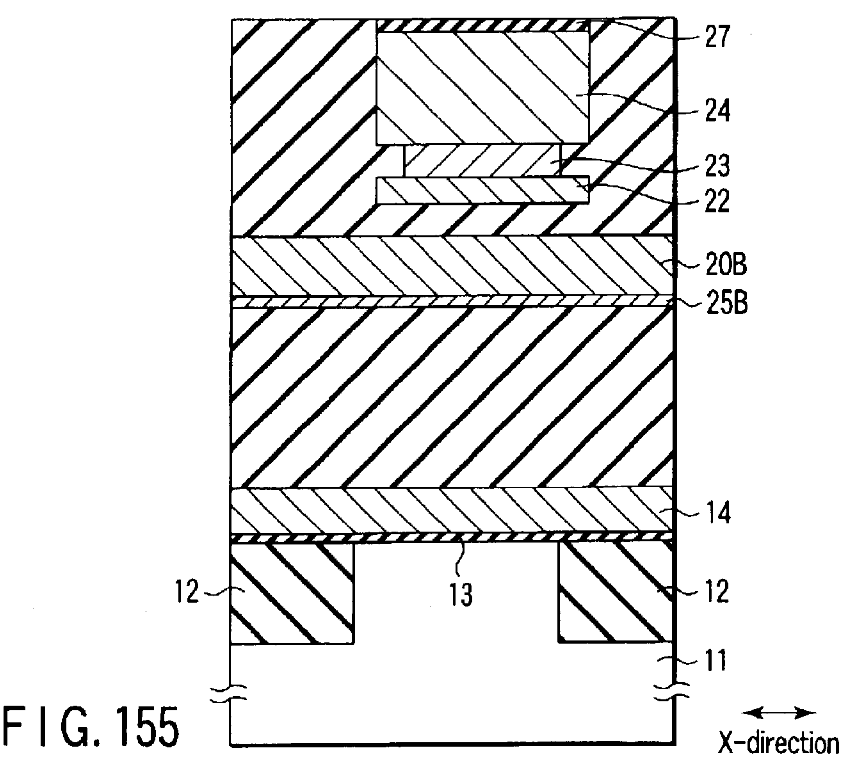
Figure 156:
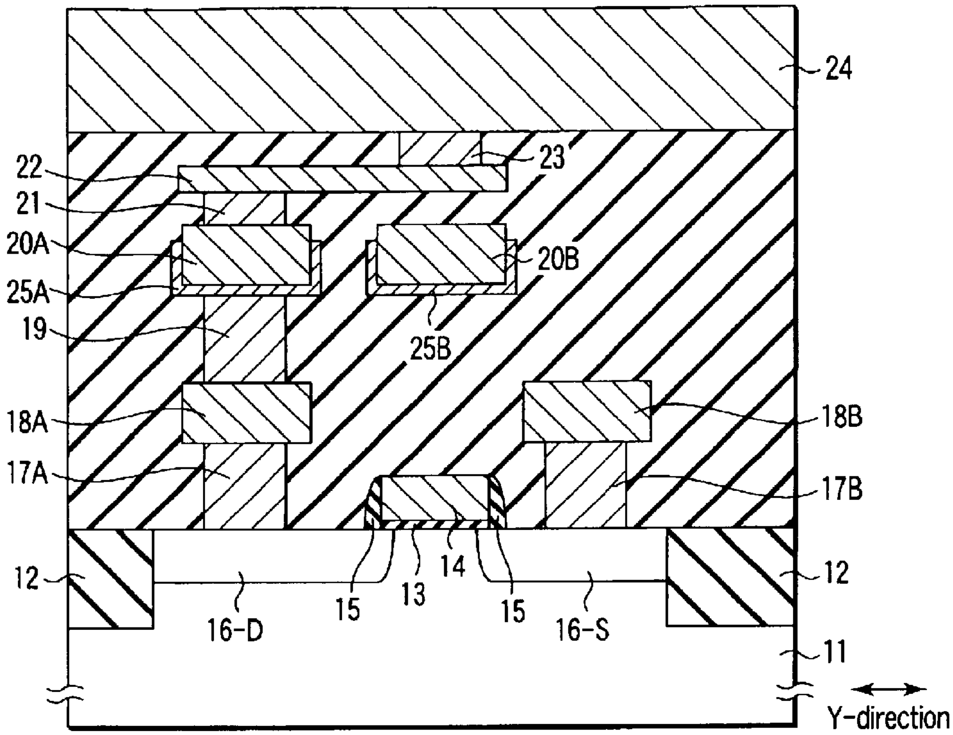
Figure 157:
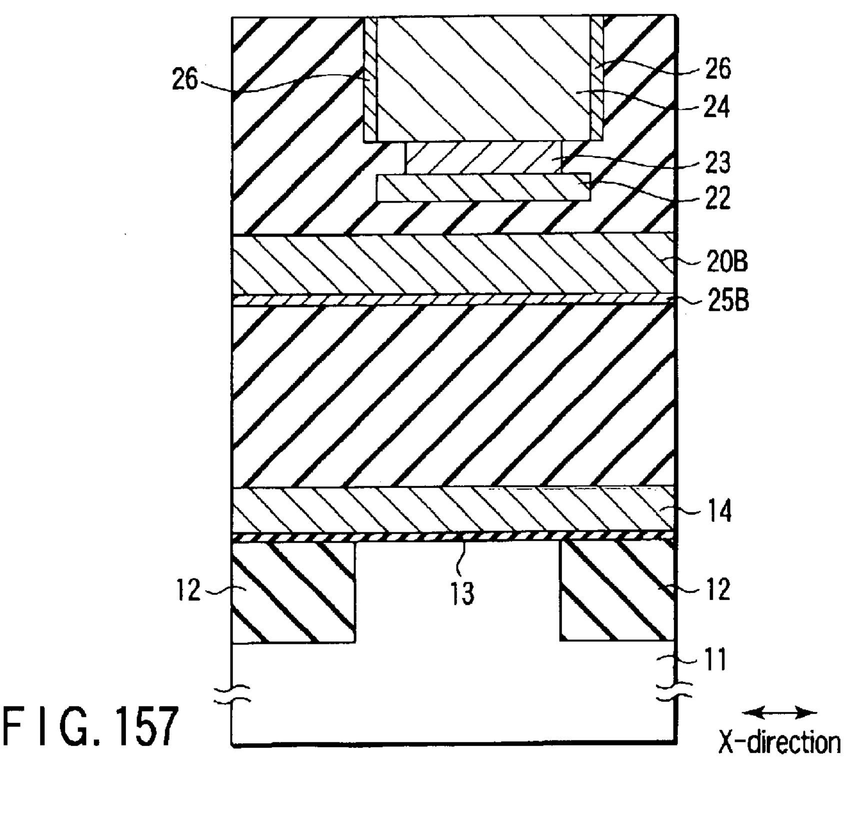
Figure 158:
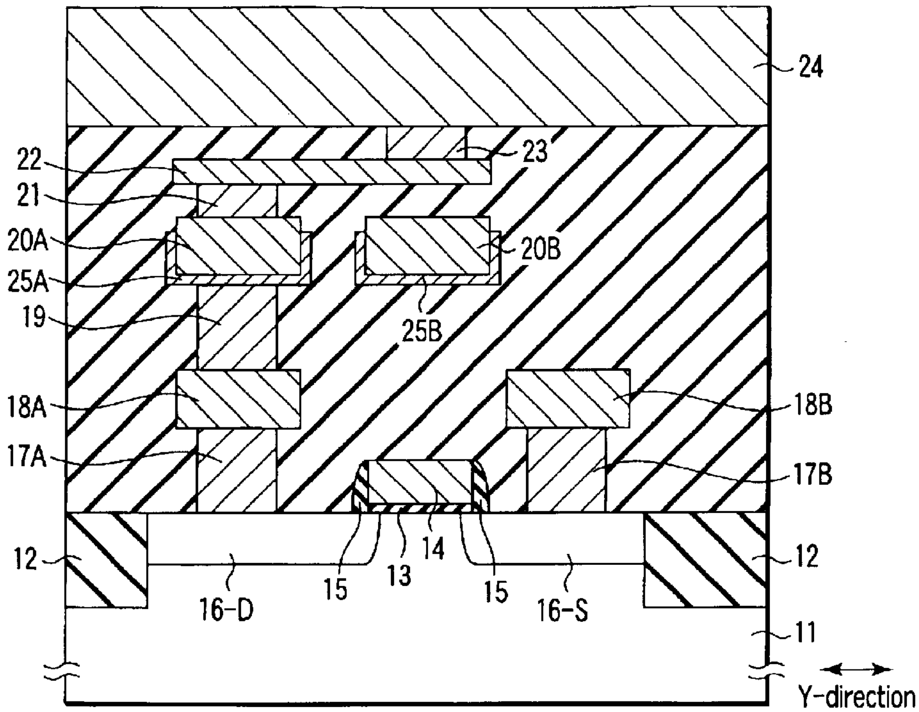
Figure 159:
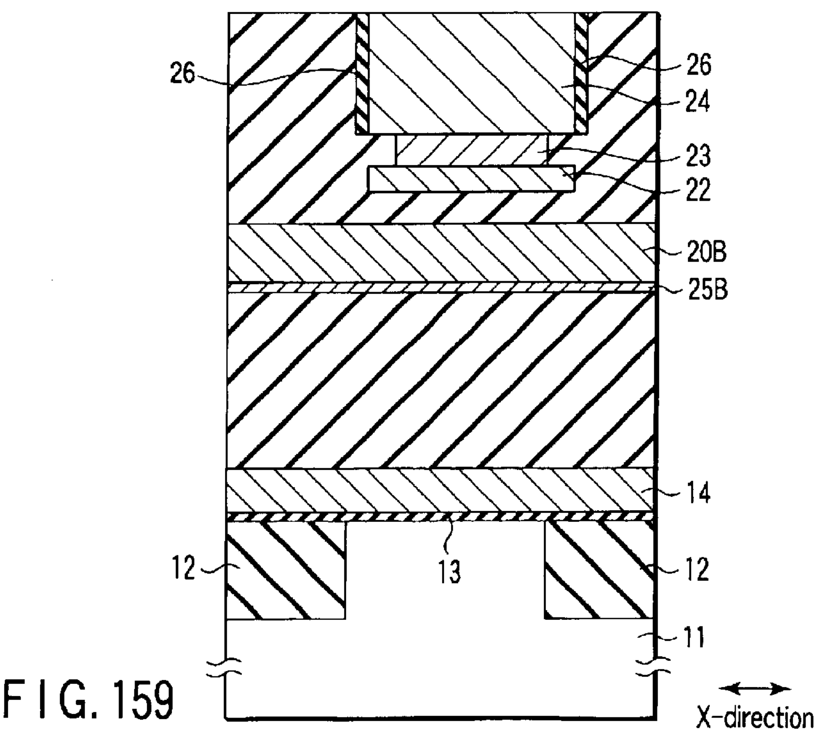
Figure 160:
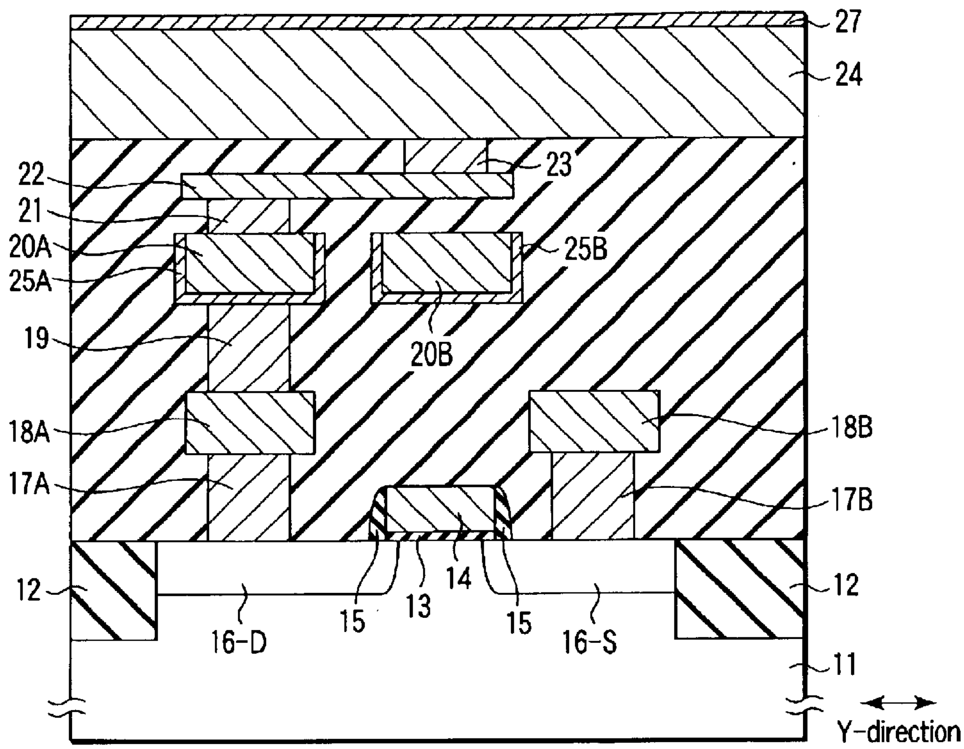
Figure 161:
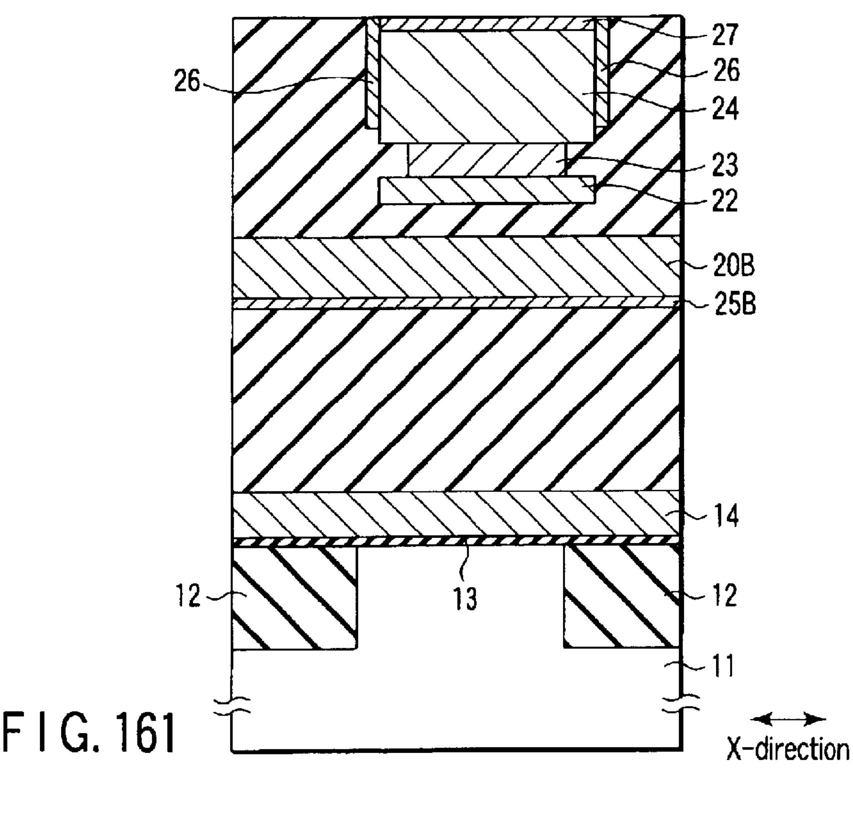
Figure 162:
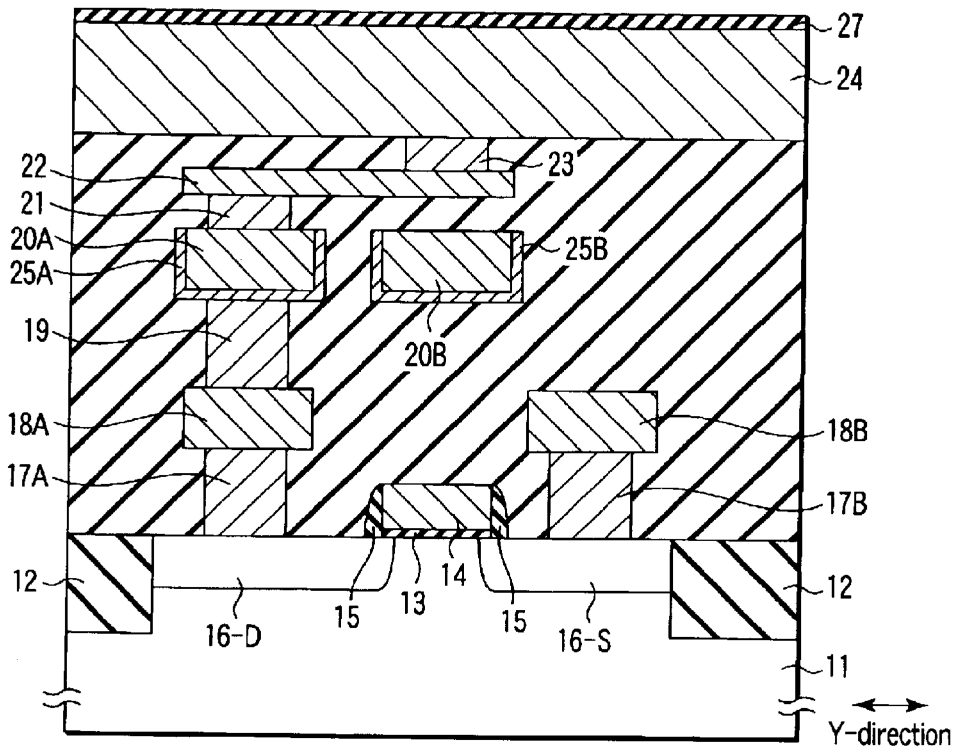
Figure 163:
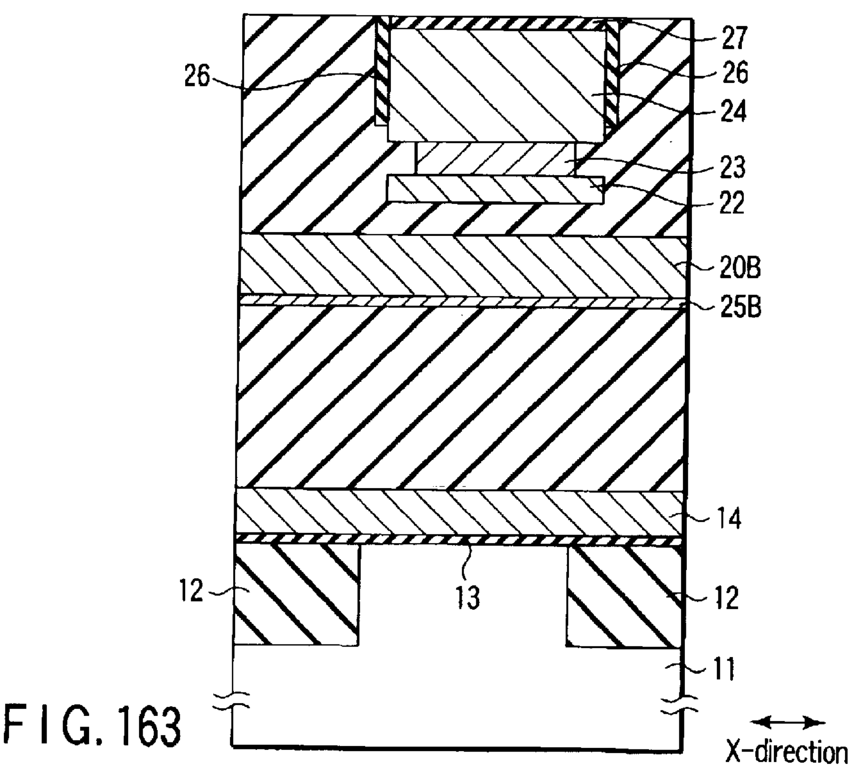
Figure 164:
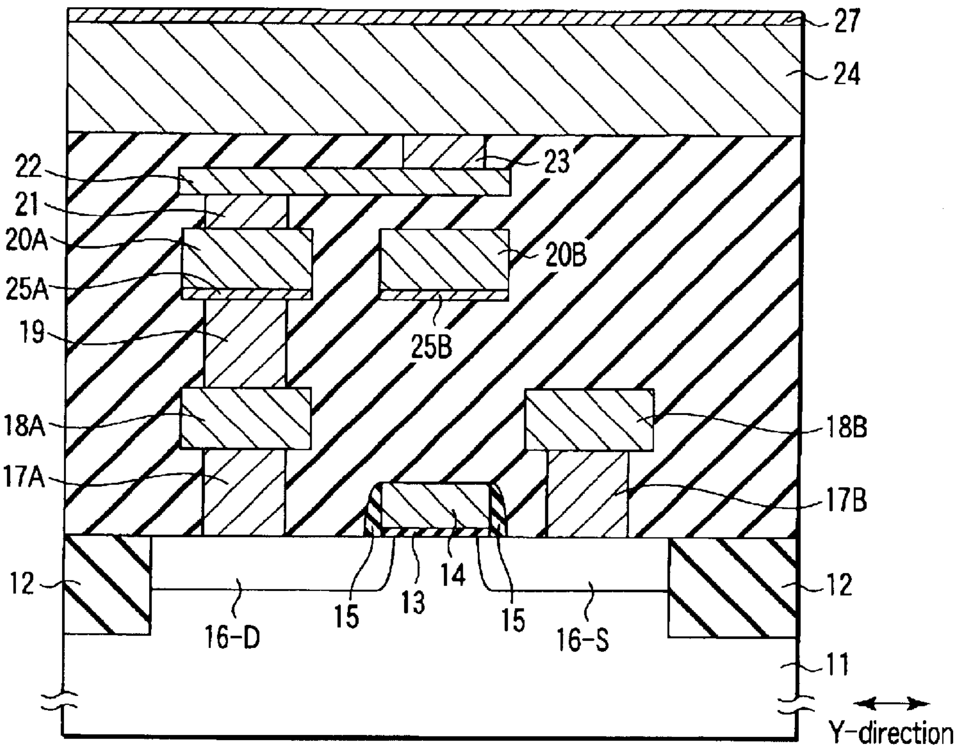
Figure 165:
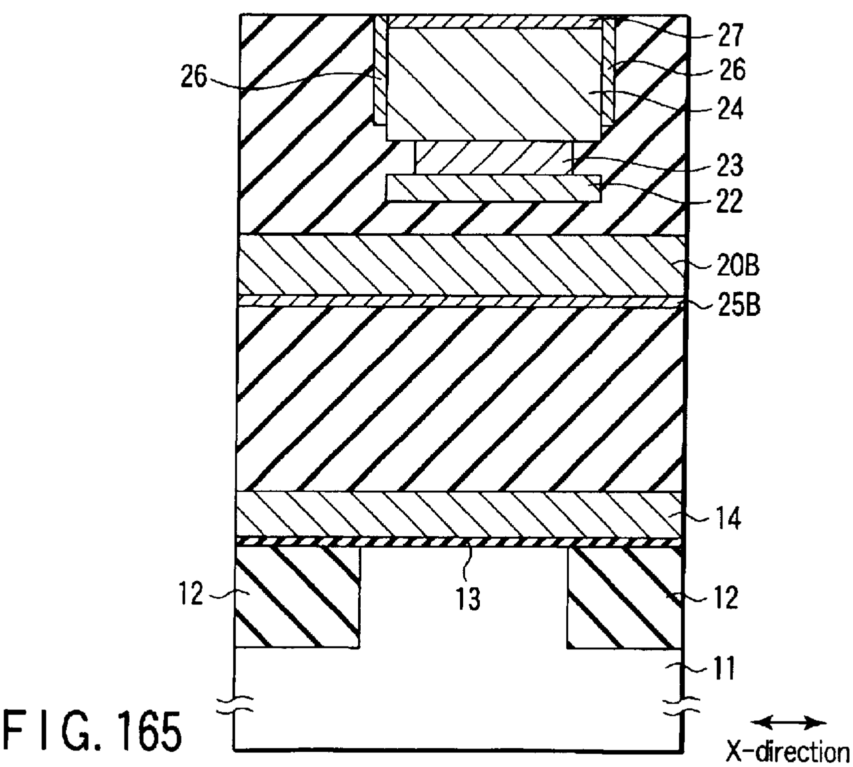
Figure 166:
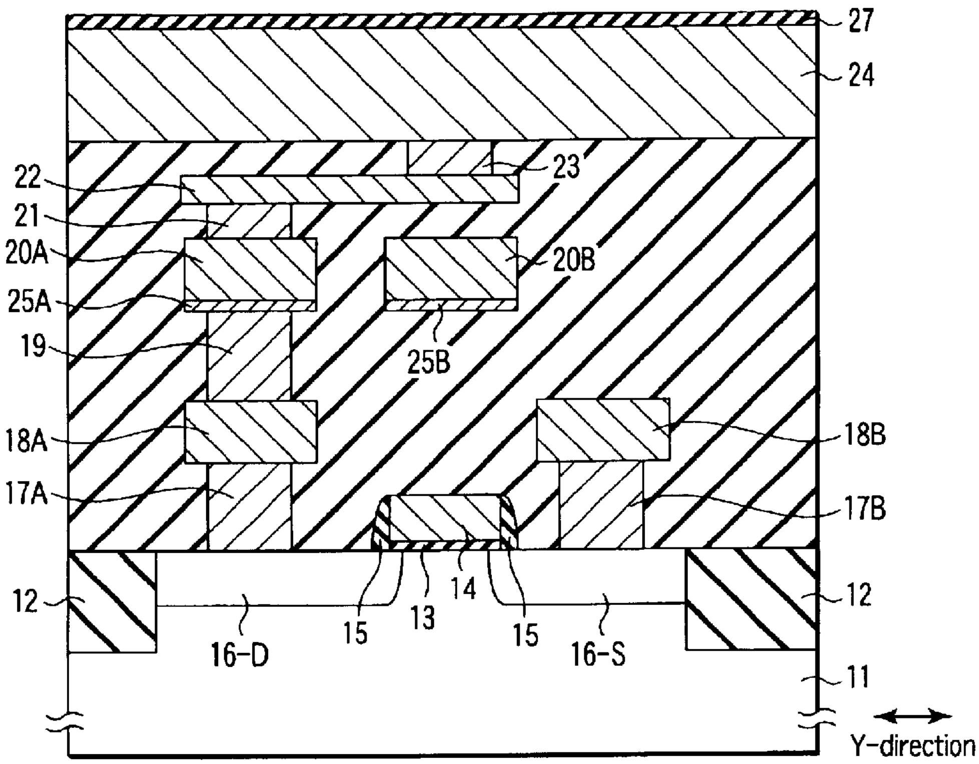
Figure 167:
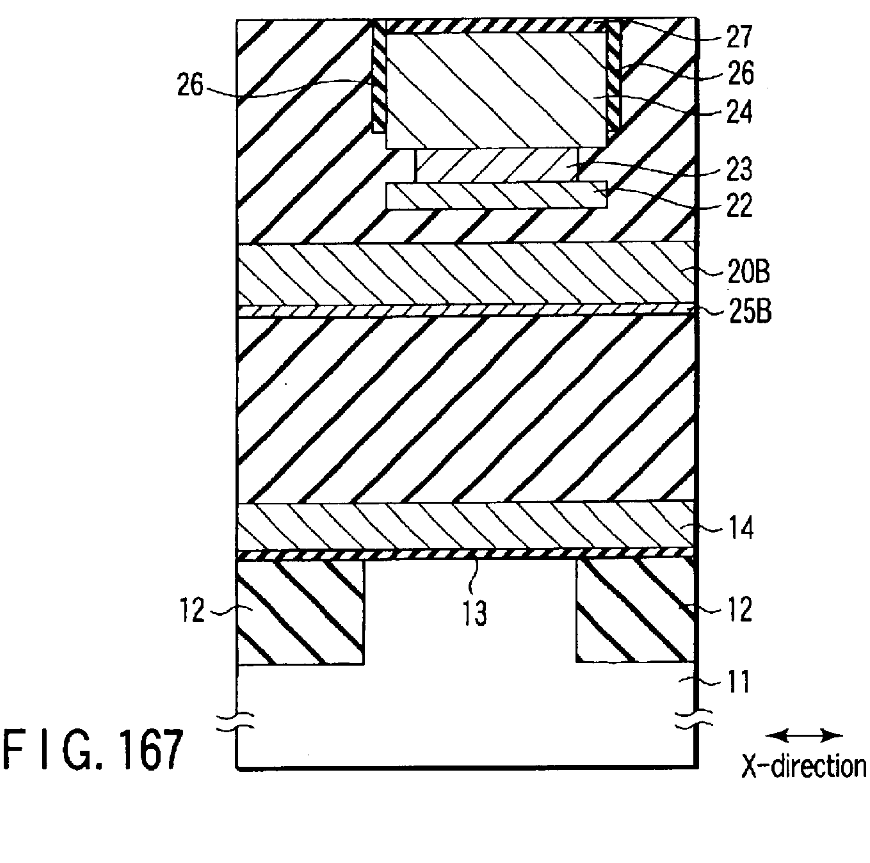
Figure 168:
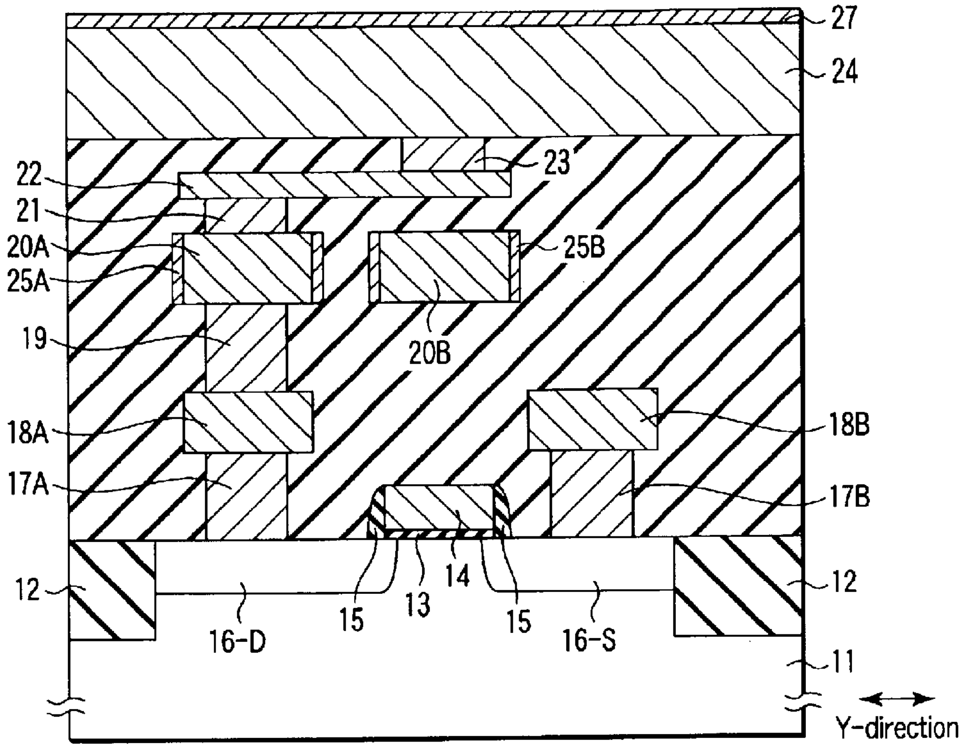
Figure 169:
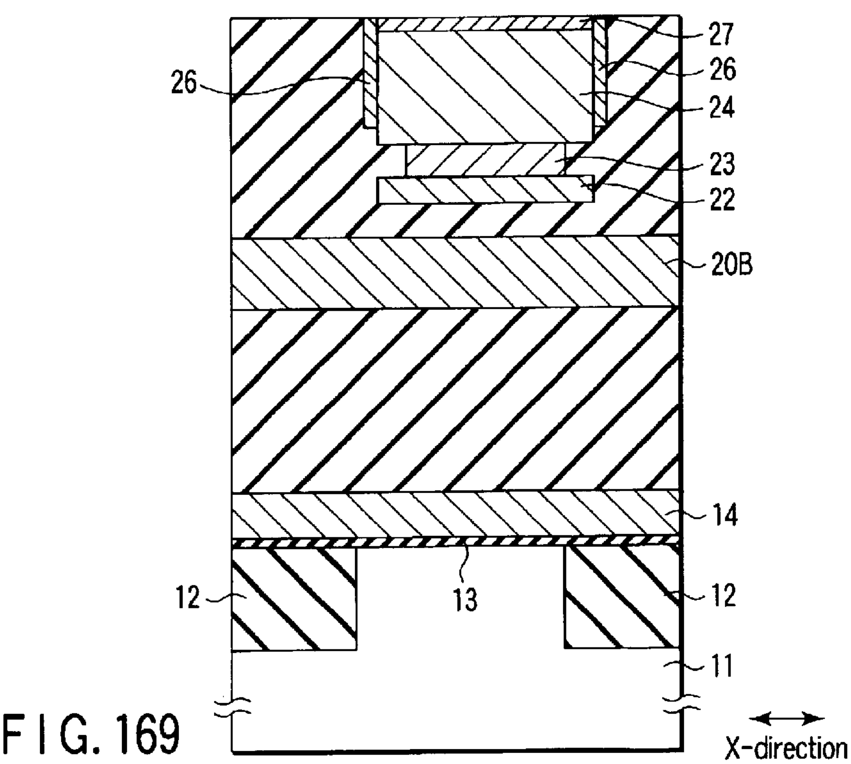
Figure 170:
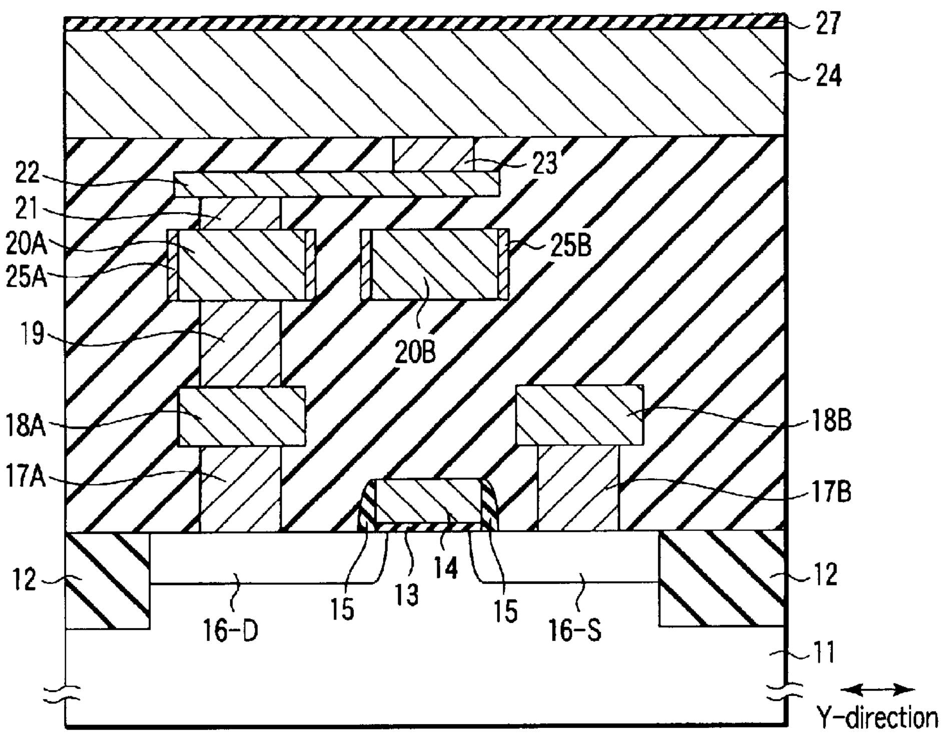
Figure 171:
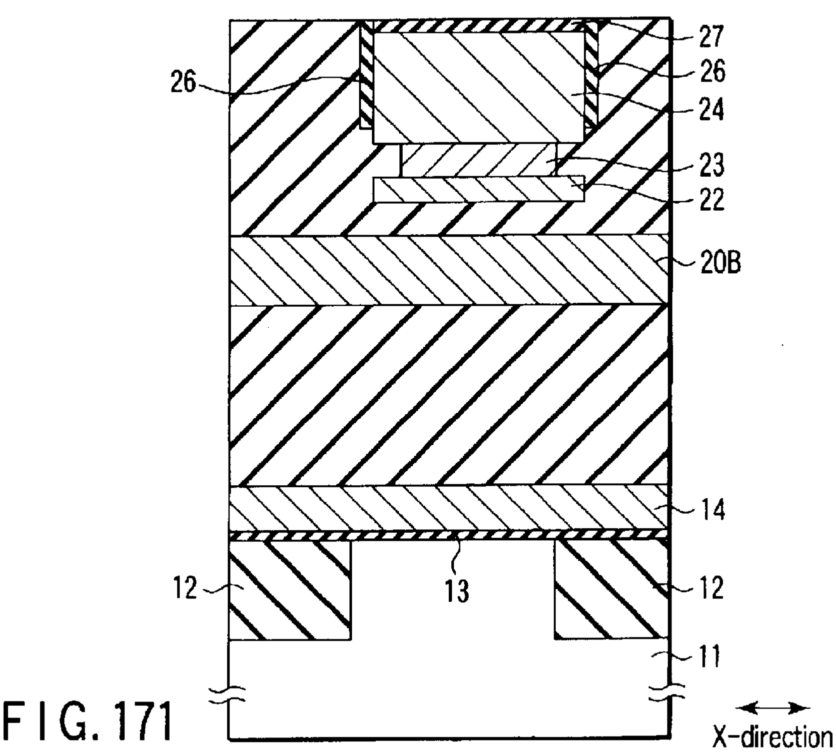
Figure 172:
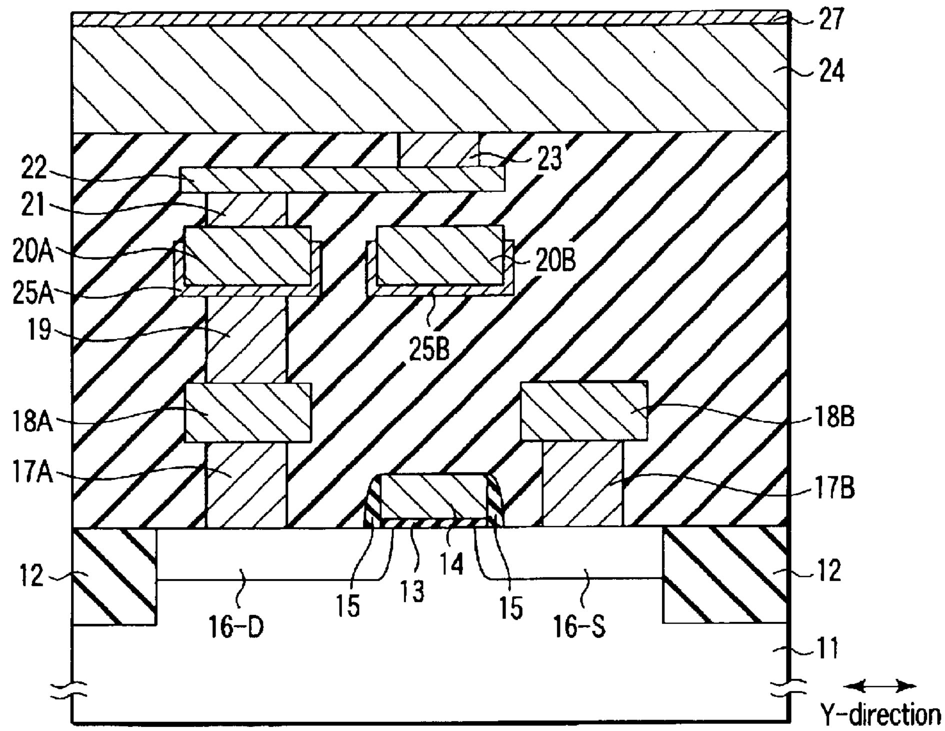
Figure 173:
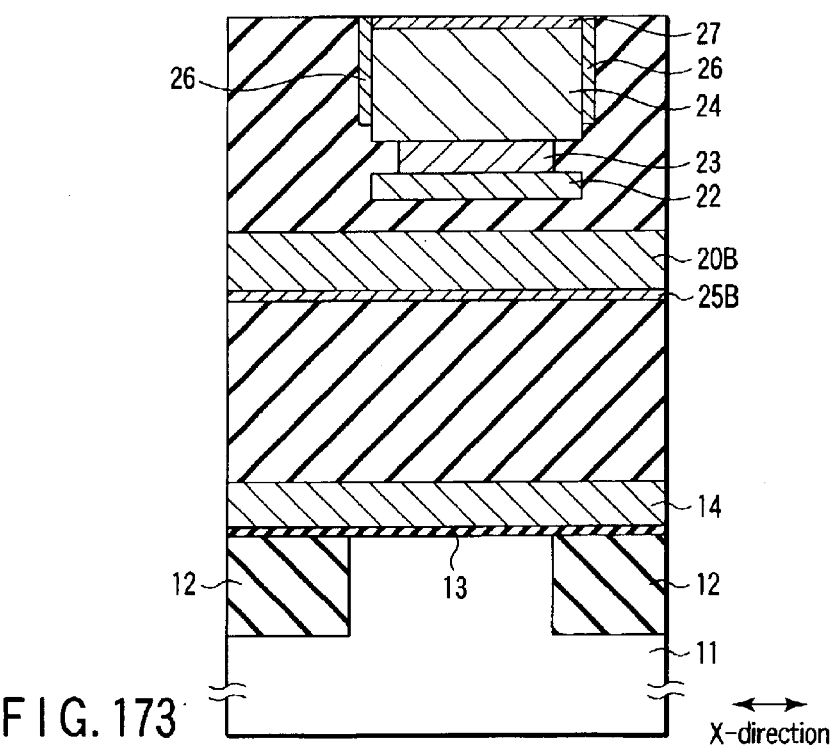
Figure 174:
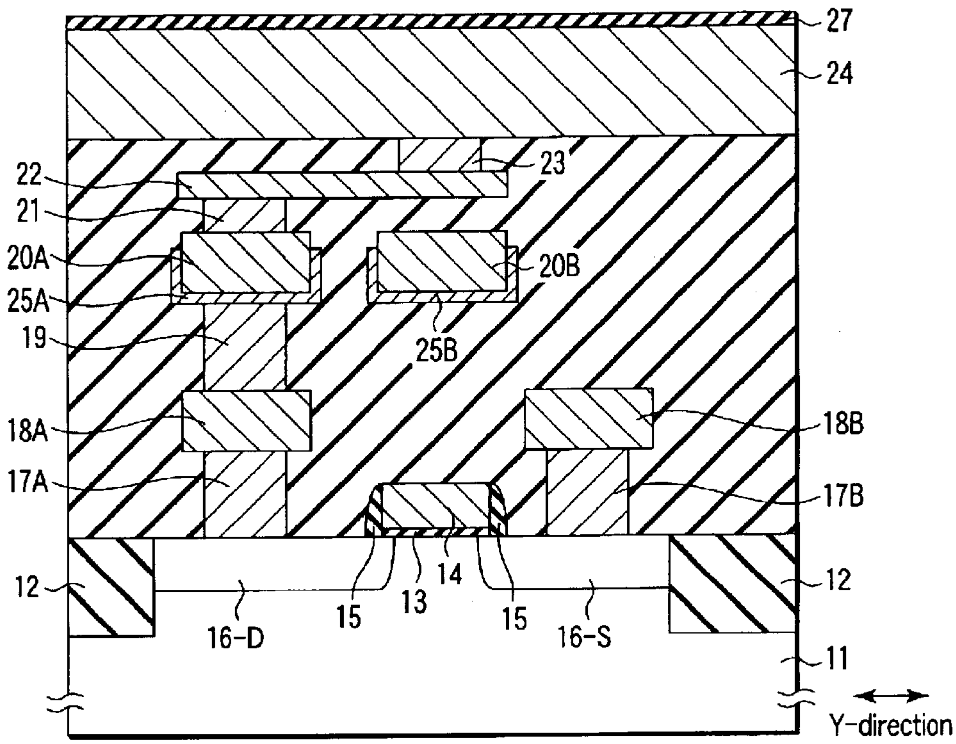
Figure 175:
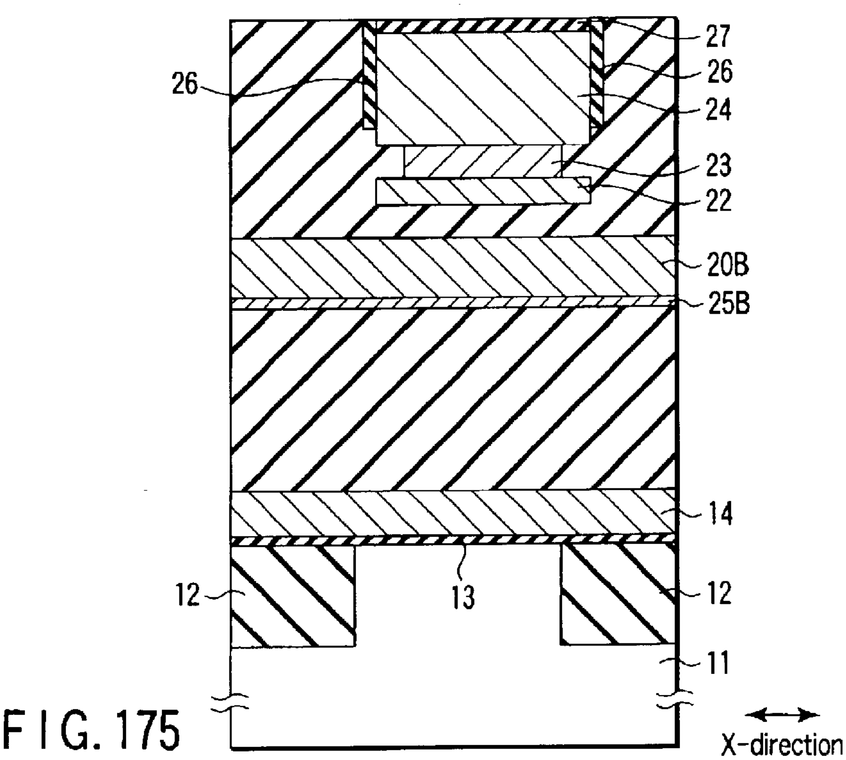
Figure 176:
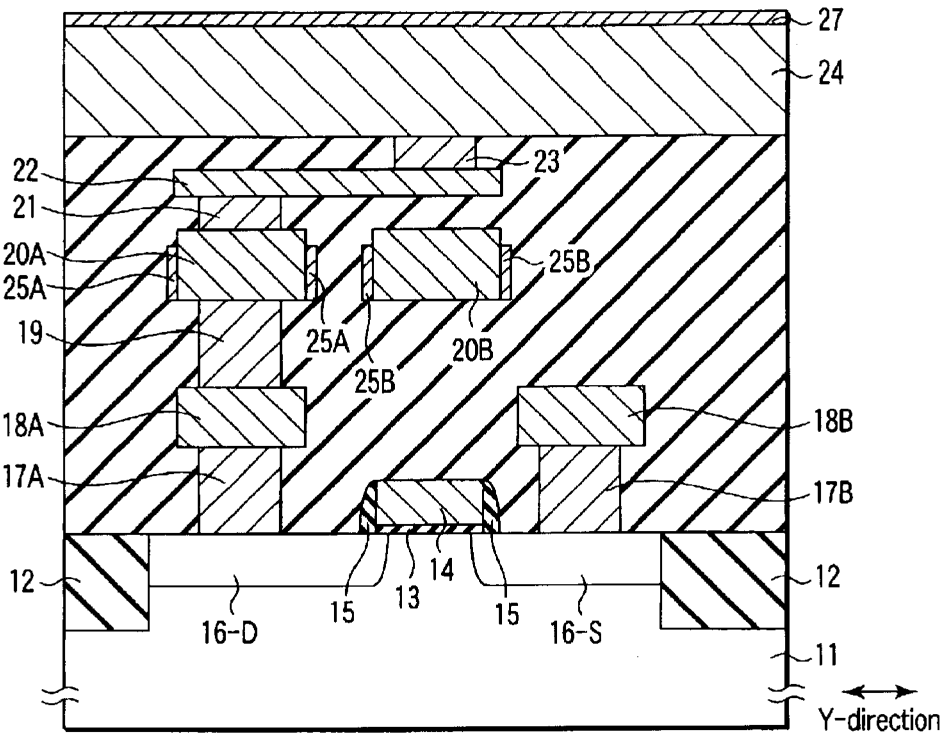
Figure 177:
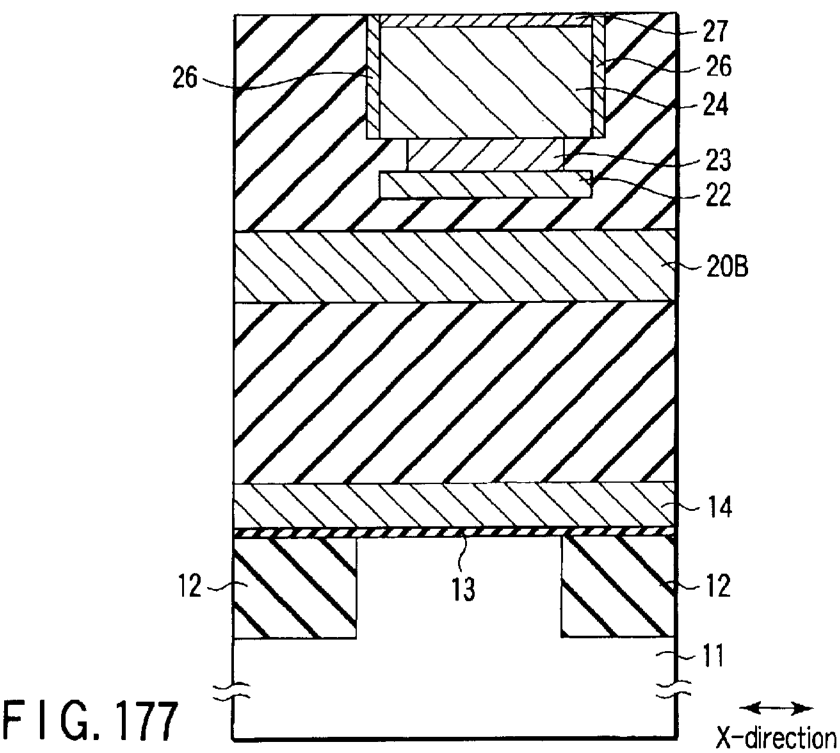
Figure 178:
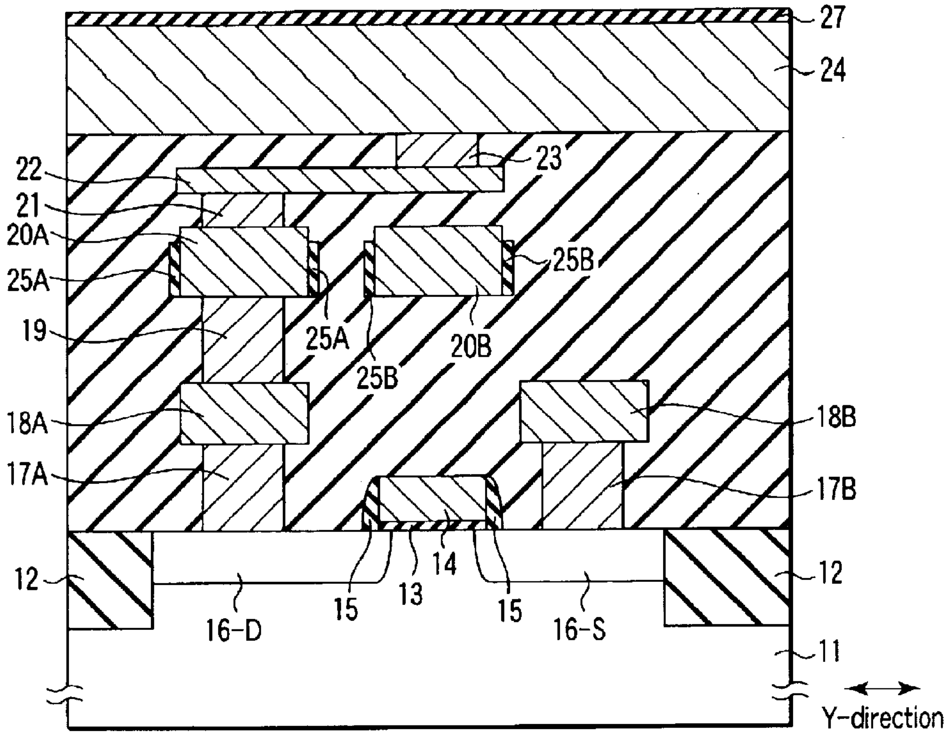
Figure 179:
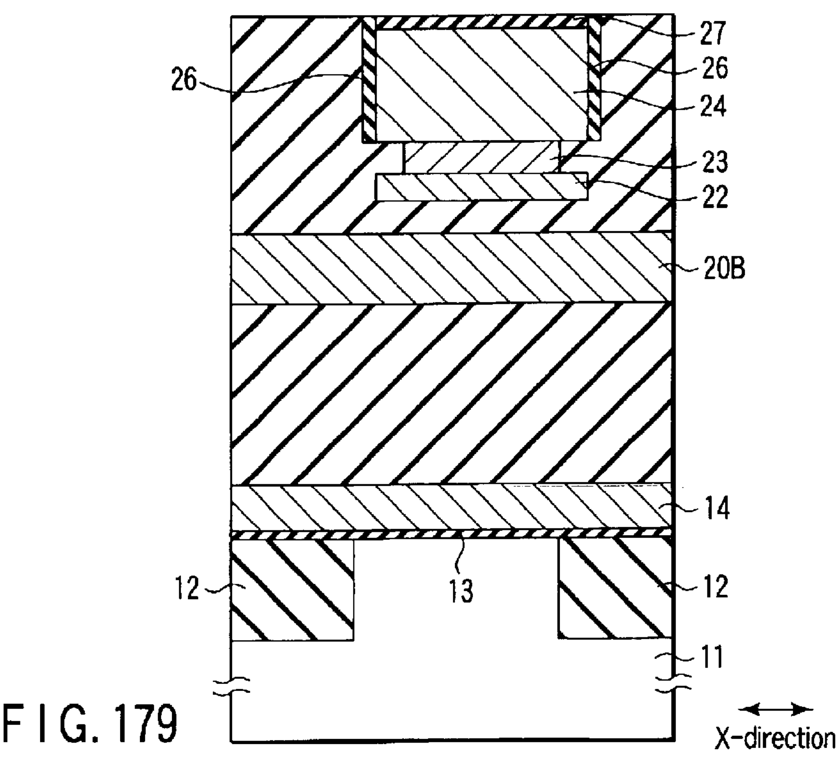
Figure 180:
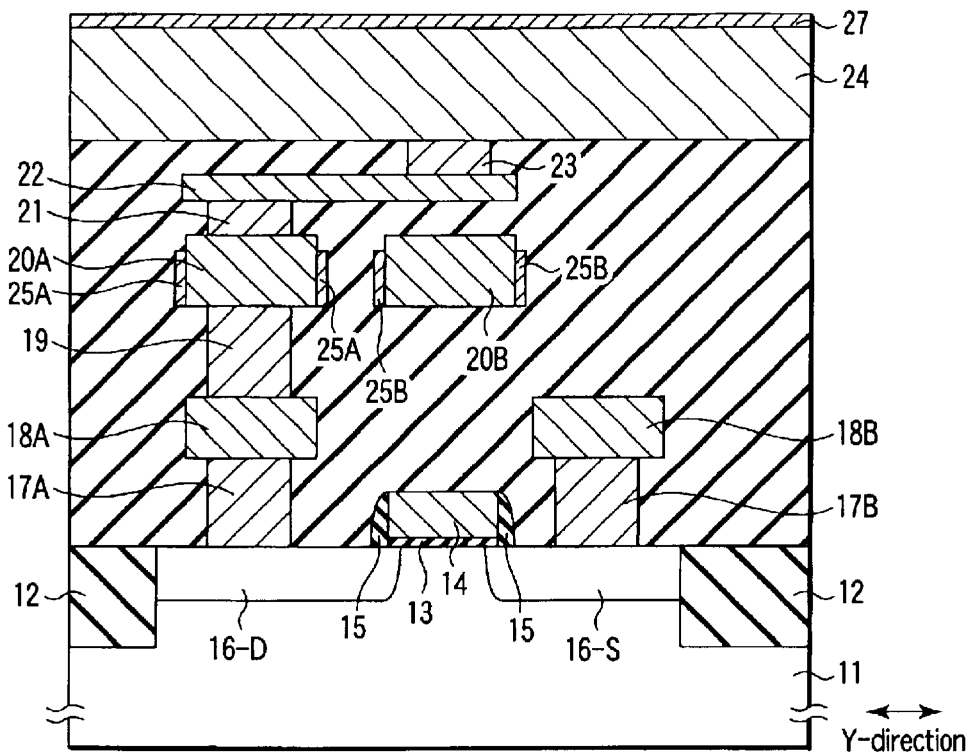
Figure 181:
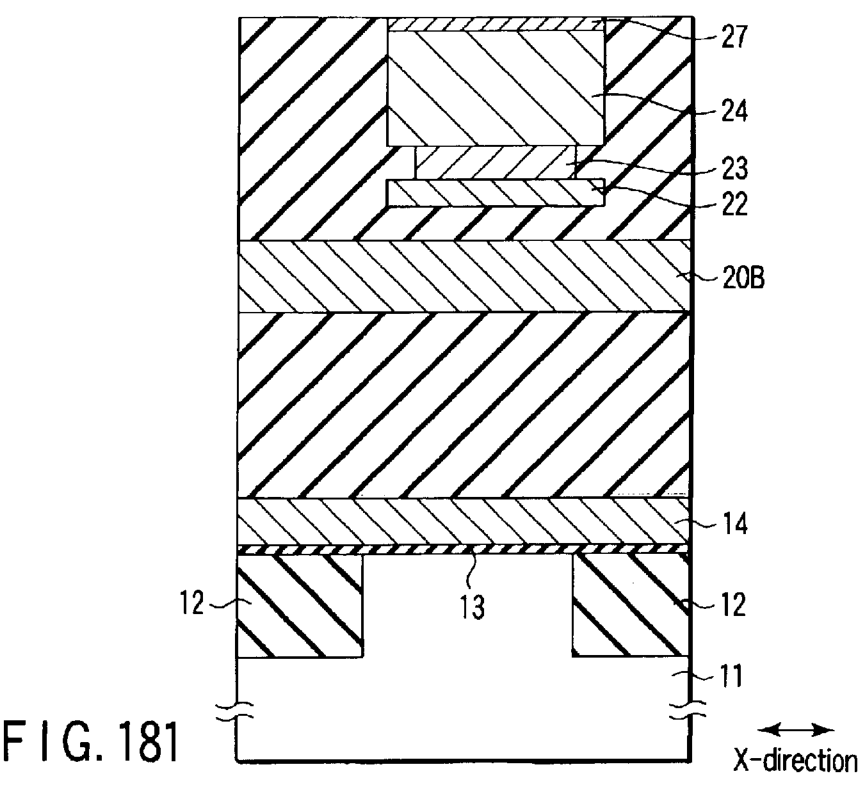
Figure 182:
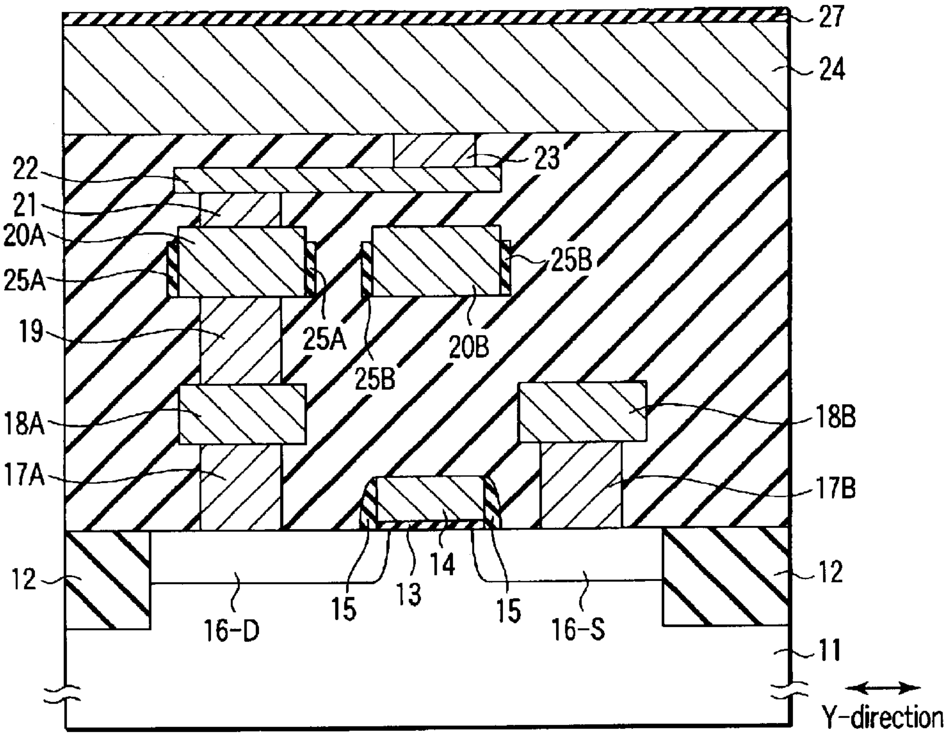
Figure 183:
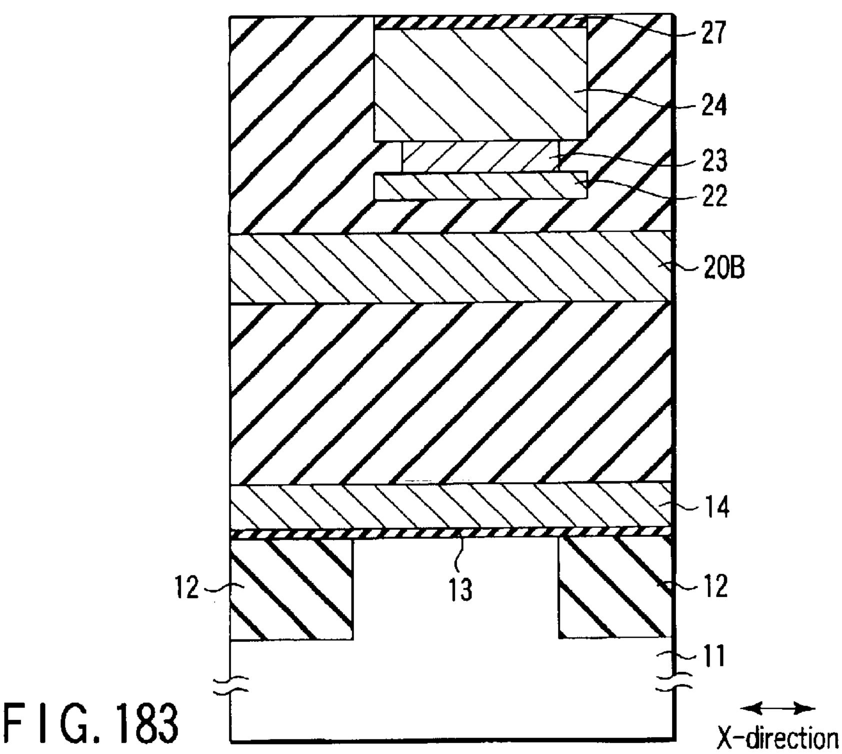
Figure 184:
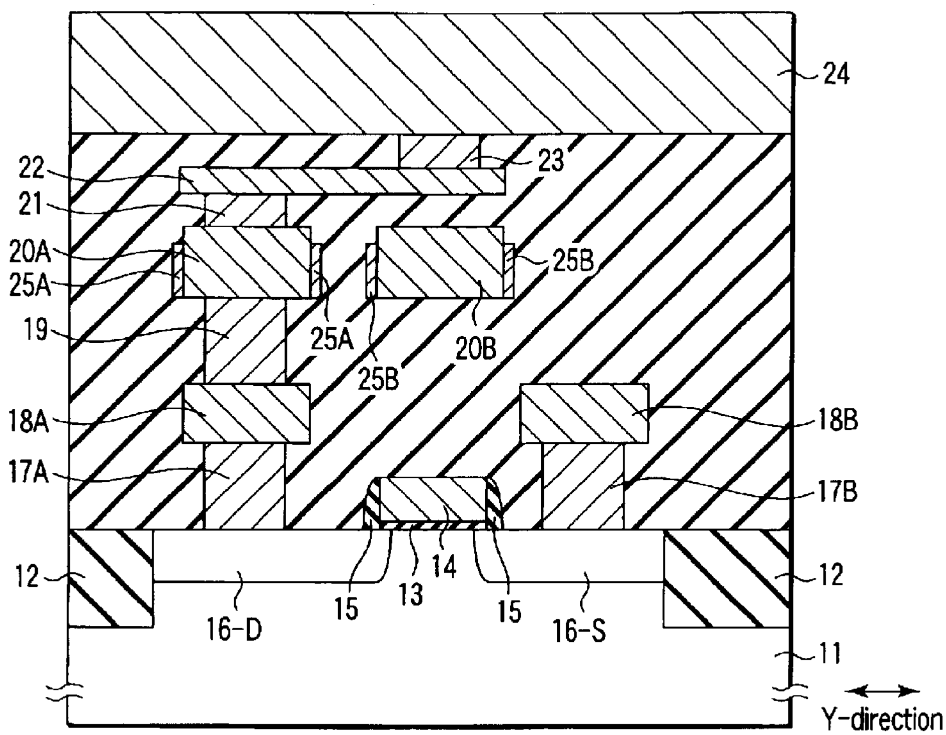
Figure 185:
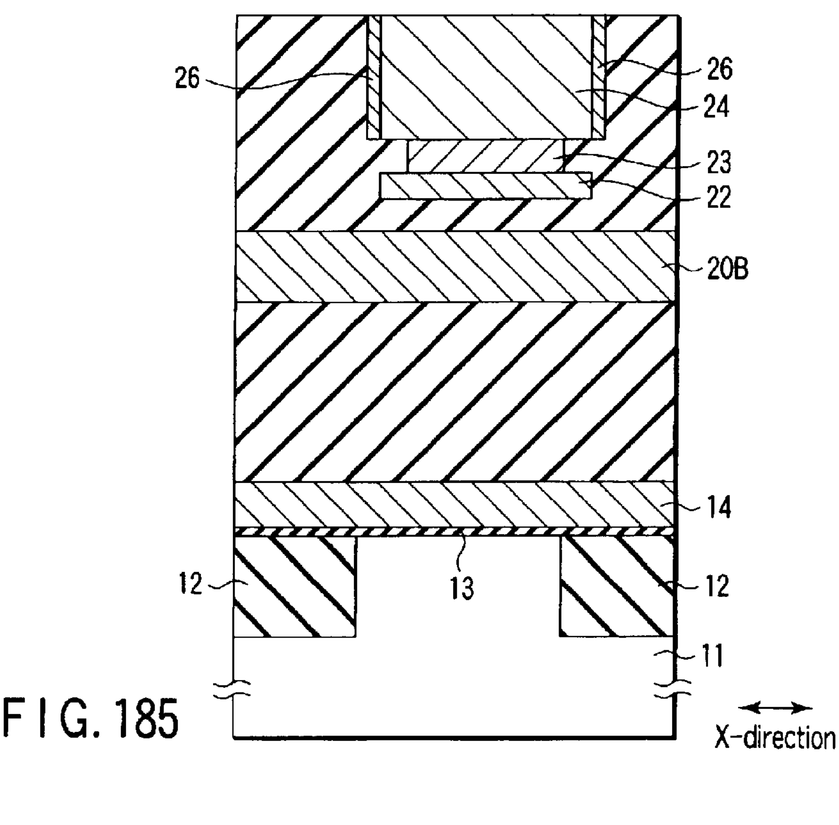
Figure 186:
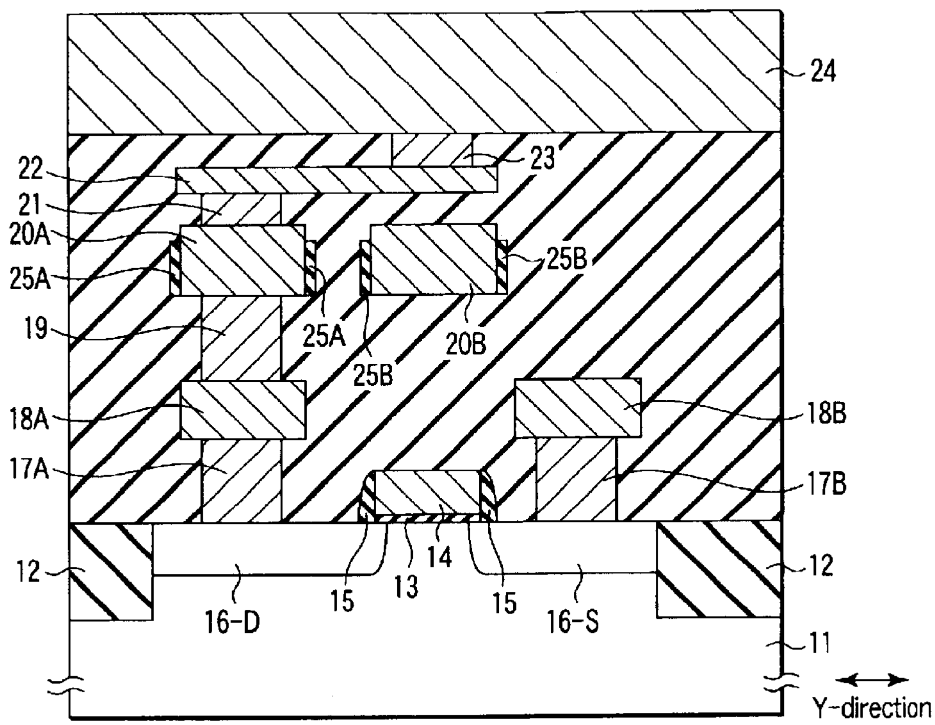
Figure 187:
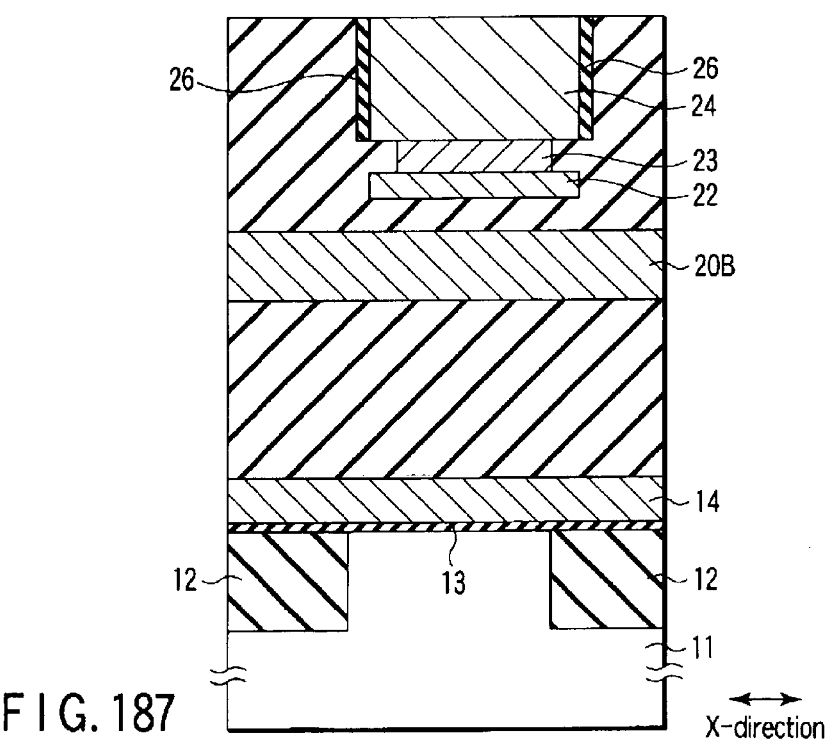
Figure 188:
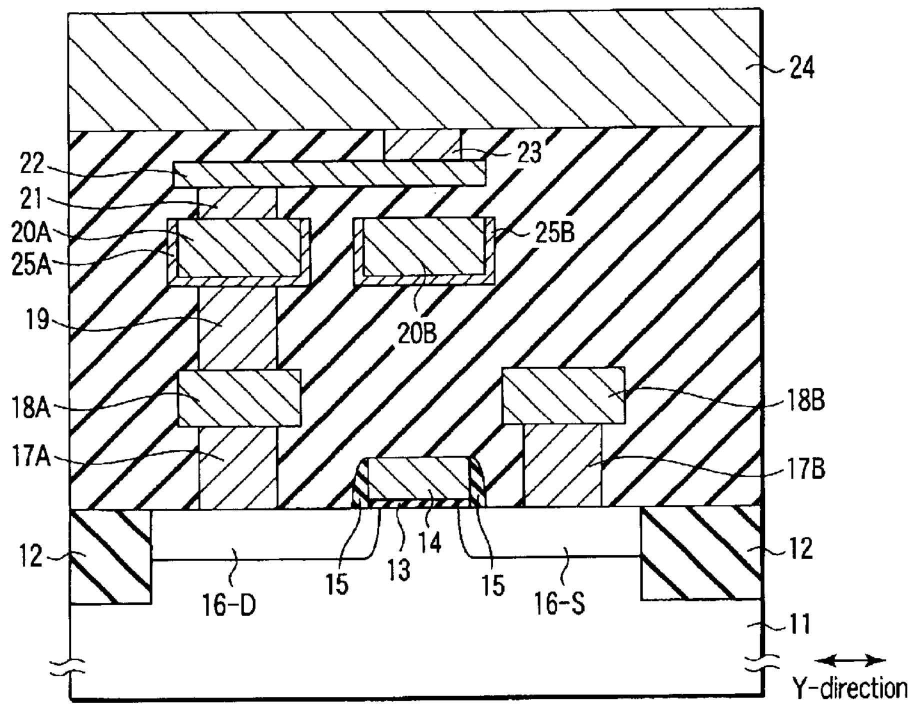
Figure 189:
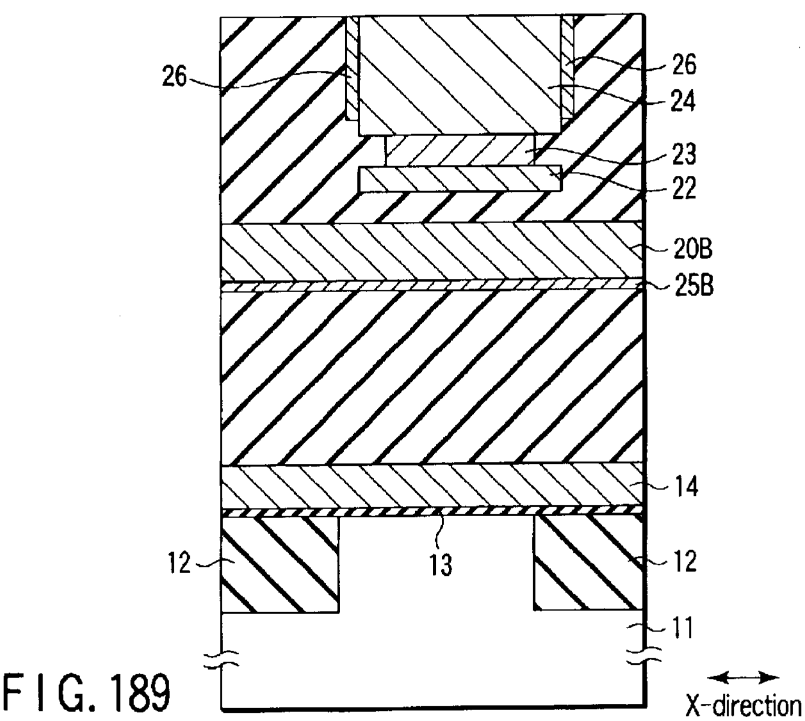
Figure 190:
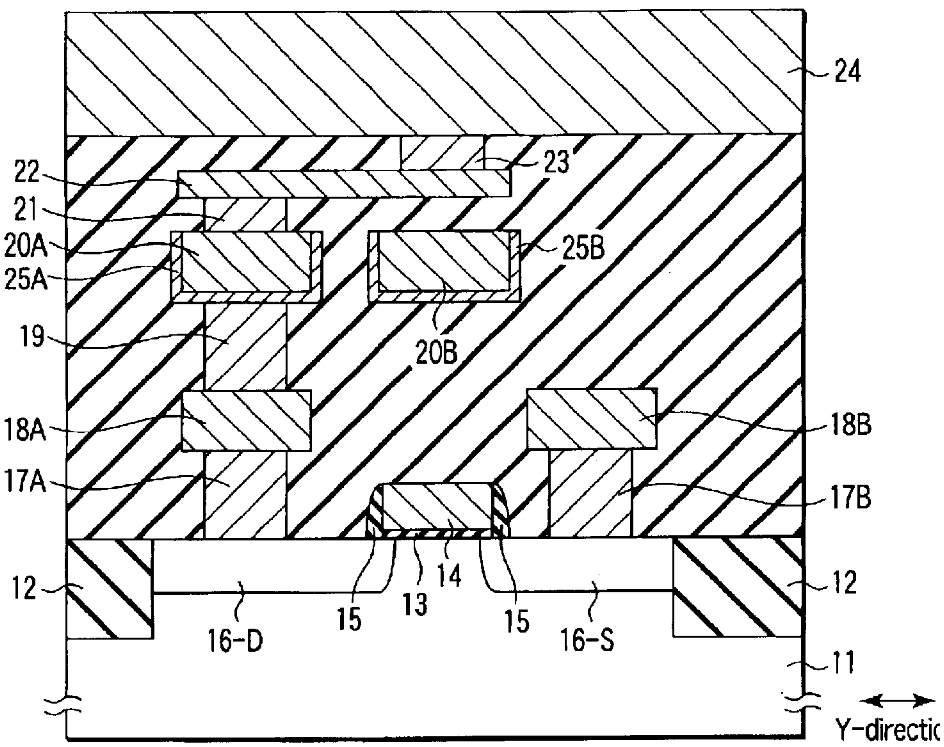
Figure 191:
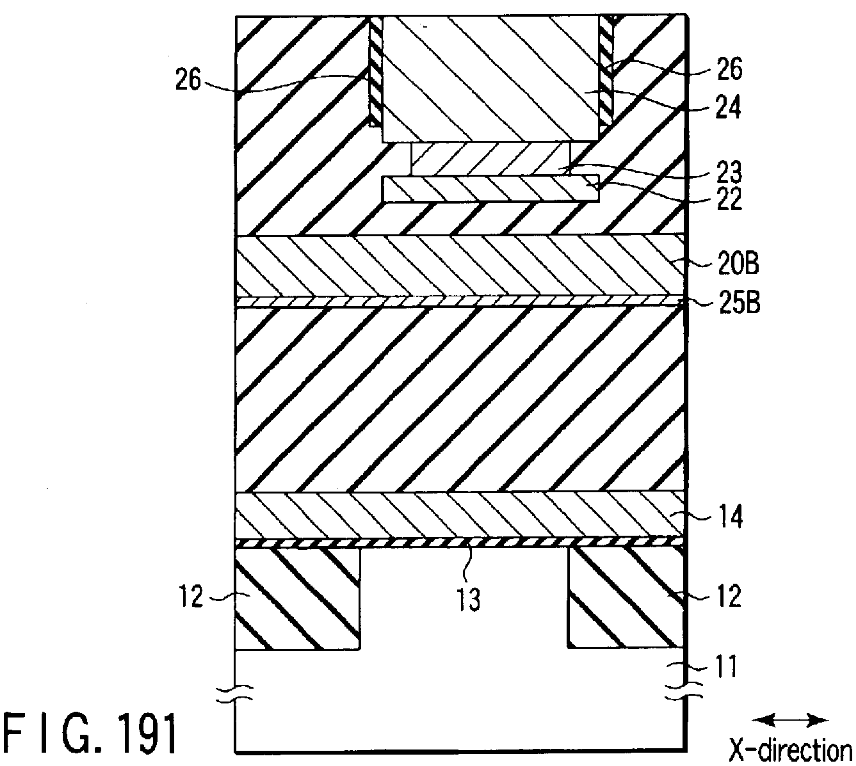
Figure 194:
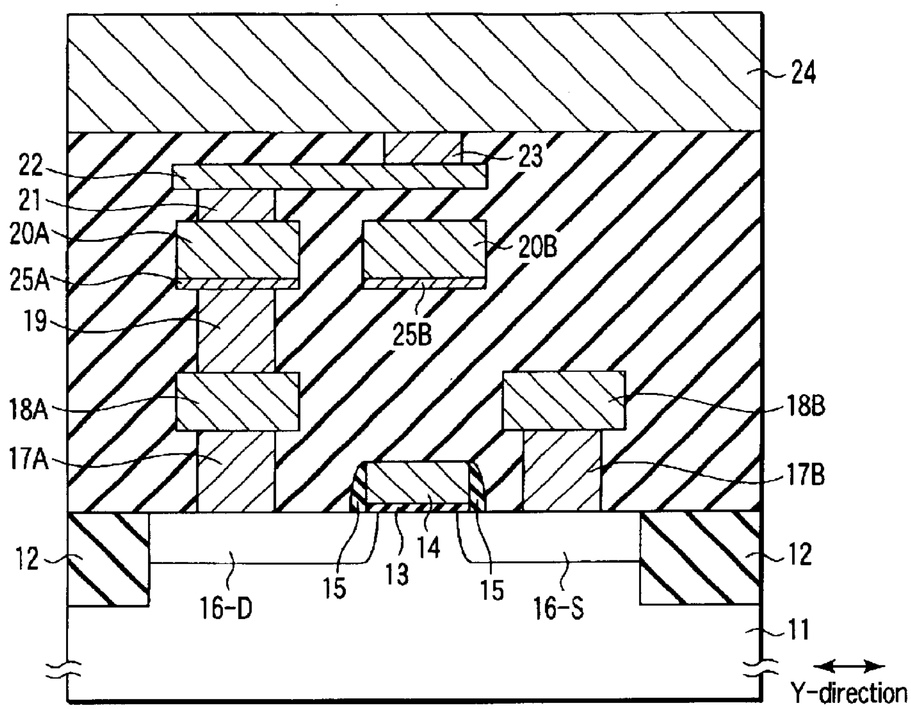
Figure 195:
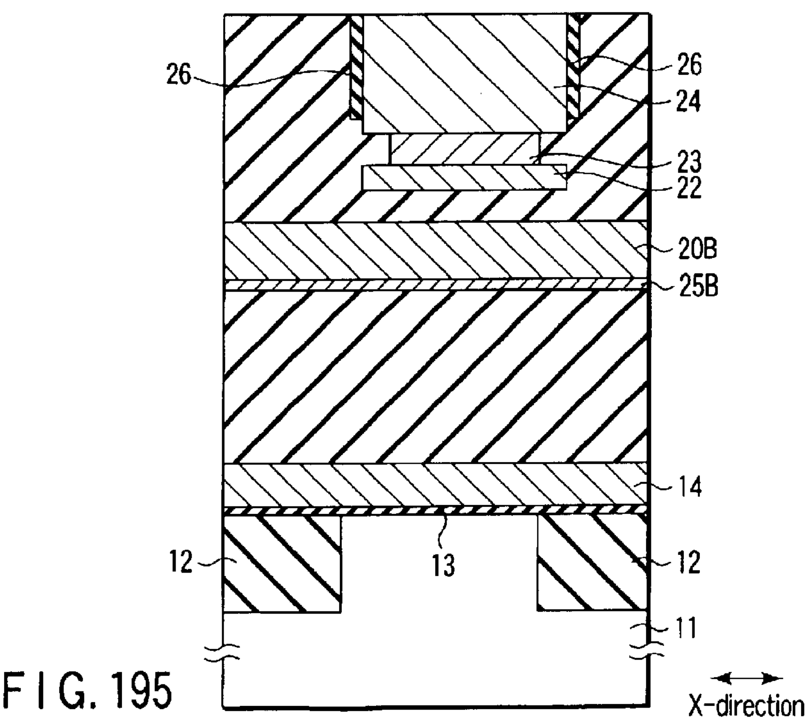
Figure 196:
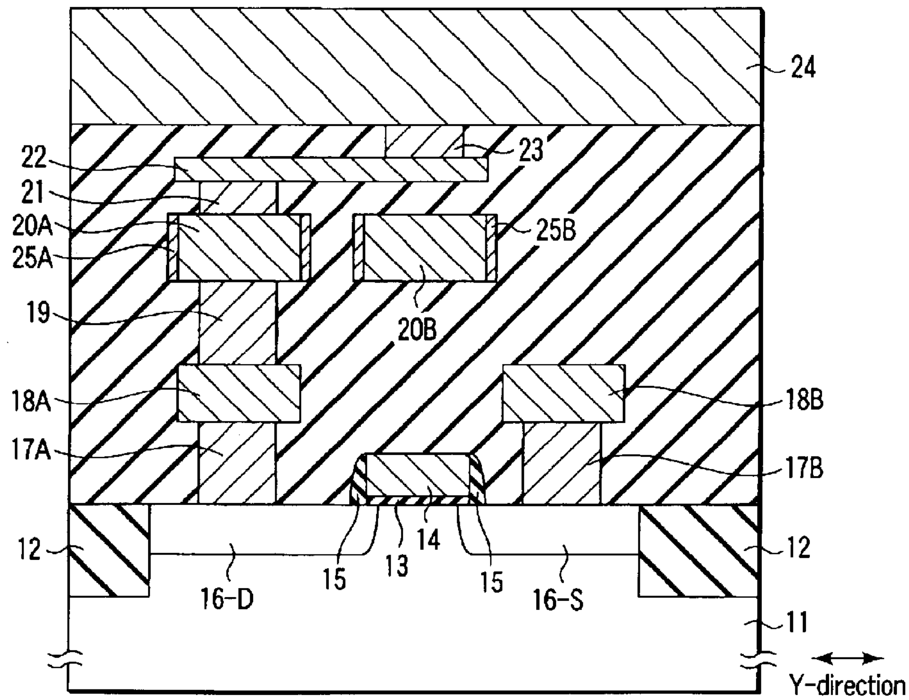
Figure 197:
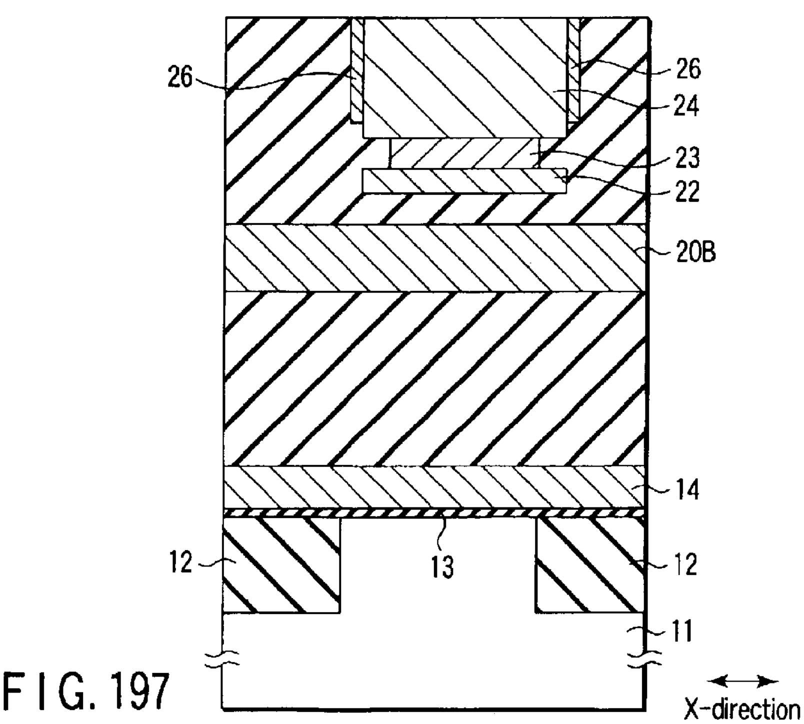
Figure 198:
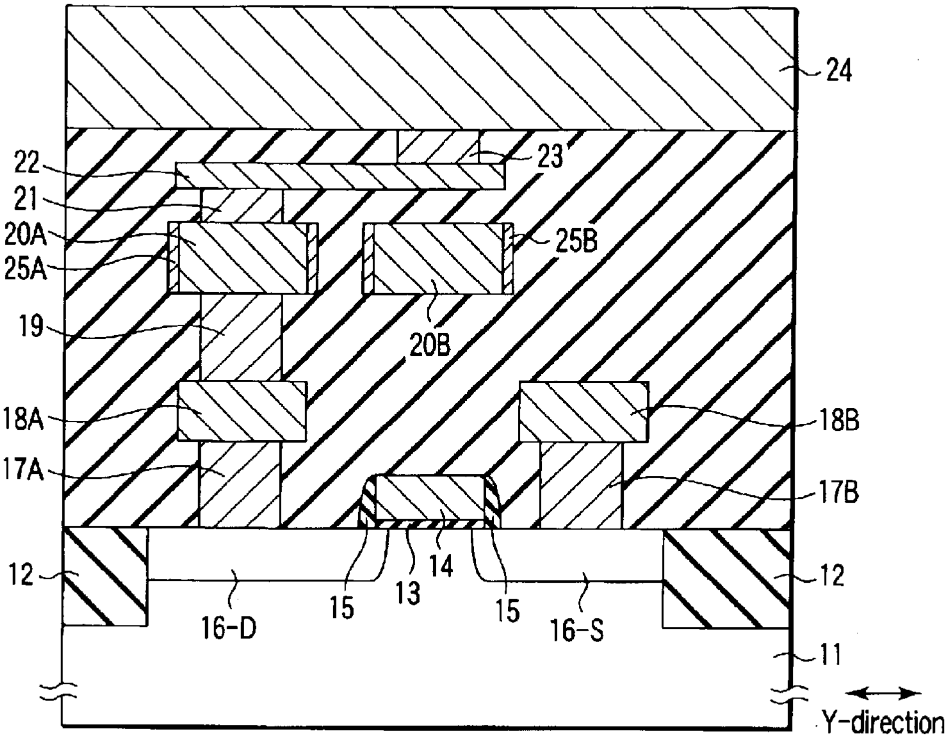
Figure 199:
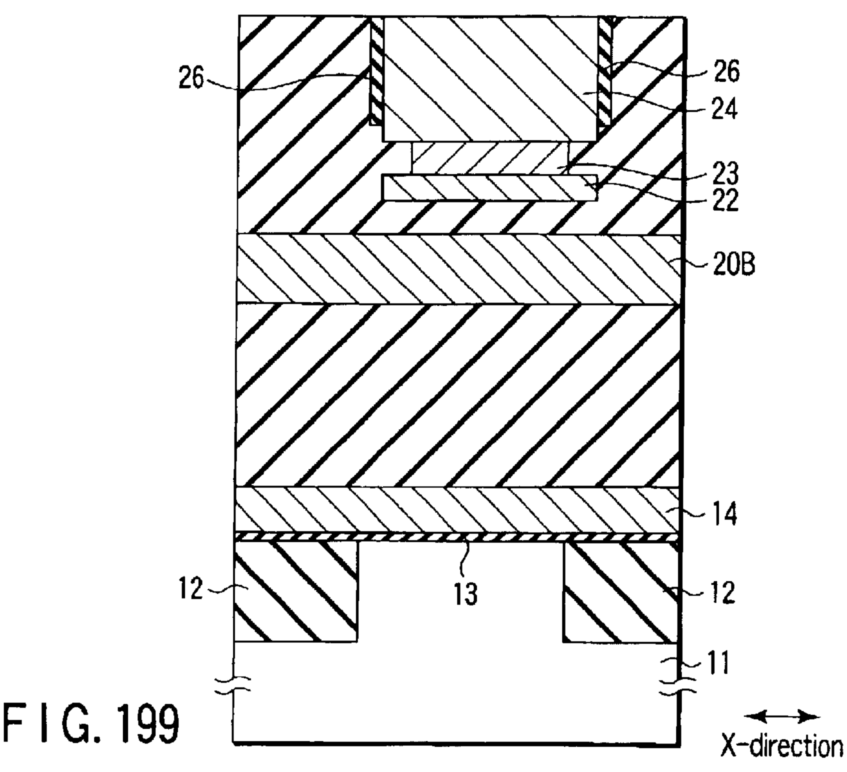
Figure 202:
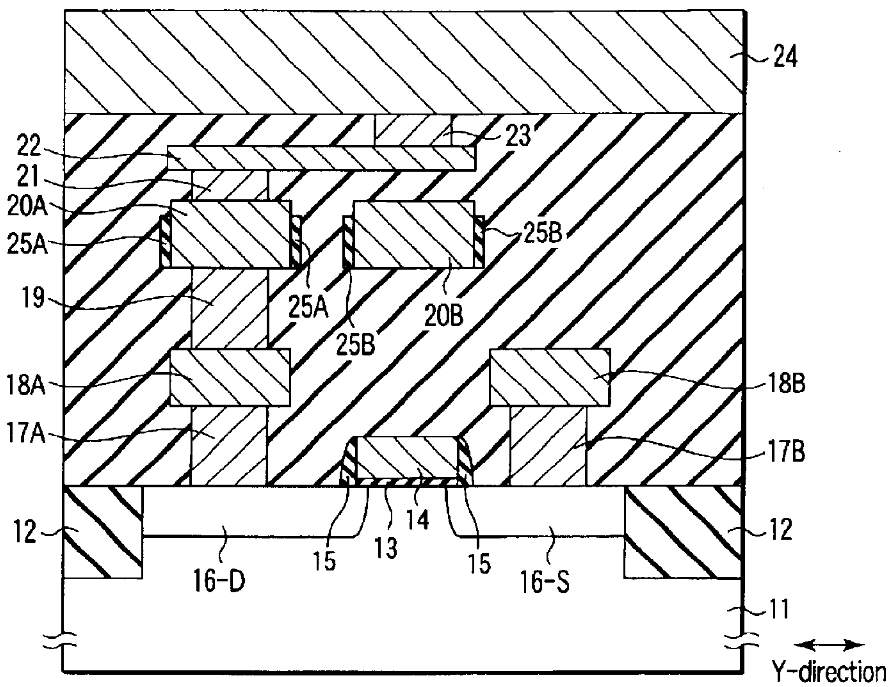
Figure 203:
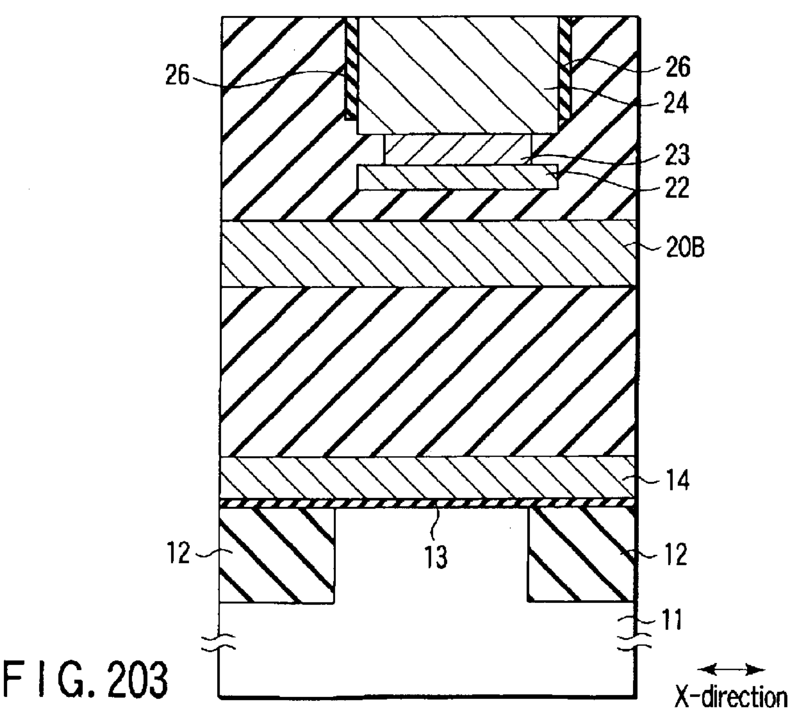
Figure 204:
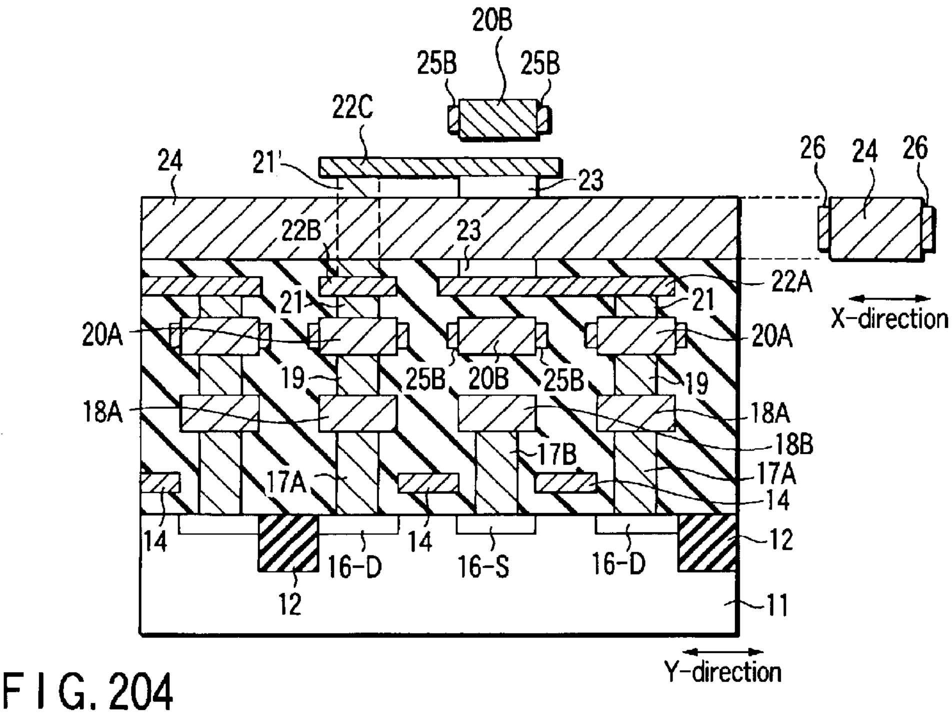
Figure 205:
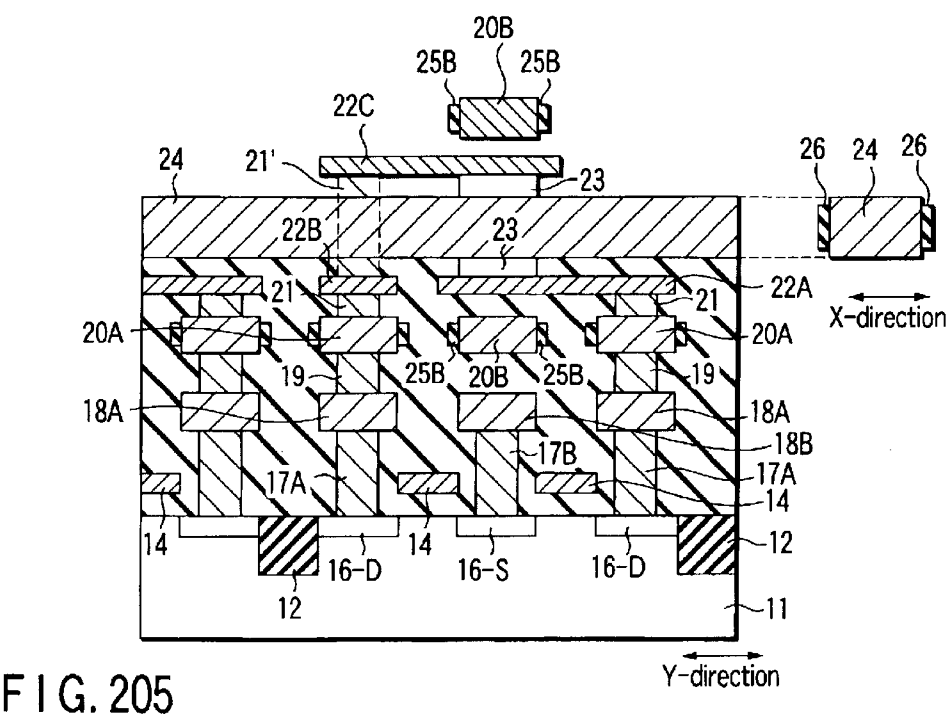
Figure 208:
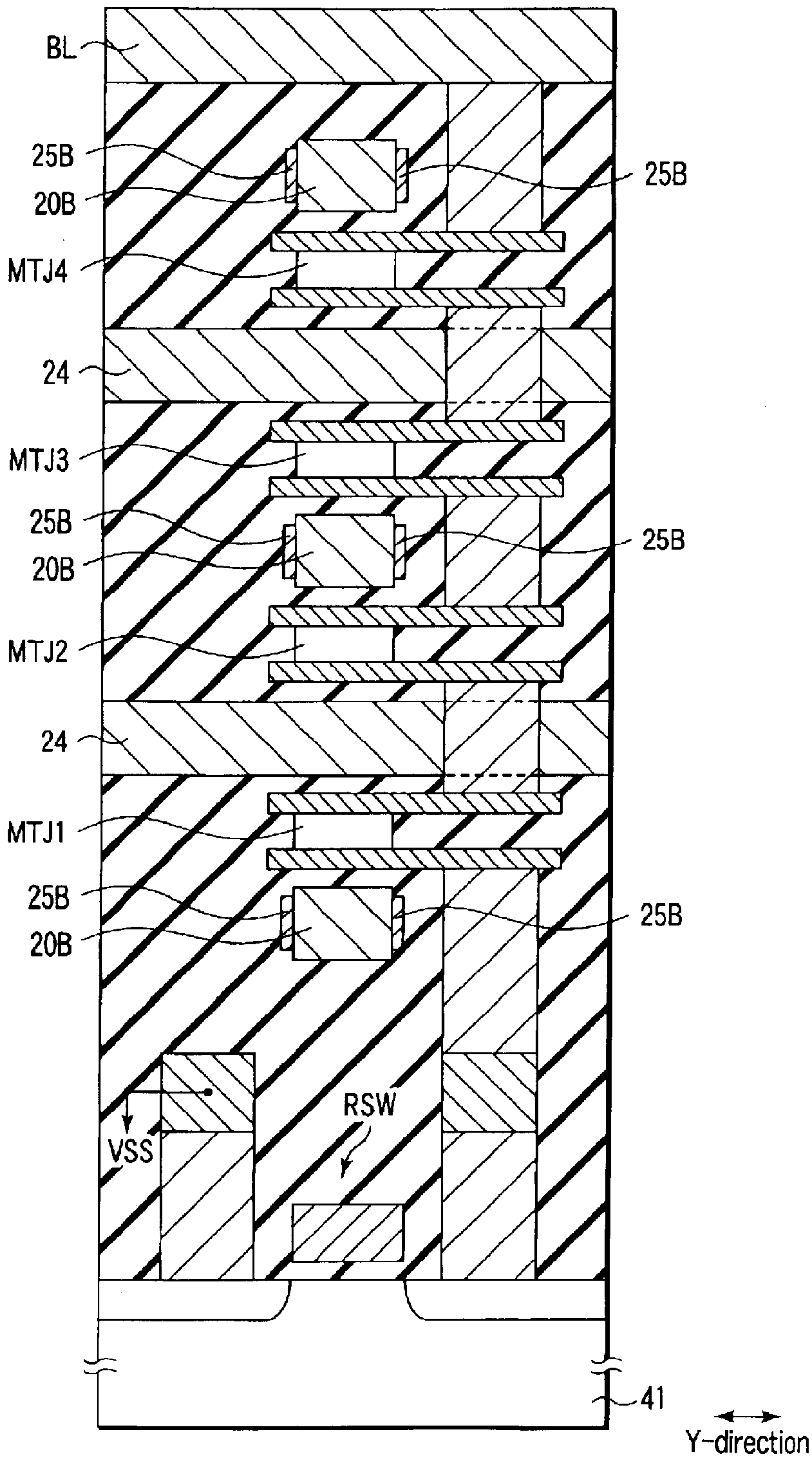
Figure 211:
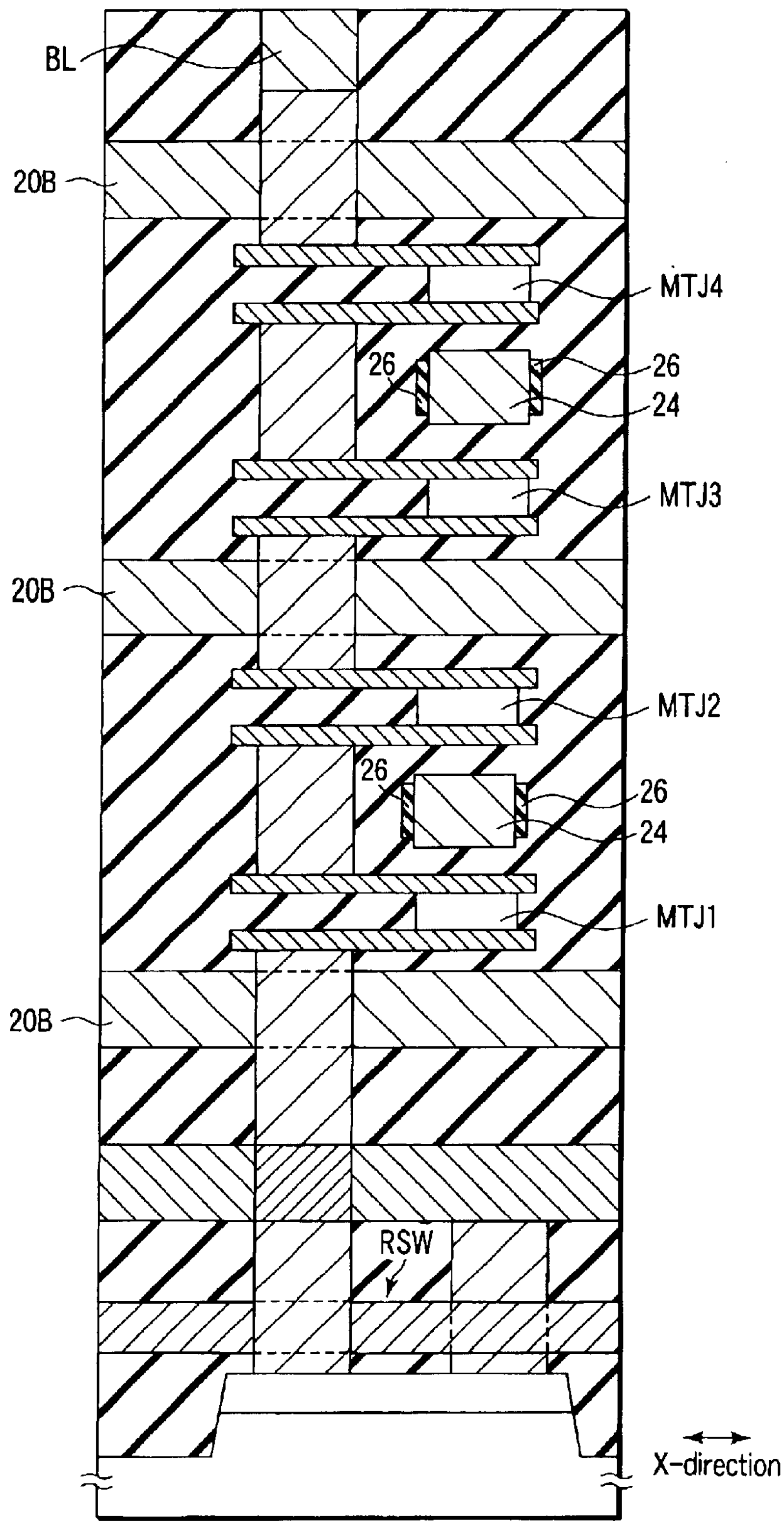
Figure 212:
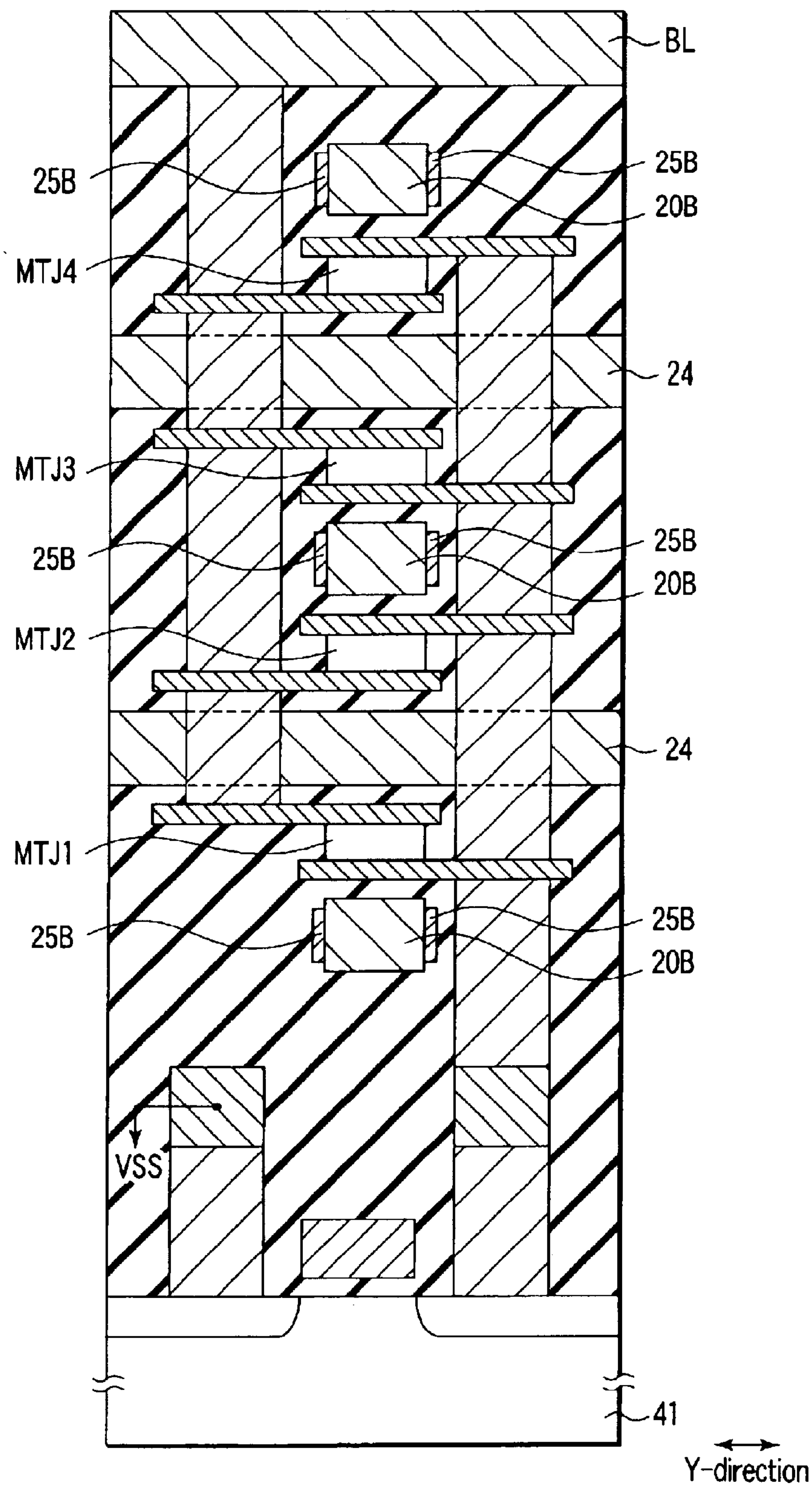
Figure 213:
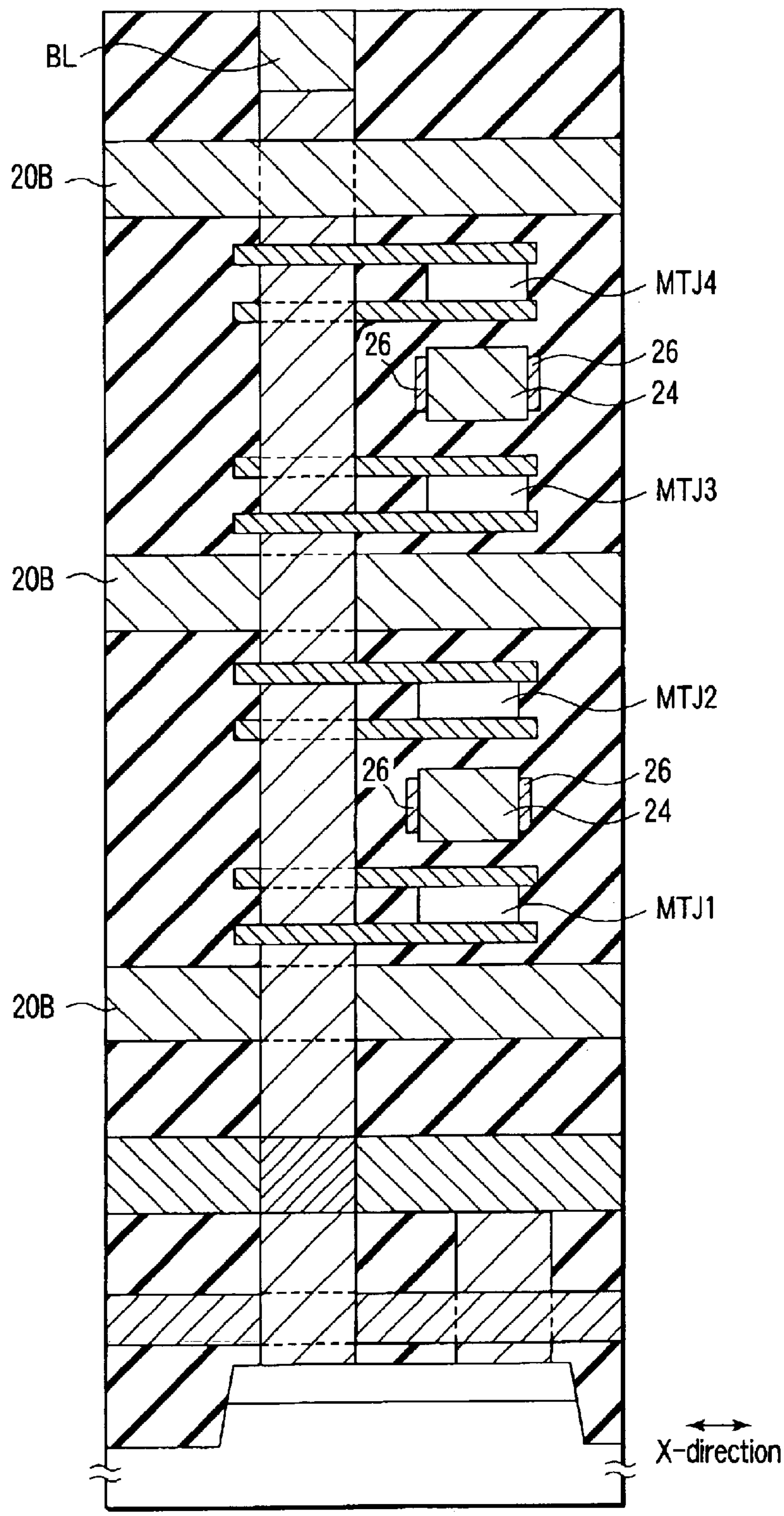
Figure 214:
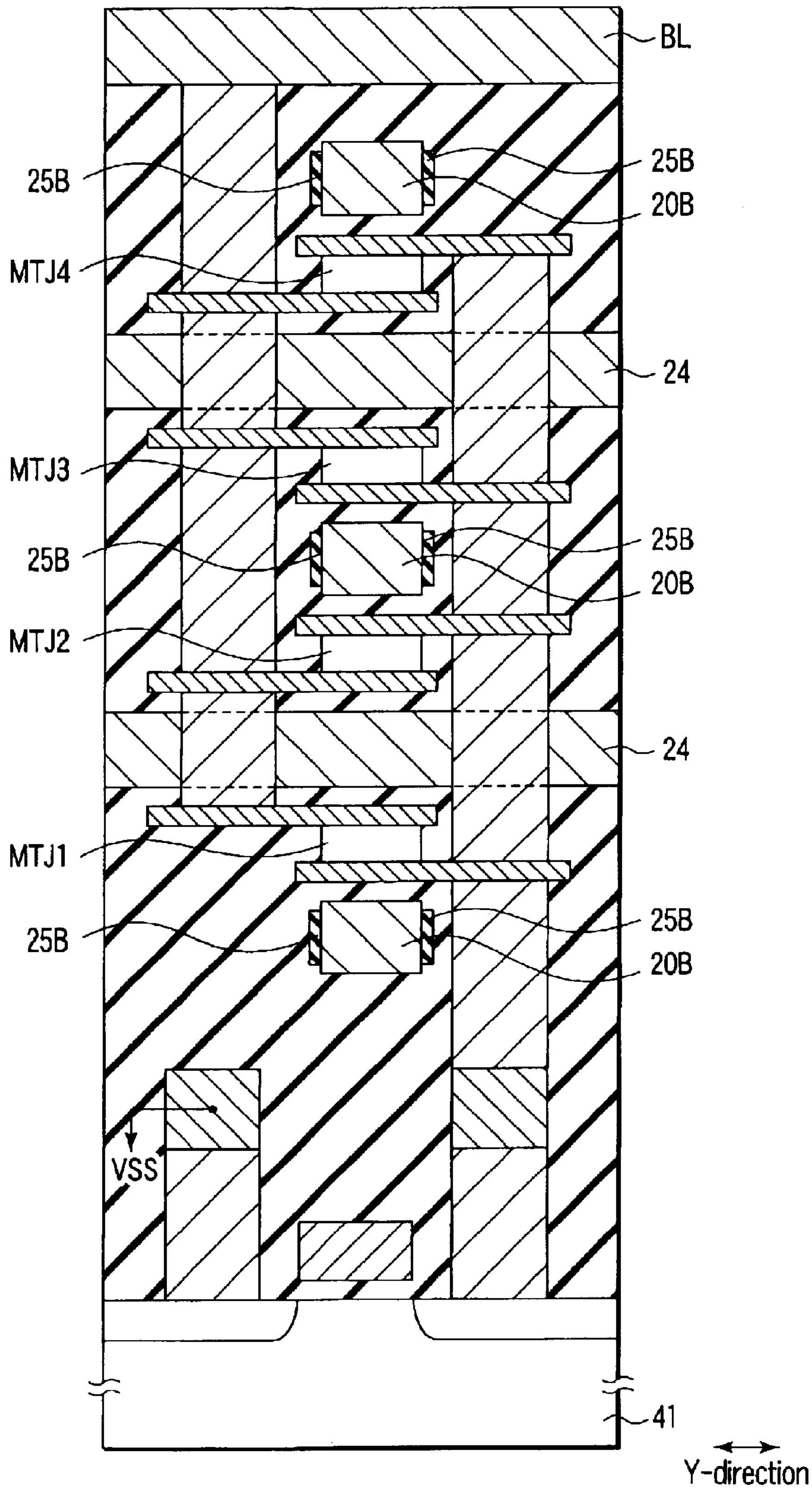
Figure 217:
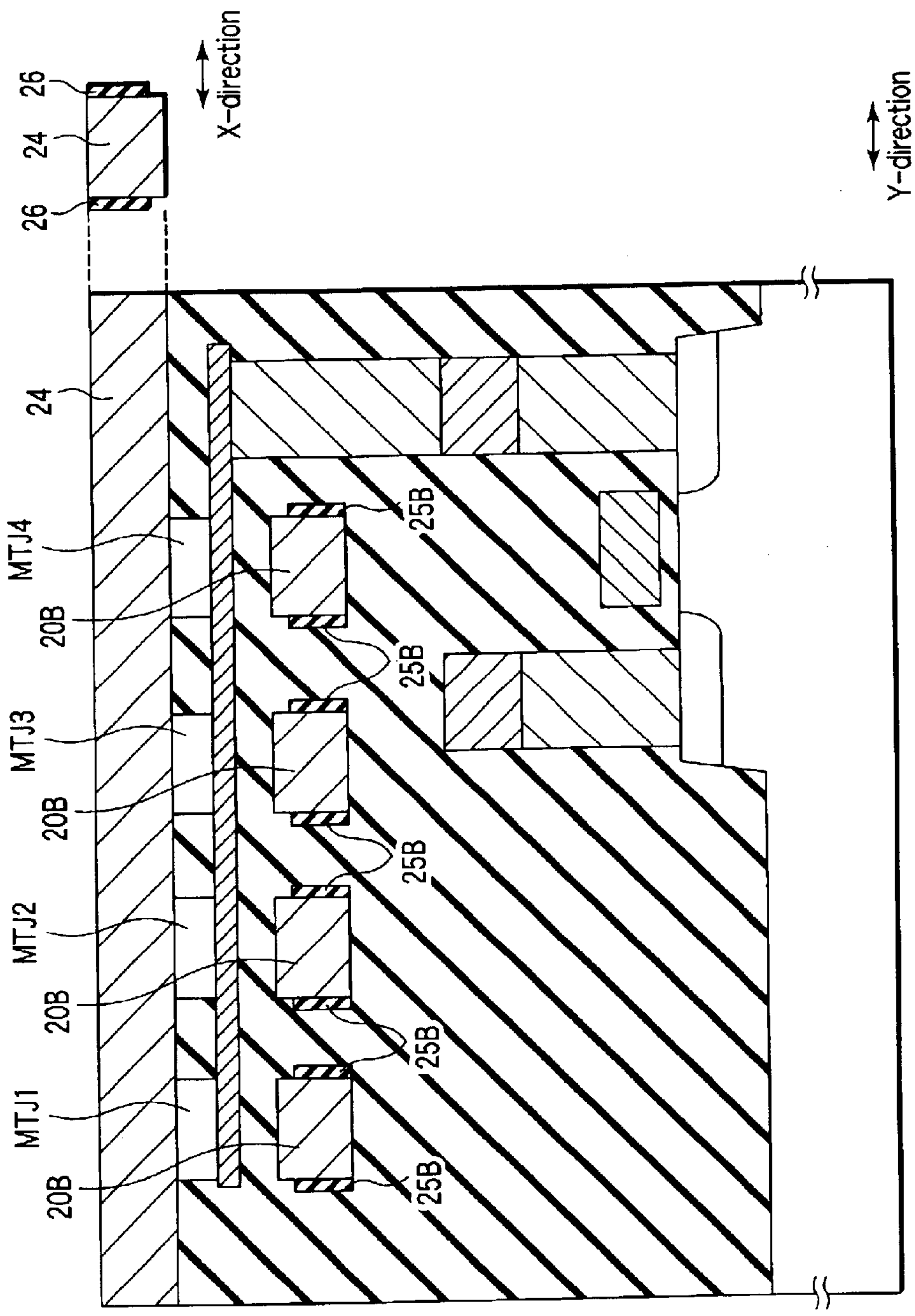
Figure 218:
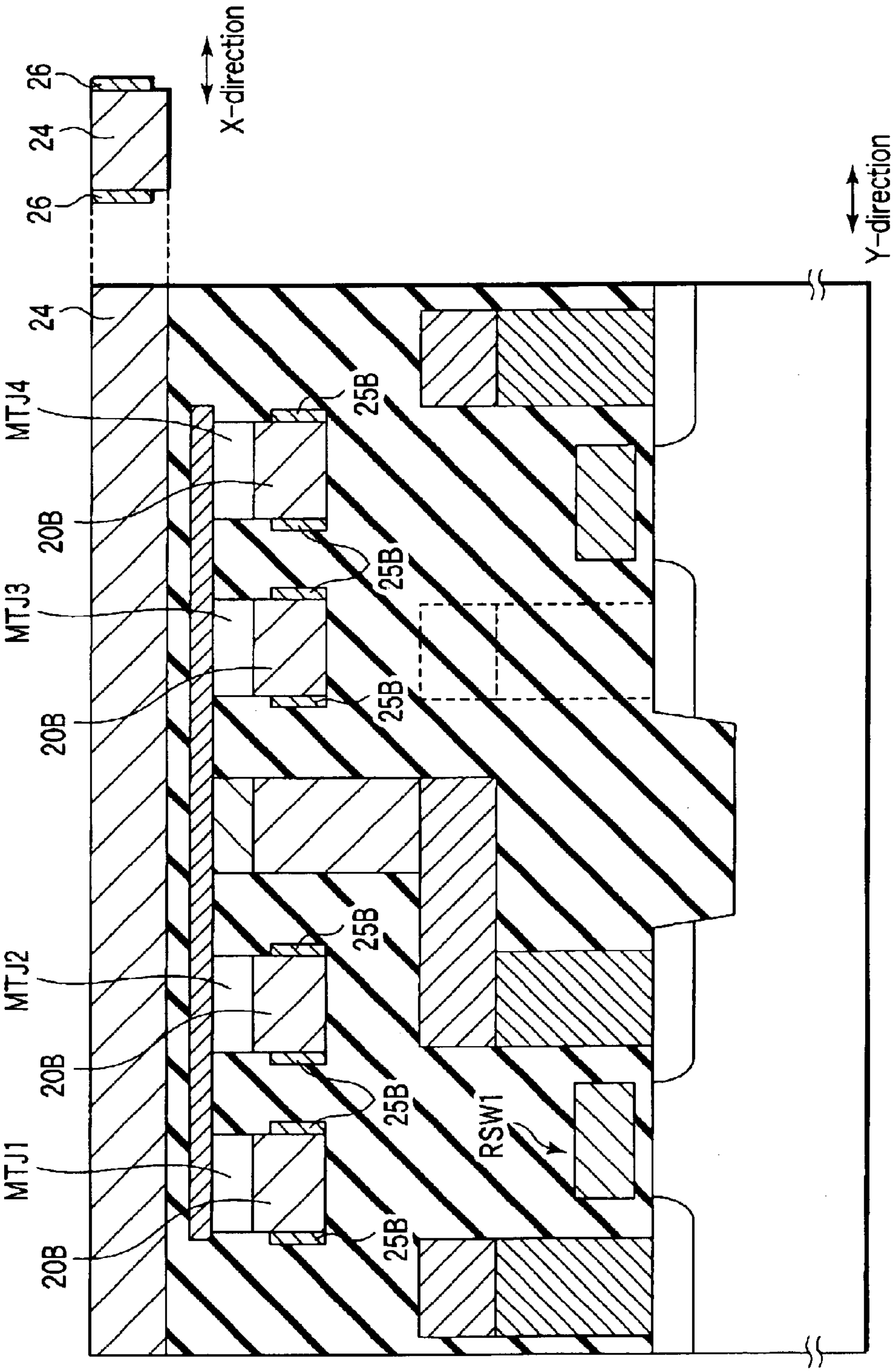
Figure 219:
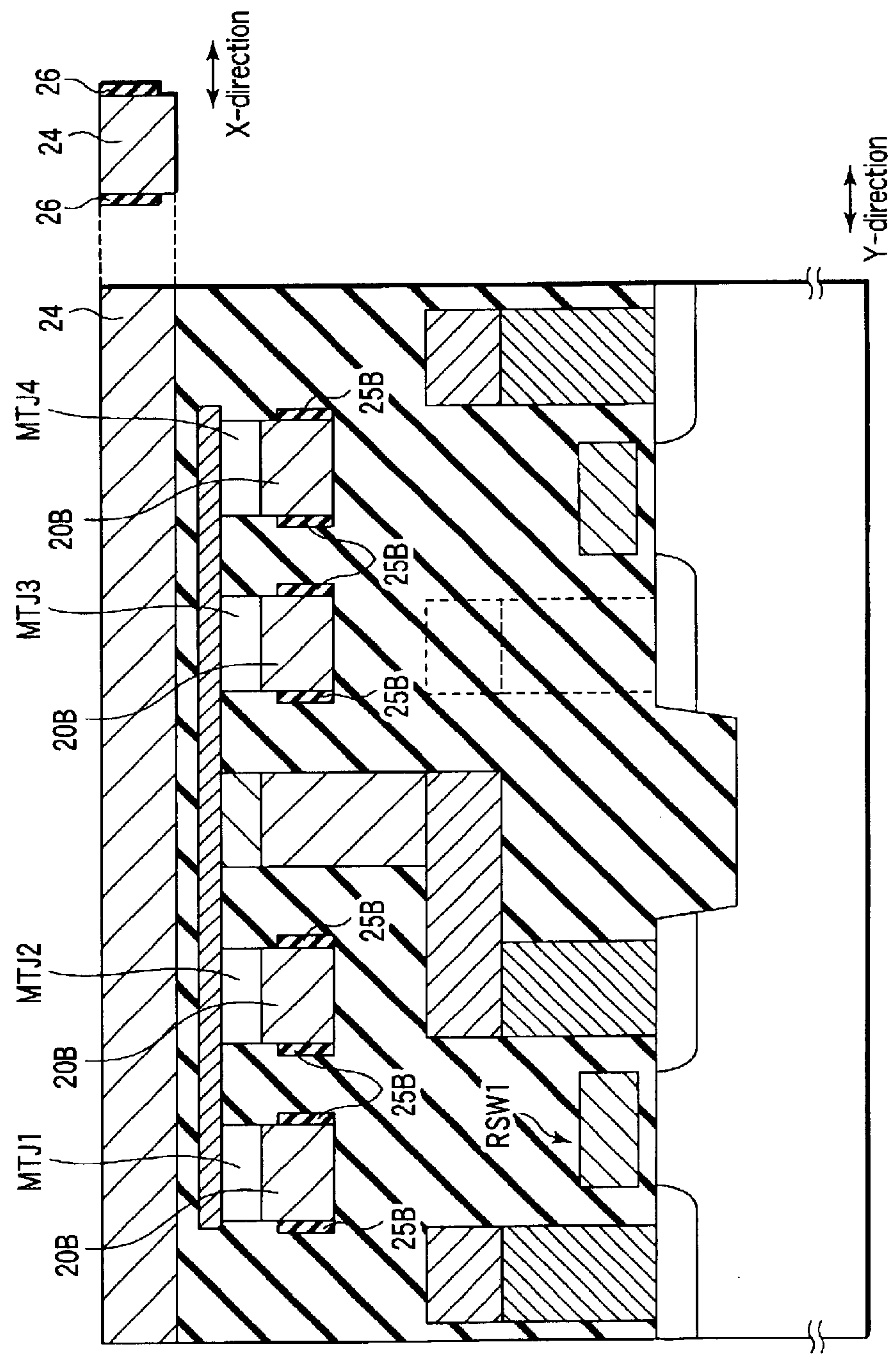
Figure 222:
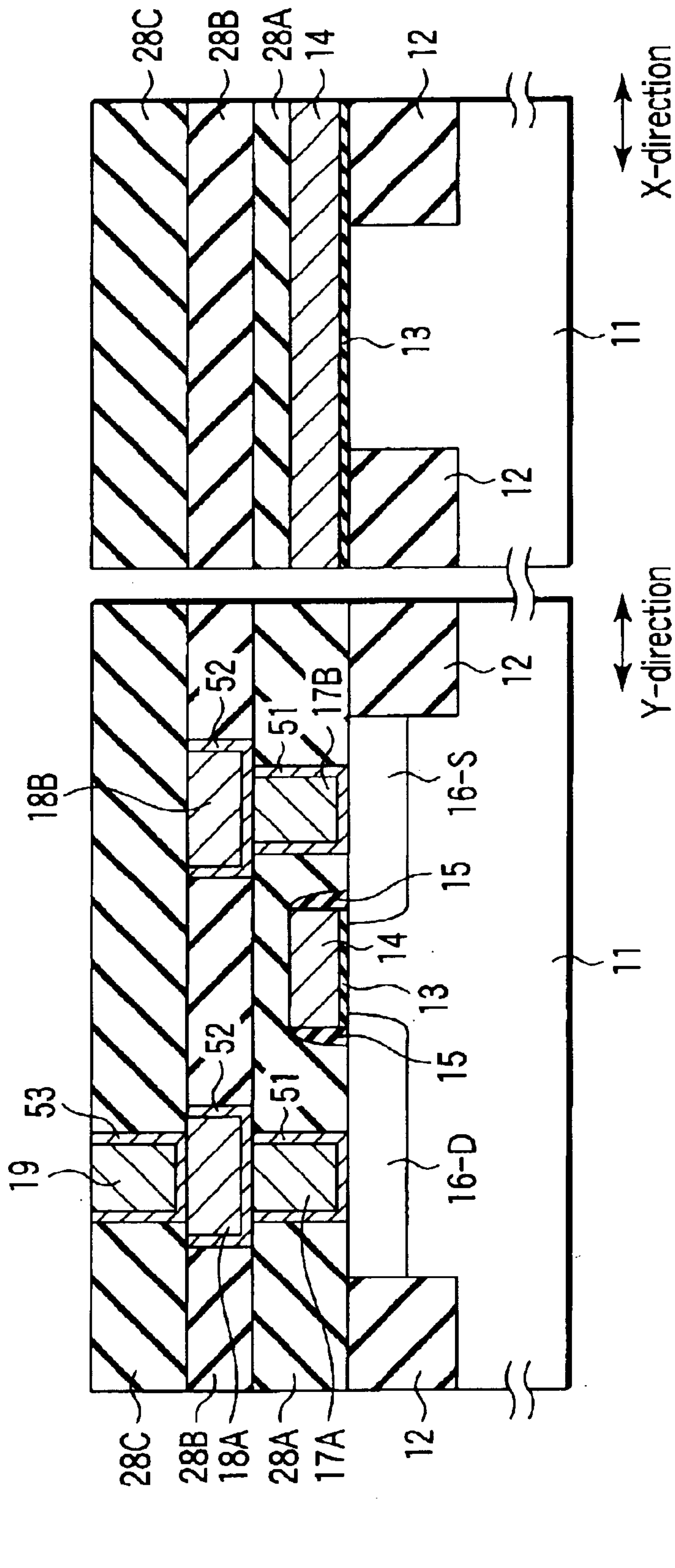
Figure 223:
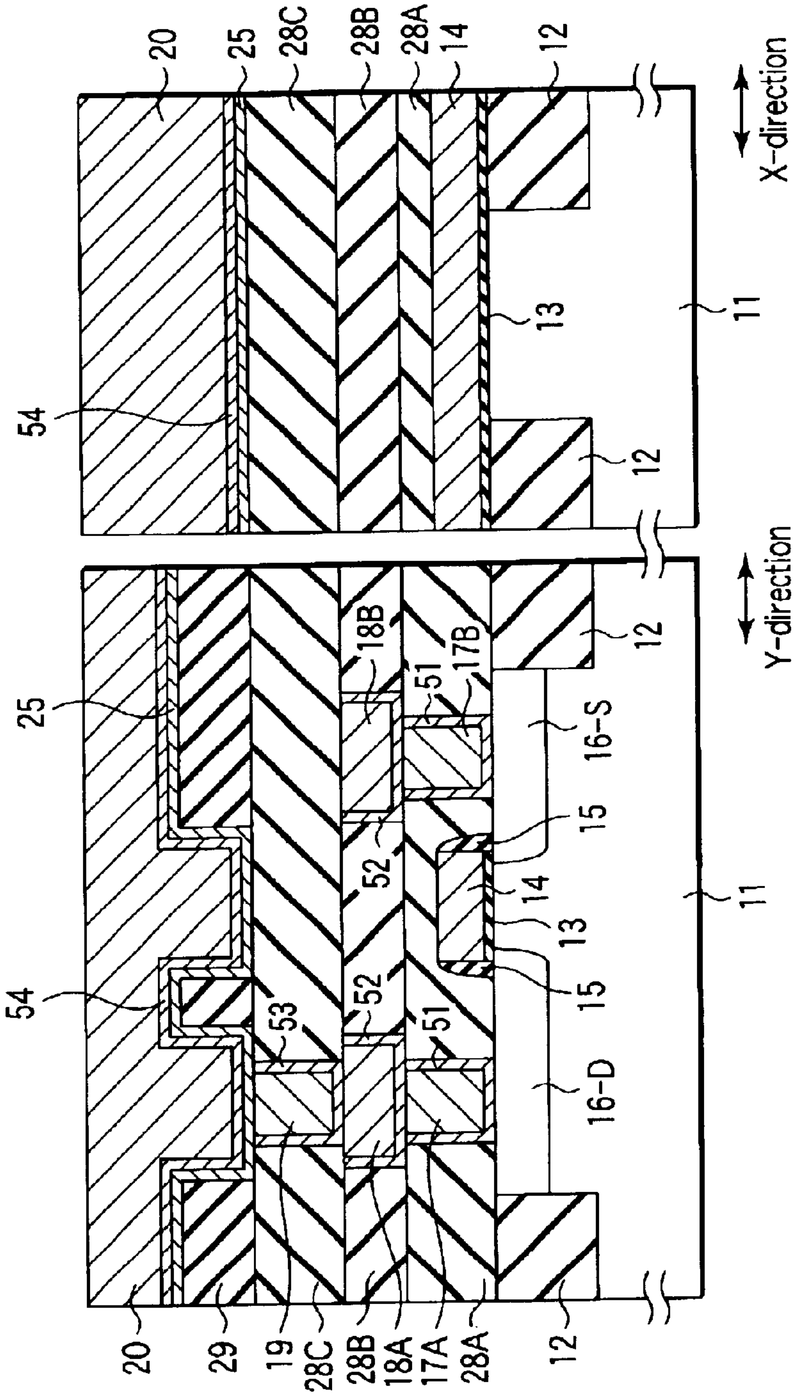
Figure 224:
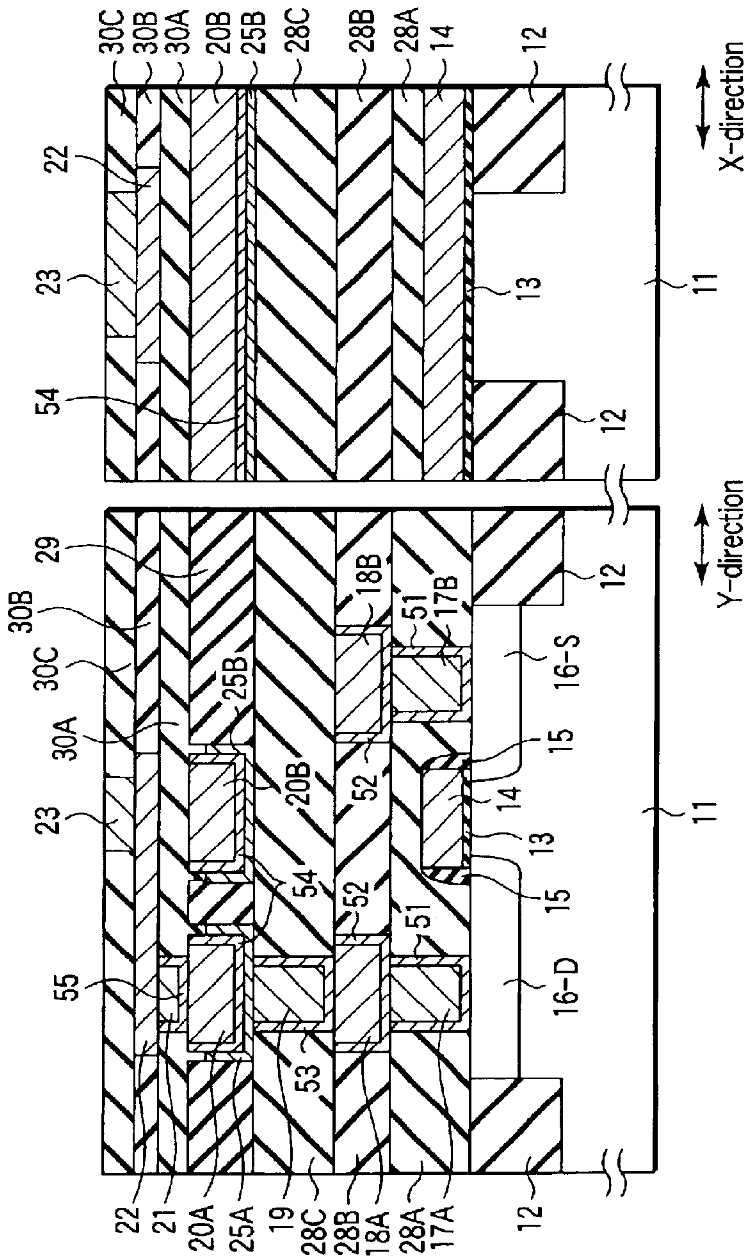
Figure 226:
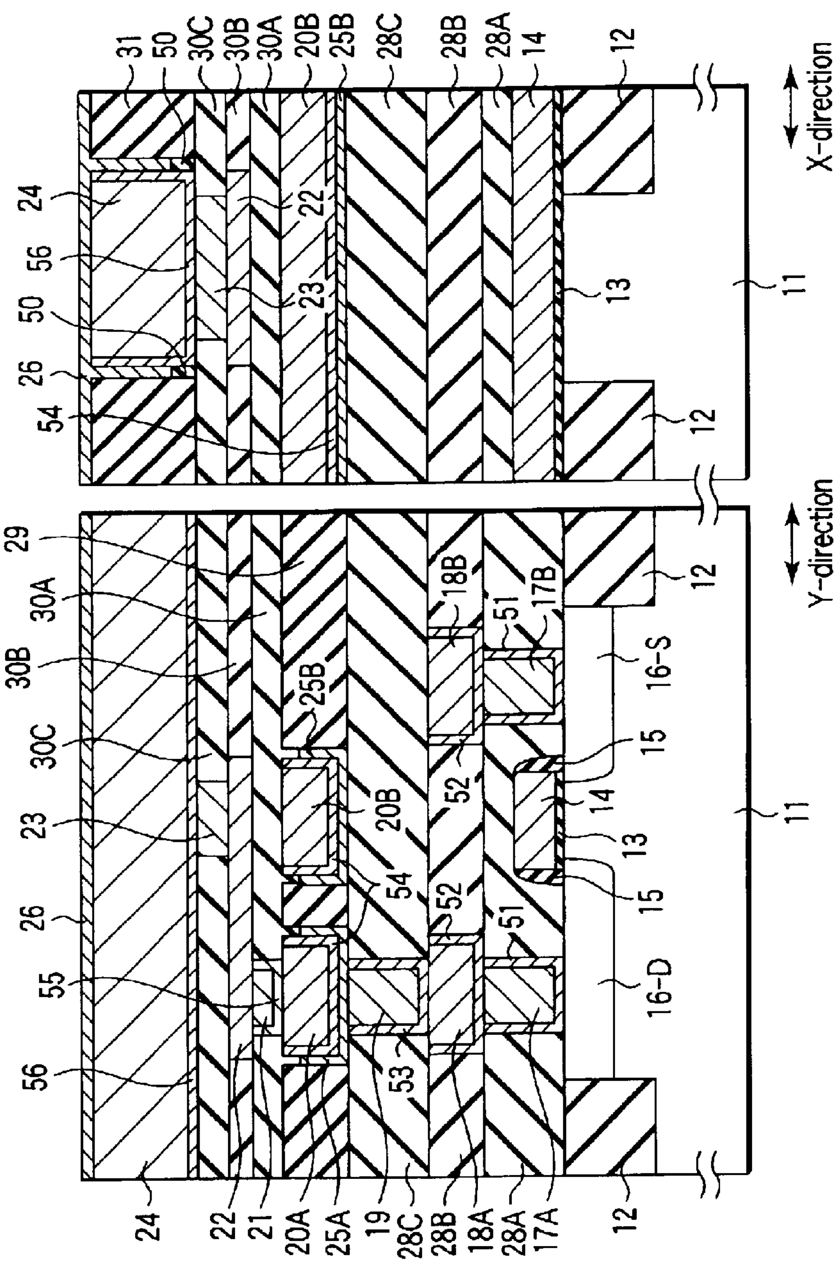
Figure 227:
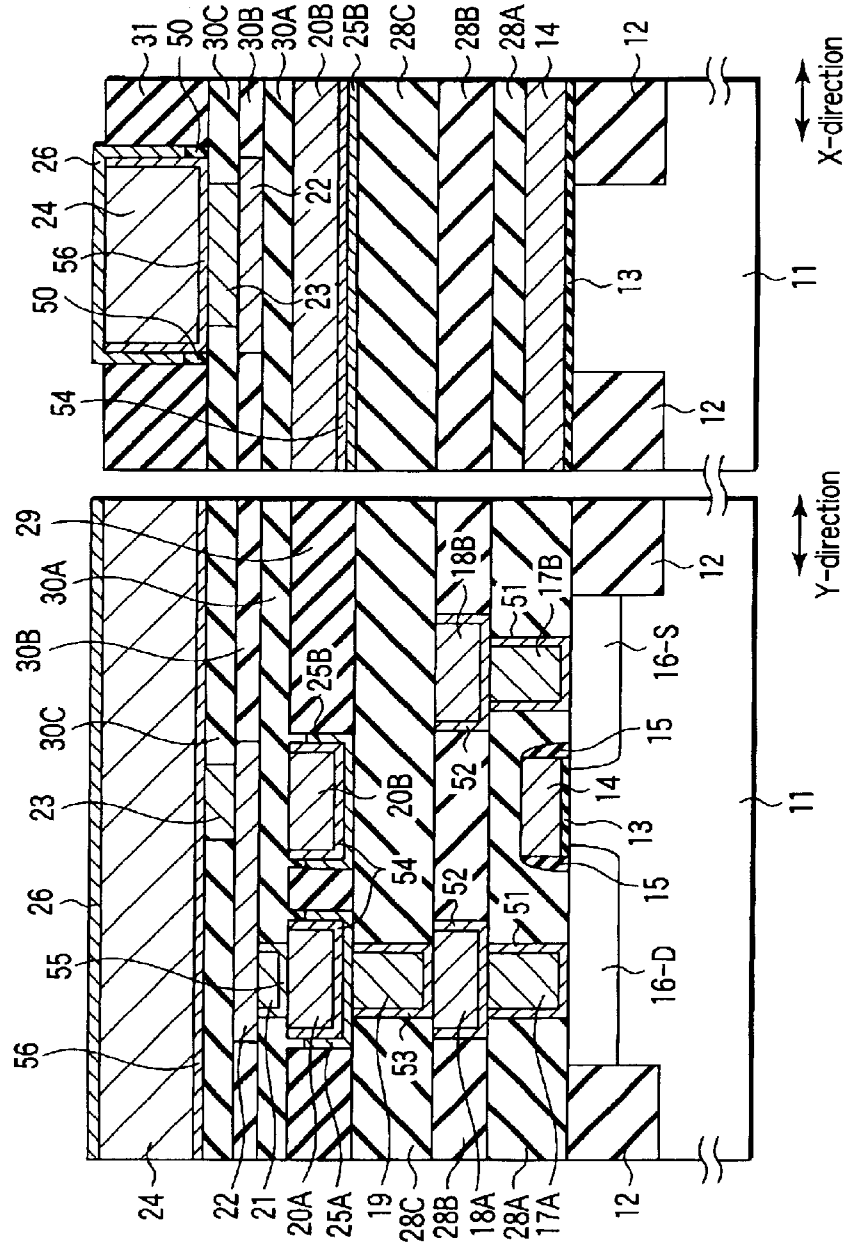
Figure 228:
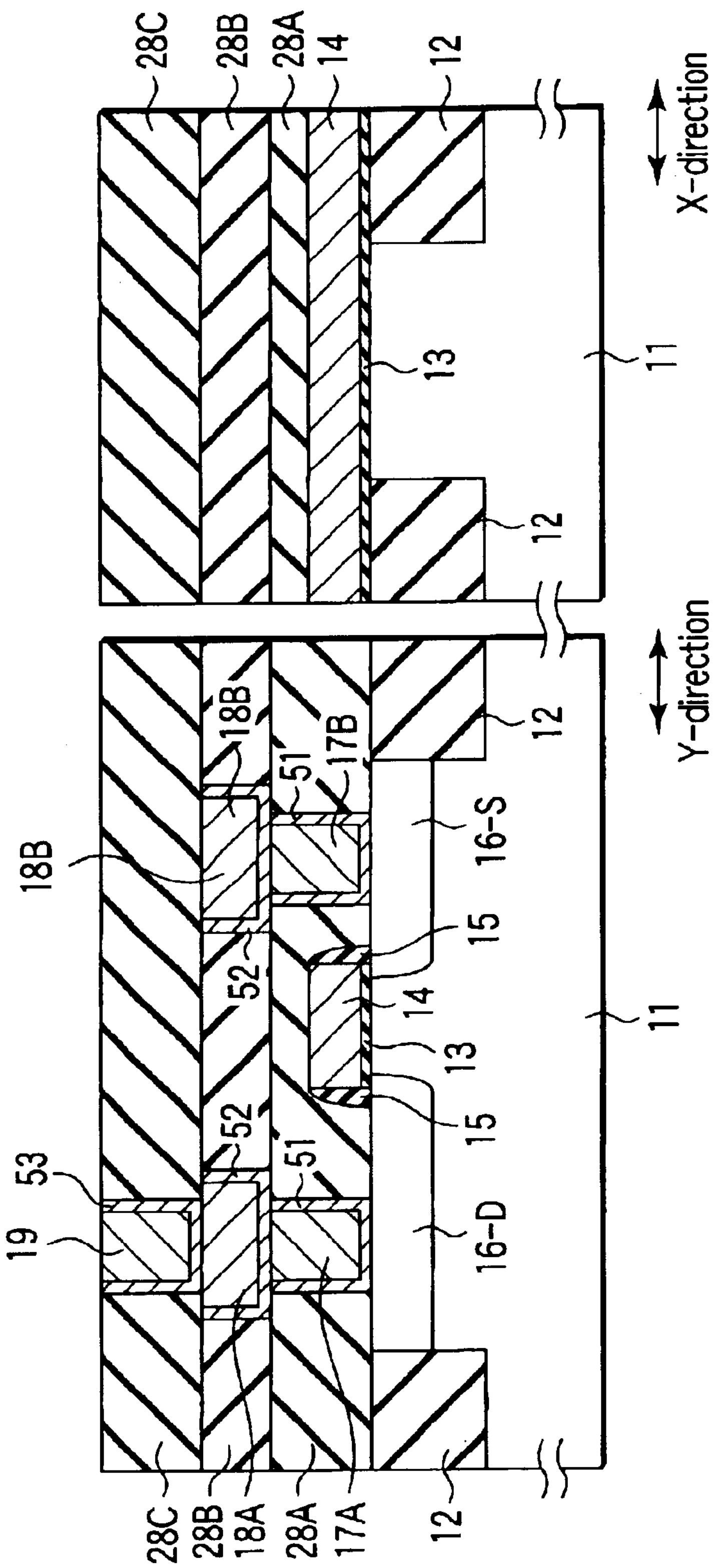
Figure 229:
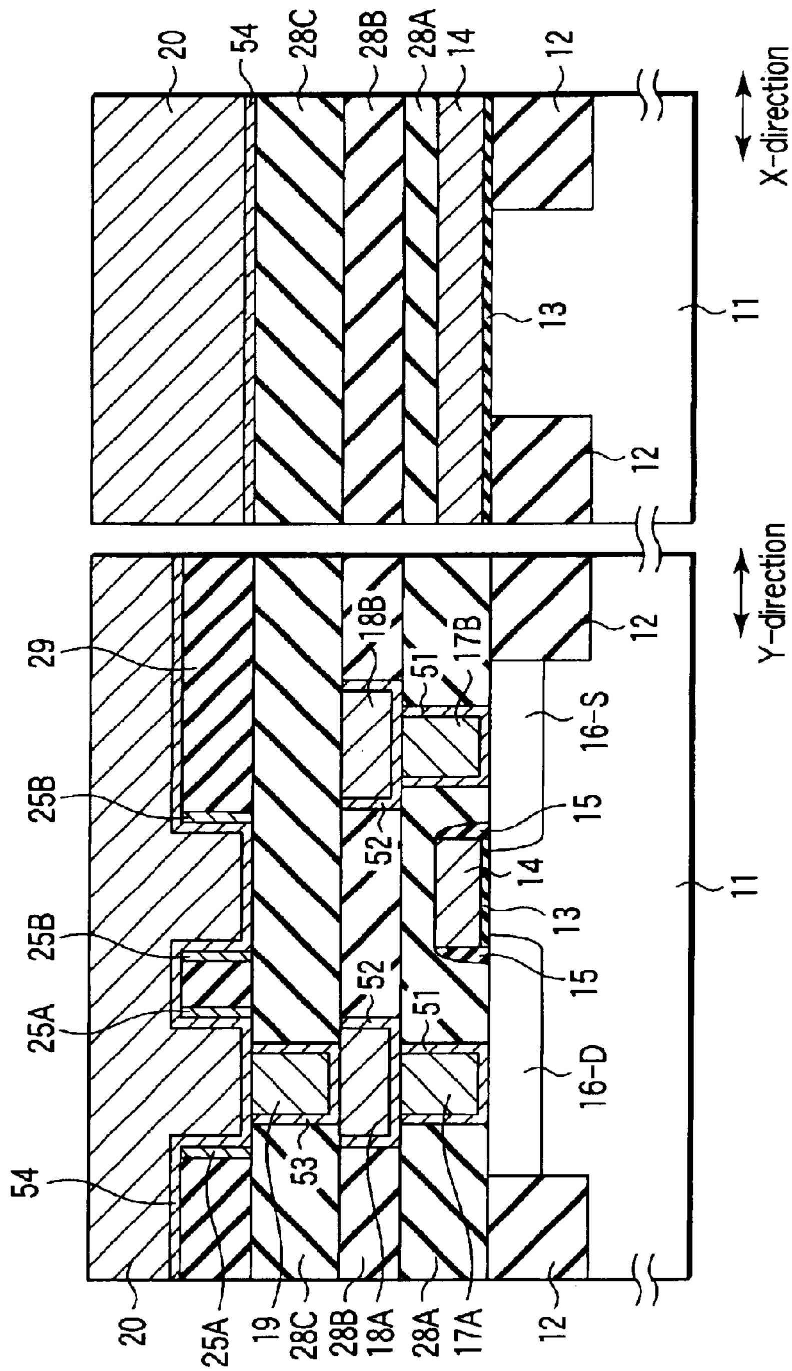
Figure 230:
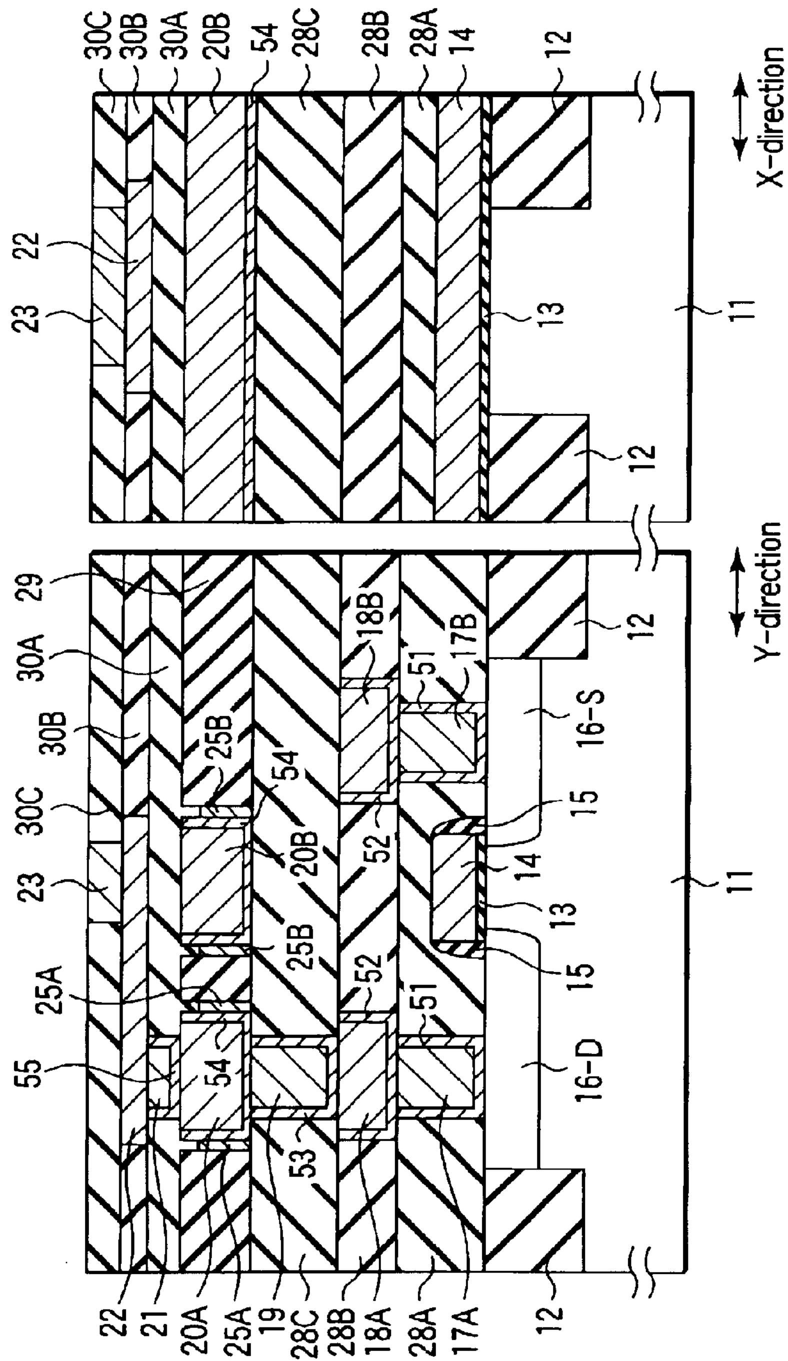
Figure 231:
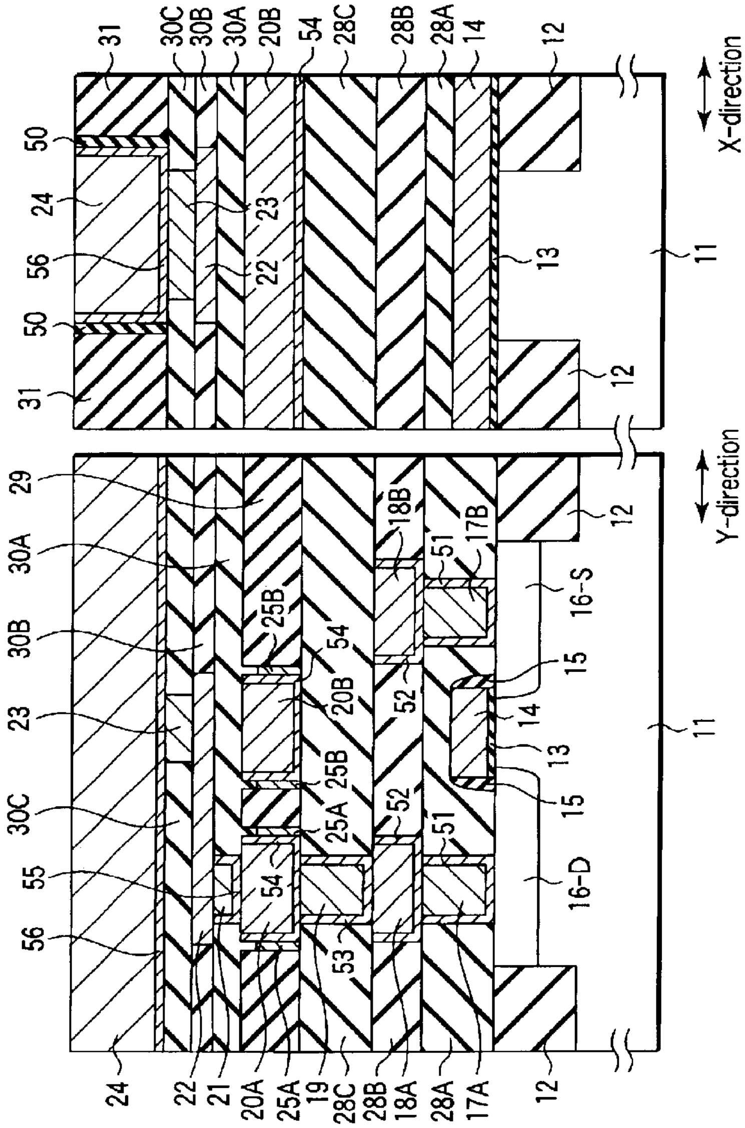
Figure 232:
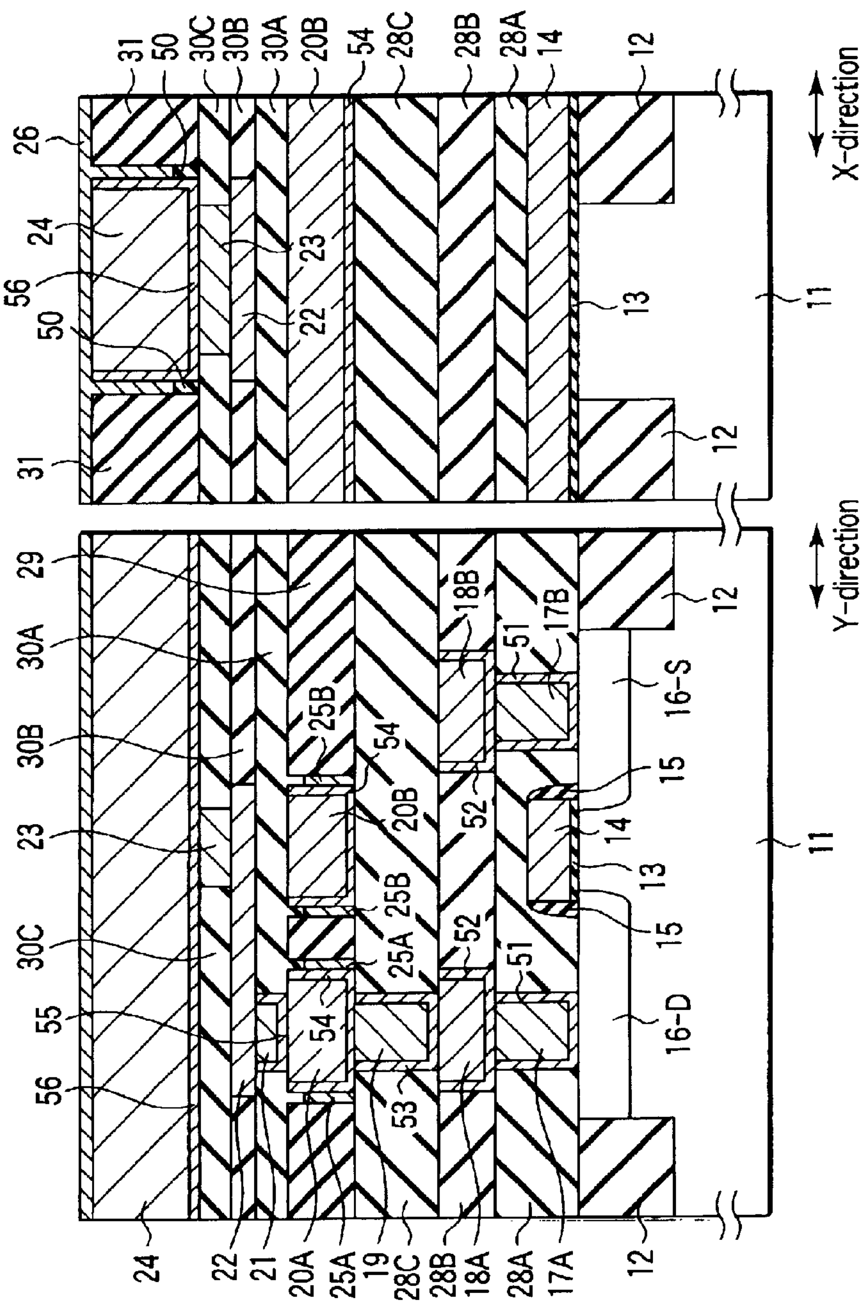
Figure 233:
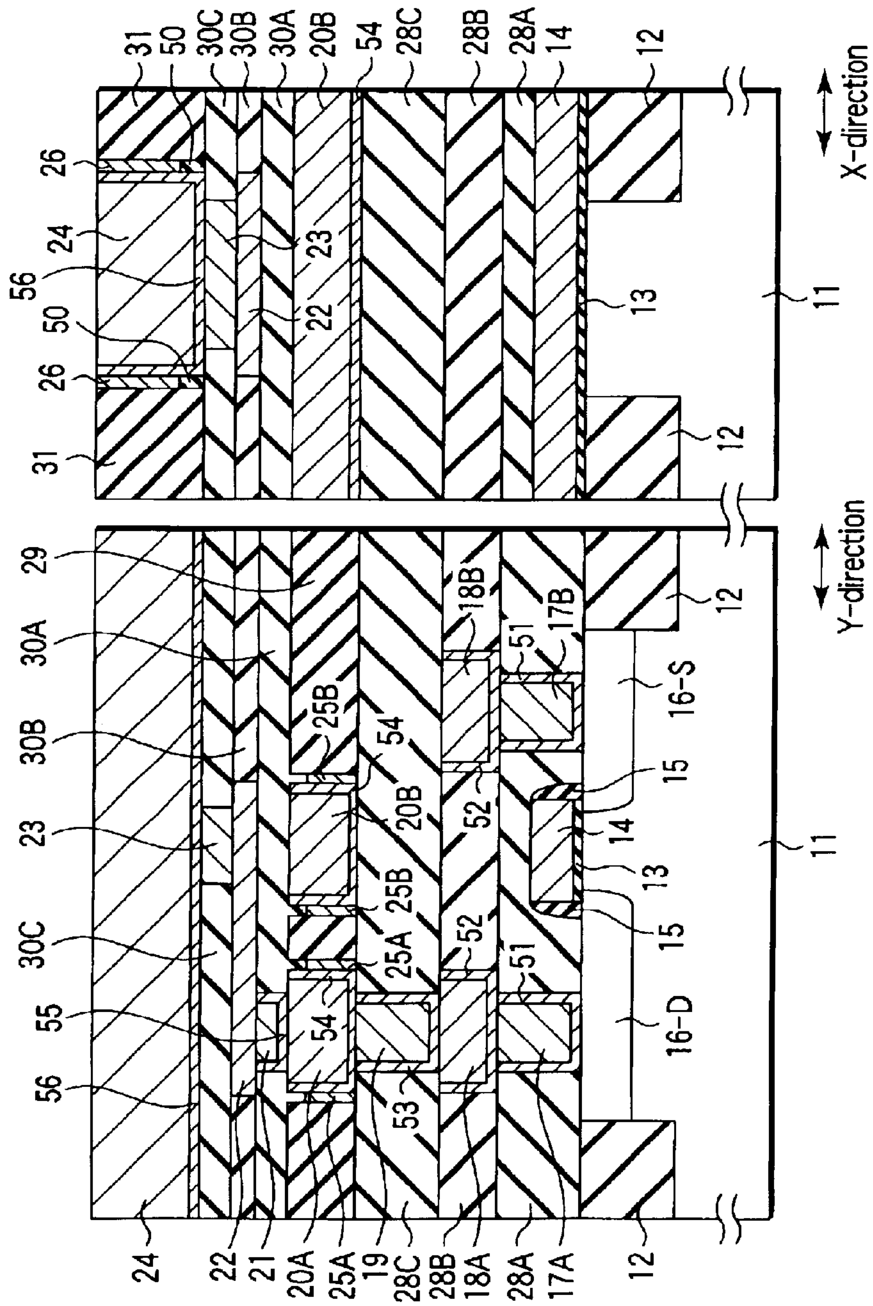
Figure 234:
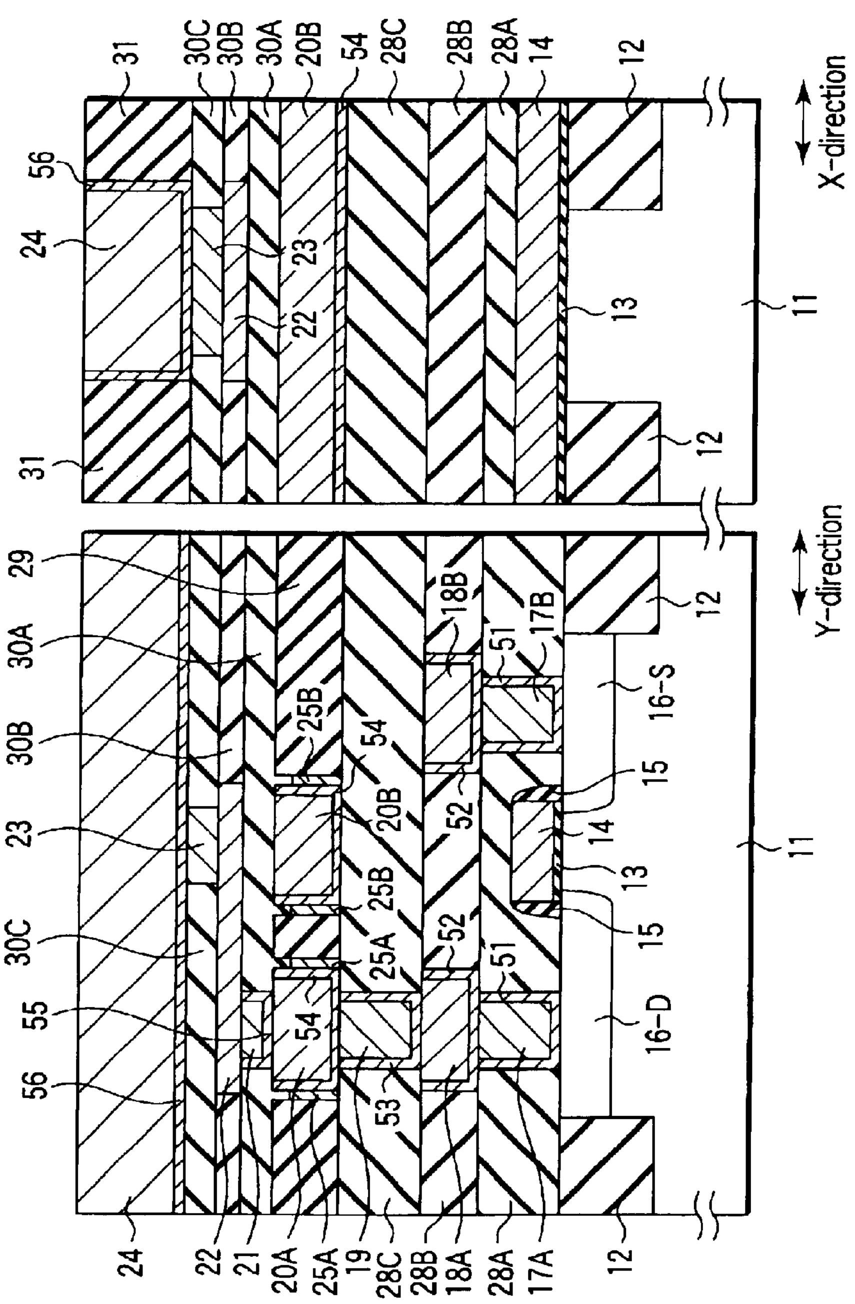
Figure 235:
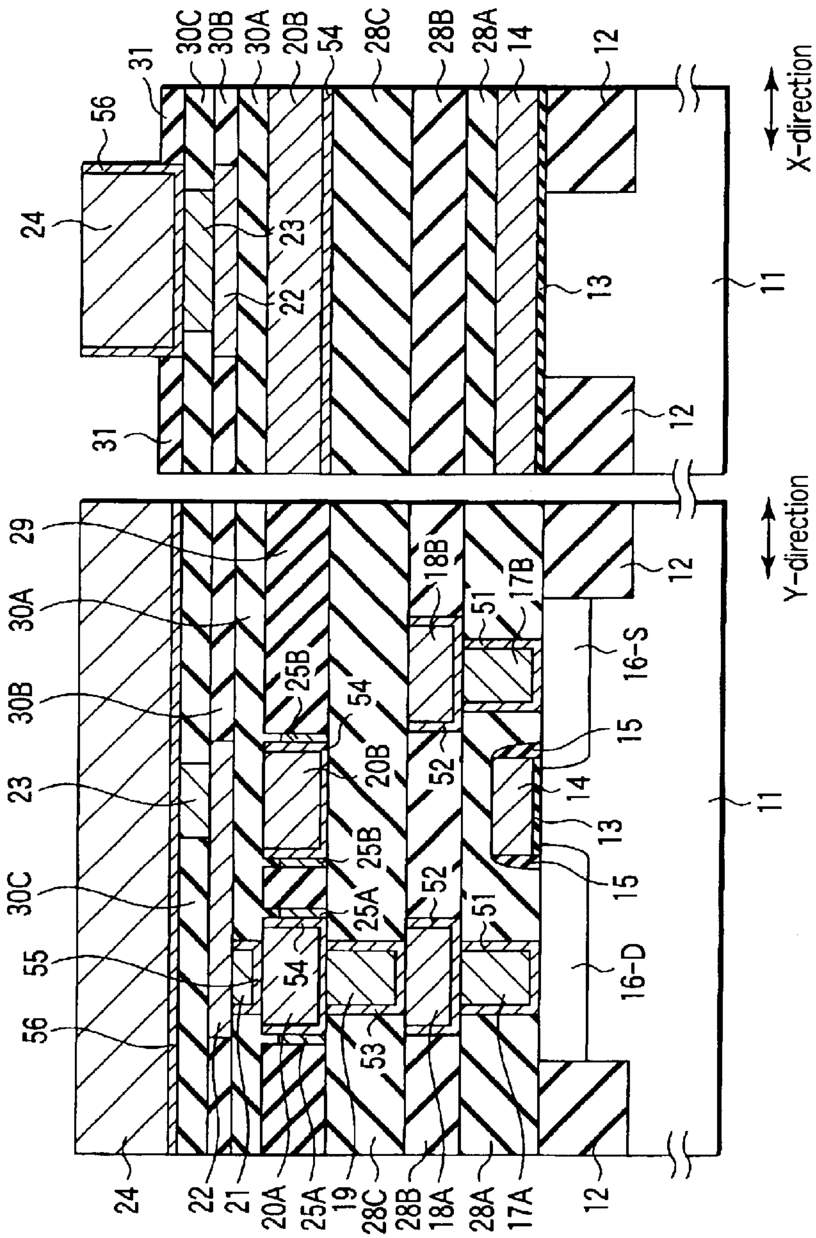
Figure 236:
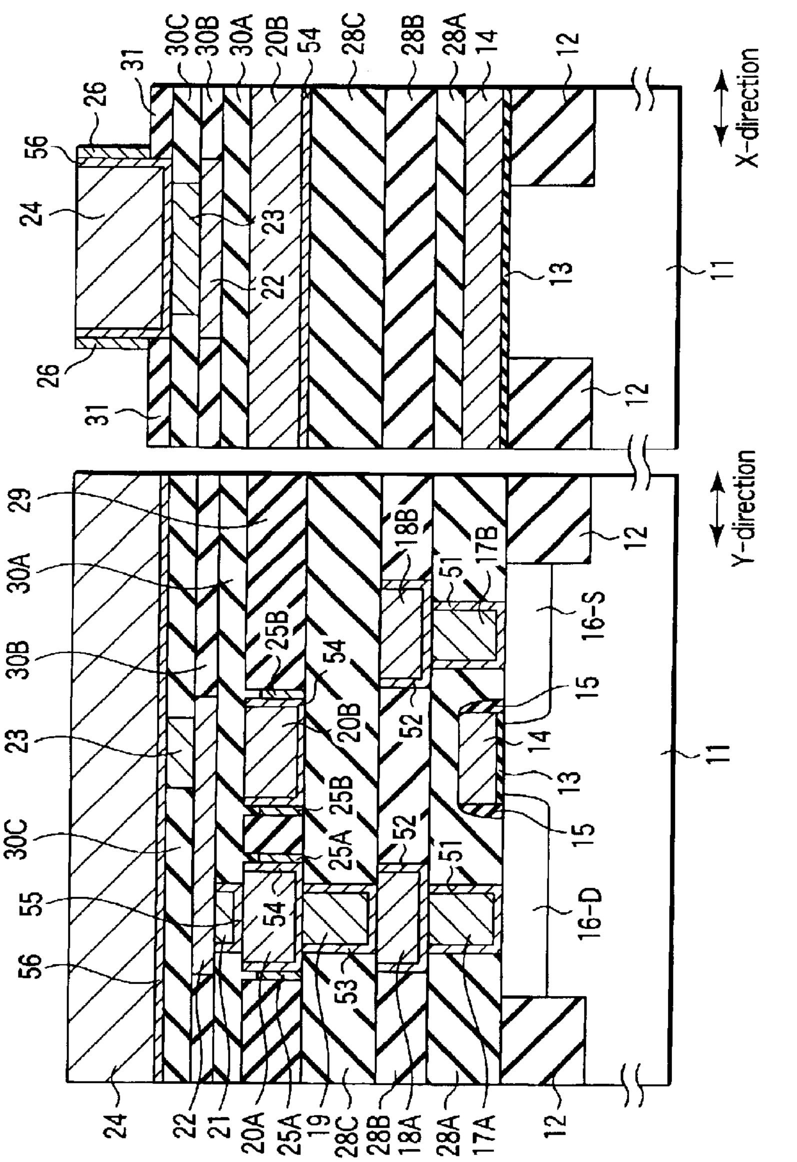

FIG. 132 is a sectional view showing the magnetic random access memory of Example 10 of the second invention;

FIG. 133 is a sectional view showing the magnetic random access memory of Example 10 of the second invention;

FIG. 134 is a sectional view showing the magnetic random access memory of Example 11 of the second invention;

FIG. 135 is a sectional view showing the magnetic random access memory of Example 11 of the second invention;

FIG. 136 is a sectional view showing the magnetic random access memory of Example 12 of the second invention;

FIG. 137 is a sectional view showing the magnetic random access memory of Example 12 of the second invention;

FIG. 138 is a circuit diagram showing a structure of a cell array according to an example of the present invention;

FIG. 139 is a diagram showing an operation waveform of the cell array of FIG. 138;

FIG. 140 is a sectional view showing one step of the manufacturing method of the device structure of Example 3 of the second invention;

FIG. 141 is a sectional view showing one step of the manufacturing method of the device structure of Example 3 of the second invention;

FIG. 142 is a sectional view showing one step of the manufacturing method of the device structure of Example 3 of the second invention;

FIG. 143 is a sectional view showing one step of the manufacturing method of the device structure of Example 3 of the second invention;

FIG. 144 is a sectional view showing one step of the manufacturing method of the device structure of Example 6 of the second invention;

FIG. 145 is a sectional view showing one step of the manufacturing method of the device structure of Example 6 of the second invention;

FIG. 146 is a sectional view showing one step of the manufacturing method of the device structure of Example 6 of the second invention;

FIG. 147 is a sectional view showing one step of the manufacturing method of the device structure of Example 6 of the second invention;

FIG. 148 is a sectional view showing the magnetic random access memory of Example 1 of a third invention;

FIG. 149 is a sectional view showing the magnetic random access memory of Example 1 of the third invention;

FIG. 150 is a sectional view showing the magnetic random access memory of Example 1 of the third invention;

FIG. 151 is a sectional view showing the magnetic random access memory of Example 1 of the third invention;

FIG. 152 is a sectional view showing the modification example of Example 1 of the third invention;

FIG. 153 is a sectional view showing the modification example of Example 1 of the third invention;

FIG. 154 is a sectional view showing the modification example of Example 1 of the third invention;

FIG. 155 is a sectional view showing the modification example of Example 1 of the third invention;

FIG. 156 is a sectional view showing the modification example of Example 1 of the third invention;

FIG. 157 is a sectional view showing the modification example of Example 1 of the third invention;

FIG. 158 is a sectional view showing the modification example of Example 1 of the third invention;

FIG. 159 is a sectional view showing the modification example of Example 1 of the third invention;

FIG. 160 is a sectional view showing the magnetic random access memory of Example 2 of the third invention;

FIG. 161 is a sectional view showing the magnetic random access memory of Example 2 of the third invention;

FIG. 162 is a sectional view showing the magnetic random access memory of Example 2 of the third invention;

FIG. 163 is a sectional view showing the magnetic random access memory of Example 2 of the third invention;

FIG. 164 is a sectional view showing the modification example of Example 2 of the third invention;

FIG. 165 is a sectional view showing the modification example of Example 2 of the third invention;

FIG. 166 is a sectional view showing the modification example of Example 2 of the third invention;

FIG. 167 is a sectional view showing the modification example of Example 2 of the third invention;

FIG. 168 is a sectional view showing the modification example of Example 2 of the third invention;

FIG. 169 is a sectional view showing the modification example of Example 2 of the third invention;

FIG. 170 is a sectional view showing the modification example of Example 2 of the third invention;

FIG. 171 is a sectional view showing the modification example of Example 2 of the third invention;

FIG. 172 is a sectional view showing the magnetic random access memory of Example 3 of the third invention;

FIG. 173 is a sectional view showing the magnetic random access memory of Example 3 of the third invention;

FIG. 174 is a sectional view showing the magnetic random access memory of Example 3 of the third invention;

FIG. 175 is a sectional view showing the magnetic random access memory of Example 3 of the third invention;

FIG. 176 is a sectional view showing the magnetic random access memory of Example 4 of the third invention;

FIG. 177 is a sectional view showing the magnetic random access memory of Example 4 of the third invention;

FIG. 178 is a sectional view showing the magnetic random access memory of Example 4 of the third invention;

FIG. 179 is a sectional view showing the magnetic random access memory of Example 4 of the third invention;

FIG. 180 is a sectional view showing the modification example of Example 4 of the third invention;

FIG. 181 is a sectional view showing the modification example of Example 4 of the third invention;

FIG. 182 is a sectional view showing the modification example of Example 4 of the third invention;

FIG. 183 is a sectional view showing the modification example of Example 4 of the third invention;

FIG. 184 is a sectional view showing the modification example of Example 4 of the third invention;

FIG. 185 is a sectional view showing the modification example of Example 4 of the third invention;

FIG. 186 is a sectional view showing the modification example of Example 4 of the third invention;

FIG. 187 is a sectional view showing the modification example of Example 4 of the third invention;

FIG. 188 is a sectional view showing the magnetic random access memory of Example 5 of the third invention;

FIG. 189 is a sectional view showing the magnetic random access memory of Example 5 of the third invention;

FIG. 190 is a sectional view showing the magnetic random access memory of Example 5 of the third invention;

FIG. 191 is a sectional view showing the magnetic random access memory of Example 5 of the third invention;

FIG. 192 is a sectional view showing the modification example of Example 5 of the third invention;

FIG. 193 is a sectional view showing the modification example of Example 5 of the third invention;

FIG. 194 is a sectional view showing the modification example of Example 5 of the third invention;

FIG. 195 is a sectional view showing the modification example of Example 5 of the third invention;

FIG. 196 is a sectional view showing the modification example of Example 5 of the third invention;

FIG. 197 is a sectional view showing the modification example of Example 5 of the third invention;

FIG. 198 is a sectional view showing the modification example of Example 5 of the third invention;

FIG. 199 is a sectional view showing the modification example of Example 5 of the third invention;

FIG. 200 is a sectional view showing the magnetic random access memory of Example 6 of the third invention;

FIG. 201 is a sectional view showing the magnetic random access memory of Example 6 of the third invention;

FIG. 202 is a sectional view showing the magnetic random access memory of Example 6 of the third invention;

FIG. 203 is a sectional view showing the magnetic random access memory of Example 6 of the third invention;

FIG. 204 is a sectional view showing the magnetic random access memory of Example 7 of the third invention;

FIG. 205 is a sectional view showing the magnetic random access memory of Example 7 of the third invention;

FIG. 206 is a sectional view showing the magnetic random access memory of Example 8 of the third invention;

FIG. 207 is a sectional view showing the magnetic random access memory of Example 8 of the third invention;

FIG. 208 is a sectional view showing the magnetic random access memory of Example 9 of the third invention;

FIG. 209 is a sectional view showing the magnetic random access memory of Example 9 of the third invention;

FIG. 210 is a sectional view showing the magnetic random access memory of Example 9 of the third invention;

FIG. 211 is a sectional view showing the magnetic random access memory of Example 9 of the third invention;

FIG. 212 is a sectional view showing the magnetic random access memory of Example 10 of the third invention;

FIG. 213 is a sectional view showing the magnetic random access memory of Example 10 of the third invention;

FIG. 214 is a sectional view showing the magnetic random access memory of Example 10 of the third invention;

FIG. 215 is a sectional view showing the magnetic random access memory of Example 10 of the third invention;

FIG. 216 is a sectional view showing the magnetic random access memory of Example 11 of the third invention;

FIG. 217 is a sectional view showing the magnetic random access memory of Example 11 of the third invention;

FIG. 218 is a sectional view showing the magnetic random access memory of Example 12 of the third invention;

FIG. 219 is a sectional view showing the magnetic random access memory of Example 12 of the third invention;

FIG. 220 is a circuit diagram showing the structure of the cell array according to the example of the present invention;

FIG. 221 is a diagram showing the operation waveform of the cell array of FIG. 220;

FIG. 222 is a sectional view showing one step of the manufacturing method of the device structure of Example 3 of the third invention;

FIG. 223 is a sectional view showing one step of the manufacturing method of the device structure of Example 3 of the third invention;

FIG. 224 is a sectional view showing one step of the manufacturing method of the device structure of Example 3 of the third invention;

FIG. 225 is a sectional view showing one step of the manufacturing method of the device structure of Example 3 of the third invention;

FIG. 226 is a sectional view showing one step of the manufacturing method of the device structure of Example 3 of the third invention;

FIG. 227 is a sectional view showing one step of the manufacturing method of the device structure of Example 3 of the third invention;

FIG. 228 is a sectional view showing one step of the manufacturing method of the device structure of Example 6 of the third invention;

FIG. 229 is a sectional view showing one step of the manufacturing method of the device structure of Example 6 of the third invention;

FIG. 230 is a sectional view showing one step of the manufacturing method of the device structure of Example 6 of the third invention;

FIG. 231 is a sectional view showing one step of the manufacturing method of the device structure of Example 6 of the third invention;

FIG. 232 is a sectional view showing one step of the manufacturing method of the device structure of Example 6 of the third invention;

FIG. 233 is a sectional view showing one step of the manufacturing method of the device structure of Example 6 of the third invention;

FIG. 234 is a sectional view showing one step of the manufacturing method of the device structure of Example 6 of the third invention;

FIG. 235 is a sectional view showing one step of the manufacturing method of the device structure of Example 6 of the third invention; and FIG. 236 is a sectional view showing one step of the manufacturing method of the device structure of Example 6 of the third invention.

DETAILED DESCRIPTION OF THE INVENTION

A magnetic random access memory according to examples of first, second, and third inventions of the present application will be described hereinafter in detail with reference to the drawings.

REFERENCE EXAMPLE

To describe the magnetic random access memory according to the examples of the first, second, and third inventions of the present application, a device structure as assumption will first be described.

It is to be noted that this device structure is described for a purpose of briefly describing the magnetic random access memory according to the examples of the first, second, and third inventions of the present application, and the present invention is not limited to this device structure.

1. Reference Example 1

Figure 6:
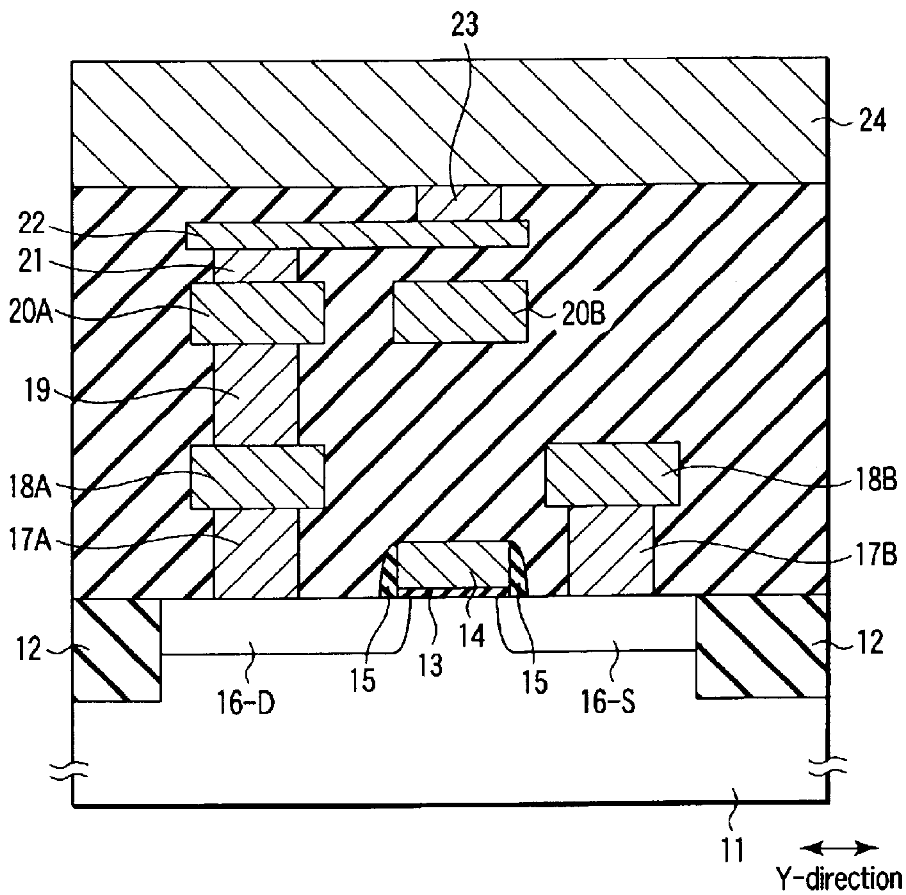
FIG. 6 is a sectional view showing the magnetic random access memory of Reference Example 1.
Figure 7:
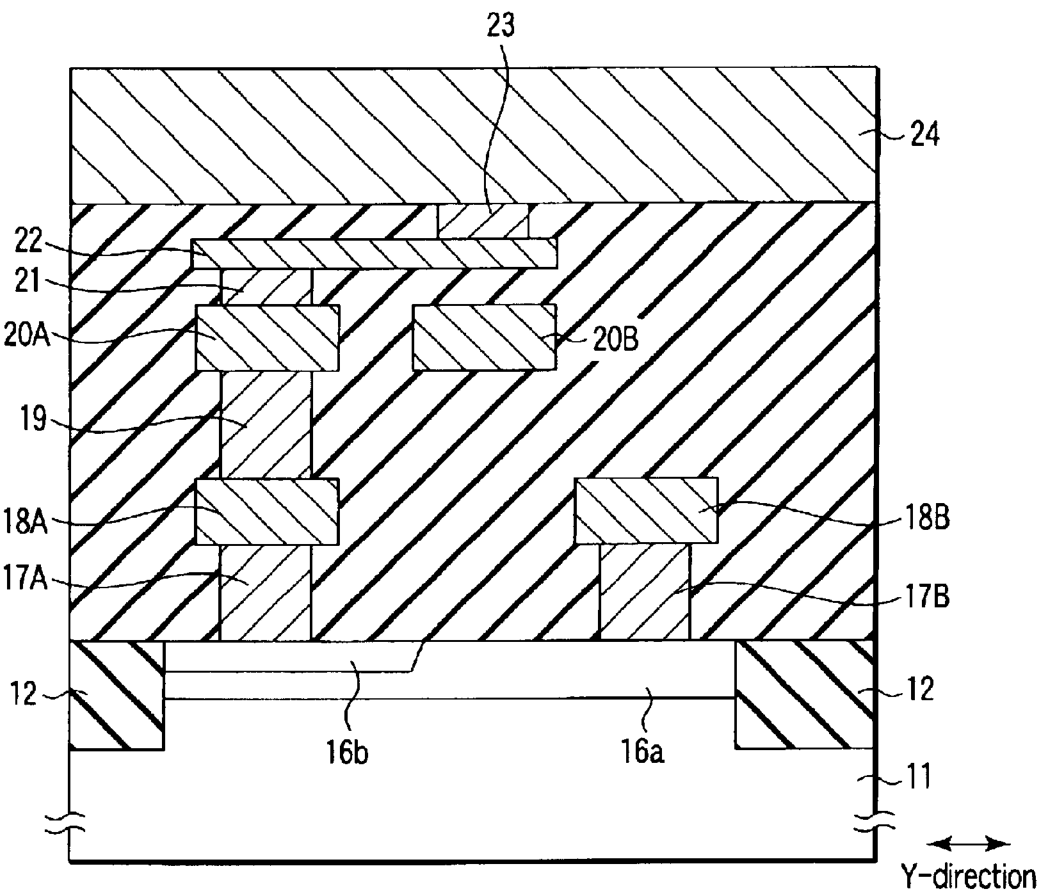
FIG. 7 is a sectional view showing the magnetic random access memory of Reference Example 1.

FIGS. 6 and 7 show the device structure which is the assumption of the magnetic random access memory according to the examples of the first, second, and third invention of the present application.

In a semiconductor substrate (e.g., p-type silicon substrate, p-type well region, and the like) 11, an element isolation insulating layer 12 including a shallow trench isolation (STI) structure is formed. A region surrounded by the element isolation insulating layer 12 is an element region in which a read selection switch (e.g., MOS transistor, diode, and the like) is formed.

In the device structure of FIG. 6, the read selection switch is constituted of the MOS transistor (n-channel type MOS transistor). On the semiconductor substrate 11, a gate insulating layer 13, gate electrode 14, and side wall insulating layer 15 are formed. The gate electrode 14 extends in an X direction, and functions as a read word line for selecting a read cell (MTJ element) at a read operation time.

In the semiconductor substrate 11, a source region (e.g., n-type diffused layer) 16-S and drain region (e.g., n-type diffused layer) 16-D are formed. The gate electrode (read word line) 14 is disposed in a channel region between the source region 16-S and drain region 16-D.

In the device structure of FIG. 7, a read selection switch is constituted of a diode. In the semiconductor substrate 11, a cathode region (e.g., the n-type diffused layer) 16*a* and anode region (e.g., p-type diffused layer) 16*b* are formed.

One of metal layers constituting a first metal wiring layer functions as an intermediate layer 18A in which contact plugs are vertically stacked, and another layer functions as a source line 18B (in FIG. 6) or read word line 18B (in FIG. 7).

In the device structure of FIG. 6, the intermediate layer 18A is electrically connected to the drain region 16-D of the read selection switch (MOS transistor) via a contact plug 17A. The source line 18B is electrically connected to the source region 16-S of the read selection switch via a contact plug 17B. The source line 18B extends in the X direction in the same manner as the gate electrode (read word line) 14.

In the device structure of FIG. 7, the intermediate layer 18A is electrically connected to the anode region 16*b* of the read selection switch (diode) via the contact plug 17A. The read word line 18B is electrically connected to the cathode region 16*a* of the read selection switch via the contact plug 17B. The read word line 18B extends in the X direction.

One of the metal layers constituting a second metal wiring layer functions as an intermediate layer 20A in which contact plugs are vertically stacked, and another layer functions as a write word line 20B. The intermediate layer 20A is electrically connected to the intermediate layer 18A via a contact plug 19. The write word line 20B extends, for example, in the X direction.

One of the metal layers constituting a third metal wiring layer functions as a lower electrode 22 of an MTJ element 23. The lower electrode 22 is electrically connected to the intermediate layer 20A via a contact plug 21. The MTJ element 23 is mounted on the lower electrode 22. Here, the MTJ element 23 is disposed right on the write word line 20B, and formed in a rectangular shape long in the X direction (magnetization easy axis corresponds to the X direction).

One of the metal layers constituting a fourth metal wiring layer functions as a data selection line (read/write bit line) 24. The data selection line 24 is electrically connected to the MTJ element 23, and extends in a Y direction.

Figure 1:
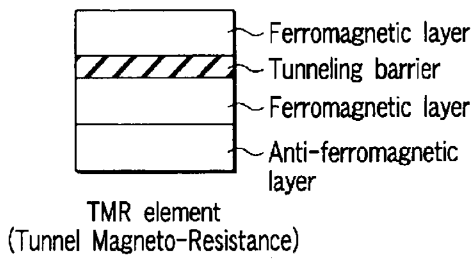
FIG. 1 is a diagram showing a structure example of an MTJ element.
Figure 2:
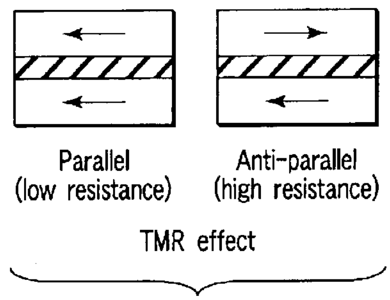
FIG. 2 is a diagram showing two states of the MTJ element.
Figure 3:
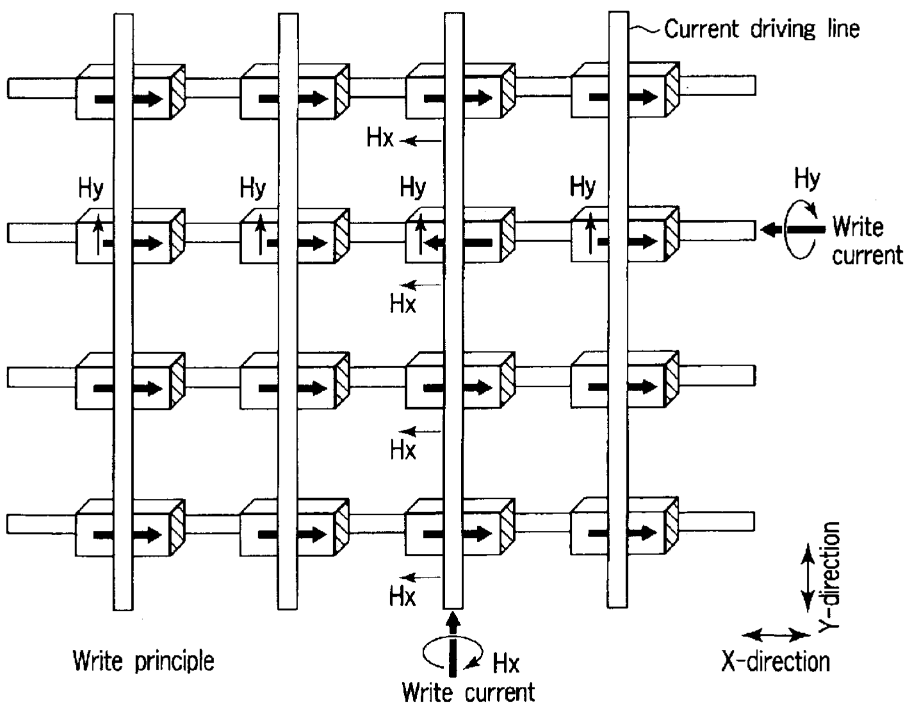
FIG. 3 is a diagram showing a write operation principle of a magnetic random access memory.
Figure 4:
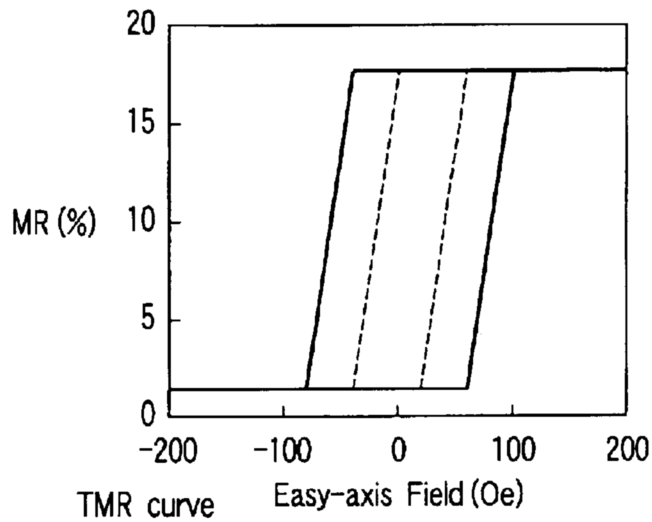
FIG. 4 is a diagram showing a TMR curve.
Figure 5:
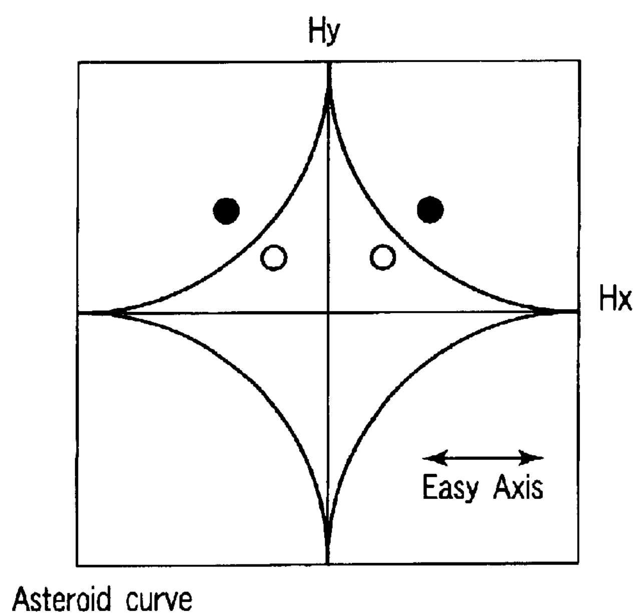
FIG. 5 is a diagram showing an asteroid curve.

It is to be noted that the structure of the MTJ element 23 is not especially limited. The structure shown in FIG. 1 or another structure may also be used. Moreover, the MTJ element 23 may also be of a multi-valued storage type in which data of bits can be stored.

The ferromagnetic layer of the MTJ element 23 is not especially limited. For example, in addition to Fe, Co, Ni, or alloy of these metals, magnetite large in spin polarization ratio, and oxides such as $CrO_2$, $RXMnO_{3-y}$ (R: rare earth, X: Ca, Ba, Sr), Heusler alloys such as NiMnSb and PtMnSb can be used.

Even when the ferromagnetic layer contains some non-magnetic elements such as Ag, Cu, Au, Al, Mg, Si, Bi, Ta, B, C, O, N, Pd, Pt, Zr, Ir, W, Mo, Nb, there is no problem as long as ferromagnetism is not lost.

If the thickness of the ferromagnetic layer is too small, super-paramagnetism results. Then, the ferromagnetic layer needs to have a thickness to such an extent that at least the super-paramagnetism does not result. Concretely, the thickness of the ferromagnetic layer is set to 0.1 nm or more, preferably not less than 0.4 nm and not more than 100 nm.

As a diamagnetic layer of the MTJ element 23, for example, Fe—Mn, Pt—Mn, Pt—Cr—Mn, Ni—Mn, Ir—Mn, NiO, $Fe_2O_3$, and the like can be used.

As the insulating layer (tunnel barrier) of the MTJ element 23, for example, dielectric materials such as $Al_2O_3$, $SiO_2$, MgO, AlN, $Bi_2O_3$, $MgF_2$, $CaF_2$, $SrTiO_2$, and $AlLaO_3$ can be used. Even when an oxygen loss, nitrogen loss, or fluorine loss exists in these materials, there is no problem.

The thickness of the insulating layer (tunnel barrier) may be as small as possible, but there is not especially any determined limitation for realizing the function. Additionally, for the sake of manufacturing, the thickness of the insulating layer is set to 10 nm or less.

2. Reference Example 2

Next, with respect to the device structure of Reference Example 1, a device structure will be described which has been proposed to concentrate the magnetic field on the MTJ element with good efficiency.

Figure 8:
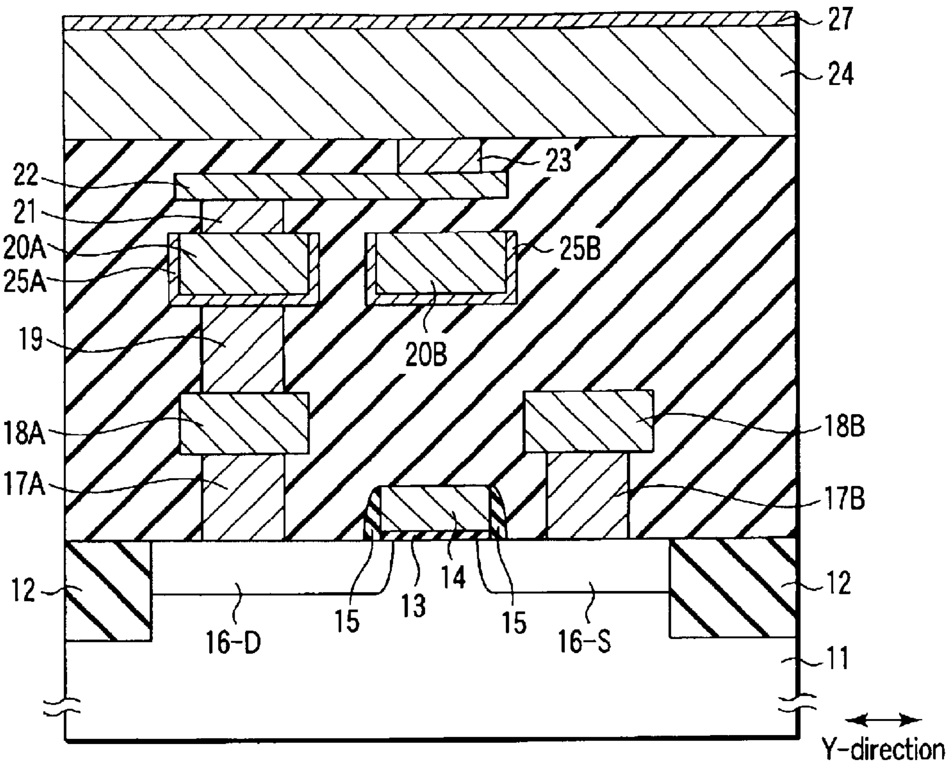
FIG. 8 is a sectional view showing the magnetic random access memory of Reference Example 2.
Figure 9:
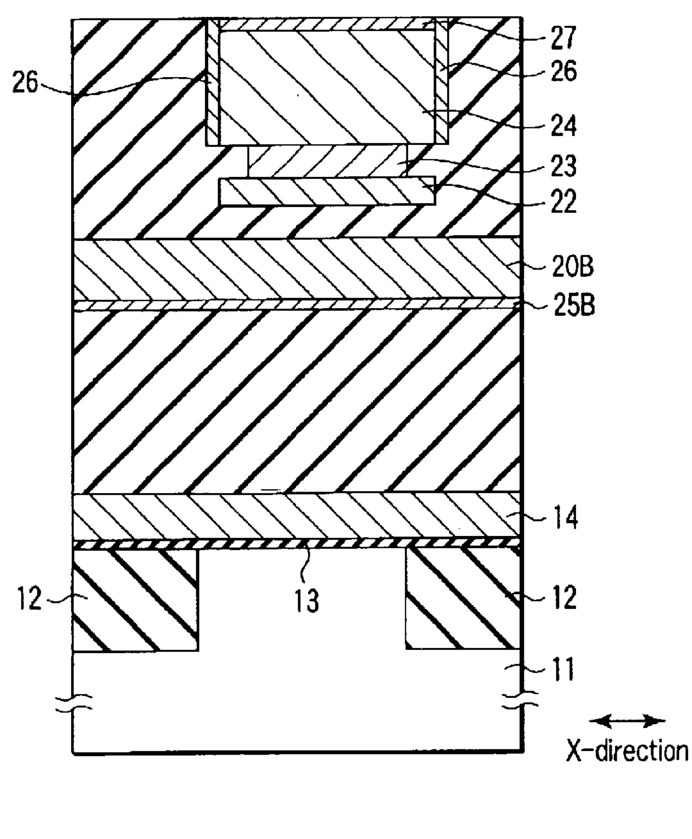
FIG. 9 is a sectional view showing the magnetic random access memory of Reference Example 2.
Figure 10:
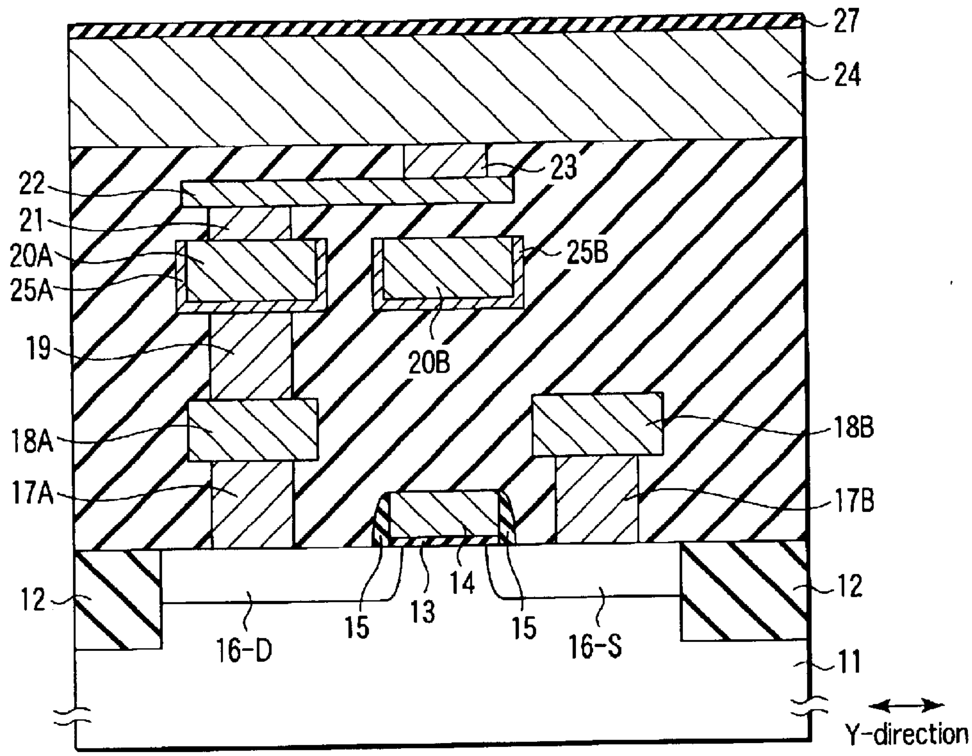
FIG. 10 is a sectional view showing the magnetic random access memory of Reference Example 2.
Figure 11:
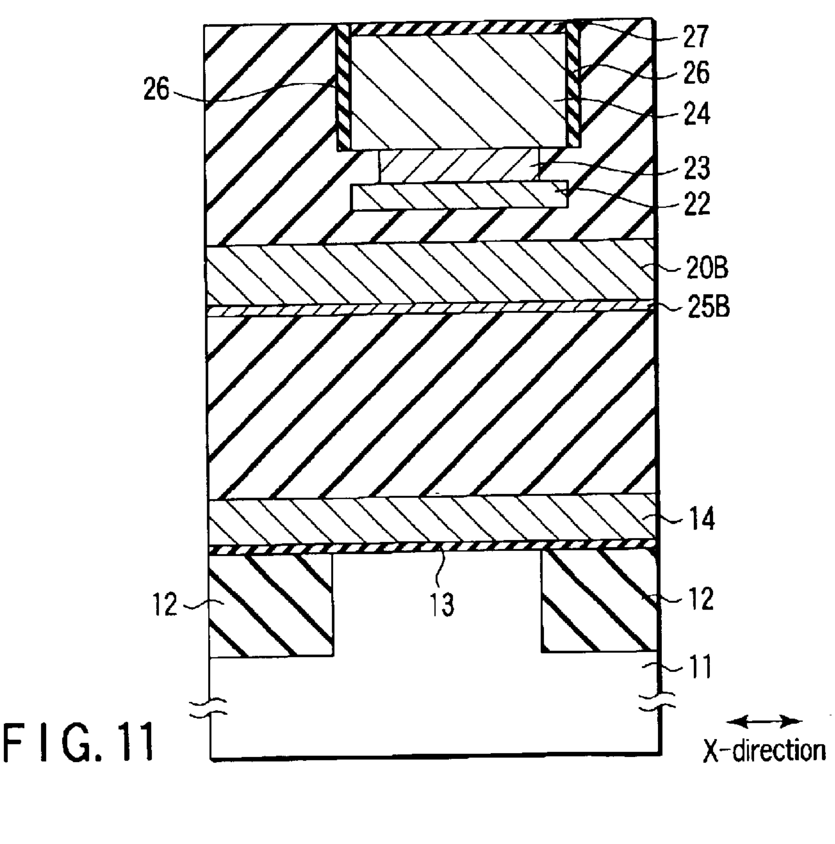
FIG. 11 is a sectional view showing the magnetic random access memory of Reference Example 2.

FIGS. 8 to 11 show the device structure which is the assumption of the magnetic random access memory according to the first, second, and third inventions of the present application. It is to be noted that FIGS. 8 and 10 show sections in the Y direction, FIG. 9 shows a section of an MTJ element portion of FIG. 8 in the X direction, and FIG. 11 shows a section of the MTJ element portion of FIG. 10 in the X direction. The X direction crosses at right angles to the Y direction.

In the semiconductor substrate (e.g., p-type silicon substrate, p-type well region, and the like) 11, the element isolation insulating layer 12 including the shallow trench isolation (STI) structure is formed. The region surrounded by the element isolation insulating layer 12 is the element region in which the read selection switch (e.g., MOS transistor) is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., n-type diffused layer) 16-S and drain region (e.g., n-type diffused layer) 16-D are formed. The gate electrode (read word line) 14 is disposed in the channel region between the source region 16-S and drain region 16-D.

One of metal layers constituting the first metal wiring layer functions as the intermediate layer 18A for vertically stacking contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the present device structure, the lower and side surfaces of the intermediate layer 20A and write word line 20B are coated with materials having high permeability, that is, yoke materials 25A, 25B. The yoke materials 25A, 25B for use herein are limited to materials which have conductivity.

A magnetic flux has a property of being concentrated on the material which has the high permeability. Therefore, when the material having the high permeability is used as a tractor of a line of magnetic force, a magnetic field Hy generated by a write current flowing through the write word line 20B can be concentrated on the MTJ element 23 with good efficiency.

To achieve the object of the present application, it is sufficient to coat the lower and side surfaces of the write word line 20B with the yoke material. Additionally, in actual, the yoke material is also formed on the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the present device structure, the upper and side surfaces of the data selection line 24 are coated with the materials having high permeability, that is, yoke materials 26, 27. The yoke materials 26, 27 for use can be constituted of the materials which have conductivity as shown in FIGS. 8 and 9, or can also be constituted of materials which have an insulating property as shown in FIGS. 10 and 11.

As described above, the magnetic flux has the property of being concentrated on the material which has the high permeability. Therefore, when the material having the high permeability is used as the tractor of the line of magnetic force, a magnetic field Hx generated by the write current flowing through the data selection line 24 can be concentrated on the MTJ element 23 with good efficiency at the write operation time.

It is to be noted that the structure of the MTJ element 23 is not especially limited. The structure shown in FIG. 1 or another structure may also be used. Moreover, the MTJ element 23 may also be of the multi-valued storage type in which data of bits can be stored.

In this device structure, the yoke material 25B is formed in the lower and side surfaces of the write word line 20B disposed right under the MTJ element 23. Moreover, the yoke materials 226, 27 are formed in the upper and side surfaces of the data selection line (read/write bit line) 24 disposed right on the MTJ element 23.

In this case, it is convenient to form the write word line 20B and yoke material 25B using a damascene process. Conversely, when the write word line 20B and yoke material 25B are formed using a reactive ion etching (RIE) process, the process becomes very complicated, and this is realistically impossible.

On the other hand, the data selection line 24 and yoke materials 26, 27 may preferably be formed using the RIE process. Conversely, when the data selection line 24 and yoke materials 26, 27 are formed using the damascene process, the process becomes very complicated.

That is, with respect to the manufacturing method for realizing the device structure shown in FIGS. 8 to 11, a manufacturing method is realistically employed comprising: forming the write word line 20B and yoke material 25B in the damascene process; and forming the data selection line 24 and yoke materials 26, 27 in the RIE process.

It is to be noted that in the following description of the manufacturing method, a manufacturing method of realizing the device structure of FIGS. 8 and 9 only in the damascene process will be described.

[First Invention]

The magnetic random access memory according to the example of the first invention of the present application will be described hereinafter in detail with reference to the drawings.

1. Example 1

Example 1 relates to the manufacturing, and the device structure in which the magnetic field can be concentrated on the MTJ element with good efficiency.

Figure 12:
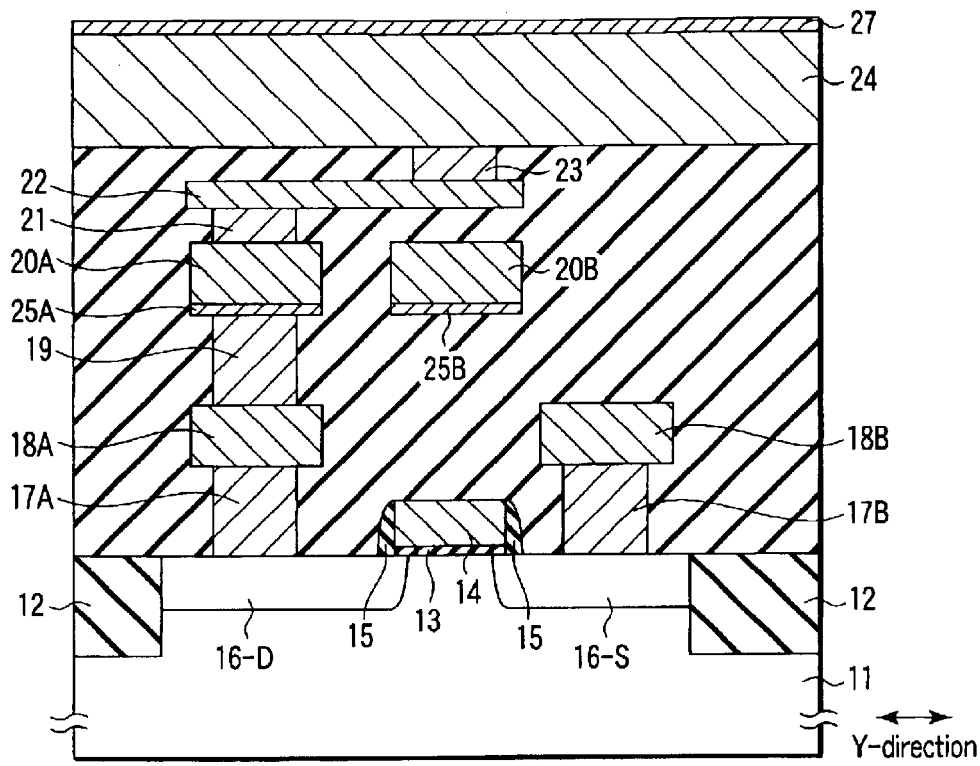
FIG. 12 is a sectional view showing the magnetic random access memory of Example 1 of the first invention.
Figure 13:
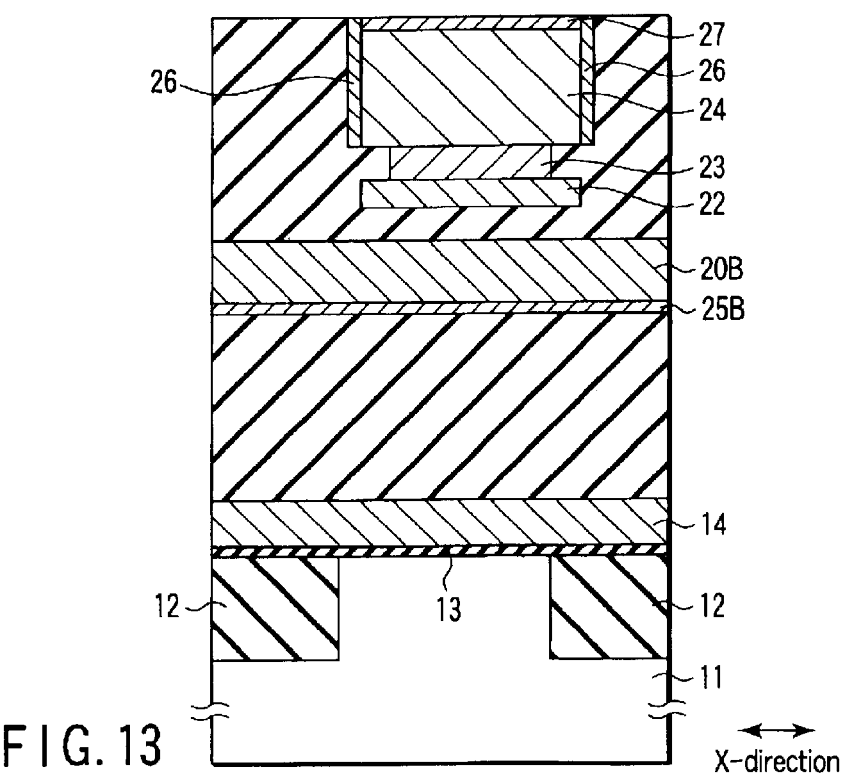
FIG. 13 is a sectional view showing the magnetic random access memory of Example 1 of the first invention.
Figure 14:
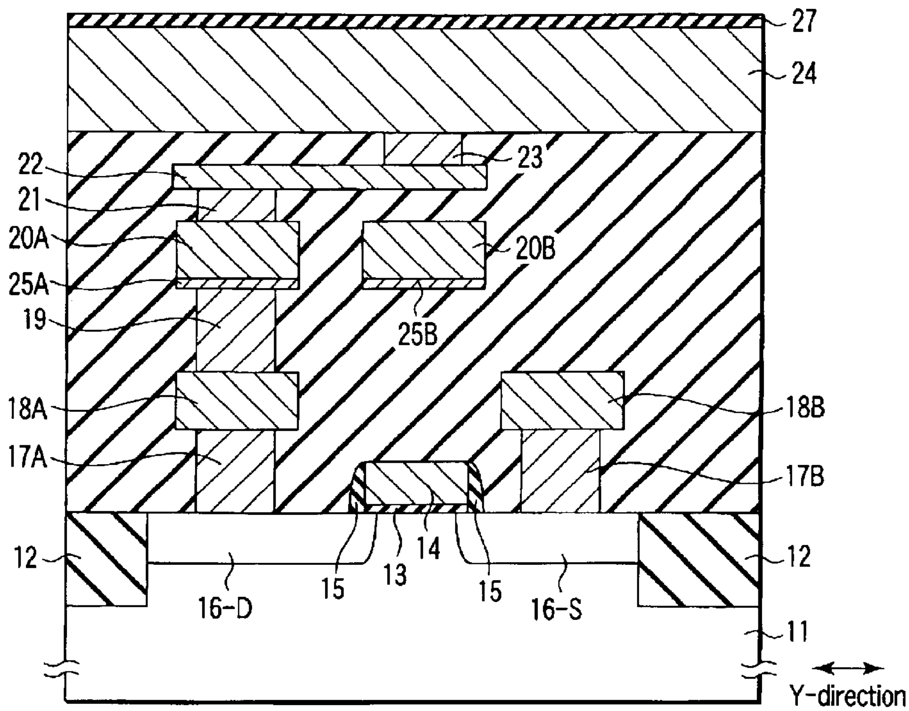
FIG. 14 is a sectional view showing the magnetic random access memory of Example 1 of the first invention.
Figure 15:
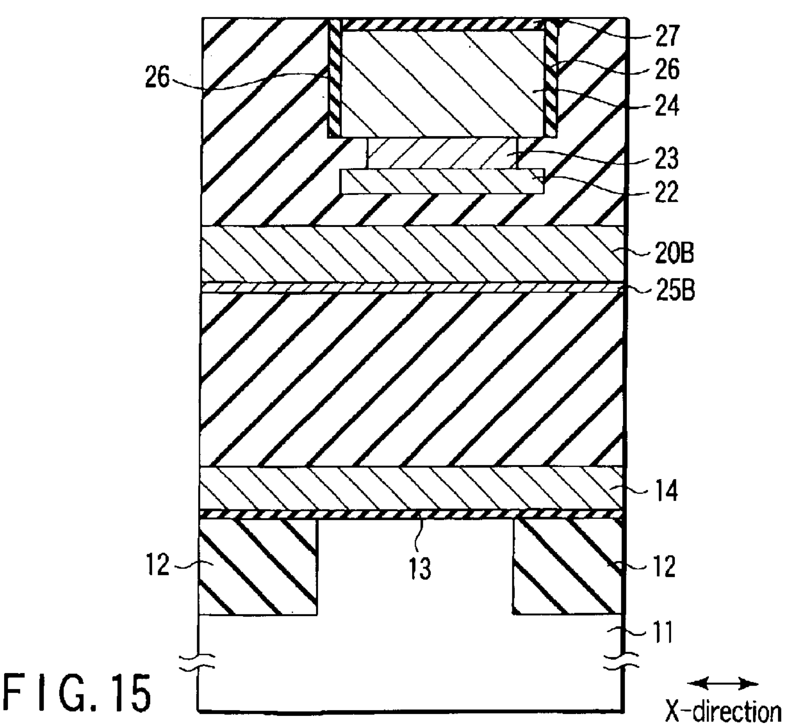
FIG. 15 is a sectional view showing the magnetic random access memory of Example 1 of the first invention.

FIGS. 12 to 15 show the device structure of the magnetic random access memory according to Example 1. It is to be noted that FIGS. 12 and 14 show the sections in the Y direction, FIG. 13 shows the section of the MTJ element portion of FIG. 12 in the X direction, and FIG. 15 shows the section of the MTJ element portion of FIG. 14 in the X direction. The X direction crosses at right angles to the Y direction.

The characteristics of the device structure of the present example lie in that only the lower surface of the write word line 20B disposed right under the MTJ element 23 is coated with the yoke material 25B and that the upper and side surfaces of the data selection line (read/write bit line) 24 disposed right on the MTJ element 23 are coated with the yoke materials 26, 27.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the present device structure, the lower surfaces of the intermediate layer 20A and write word line 20B are coated with the materials having high permeability, that is, the yoke materials 25A, 25B. The yoke materials 25A, 25B for use herein are limited to the materials which have conductivity.

The magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the lower surface of the write word line 20B with the yoke material. Additionally, in actual, the yoke material is also formed in the lower surface of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the present device structure, the upper and side surfaces of the data selection line 24 are coated with the materials having the high permeability, that is, the yoke materials 26, 27. The yoke materials 26, 27 for use herein can be constituted of the materials which have conductivity as shown in FIGS. 12 and 13, or can also be constituted of the materials which have the insulating properties as shown in FIGS. 14 and 15.

As described above, the magnetic flux has the property of being concentrated on the material which has the high permeability. Therefore, when the material having the high permeability is used as the tractor of the line of magnetic force, the magnetic field Hx generated by the write current flowing through the data selection line 24 can be concentrated on the MTJ element 23 with good efficiency at the write operation time.

It is to be noted that the structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed only on the lower surface of the write word line 20B disposed right under the MTJ element 23. Moreover, the yoke materials 26, 27 are formed on the upper and side surfaces of the data selection line (read/write bit line) 24 disposed right on the MTJ element 23.

In this case, it is convenient to form the write word line 20B and yoke material 25B using the reactive ion etching (RIE) process. Conversely, when the write word line 20B and yoke material 25B are formed using the damascene process, the process becomes very complicated, and this is realistically impossible.

Moreover, the data selection line 24 and yoke materials 26, 27 may preferably be formed using the RIE process. Conversely, when the data selection line 24 and yoke materials 26, 27 are formed using the damascene process, the process becomes very complicated.

That is, for the manufacturing method for realizing the device structure shown in FIGS. 12 to 15, a manufacturing method is employed comprising: forming the write word line 20B and yoke material 25B in the RIE process; and forming the data selection line 24 and yoke materials 26, 27 in the RIE process.

2. Example 2

Figure 16:
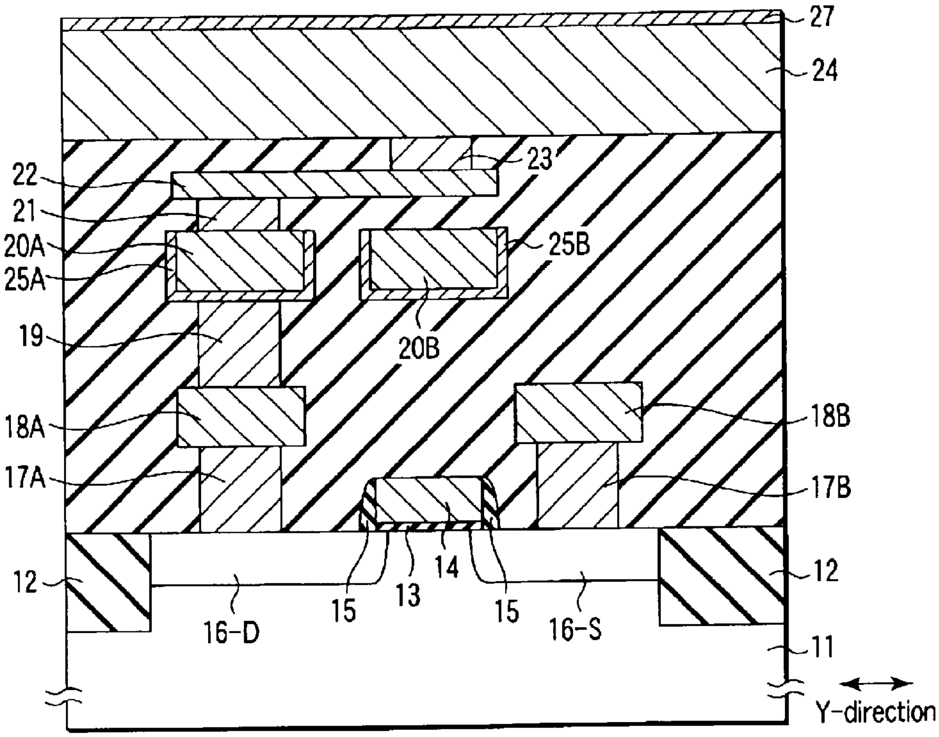
FIG. 16 is a sectional view showing the magnetic random access memory of Example 2 of the first invention.
Figure 17:
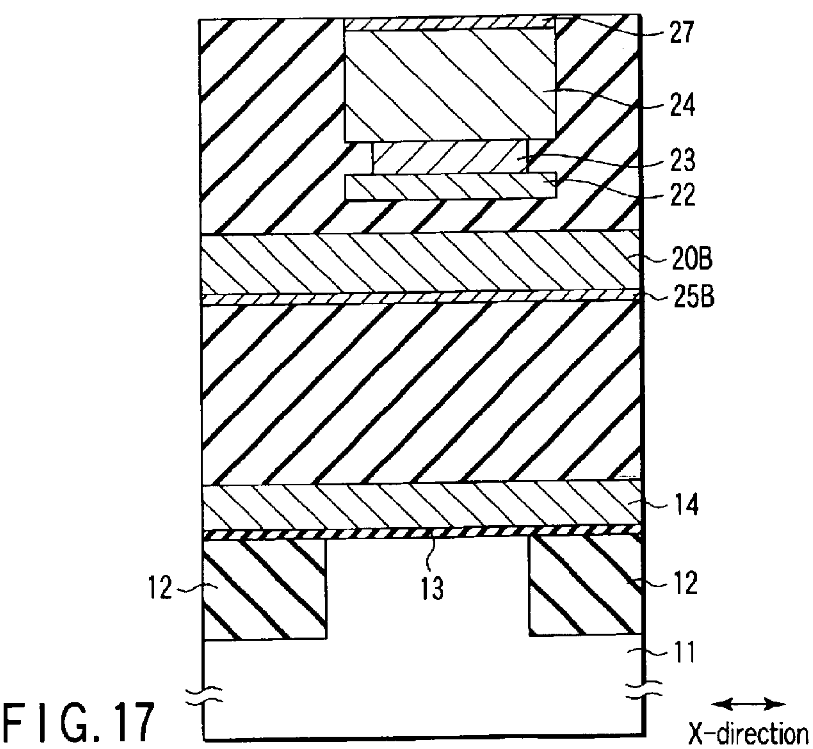
FIG. 17 is a sectional view showing the magnetic random access memory of Example 2 of the first invention.
Figure 18:
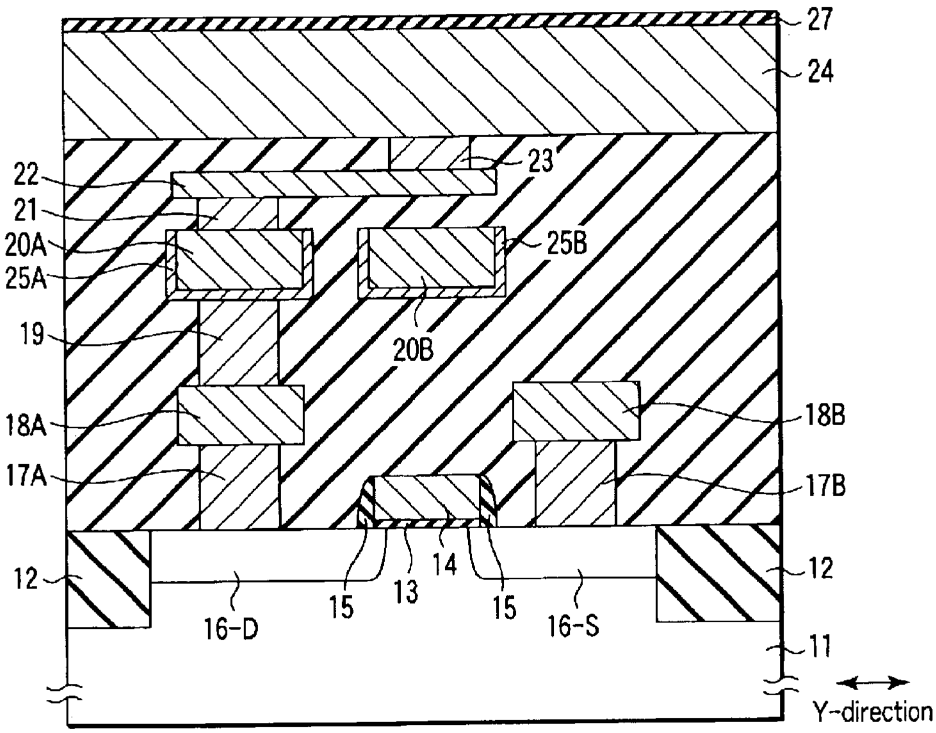
FIG. 18 is a sectional view showing the magnetic random access memory of Example 2 of the first invention.
Figure 19:
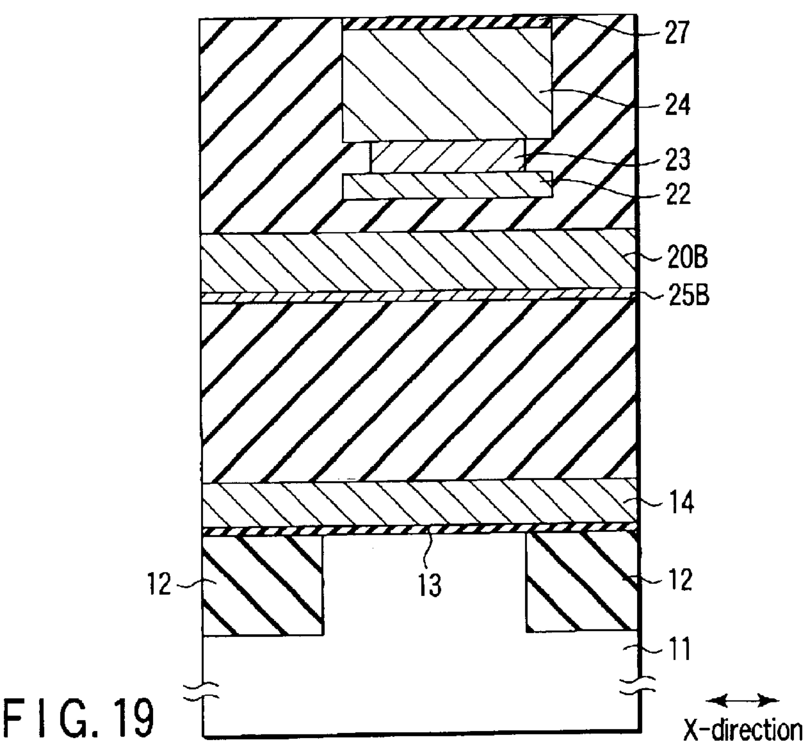
FIG. 19 is a sectional view showing the magnetic random access memory of Example 2 of the first invention.

FIGS. 16 to 19 show the device structure of the magnetic random access memory according to Example 2. It is to be noted that FIGS. 16 and 18 show the sections in the Y direction, FIG. 17 shows the section of the MTJ element portion of FIG. 16 in the X direction, and FIG. 19 shows the section of the MTJ element portion of FIG. 18 in the X direction. The X direction crosses at right angles to the Y direction.

The characteristic of the device structure of the present example lies in that the lower and side surfaces of the write word line 20B disposed right under the MTJ element 23 are coated with the yoke material 25B and that only the upper surface of the data selection line (read/write bit line) 24 disposed right on the MTJ element 23 is coated with the yoke material 27.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the present device structure, the lower and side surfaces of the intermediate layer 20A and write word line 20B are coated with the materials having the high permeability, that is, the yoke materials 25A, 25B. The yoke materials 25A, 25B for use herein are limited to the materials which have conductivity.

The magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the lower and side surfaces of the write word line 20B with the yoke material. Additionally, in actual, the yoke material is also formed on the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the present device structure, the upper surface of the data selection line 24 is coated with the material having the high permeability, that is, the yoke material 27. The yoke material 27 for use herein can be constituted of the material which has the conductivity as shown in FIGS. 16 and 17, or can also be constituted of the material which has the insulating property as shown in FIGS. 18 and 19.

The magnetic flux has the property of being concentrated on the material which has the high permeability. Therefore, when the material having the high permeability is used as the tractor of the line of magnetic force, the magnetic field Hx generated by the write current flowing through the data selection line 24 can be concentrated on the MTJ element 23 with good efficiency at the write operation time.

It is to be noted that the structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed on the lower and side surfaces of the write word line 20B disposed right under the MTJ element 23. Moreover, the yoke materials 26, 27 are formed only on the upper surface of the data selection line (read/write bit line) 24 disposed right on the MTJ element 23.

In this case, it is convenient to form the write word line 20B and yoke material 25B using the damascene process. Conversely, when the write word line 20B and yoke material 25B are formed using the reactive ion etching (RIE) process, the process becomes very complicated, and this is realistically impossible.

Moreover, the data selection line 24 and yoke material 27 may preferably be formed using the RIE process. Conversely, when the data selection line 24 and yoke material 27 are formed using the damascene process, the process becomes very complicated.

That is, for the manufacturing method for realizing the device structure shown in FIGS. 16 to 19, a manufacturing method is employed comprising: forming the write word line 20B and yoke material 25B in the damascene process; and forming the data selection line 24 and yoke material 27 in the RIE process.

3. Example 3

Figure 20:
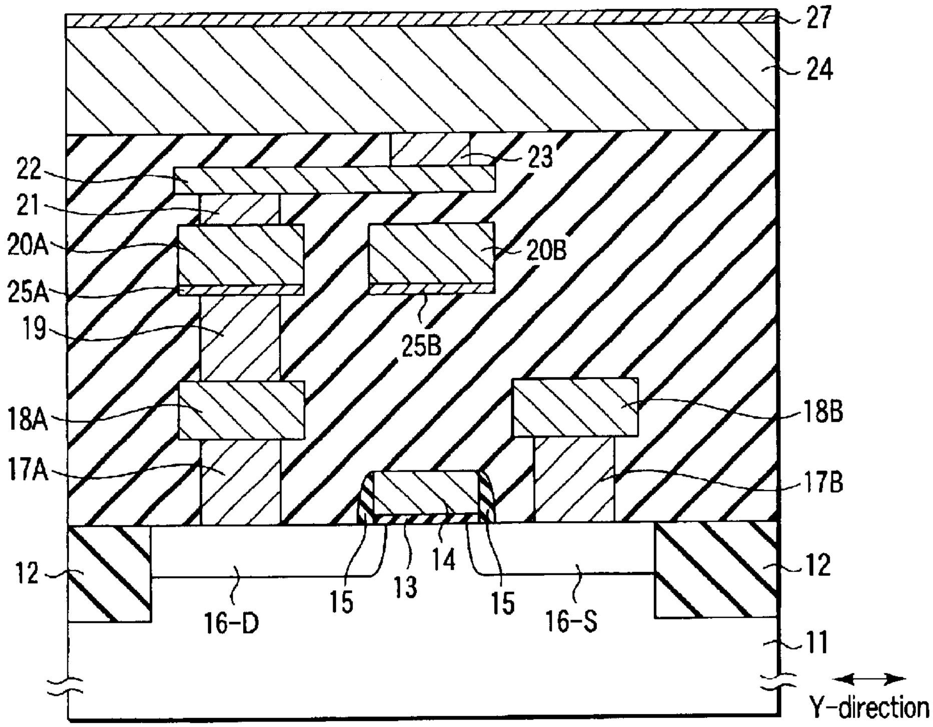
FIG. 20 is a sectional view showing the magnetic random access memory of Example 3 of the first invention.
Figure 21:
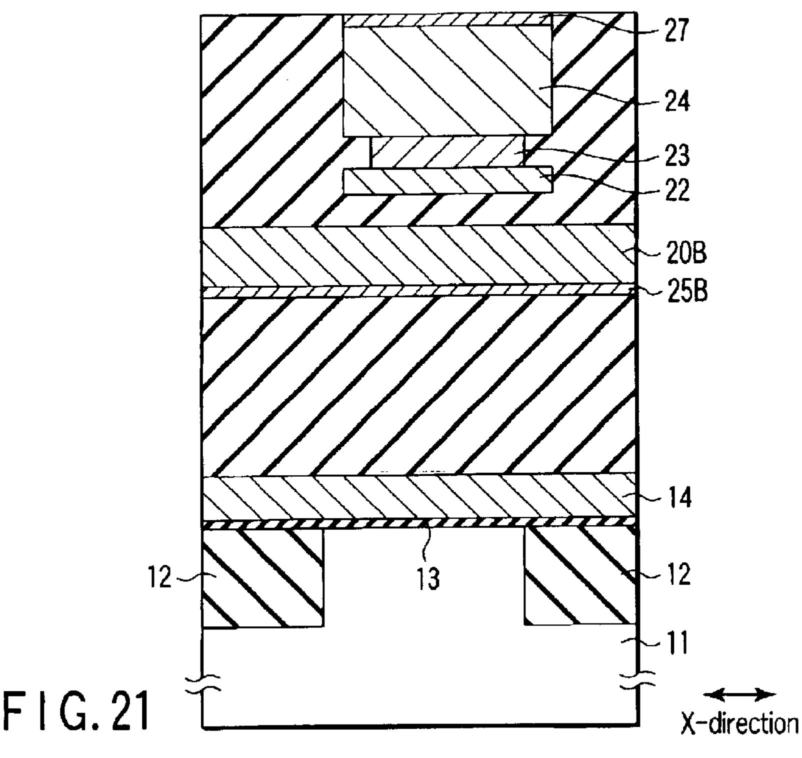
FIG. 21 is a sectional view showing the magnetic random access memory of Example 3 of the first invention.

FIGS. 20 to 23 show the device structure of the magnetic random access memory according to Example 3. It is to be noted that FIGS. 20 and 22 show the sections in the Y direction, FIG. 21 shows the section of the MTJ element portion of FIG. 20 in the X direction, and FIG. 23 shows the section of the MTJ element portion of FIG. 22 in the X direction. The X direction crosses at right angles to the Y direction.

The characteristic of the device structure of the present example lies in that only the lower surface of the write word line 20B disposed right under the MTJ element 23 is coated with the yoke material 25B and that only the upper surface of the data selection line (read/write bit line) 24 disposed right on the MTJ element 23 is coated with the yoke material 27.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the present device structure, the lower surfaces of the intermediate layer 20A and write word line 20B are coated with the materials having the high permeability, that is, the yoke materials 25A, 25B. The yoke materials 25A, 25B for use herein are limited to the materials which have conductivity.

The magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the lower surface of the write word line 20B with the yoke material. Additionally, in actual, the yoke material is also formed in the lower surface of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the present device structure, the upper surface of the data selection line 24 is coated with the material having the high permeability, that is, the yoke material 27. The yoke material 27 for use herein can be constituted of the material which has the conductivity as shown in FIGS. 20 and 21, or can also be constituted of the material which has the insulating property as shown in FIGS. 22 and 23.

As described above, the magnetic flux has the property of being concentrated on the material which has the high permeability. Therefore, when the material having the high permeability is used as the tractor of the line of magnetic force, the magnetic field Hx generated by the write current flowing through the data selection line 24 can be concentrated on the MTJ element 23 with good efficiency at the write operation time.

It is to be noted that the structure of the MTJ element 23 is not especially limited. The structure shown in FIG. 1 or another structure may also be used. Moreover, the MTJ element 23 may also be of the multi-valued storage type in which the data of bits can be stored.

In the device structure, the yoke material 25B is formed only on the lower surface of the write word line 20B disposed right under the MTJ element 23. Moreover, the yoke material 27 is formed only on the upper surface of the data selection line (read/write bit line) 24 disposed right on the MTJ element 23.

In this case, it is convenient to form the write word line 20B and yoke material 25B using the reactive ion etching (RIE) process. Conversely, when the write word line 20B and yoke material 25B are formed using the damascene process, the process becomes very complicated, and this is realistically impossible.

Moreover, the data selection line 24 and yoke material 27 may preferably be formed using the RIE process. Conversely, when the data selection line 24 and yoke material 27 are formed using the damascene process, the process becomes very complicated.

That is, for the manufacturing method for realizing the device structure shown in FIGS. 20 to 23, a manufacturing method is employed comprising: forming the write word line 20B and yoke material 25B in the RIE process; and forming the data selection line 24 and yoke material 27 in the RIE process.

It is to be noted that the manufacturing method of the present device structure will be described later in detail.

4. Example 4

Figure 24:
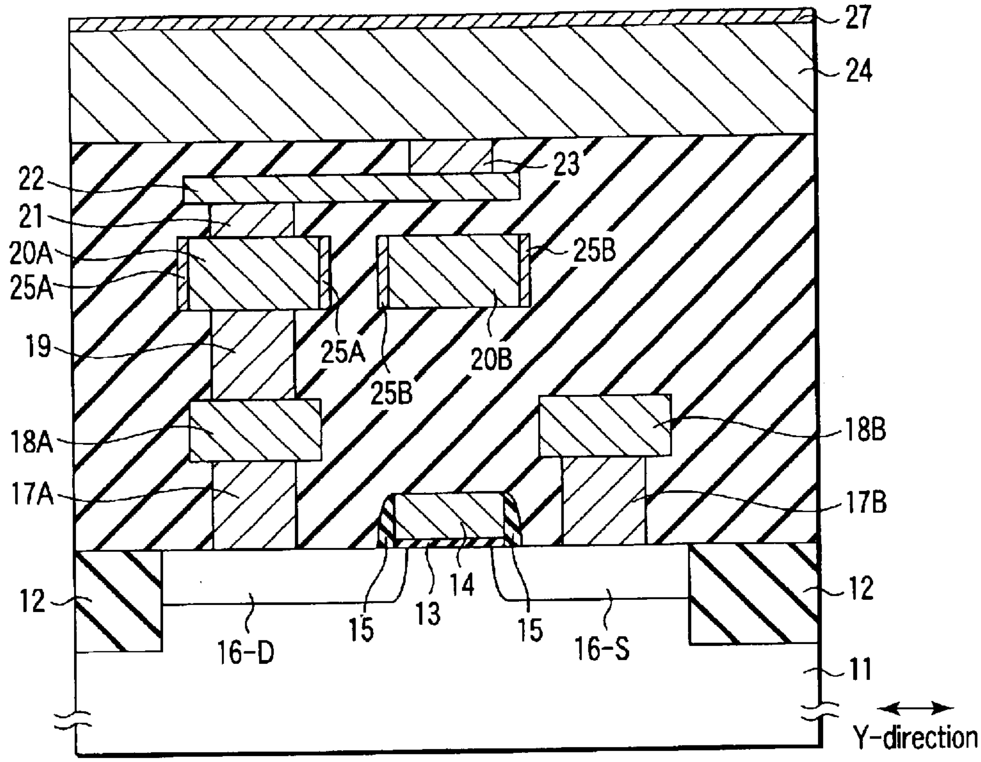
FIG. 24 is a sectional view showing the magnetic random access memory of Example 4 of the first invention.
Figure 25:
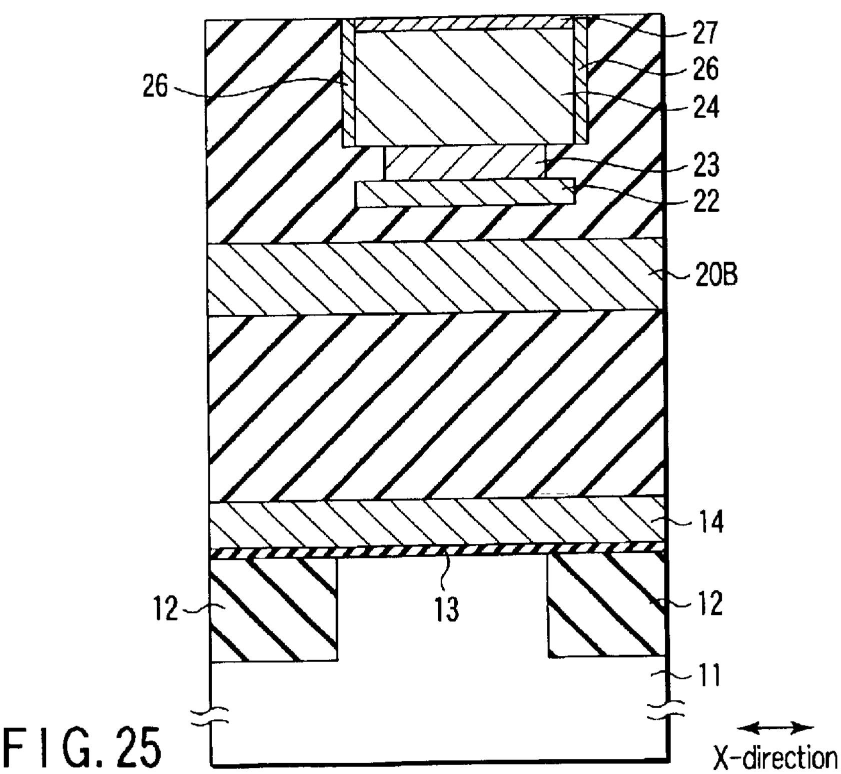
FIG. 25 is a sectional view showing the magnetic random access memory of Example 4 of the first invention.
Figure 26:
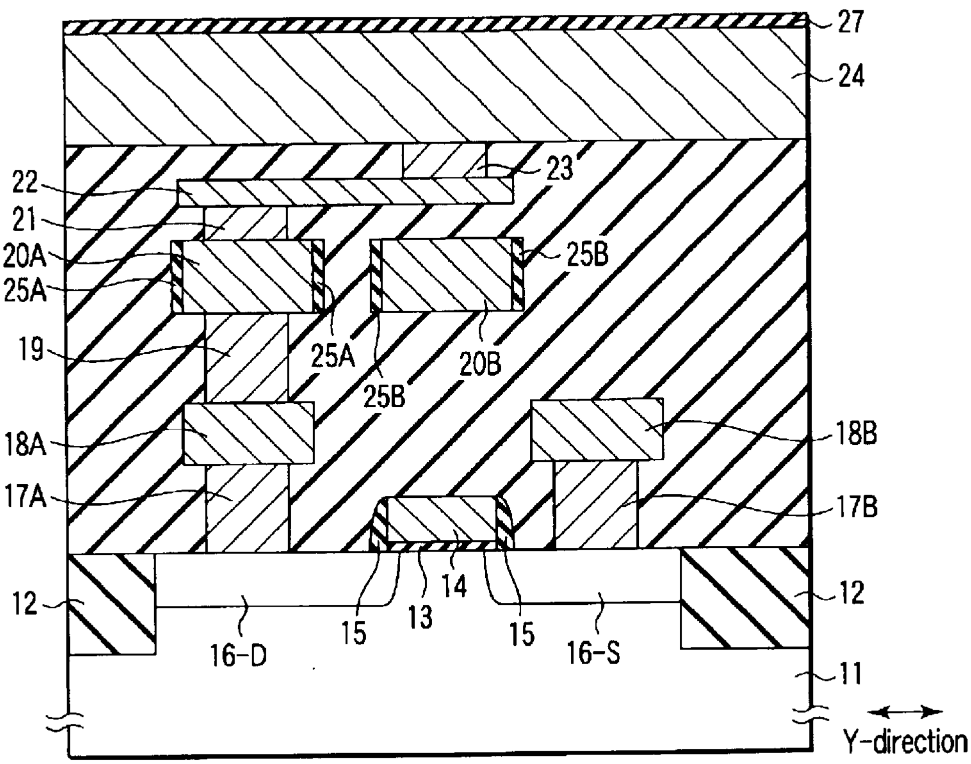
FIG. 26 is a sectional view showing the magnetic random access memory of Example 4 of the first invention.
Figure 27:
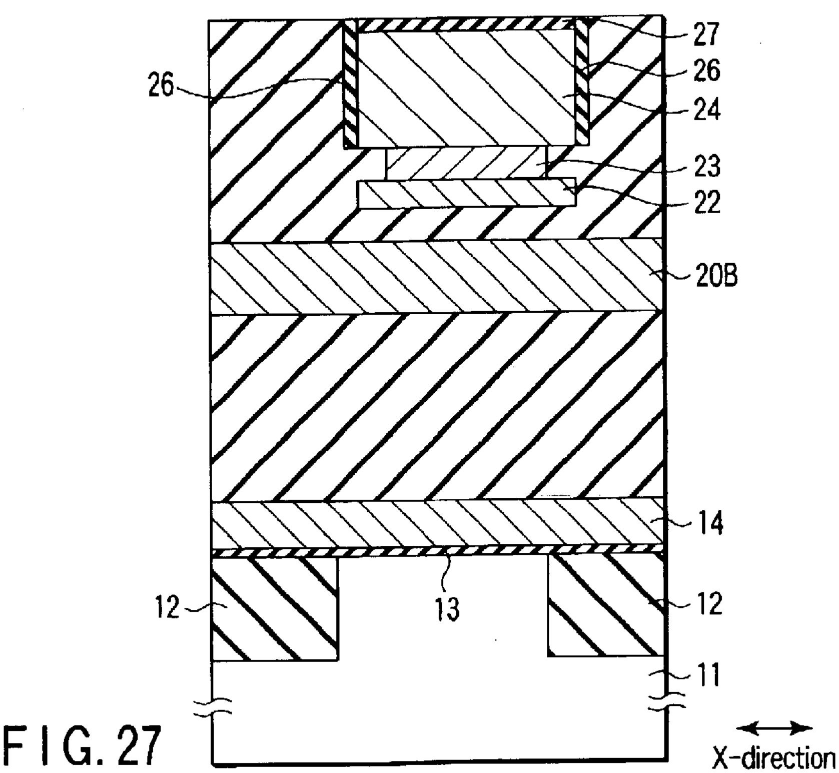
FIG. 27 is a sectional view showing the magnetic random access memory of Example 4 of the first invention.

FIGS. 24 to 27 show the device structure of the magnetic random access memory according to Example 4. It is to be noted that FIGS. 24 and 26 show the sections in the Y direction, FIG. 25 shows the section of the MTJ element portion of FIG. 24 in the X direction, and FIG. 27 shows the section of the MTJ element portion of FIG. 26 in the X direction. The X direction crosses at right angles to the Y direction.

The characteristic of the device structure of the present example lies in that only the side surface of the write word line 20B disposed right under the MTJ element 23 is coated with the yoke material 25B and that the upper and side surfaces of the data selection line (read/write bit line) 24 disposed right on the MTJ element 23 are coated with the yoke materials 26, 27.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

Figure 28:
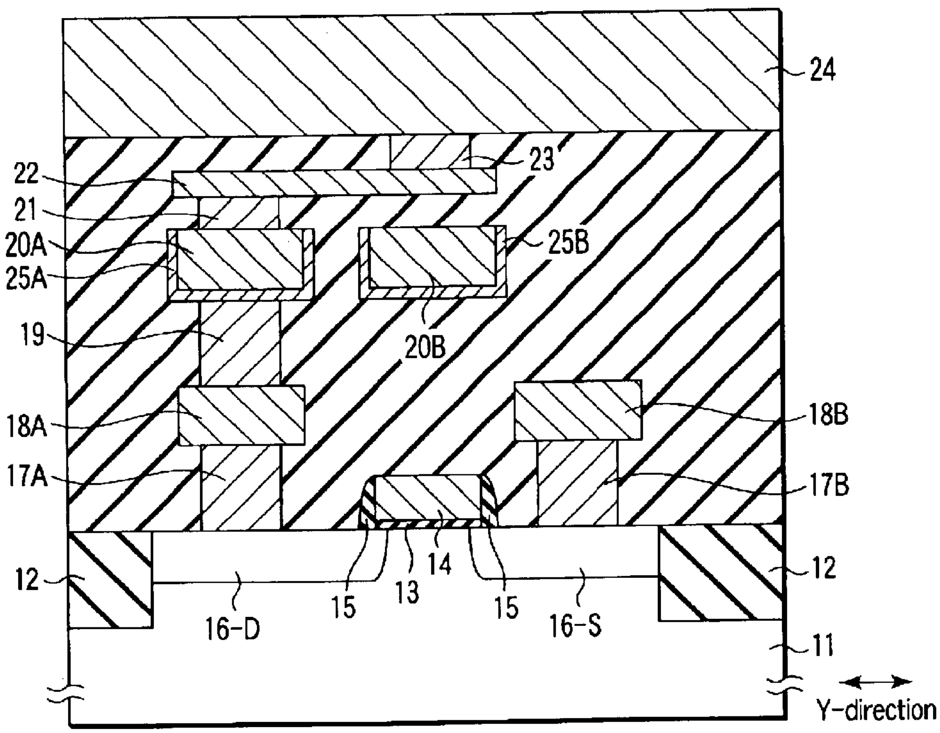
FIG. 28 is a sectional view showing the magnetic random access memory of Example 5 of the first invention.

In the present device structure, the side surfaces of the intermediate layer 20A and write word line 20B are coated with the materials having the high permeability, that is, the yoke materials 25A, 25B. The yoke materials 25A, 25B for use herein are limited to the materials which have conductivity as shown in FIGS. 24 and 25, or the materials which have insulating properties as shown in FIGS. 26 and 28.

The magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the side surface of the write word line 20B with the yoke material. Additionally, in actual, the yoke material is also formed in side lower surface of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the present device structure, the upper and side surfaces of the data selection line 24 are coated with the materials having the high permeability, that is, the yoke materials 26, 27. The yoke materials 26, 27 for use herein can be constituted of the material which has the conductivity as shown in FIGS. 24 and 25, or can also be constituted of the material which has the insulating property as shown in FIGS. 26 and 27.

As described above, the magnetic flux has the property of being concentrated on the material which has the high permeability. Therefore, when the material having the high permeability is used as the tractor of the line of magnetic force, the magnetic field Hx generated by the write current flowing through the data selection line 24 can be concentrated on the MTJ element 23 with good efficiency at the write operation time.

It is to be noted that the structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed only on the side surface of the write word line 20B disposed right under the MTJ element 23. Moreover, the yoke material 27 is formed on the upper and side surfaces of the data selection line (read/write bit line) 24 disposed right on the MTJ element 23.

In this case, the write word line 20B and yoke material 25B can be formed in either one of the reactive ion etching (RIE) and damascene processes.

Moreover, the data selection line 24 and yoke materials 26, 27 may preferably be formed using the RIE process. Conversely, when the data selection line 24 and yoke materials 26, 27 are formed using the damascene process, the process becomes very complicated.

5. Example 5

Figure 29:
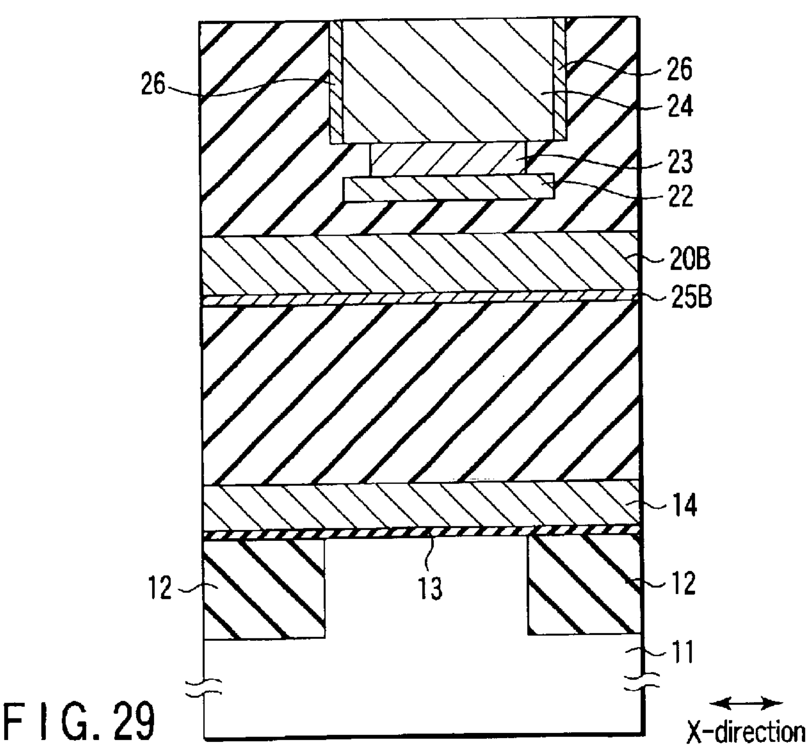
FIG. 29 is a sectional view showing the magnetic random access memory of Example 5 of the first invention.

FIGS. 28 to 31 show the device structure of the magnetic random access memory according to Example 5. It is to be noted that FIGS. 28 and 30 show the sections in the Y direction, FIG. 29 shows the section of the MTJ element portion of FIG. 28 in the X direction, and FIG. 31 shows the section of the MTJ element portion of FIG. 30 in the X direction. The X direction crosses at right angles to the Y direction.

The characteristic of the device structure of the present example lies in that the lower and side surfaces of the write word line 20B disposed right under the MTJ element 23 is coated with the yoke material 25B and that only the side surface of the data selection line (read/write bit line) 24 disposed right on the MTJ element 23 is coated with the yoke material 26.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the present device structure, the lower and side surfaces of the intermediate layer 20A and write word line 20B are coated with the materials having the high permeability, that is, the yoke materials 25A, 25B. The yoke materials 25A, 25B for use herein are limited to the materials which have conductivity.

The magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the lower and side surfaces of the write word line 20B with the yoke material. Additionally, in actual, the yoke material is also formed in the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the present device structure, the side surface of the data selection line 24 is coated with the material having the high permeability, that is, the yoke material 26. The yoke material 26 for use herein can be constituted of the material which has the conductivity as shown in FIGS. 28 and 29, or can also be constituted of the material which has the insulating property as shown in FIGS. 30 and 31.

As described above, the magnetic flux has the property of being concentrated on the material which has the high permeability. Therefore, when the material having the high permeability is used as the tractor of the line of magnetic force, the magnetic field Hx generated by the write current flowing through the data selection line 24 can be concentrated on the MTJ element 23 with good efficiency at the write operation time.

It is to be noted that the structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed only on the lower and side surfaces of the write word line 20B disposed right under the MTJ element 23. Moreover, the yoke material 26 is formed only on the side surfaces of the data selection line (read/write bit line) 24 disposed right on the MTJ element 23.

In this case, the write word line 20B and yoke material 25B are preferably formed using the damascene process. Conversely, when the write word line 20B and yoke material 25B are formed using the reactive ion etching (RIE) process, the process becomes very complicated.

Moreover, the data selection line 24 and yoke material 26 can be formed in either one of the damascene and RIE processes.

6. Example 6

Figure 32:
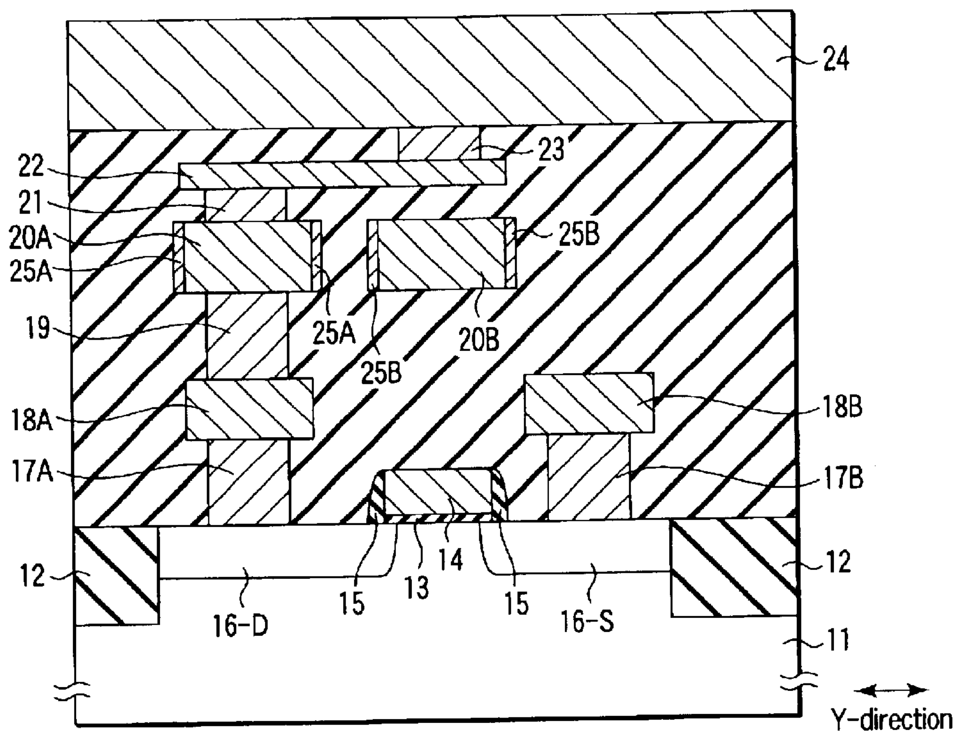
FIG. 32 is a sectional view showing the magnetic random access memory of Example 6 of the first invention.
Figure 33:
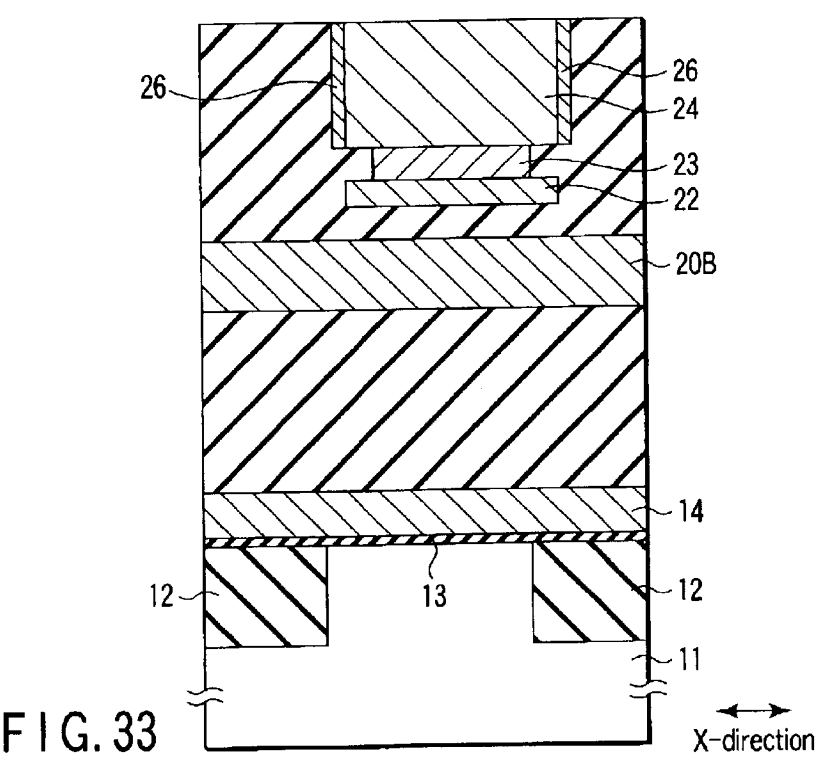
FIG. 33 is a sectional view showing the magnetic random access memory of Example 6 of the first invention.
Figure 34:
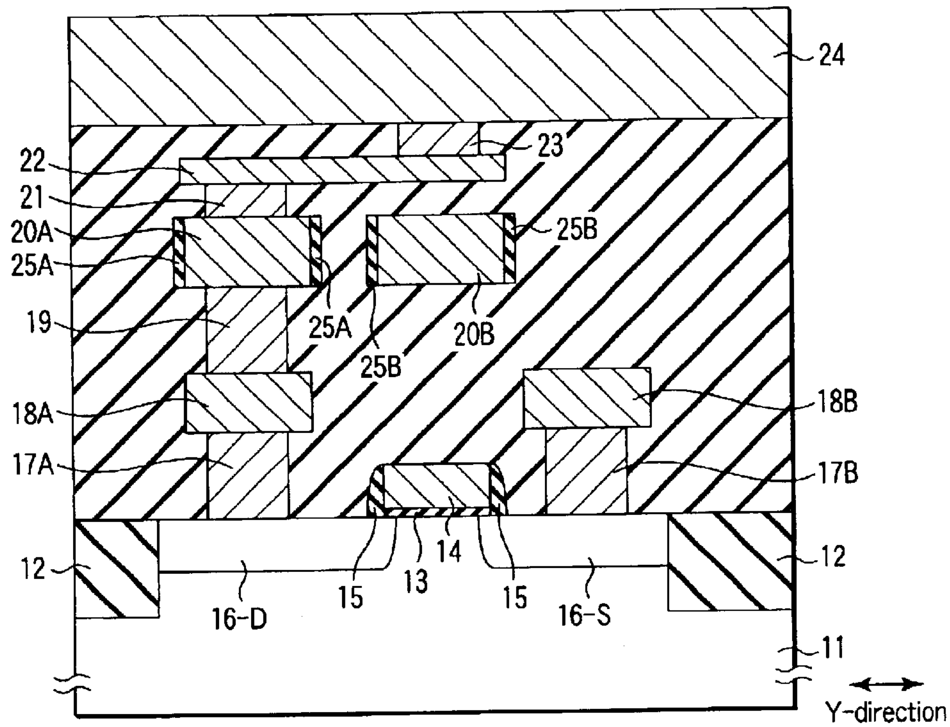
FIG. 34 is a sectional view showing the magnetic random access memory of Example 6 of the first invention.
Figure 35:
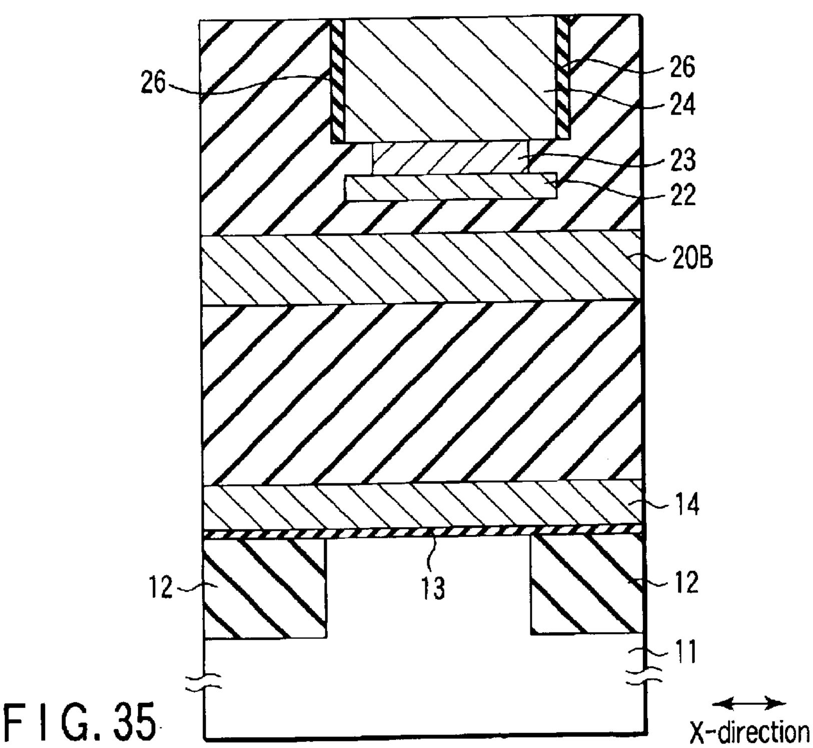
FIG. 35 is a sectional view showing the magnetic random access memory of Example 6 of the first invention.

FIGS. 32 to 35 show the device structure of the magnetic random access memory according to Example 6. It is to be noted that FIGS. 32 and 34 show the sections in the Y direction, FIG. 33 shows the section of the MTJ element portion of FIG. 32 in the X direction, and FIG. 35 shows the section of the MTJ element portion of FIG. 34 in the X direction. The X direction crosses at right angles to the Y direction.

The characteristic of the device structure of the present example lies in that only the side surfaces of the write word line 20B disposed right under the MTJ element 23 are coated with the yoke material 25B and that only the side surfaces of the data selection line (read/write bit line) 24 disposed right on the MTJ element 23 are coated with the yoke material 26.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the present device structure, the side surfaces of the intermediate layer 20A and write word line 20B are coated with the materials having the high permeability, that is, the yoke materials 25A, 25B. The yoke materials 25A, 25B for use herein can be constituted of the materials which have conductivity as shown in FIGS. 32 and 33, or can be constituted of the materials which have the insulating property as shown in FIGS. 34 and 35.

The magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the side surfaces of the write word line 20B with the yoke material. Additionally, in actual, the yoke material is also formed in the side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the present device structure, the side surface of the data selection line 24 is coated with the material having the high permeability, that is, the yoke material 26. The yoke material 26 for use herein can be constituted of the material which has the conductivity as shown in FIGS. 32 and 33, or can also be constituted of the material which has the insulating property as shown in FIGS. 34 and 35.

As described above, the magnetic flux has the property of being concentrated on the material which has the high permeability. Therefore, when the material having the high permeability is used as the tractor of the line of magnetic force, the magnetic field Hx generated by the write current flowing through the data selection line 24 can be concentrated on the MTJ element 23 with good efficiency at the write operation time.

It is to be noted that the structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed only on the side surface of the write word line 20B disposed right under the MTJ element 23. Moreover, the yoke material 26 is formed only on the side surface of the data selection line (read/write bit line) 24 disposed right on the MTJ element 23.

In this case, for the write word line 20B and yoke material 25B, either one of the damascene process and reactive ion etching (RIE) process can be employed. Moreover, also for the data selection line 24 and yoke material 26, either one of the damascene and RIE processes can be employed.

It is to be noted that the manufacturing method of the device structure of the present example will be described later in detail.

6. Examples 7 to 12

Next Examples 7 to 12 will be described which are modification examples of the device structure according to Examples 4 to 6.

The characteristics of the device structures of Examples 7 to 12 lie in that when the MTJ elements are stacked in a plurality of stages (Examples 7 to 10) or the MTJ elements are arranged in a lateral direction (Examples 11, 12), the plurality of MTJ elements share one write line, and the side surface of the write line is coated with the yoke material having the high permeability.

(1) Example 7

Figure 36:
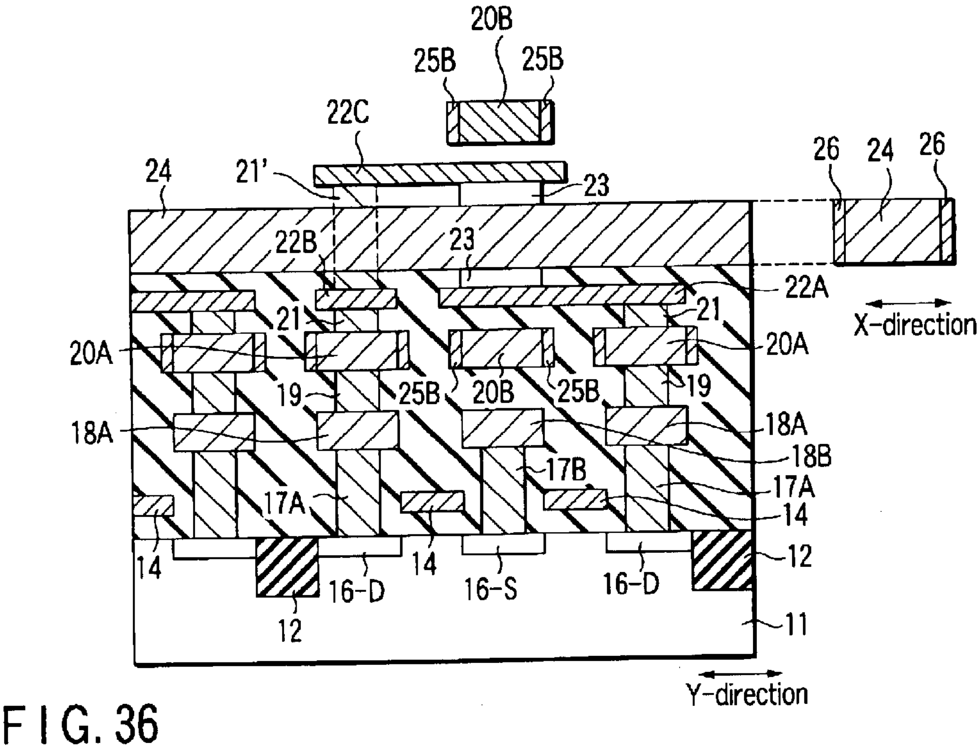
FIG. 36 is a sectional view showing the magnetic random access memory of Example 7 of the first invention.
Figure 37:
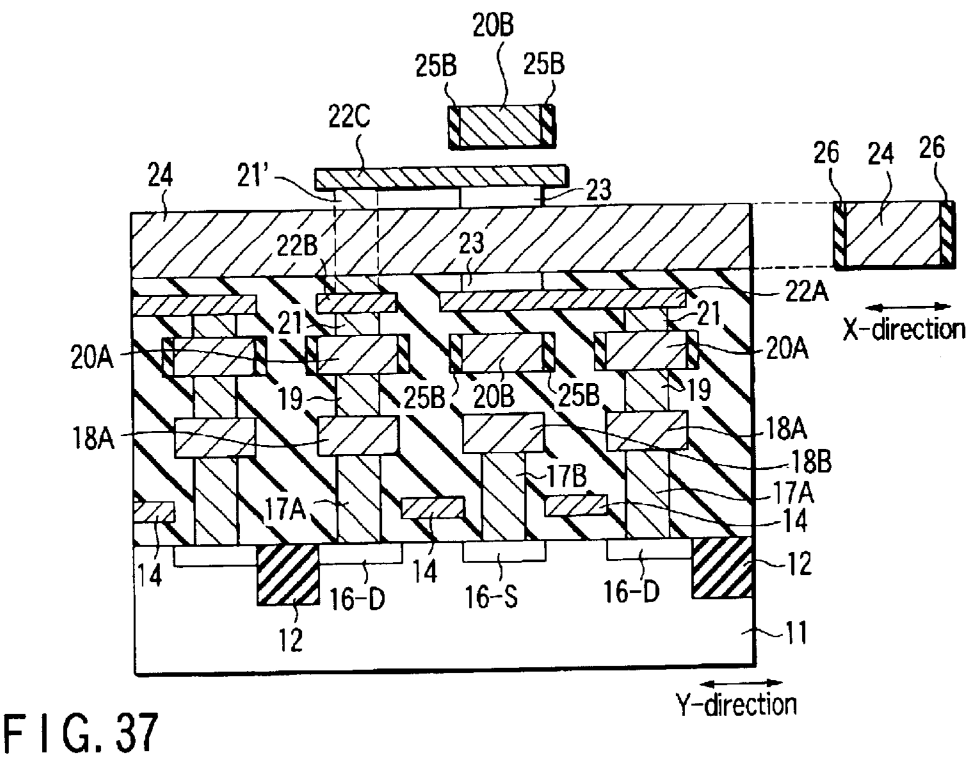
FIG. 37 is a sectional view showing the magnetic random access memory of Example 7 of the first invention.

FIGS. 36 and 37 show the device structure of the magnetic random access memory according to Example 7.

In the present device structure, on the semiconductor substrate 11, two MTJ elements 23 are stacked, and these two MTJ elements 23 share one data selection line (read/write bit line) 24.

The data selection line 24 is disposed between two MTJ elements, and extends in the Y direction. Moreover, one MTJ element 23 contacts the lower surface of the data selection line 24, and the other MTJ element 23 contacts the upper surface of the data selection line 24. The side surface of the data selection line 24 is coated with the yoke material 26 which has the high permeability.

The write current flows through the data selection line 24 at the write operation time. The magnetic field generated by the write current is applied to the MTJ element 23 by the yoke material 26 with good efficiency.

The write word line 20B extending in the X direction crossing at right angles to the Y direction is disposed right under or on the MTJ element 23. The side surface of the write word line 20B is coated with the yoke material 25B which has the high permeability.

The write current flows through the write word line 20B at the write operation time. The magnetic field generated by the write current is applied to the MTJ element 23 by the yoke material 25B with good efficiency.

It is to be noted that the yoke materials 25B, 26 may be constituted of the conductive material as shown in FIG. 36, or constituted of the insulating material as shown in FIG. 37.

(2) Example 8

Figure 38:
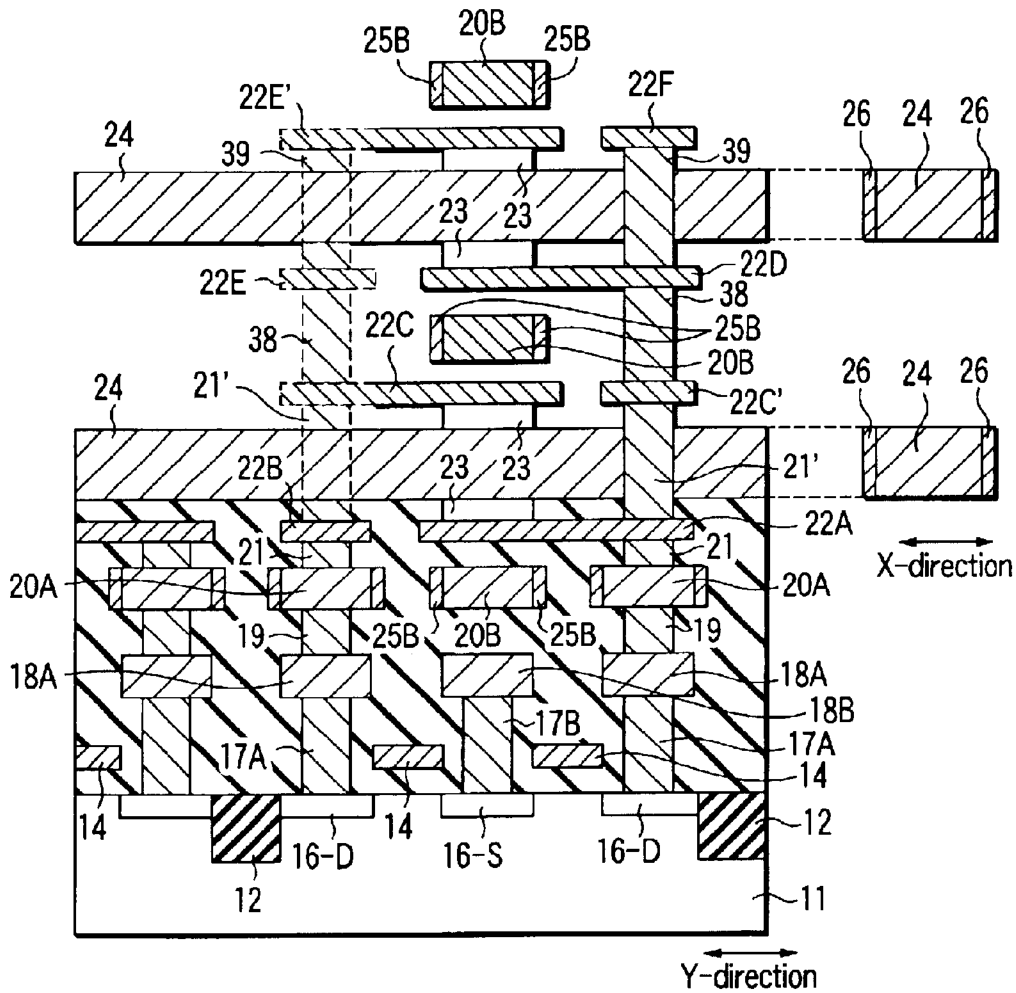
FIG. 38 is a sectional view showing the magnetic random access memory of Example 8 of the first invention.
Figure 39:
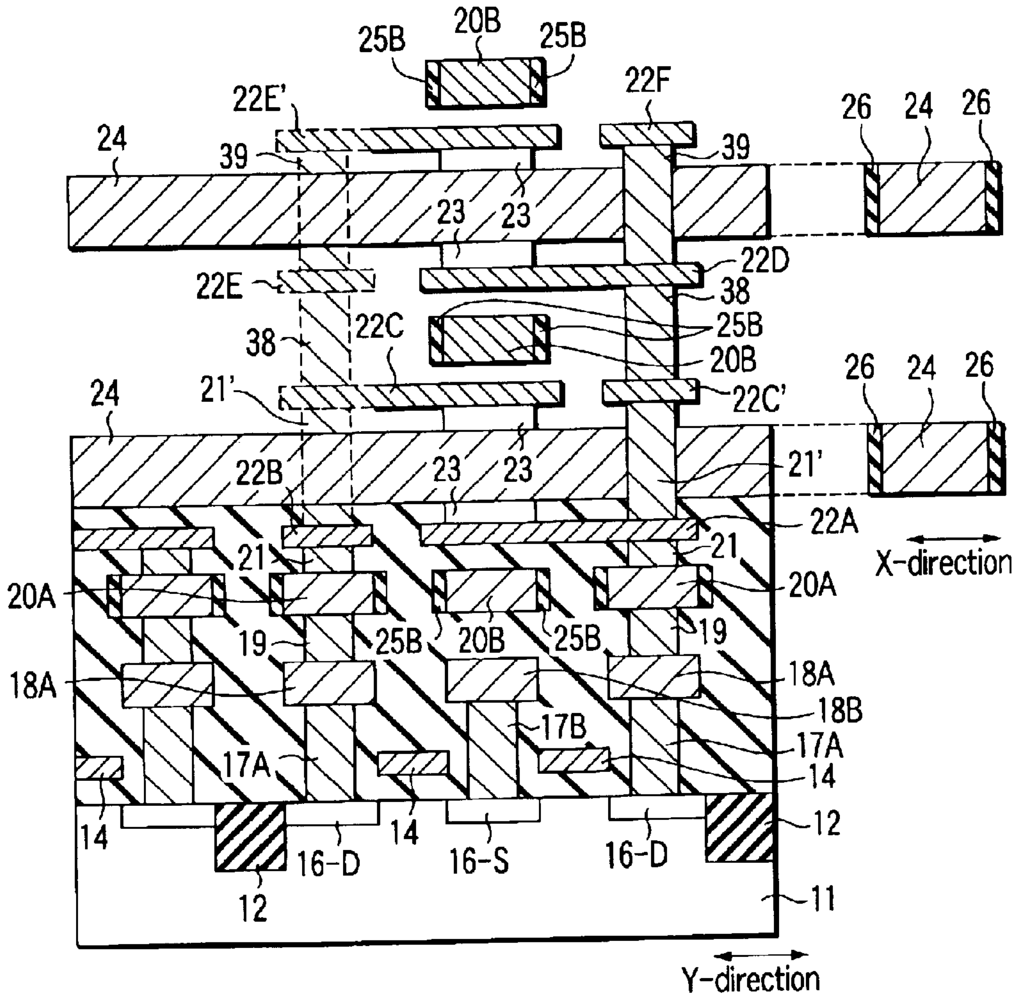
FIG. 39 is a sectional view showing the magnetic random access memory of Example 8 of the first invention.

FIGS. 38 and 39 show the device structure of the magnetic random access memory according to Example 8.

In the device structure of the present example, four MTJ elements 23 are stacked. Two of these MTJ elements 23 share one write word line 20B or one data selection line (read/write bit line) 24.

The data selection line 24 is disposed between two MTJ elements 23, and extends in the Y direction. Moreover, one MTJ element 23 contacts the lower surface of the data selection line 24, and the other MTJ element 23 contacts the upper surface of the data selection line 24. The side surface of the data selection line 24 is coated with the yoke material 26 which has the high permeability.

At the write operation time, the write current flows through the data selection line 24. The magnetic field generated by the write current is applied to the MTJ element 23 by the yoke material 26 with good efficiency.

One write word line 20B extending in the X direction crossing at right angles to the Y direction is disposed between the MTJ element which contacts the lower surface of the upper data selection line 24 and the MTJ element 23 which contacts the upper surface of the lower data selection line 24. This write word line 20B is shared by these two MTJ elements. The side surface of the write word line 20B is coated with the yoke material 25B which has the high permeability.

Moreover, the write word lines 20B extending in the X direction are arranged right on the MTJ element 23 which contacts the upper surface of the upper data selection line 24 and right under the MTJ element 23 which contacts the lower surface of the lower data selection line 24. The side surface of the write word line 20B is coated with the yoke material 25B which has the high permeability.

At the write operation time, the write current flows through the write word line 20B. The magnetic field generated by the write current is applied to the MTJ element 23 by the yoke material 25B with good efficiency.

It is to be noted that the yoke materials 25B, 26 may be constituted of the conductive material as shown in FIG. 38, or may also be constituted of the insulating material as shown in FIG. 39.

(3) Example 9

FIGS. 40 to 43 show the device structure of the magnetic random access memory according to Example 9.

In the device structure of the present example, four MTJ elements 23 connected in series are stacked on the semiconductor substrate 11. One end of these MTJ elements 23 connected in series is connected to a read selection switch RSW, and the other end is connected to a read bit line BL. Two of these MTJ elements 23 share one write word line 20B or one write bit line 24.

The write bit line 24 is disposed between two MTJ elements 23, and extends in the Y direction. The side surface of the write bit line 24 is coated with the yoke material 26 which has the high permeability. At the write operation time, the write current flows through the write bit line 24. The magnetic field generated by the write current is applied to the MTJ element 23 by the yoke material 26 with good efficiency.

The write word line 20B is disposed between two MTJ elements 23, and extends in the X direction crossing at right angles to the Y direction. The side surface of the write word line 20B is coated with the yoke material 25B which has the high permeability. Moreover, the write word line 20B is disposed right under or on the MTJ element 23, and extends in the X direction. The side surface of the write word line 20B is coated with the yoke material 25B which has the high permeability.

At the write operation time, the write current flows through the write word line 20B. The magnetic field generated by the write current is applied to the MTJ element 23 by the yoke material 25B with good efficiency.

Figure 42:
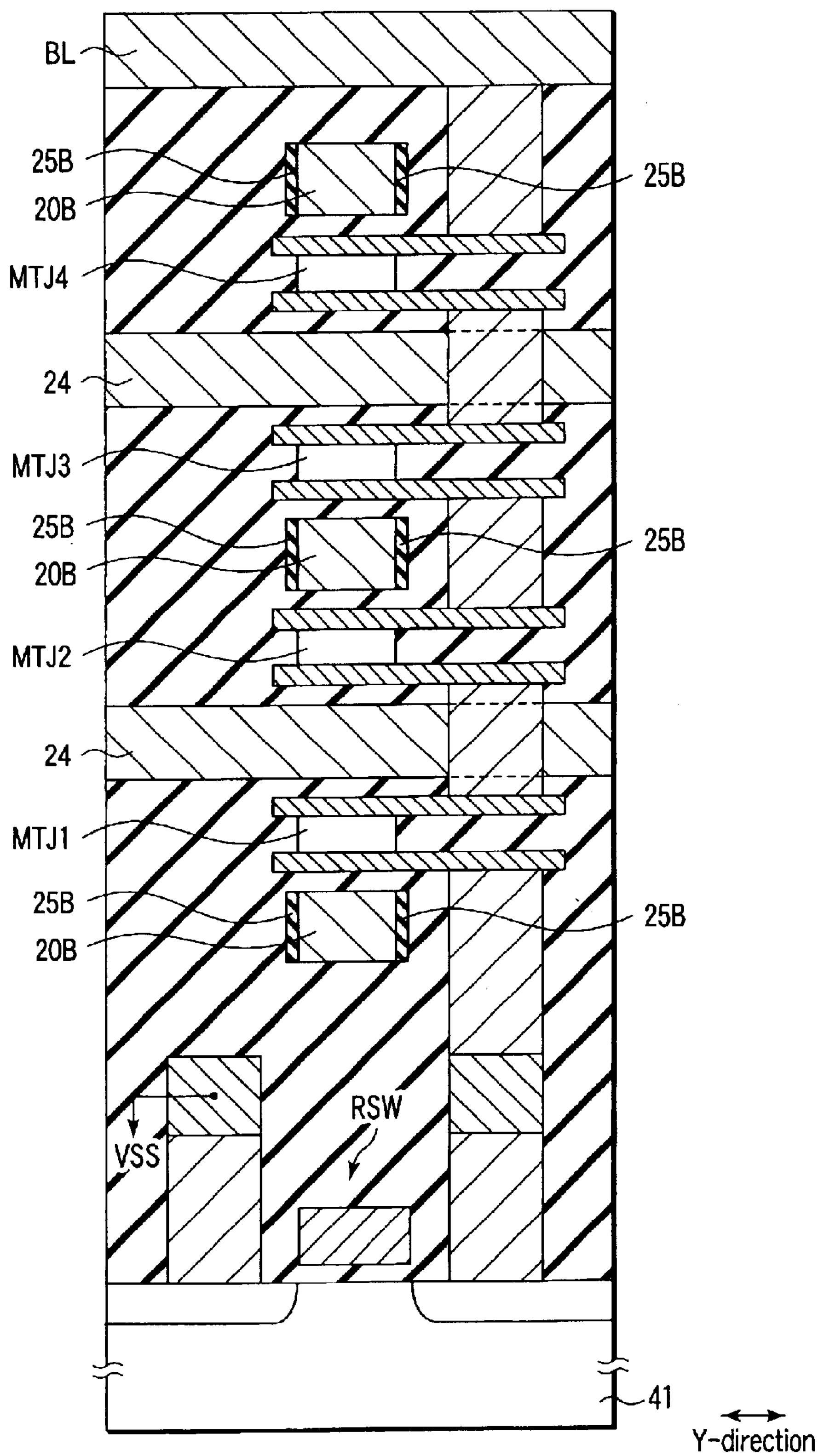
FIG. 42 is a sectional view showing the magnetic random access memory of Example 9 of the first invention.

It is to be noted that the yoke materials 25B, 26 may be constituted of the conductive material as shown in FIGS. 40 and 41, or may also be constituted of the insulating material as shown in FIGS. 42 and 43.

(4) Example 10

FIGS. 44 to 47 show the device structure of the magnetic random access memory according to Example 10.

In the device structure of the present example, four MTJ elements 23 connected in parallel to one another are stacked on the semiconductor substrate 11. One end of these MTJ elements 23 connected in parallel to one another is connected to the read selection switch RSW, and the other end is connected to the read bit line BL. Two of these MTJ elements 23 share one write word line 20B or one write bit line 24.

The write bit line 24 is disposed between two MTJ elements 23, and extends in the Y direction. The side surface of the write bit line 24 is coated with the yoke material 26 which has the high permeability. At the write operation time, the write current flows through the write bit line 24. The magnetic field generated by the write current is applied to the MTJ element 23 by the yoke material 26 with good efficiency.

The write word line 20B is disposed between two MTJ elements 23, and extends in the X direction crossing at right angles to the Y direction. The side surface of the write word line 20B is coated with the yoke material 25B which has the high permeability. Moreover, the write word line 20B is disposed right under or on the MTJ element 23, and extends in the X direction. The side surface of the write word line 20B is coated with the yoke material 25B which has the high permeability.

At the write operation time, the write current flows through the write word line 20B. The magnetic field generated by the write current is applied to the MTJ element 23 by the yoke material 25B with good efficiency.

Figure 44:
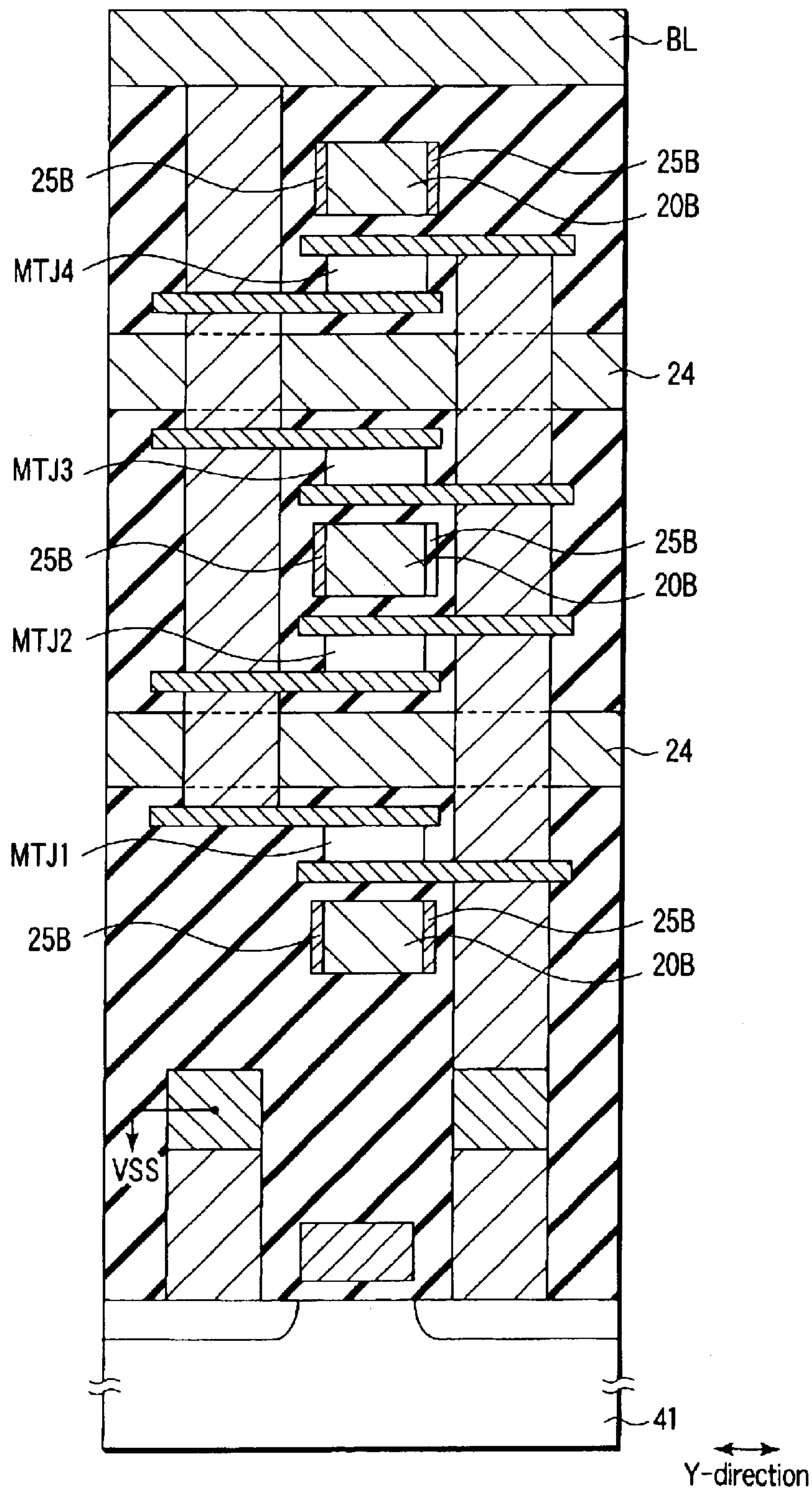
FIG. 44 is a sectional view showing the magnetic random access memory of Example 10 of the first invention.

It is to be noted that the yoke materials 25B, 26 may be constituted of the conductive material as shown in FIGS. 44 and 45, or may also be constituted of the insulating material as shown in FIGS. 46 and 47.

(5) Example 11

Figure 48:
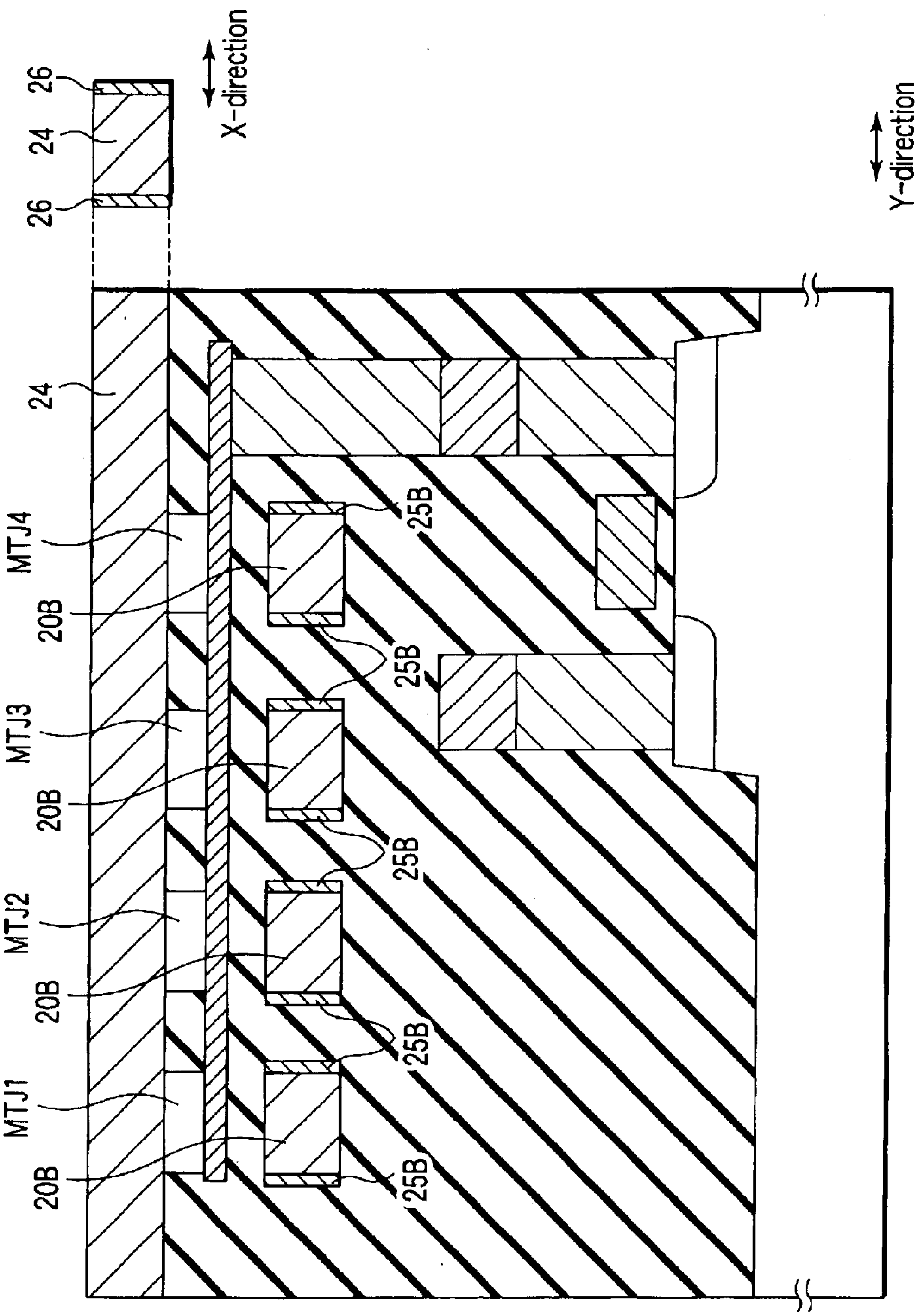
FIG. 48 is a sectional view showing the magnetic random access memory of Example 11 of the first invention.
Figure 49:
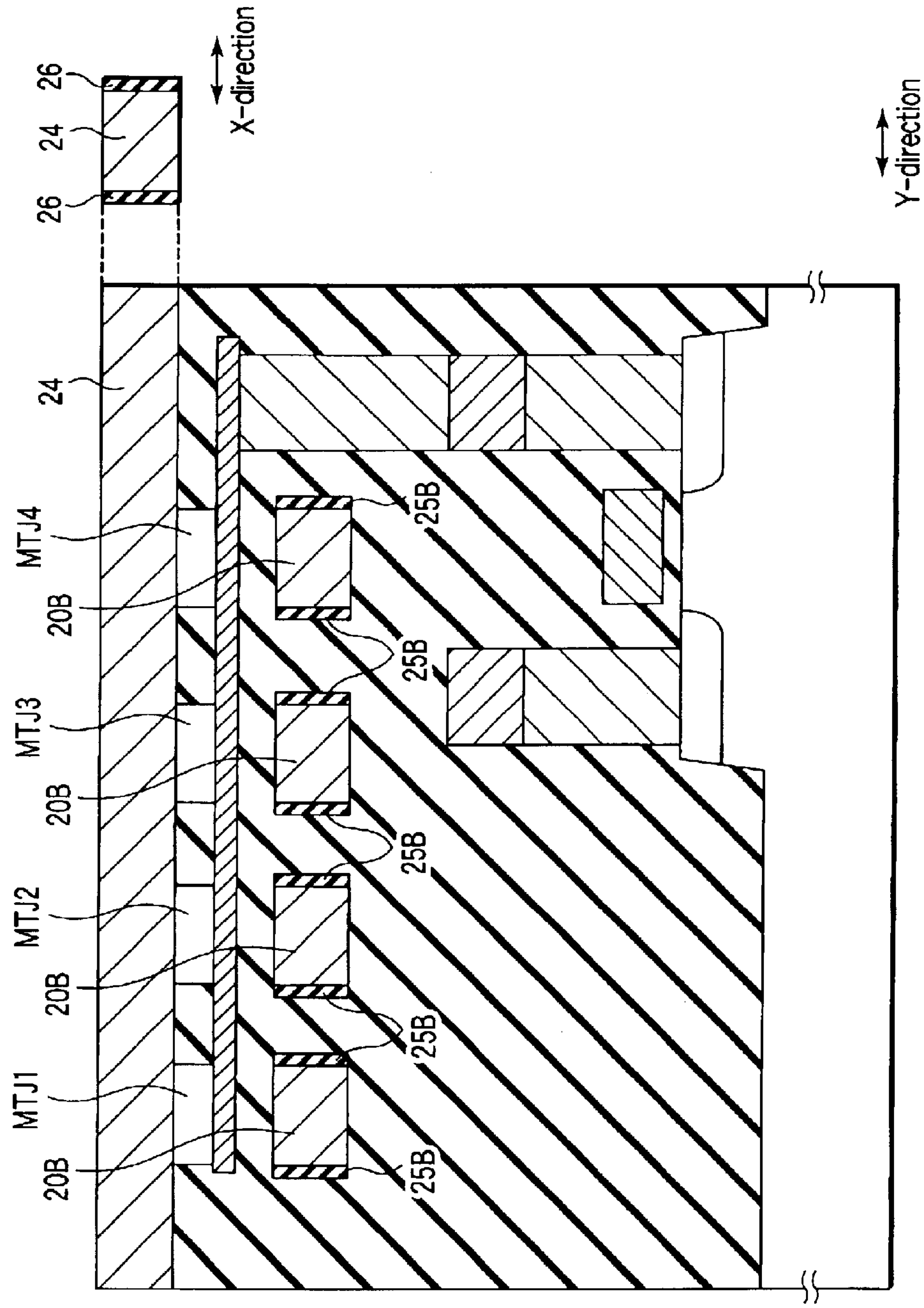
FIG. 49 is a sectional view showing the magnetic random access memory of Example 11 of the first invention.

FIGS. 48 and 49 show the device structure of the magnetic random access memory according to Example 11.

In the device structure of the present example, on the semiconductor substrate 11, a plurality of (four in the present example) MTJ elements 23 are arranged in a lateral direction (in a direction parallel to the surface of the semiconductor substrate). One end of these MTJ elements 23 is connected in common to the read selection switch RSW, and the other end is connected in common to the data selection line (read/write bit line) 24. These MTJ elements 23 share one data selection line (read/write bit line) 24.

The data selection line 24 is disposed right on the MTJ elements 23, and extends in the Y direction. The side surface of the data selection line 24 is coated with the yoke material 26 which has the high permeability. At the write operation time, the write current flows through the data selection line 24. The magnetic field generated by the write current is applied to the MTJ element 23 by the yoke material 26 with good efficiency.

The write word line 20B is disposed right under the MTJ element 23, and extends in the X direction crossing at right angles to the Y direction. The side surface of the write word line 20B is coated with the yoke material 25B which has the high permeability. At the write operation time, the write current flows through the write word line 20B. The magnetic field generated by the write current is applied to the MTJ element 23 by the yoke material 25B with good efficiency.

It is to be noted that the yoke materials 25B, 26 may be constituted of the conductive material as shown in FIG. 48, or may also be constituted of the insulating material as shown in FIG. 49.

(6) Example 12

Figure 50:
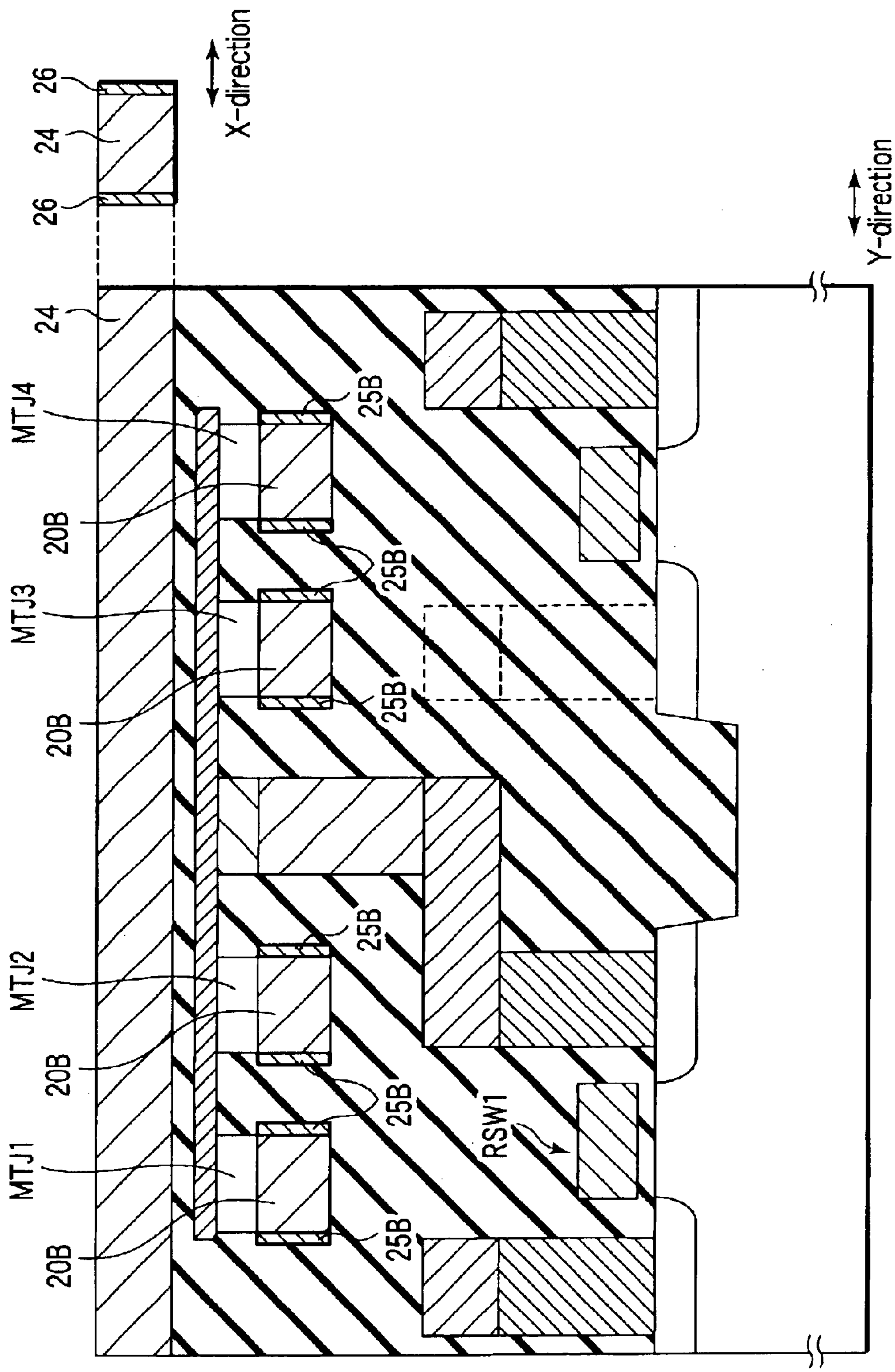
FIG. 50 is a sectional view showing the magnetic random access memory of Example 12 of the first invention.
Figure 51:
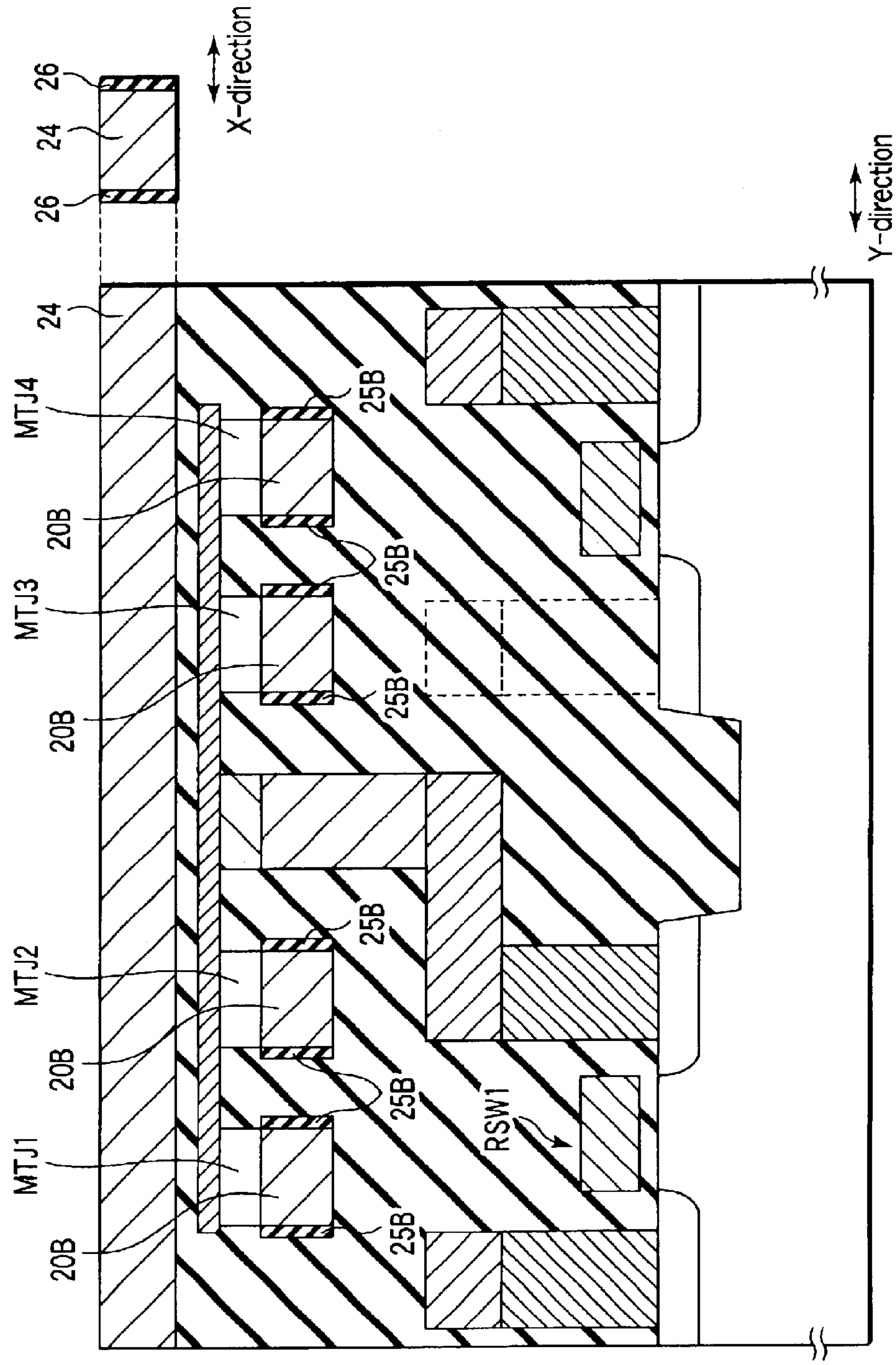
FIG. 51 is a sectional view showing the magnetic random access memory of Example 12 of the first invention.

FIGS. 50 and 51 show the device structure of the magnetic random access memory according to Example 12.

In the device structure of the present example, on the semiconductor substrate 11, a plurality of (four in the present example) MTJ elements 23 are arranged in the lateral direction (in the direction parallel to the surface of the semiconductor substrate). One end of each of these MTJ elements 23 is connected in common to the read selection switch RSW, and the other end thereof is independently connected to the data selection line (read bit line/write word line) 20B.

These MTJ elements 23 share one write bit line 24. The write bit line 24 is disposed right on the MTJ elements 23, and extends in the Y direction. The side surface of the write bit line 24 is coated with the yoke material 26 which has the high permeability. At the write operation time, the write current flows through the write bit line 24. The magnetic field generated by the write current is applied to the MTJ element 23 by the yoke material 26 with good efficiency.

The data selection line 20B is disposed right under the MTJ element 23, and extends in the X direction crossing at right angles to the Y direction. The side surface of the data selection line 20B is coated with the yoke material 25B which has the high permeability. At the write operation time, the write current flows through the data selection line 20B. The magnetic field generated by the write current is applied to the MTJ element 23 by the yoke material 25B with good efficiency.

It is to be noted that the yoke materials 25B, 26 may be constituted of the conductive material as shown in FIG. 50, or may also be constituted of the insulating material as shown in FIG. 51.

8. Memory Cell Array Structure

Examples of a memory cell array structure (circuit structure) realized by the device structures according to Reference Examples 1, 2, and Examples 1 to 12 will be described.

FIG. 52 shows a main part of the memory cell array structure of the magnetic random access memory.

In the cell array structure, it is assumed that the magnetization easy axis of the MTJ element is directed in the Y direction, and the direction of the write current flowing through the write word line therefore changes in accordance with write data.

Control signals φ1, φ31, φ32, φ33 control and turn on/off N-channel MOS transistors QN1, QN31, QN32, QN33 to determine whether or not the currents are passed through data selection lines (read/write bit lines) BL1, BL2, BL3. One end (the side of the N-channel MOS transistor QN1) of the data selection lines BL1, BL2, BL3 is connected to a current driving power supply 40. The current driving power supply 40 sets a potential of one end of the data selection lines BL1, BL2, BL3 to Vy.

The N-channel MOS transistors QN31, QN32, QN33 are connected between the other ends of the data selection lines BL1, BL2, BL3 and ground points Vss.

At the write operation time, the control signal φ1 turns to an "H" level, and one of the control signals φ31, φ32, φ33 turns to the "H" level. For example, when the data is written into the MTJ element of a memory cell MC1, as shown in a timing chart of FIG. 53, the control signals φ1, φ31 turn to the "H" level, and therefore the current flows through the data selection line BL1. At this time, control signals φ41, φ42, φ43 turn to an "L" level.

Moreover, Vx1 indicates a current driving power supply potential for "1"-write, and Vx2 indicates a current driving power supply potential for "0"-write.

Figure 53:
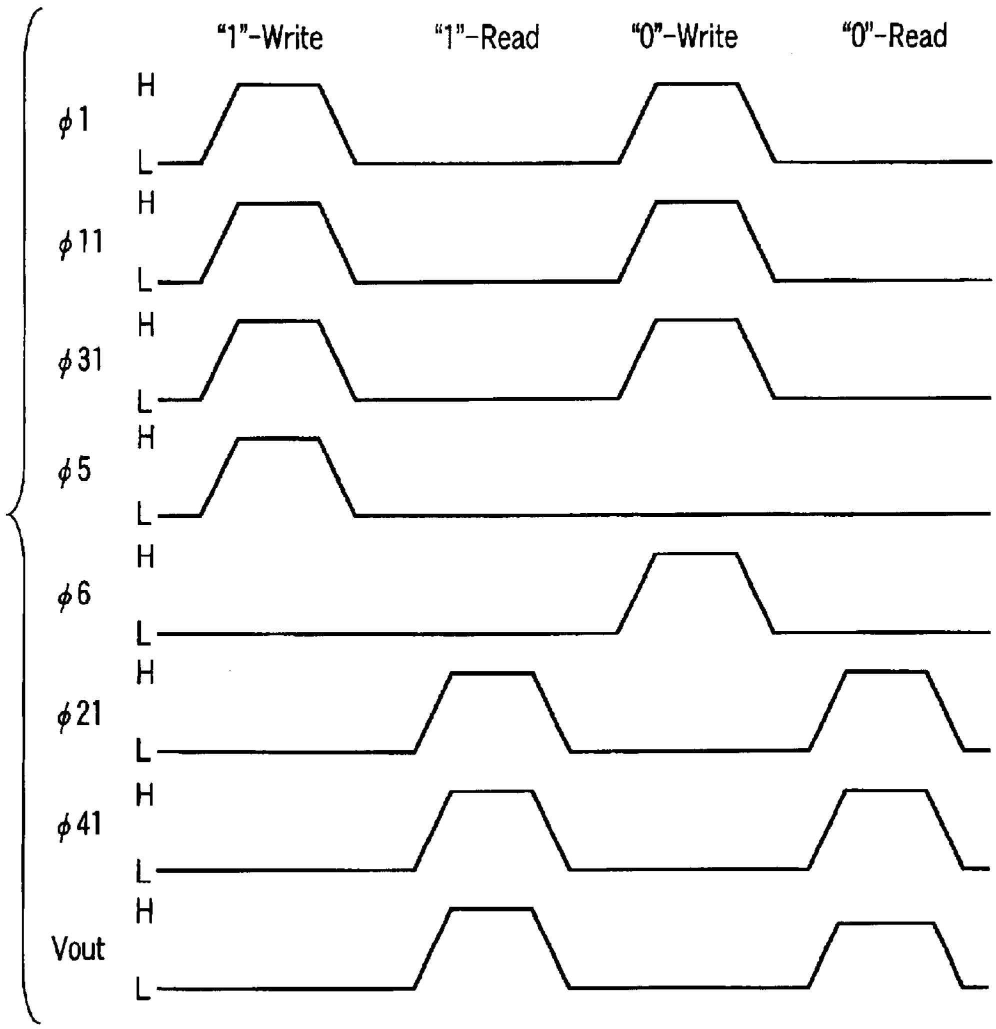
FIG. 53 is a diagram showing an operation waveform of the cell array of FIG. 52.

For example, at a "1"-write time, as shown in FIG. 53, the control signals φ5, φ11 turn to the "H" level. At this time, the control signals φ6, φ12 turn to the "L" level. For this, the current flows through a write word line WWL1 to the right from the left (to the ground point from a current driving power supply 41). Therefore, "1"-data is written in the MTJ element of the memory cell MC1 disposed in the intersection of the data selection line BL1 and write word line WWL1.

Moreover, at the "0"-write time, as shown in FIG. 53, the control signals φ6, φ11 turn to the "H" level. At this time, the control signals φ5, φ12 turn to the "L" level. For this, the current flows through the write word line WWL1 to the left from the right (to a current driving power supply 42 from the ground point Vss). Therefore, "0"-data is written in the MTJ element of the memory cell MC1 disposed in the intersection of the data selection line BL1 and write word line WWL1.

In this manner, at the write operation time, the control signal φ1 is used to supply a driving current to all the data selection lines, and the control signals φ31, φ32, φ33 are used to select the data selection line through which the driving current is passed. It is to be noted that in the present example the direction of the driving current flowing through the data selection line is constant. The control signals φ5, φ6 are used to control the direction of the current flowing through the write word line (corresponding to the write data). The control signals φ11, φ12 are used to select the write word line through which the driving current is passed.

In the present example, to simplify the description, a 3×2 memory cell array is assumed. The memory cells (MTJ elements) are disposed in the intersections of the write word lines WWL1, WWL2, and data selection lines BL1, BL2, BL3. Here, to read the data stored in the memory cell MC1, the control signals φ21, φ22, φ41, φ42, φ43 are controlled as follows.

That is, at the read operation time, the control signal φ21 given to a read word line RWL1 is set to the "H" level, and the N-channel MOS transistor connected to the read word line RWL1 is brought in an on state. At this time, the control signal φ22 given to another read word line RWL2 indicates the "L" level.

Moreover, when the control signal φ41 is set to the "H" level, and the other control signals φ42, φ43 are set to the "L" level, the driving current flows toward the ground point from a read power supply 43 via the memory cell MC1 (N-channel MOS transistor and MTJ element), data selection line BL1, N-channel MOS transistor QN41, and detection resistance Rs.

Therefore, detection voltages Vo are generated in the opposite ends of the detection resistance Rs in accordance with a data value of the memory cell MC1. For example, when the detection voltages Vo are detected by a sense amplifier S/A, the data of the memory cell (MTJ element) can be read.

9. Manufacturing Method

Next, a manufacturing method of the main device structure will be described among the device structures according to Reference Examples 1, 2 and Examples 1 to 12.

(1) Manufacturing Method of Device Structure According to Reference Example 2

Figure 54:
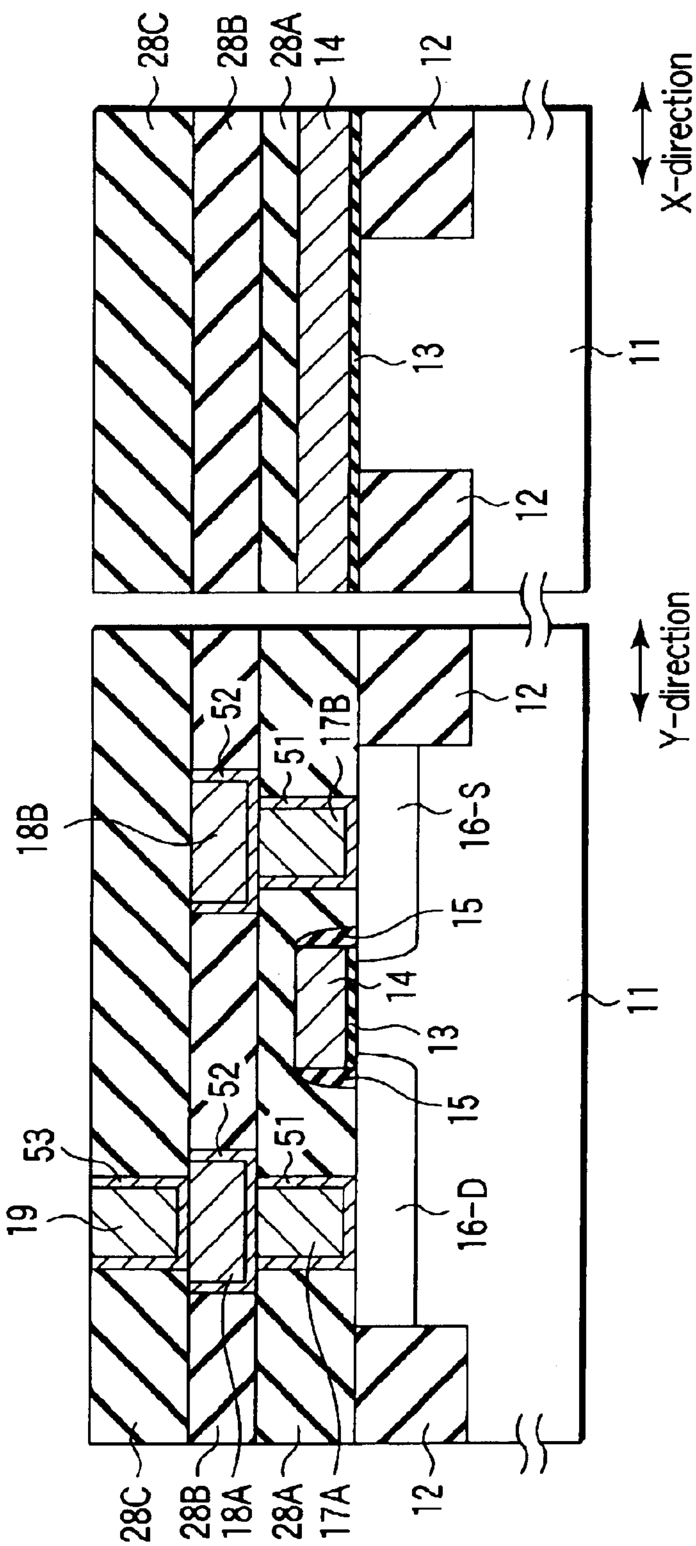
FIG. 54 is a sectional view showing one step of a manufacturing method of a device structure of Reference Example 2.

First, as shown in FIG. 54, known methods such as a photo engraving process (PEP) method, chemical vapor deposition (CVD) method, and chemical mechanical polishing (CMP) method are used to form the element isolation insulating layer 12 including an STI structure in the semiconductor substrate 11.

Moreover, the MOS transistor is formed as the read selection switch in the element region surrounded by the element isolation insulating layer 12.

The MOS transistor can easily be formed by forming the gate insulating layer 13 and gate electrode (read word line) 14 by the CVD, PEP, and reactive ion etching (RIE) methods, and subsequently forming the source region 16-S and drain region 16-D by an ion implantation method. It is to be noted that the side wall insulating layer 15 may also be formed on the side wall portion of the gate electrode 14 by the CVD and RIE methods.

Thereafter, an insulating layer 28A with which the MOS transistor is completely coated is formed by the CVD method. Moreover, the CMP method is used to flatten the surface of the insulating layer 28A. The PEP and RIE methods are used to form a contact hole reaching the source diffused layer 16-S and drain diffused layer 16-D of the MOS transistor in the insulating layer 28A.

On the insulating layer 28A and on inner surface of the contact hole, a sputter method is used to form a barrier metal (e.g., Ti, TiN or a lamination of these) 51. Subsequently, by the sputter method, the conductive material (e.g., an impurity-containing conductive polysilicon film, metal film, and the like) with which the contact hole is completely filled is formed on the insulating layer 28A. Subsequently, by the CMP method, the conductive material and barrier metal 51 are polished to form contact plugs 17A, 17B.

The CVD method is used to form an insulating layer 28B on the insulating layer 28A. The PEP and RIE methods are used to form a wiring trench in the insulating layer 28B. By the sputter method, a barrier metal (e.g., Ti, TiN or a lamination of these) 52 is formed on the insulating layer 28B and on the inner surface of the wiring trench. Subsequently, by the sputter method, the conductive material (e.g., the metal films such as aluminum and copper) with which the wiring trench is completely filled is formed on the insulating layer 28B. Thereafter, the conductive material and barrier metal 52 are polished by the CMP to form the intermediate layer 18A and source line 18B.

Subsequently, the CVD method is used to form an insulating layer 28C on the insulating layer 28B. The PEP and RIE methods are used to form a via hole in the insulating layer 28C. By the sputter method, a barrier metal (e.g., Ti, TiN or a lamination of these) 53 is formed on the insulating layer 28C and the inner surface of the via hole. Subsequently, by the sputter method, the conductive material (e.g., the metal films such as aluminum and copper) with which the via hole is completely filled is formed on the insulating layer 28C. Thereafter, the conductive material and barrier metal 53 are polished by the CMP method to form the via plug 19.

Figure 55:
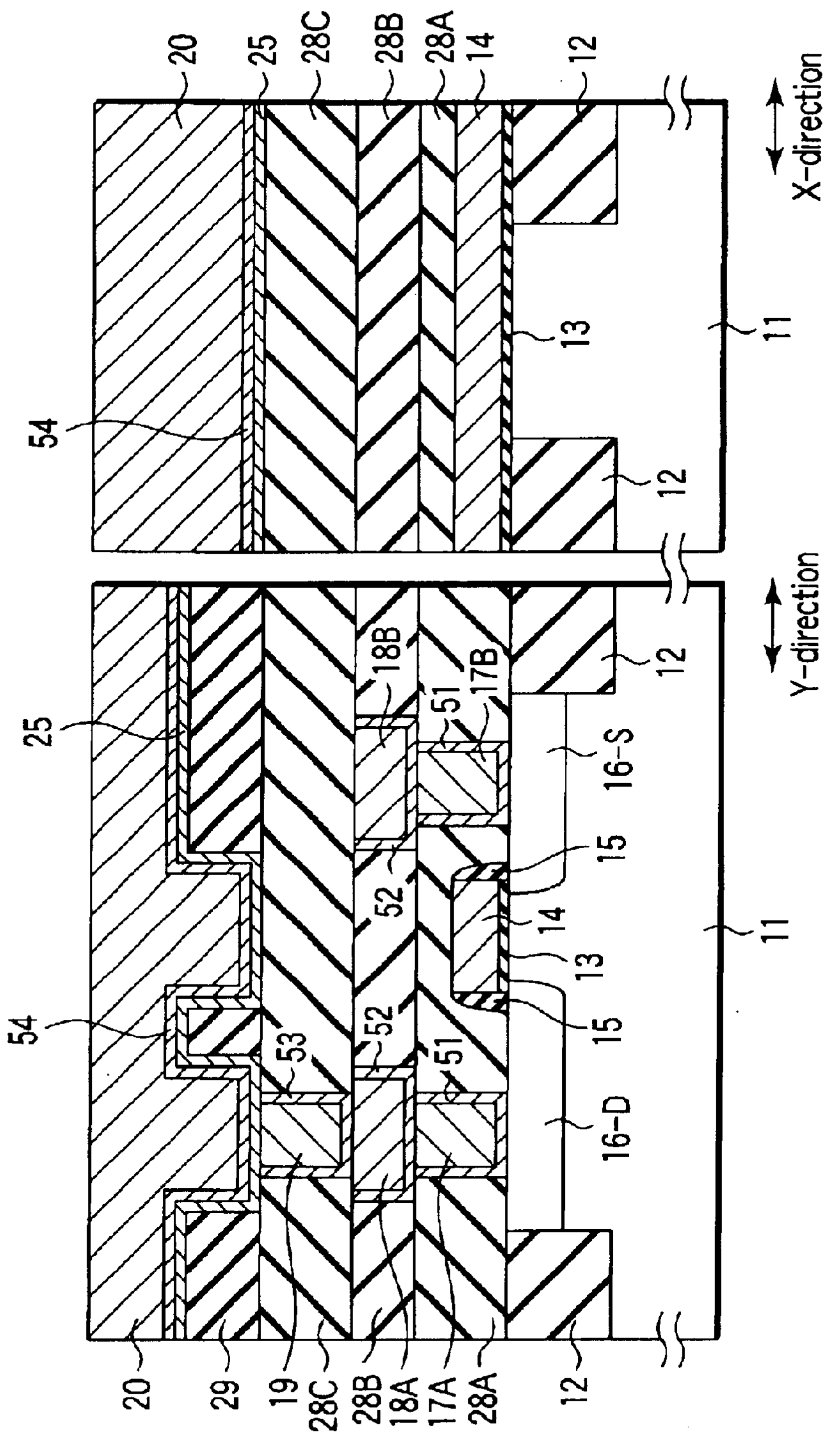
FIG. 55 is a sectional view showing one step of the manufacturing method of the device structure of Reference Example 2.

Next, as shown in FIG. 55, the CVD method is used to form an insulating layer 29 on the insulating layer 28C. The PEP and RIE methods are used to form the wiring trench in the insulating layer 29. The sputter method is used to form the yoke material (e.g., NiFe) 25 having the high permeability in a thickness of about 20 nm on the insulating layer 29 and in the wiring trench.

Subsequently, by the sputter method, a barrier metal (e.g., a lamination of Ti (10 nm) and TiN (10 nm) 54 is formed on the insulating layer 29 and in the wiring trench. Subsequently, the sputter method is used to form a conductive material (e.g., the metal films such as aluminum, copper, and alloy (AlCu)) 20 with which the wiring trench is completely filled in a thickness of about 200 nm on the insulating layer 29. Thereafter, when the conductive material 20 is polished by the CMP, the intermediate layer 20A and write word line 20B are formed (see FIG. 56).

Here, when the conductive material is constituted of copper (Cu), the conductive layer can be formed, for example, by a method comprising: first forming a Cu seed layer in about 80 nm; and stacking a sufficiently thick (e.g., about 800 nm) Cu layer on the Cu seed layer by a plating method.

Figure 56:
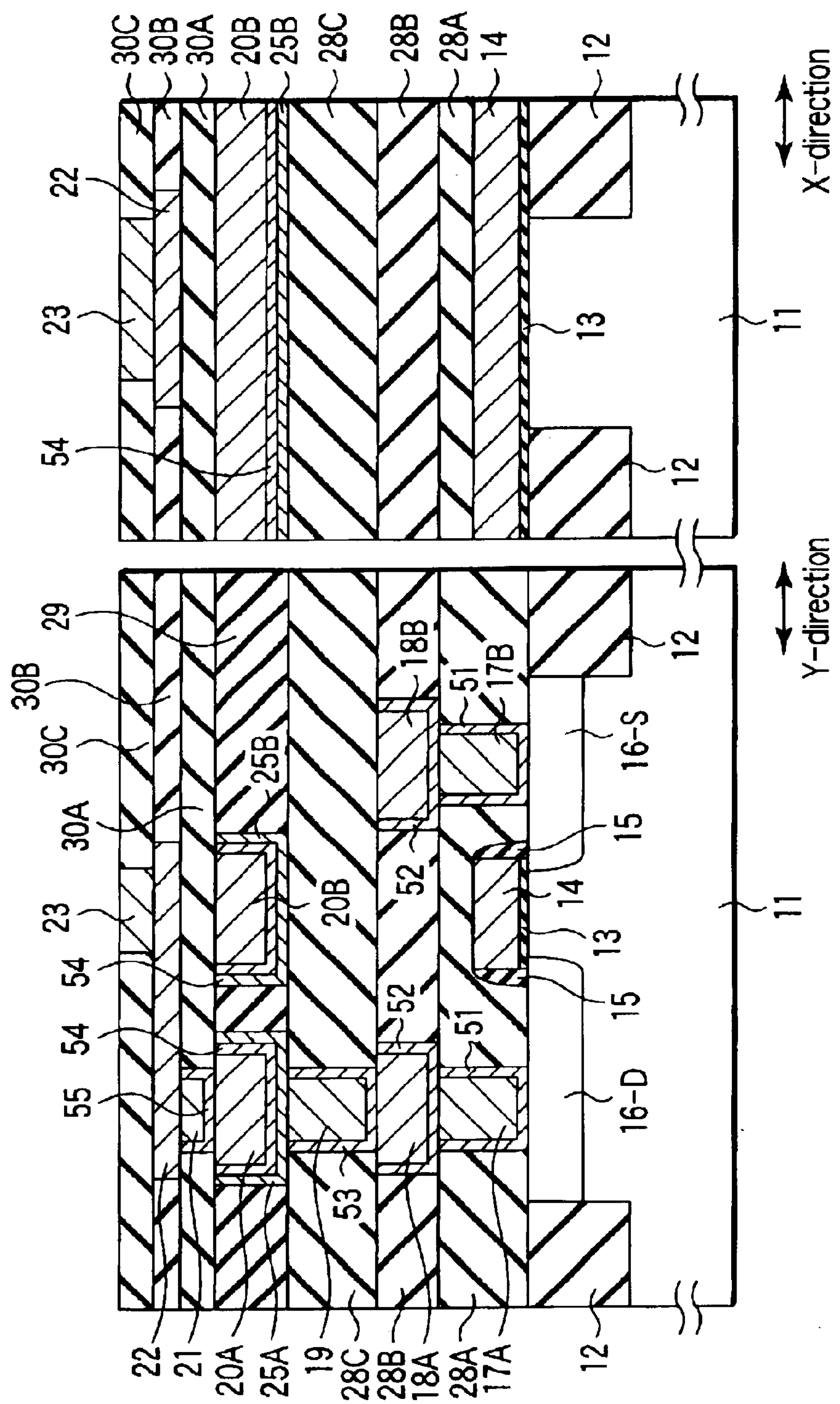
FIG. 56 is a sectional view showing one step of the manufacturing method of the device structure of Reference Example 2.

Next, as shown in FIG. 56, the CVD method is used to form an insulating layer 30A on the insulating layer 29. The PEP and RIE methods are used to form the via hole in the insulating layer 30A. By the sputter method, a barrier metal (e.g., Ti, TiN or the lamination of these) 55 is formed on the insulating layer 30A and on the inner surface of the via hole. Subsequently, by the CVD method, the conductive material (e.g., the metal films such as tungsten) with which the via hole is completely filled is formed on the insulating layer 30A. Thereafter, the conductive material and barrier metal 55 are polished by the CMP method to form the via plug 21.

Here, the thickness of the insulating layer 30A (or the height of the via plug 21) determines a distance between the write word line 20B and MTJ element 23. The intensity of the magnetic field decreases in inverse proportion to the distance, therefore the MTJ element is brought as close as possible toward the write word line 20B, and the data is preferably rewritten by a small driving current. Therefore, the thickness of the insulating layer 30A is set to be as thin as possible.

The CVD method is used to form an insulating layer 30B on the insulating layer 30A. The PEP and RIE methods are used to form the wiring trench in the insulating layer 30B. By the sputter method, on the insulating layer 30B, the conductive material (e.g., the metal films such as tantalum) with which the wiring trench is completely filled is formed. Thereafter, the conductive material is polished by the CMP to form local interconnect lines (lower electrodes of the MTJ elements) 22.

The CVD method is used to successively form, for example, NiFe (about 5 nm), IrMn (about 12 nm), CoFe (about 3 nm), AlOx (about 1.2 nm), CoFe (about 5 nm), and NiFe (about 15 nm) on the local interconnect lines 22. Thereafter, these stacked films are patterned to form the MTJ elements 23.

Moreover, after using the CVD method to form an insulating layer 30C with which the MTJ elements 23 are coated, for example, the insulating layer 30C on the MTJ elements 23 is removed by the CMP method, so that only the side surfaces of the MTJ elements 23 are coated with the insulating layer 30C.

Figure 57:
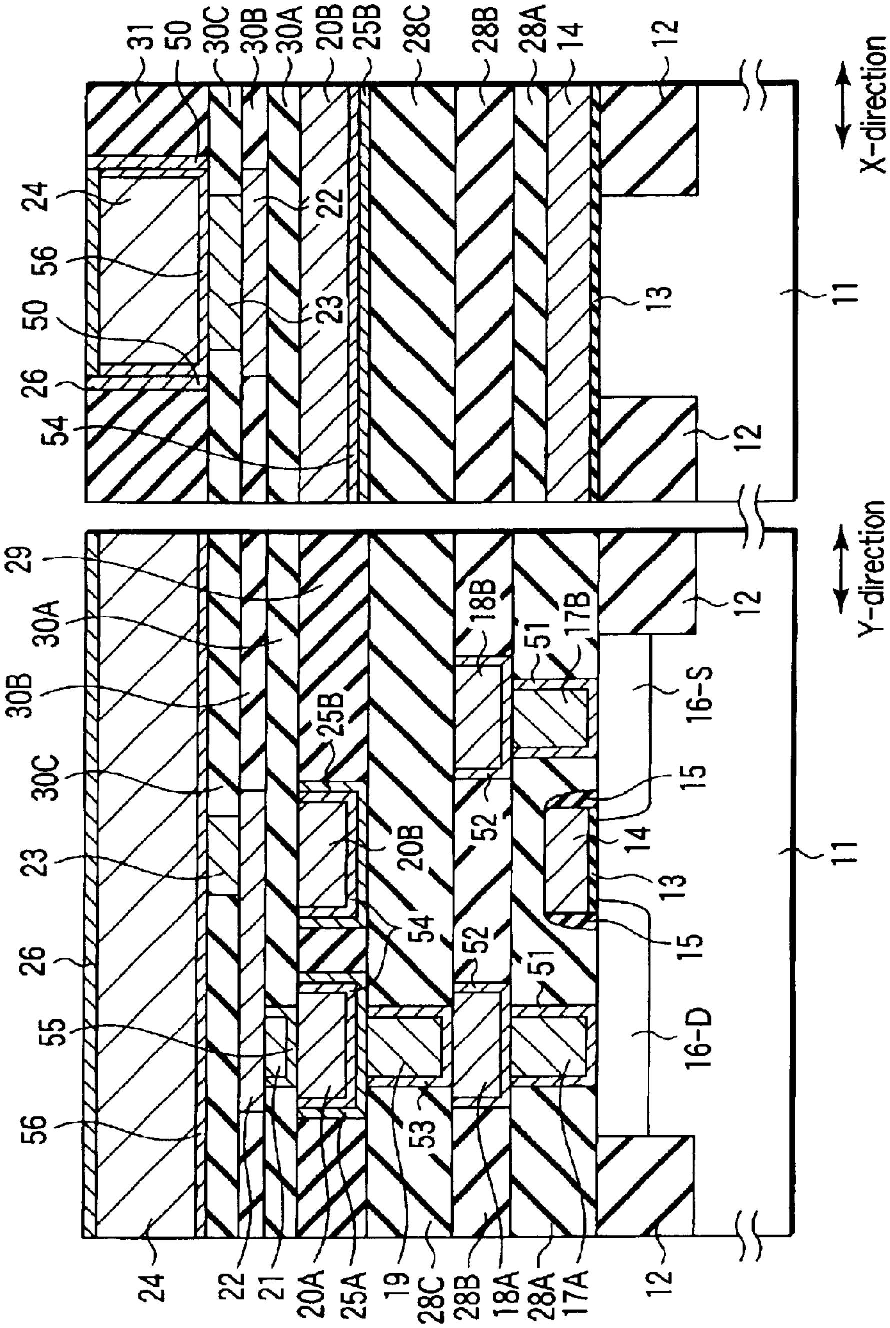
FIG. 57 is a sectional view showing one step of the manufacturing method of the device structure of Reference Example 2.

Next, as shown in FIG. 57, the CVD method is used to form an insulating layer 31 on the insulating layer 30C. The PEP and RIE methods are used to form the wiring trench in the insulating layer 31. The sputter and RIE methods are used to form the yoke material (e.g., NiFe) 26 having the high permeability in a thickness of about 20 nm on the side wall portion of the wiring trench of the insulating layer 31.

By the sputter method, a barrier metal (e.g., Ti, TiN or the lamination of these) 56 is formed on the insulating layer 31 and on the inner surface of the wiring trench. Subsequently, the conductive material (e.g., the metal films such as aluminum, copper, and alloy (AlCu)) is formed with which the wiring trench is completely filled on the insulating layer 31. Subsequently, the conductive material and barrier metal 56 are polished by the CMP to form the data selection line (read/write bit line) 24.

Furthermore, the sputter, PEP, and RIE methods are used to form the yoke material 27 with which the upper surface of the data selection line 24 is coated and which has the high permeability.

By the above-described steps, the magnetic random access memory according to Reference Example 1 (FIGS. 8 and 9) is completed.

It is to be noted that in the manufacturing method of the present example, the metal wirings 20A, 20B, 24 are formed by the damascene process. However, for example, the RIE process may also be used to form the metal wirings 20A, 20B, 24.

Moreover, in the manufacturing method of the present example, after forming the yoke materials 25A, 25B, the barrier metal 54 is formed. Instead, for example, after forming the barrier metal 54, the yoke materials 25A, 25B may also be formed.

(2) Manufacturing Method of Device Structure According to Examples 1 to 3

Reference Example 2 relates to the device structure in which the lower and side surfaces of the write word line are coated with the yoke material, and the upper and side surfaces of the data selection line are coated with the yoke material.

On the other hand, in Example 1, only the lower surface of the write word line is coated with the yoke material. In Example 2, only the upper surface of the data selection line is coated with the yoke material. In Example 3, only the lower surface of the write word line and only the upper surface of the data selection line are coated with the yoke material. Other respects of Examples 1 to 3 are the same as those of Reference Example 2.

Therefore, when the manufacturing method of the device structure according to Example 3 is described, the device structure according to Examples 1, 2 can easily be formed by a combination of the manufacturing method of the device structure according to Reference Example 2 with the manufacturing method of the device structure according to Example 3.

The manufacturing method of the device structure according to Example 3 will therefore be described hereinafter.

Figure 58:
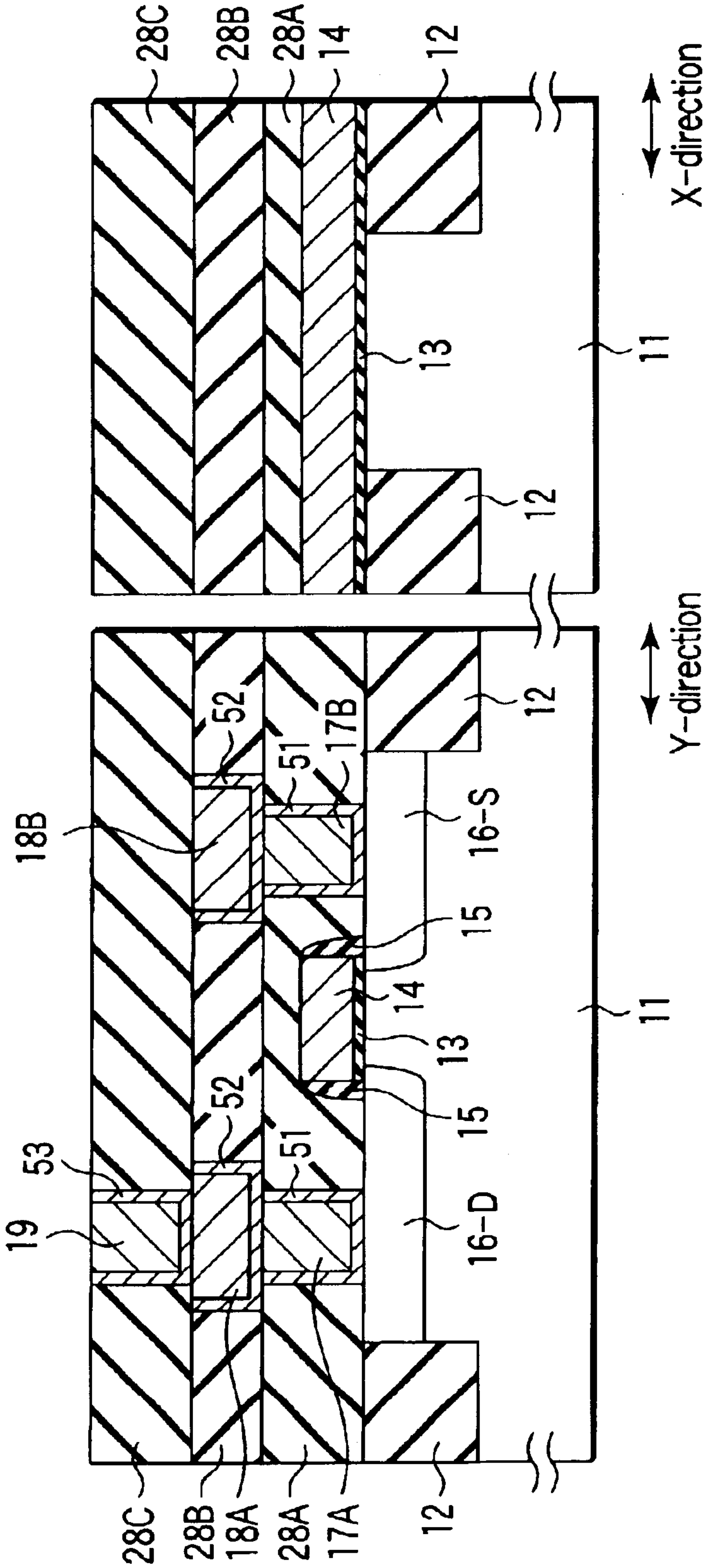
FIG. 58 is a sectional view showing one step of the manufacturing method of the device structure of Example 3 of the first invention.

First, as shown in FIG. 58, the known methods such as the photo engraving process (PEP) method, chemical vapor deposition (CVD) method, and chemical mechanical polishing (CMP) method are used to form the element isolation insulating layer 12 including the STI structure in the semiconductor substrate 11.

Moreover, the MOS transistor is formed as the read selection switch in the element region surrounded by the element isolation insulating layer 12.

The MOS transistor can easily be formed by forming the gate insulating layer 13 and gate electrode (read word line) 14 by the CVD, PEP, and reactive ion etching (RIE) methods, and subsequently forming the source region 16-S and drain region 16-D by the ion implantation method. It is to be noted that the side wall insulating layer 15 may also be formed on the side wall portion of the gate electrode 14 by the CVD and RIE methods.

Thereafter, the insulating layer 28A with which the MOS transistor is completely coated is formed by the CVD method. Moreover, the CMP method is used to flatten the surface of the insulating layer 28A. The PEP and RIE methods are used to form the contact hole which reaches the source diffused layer 16-S and drain diffused layer 16-D of the MOS transistor in the insulating layer 28A.

On the insulating layer 28A and on the inner surface of the contact hole, the sputter method is used to form the barrier metal (e.g., Ti, TiN or the lamination of these) 51. Subsequently, by the sputter method, the conductive material (e.g., the impurity-containing conductive polysilicon film, metal film, and the like) with which the contact hole is completely filled is formed on the insulating layer 28A. Subsequently, by the CMP method, the conductive material and barrier metal 51 are polished to form the contact plugs 17A, 17B.

The CVD method is used to form the insulating layer 28B on the insulating layer 28A. The PEP and RIE methods are used to form the wiring trench in the insulating layer 28B. By the sputter method, the barrier metal (e.g., Ti, TiN or the lamination of these) 52 is formed on the insulating layer 28B and on the inner surface of the wiring trench. Subsequently, by the sputter method, the conductive material (e.g., the metal films such as aluminum and copper) with which the wiring trench is completely filled is formed on the insulating layer 28B. Thereafter, the conductive material and barrier metal 52 are polished by the CMP to form the intermediate layer 18A and source line 18B.

Subsequently, the CVD method is used to form the insulating layer 28C on the insulating layer 28B. The PEP and RIE methods are used to form the via hole in the insulating layer 28C. By the sputter method, the barrier metal (e.g., Ti, TiN or the lamination of these) 53 is formed on the insulating layer 28C and the inner surface of the via hole. Subsequently, by the sputter method, the conductive material (e.g., the metal films such as aluminum and copper) with which the via hole is completely filled is formed on the insulating layer 28C. Thereafter, the conductive material and barrier metal 53 are polished by the CMP method to form the via plug 19.

Figure 59:
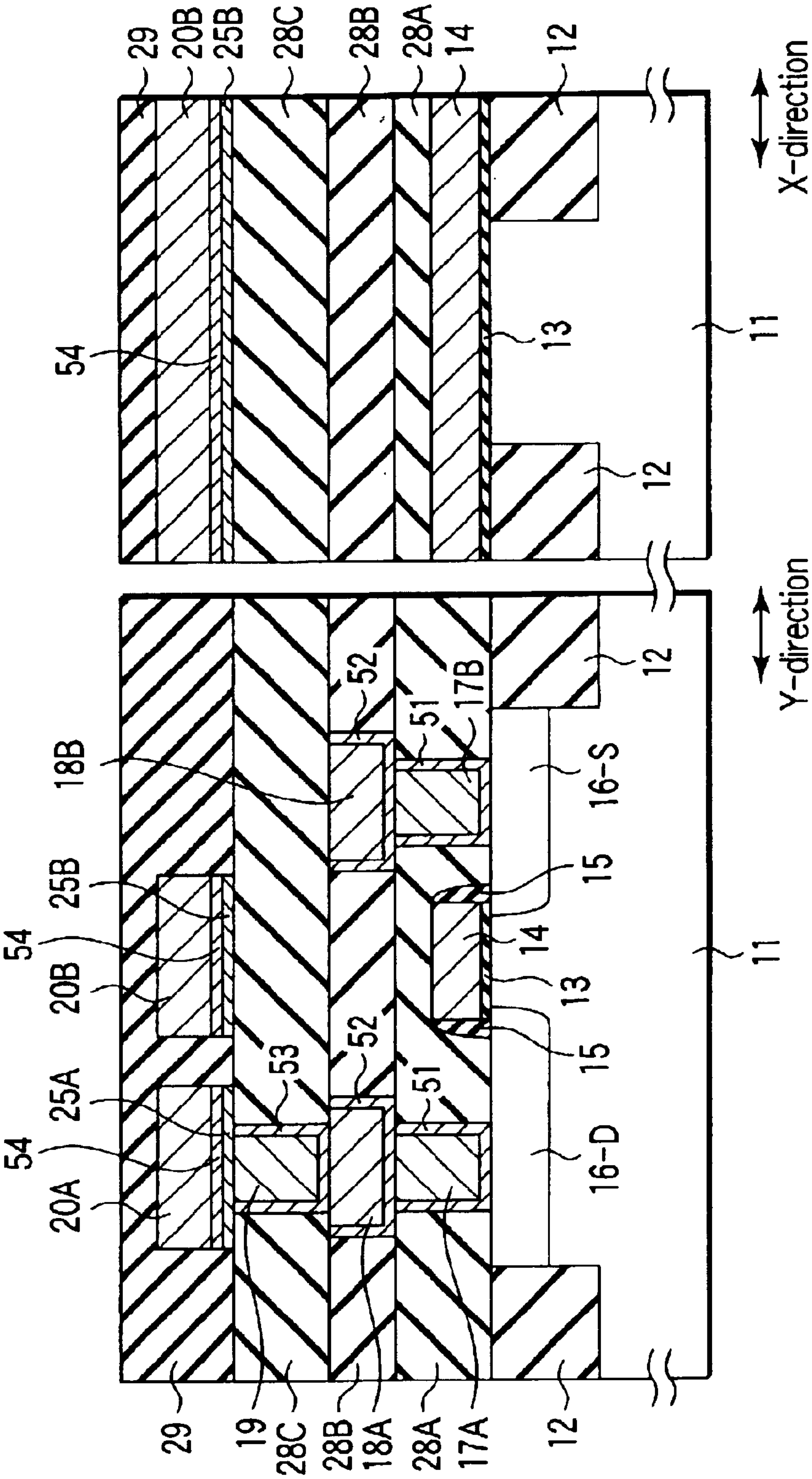
FIG. 59 is a sectional view showing one step of the manufacturing method of the device structure of Example 3 of the first invention.

Next, as shown in FIG. 59, the sputter method is used to form the yoke materials (e.g., NiFe) 25A, 25B having the high permeability in a thickness of about 20 nm on the insulating layer 28C. Subsequently, the barrier metal (e.g., the lamination of Ti (10 nm) and TiN (10 nm)) 54 is formed on the yoke materials 25A, 25B by the sputter method. Subsequently, the sputter method is used to form the conductive material (e.g., AlCU) in a thickness of about 200 nm on the barrier metal 54. Thereafter, the PEP and RIE methods are used to etch the conductive material, barrier metal 54, and yoke materials 25A, 25B. Then, the intermediate layer 20A and write word line 20B are formed.

Thereafter, the CVD method is used to form the insulating layer 29 with which the intermediate layer 20A and write word line 20B are completely coated on the insulating layer 28C. Moreover, the surface of the insulating layer 29 is flattened by the CMP method.

Figure 60:
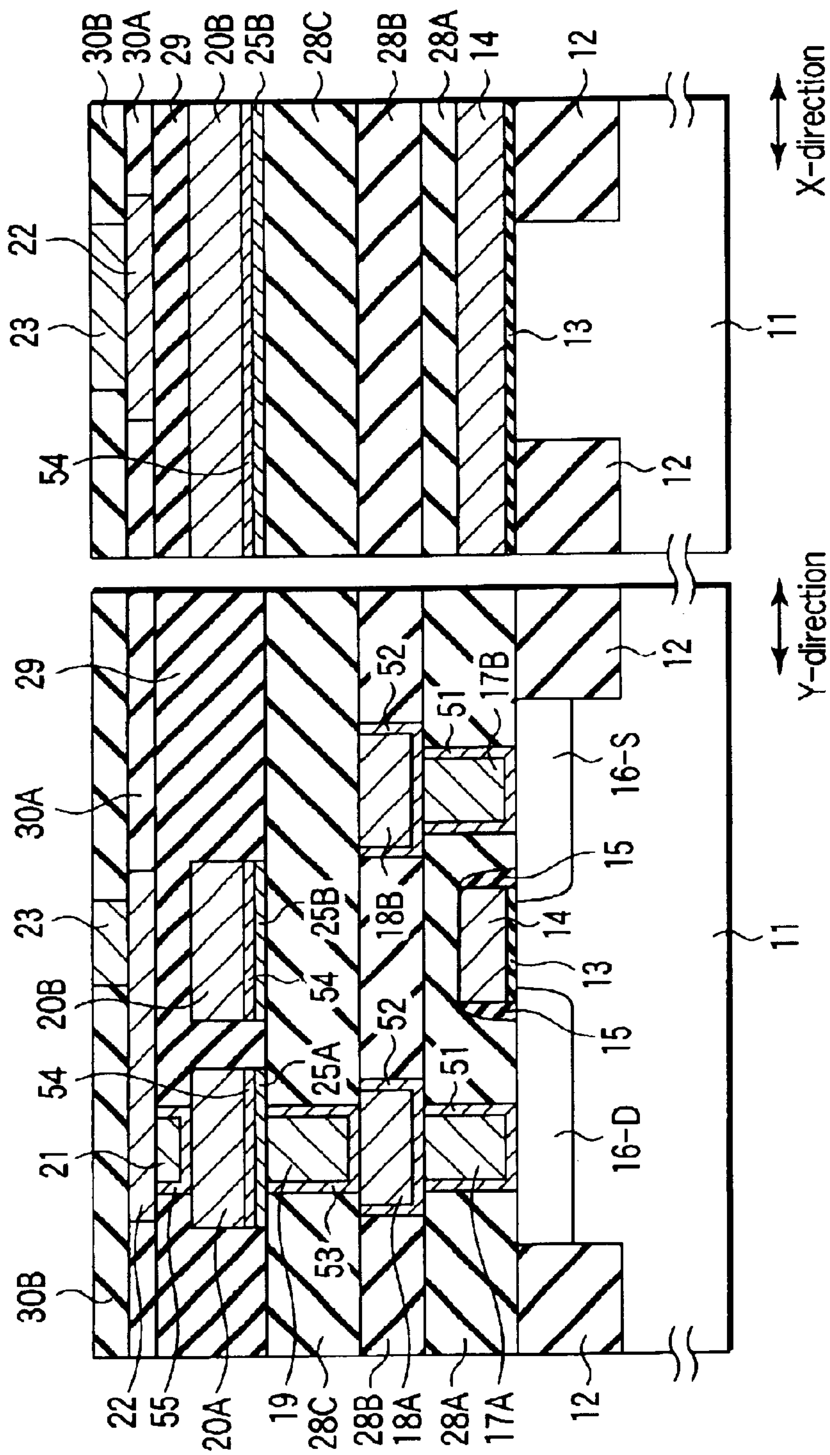
FIG. 60 is a sectional view showing one step of the manufacturing method of the device structure of Example 3 of the first invention.

Next, as shown in FIG. 60, the PEP and RIE methods are used to form the via hole which reaches the intermediate layer 20A in the insulating layer 29. The barrier metal (e.g., TiN) 55 is formed in a thickness of about 10 nm on the insulating layer 29 and on the inner surface of the via hole by the sputter method. Subsequently, the conductive material (e.g., the metal films such as tungsten) with which the via hole is completely filled is formed on the insulating layer 29 by the CVD method. Thereafter, the conductive material and barrier metal 55 are polished by the CMP method to form the via plug 21.

The CVD method is used to form the insulating layer 30A on the insulating layer 29. The PEP and RIE methods are used to formed the wiring trench in the insulating layer 30A. By the sputter method, the conductive material (e.g., the metal films such as Ta) with which the wiring trench is completely filled is formed in a thickness of about 50 nm on the insulating layer 30A. Thereafter, the conductive material is polished by the CMP to form the local interconnect line (lower electrode of the MTJ element) 22.

The CVD method is used to successively form, for example, NiFe (about 5 nm), IrMn (about 12 nm), CoFe (about 3 nm), AlOx (about 1.2 nm), CoFe (about 5 nm), and NiFe (about 15 nm) on the local interconnect lines 22. Thereafter, these stacked films are patterned to form the MTJ elements 23.

Moreover, after using the CVD method to form the insulating layer 30B with which the MTJ elements 23 are coated, for example, the insulating layer 30B on the MTJ elements 23 is removed by the CMP method, so that only the side surfaces of the MTJ elements 23 are coated with the insulating layer 30B.

Figure 61:
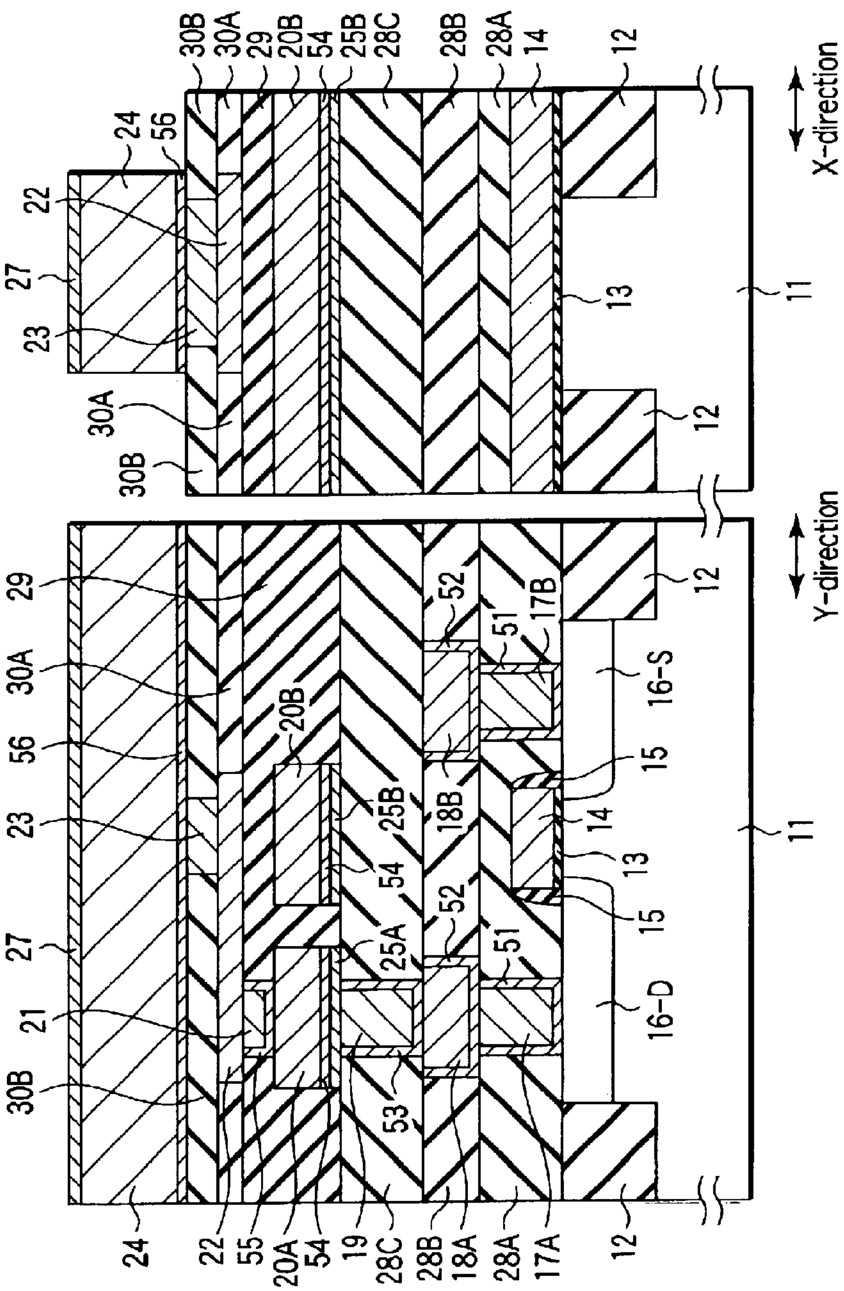
FIG. 61 is a sectional view showing one step of the manufacturing method of the device structure of Example 3 of the first invention.

Next, as shown in FIG. 61, by the sputter method, the barrier metal (e.g., the lamination of Ti (25 nm) and TiN (25 nm)) 56 is formed on the insulating layer 30B. Subsequently, the conductive material (e.g., AlCu, and the like) is formed in a thickness of about 650 nm on the barrier metal 56. Subsequently, by the sputter method, the yoke material (e.g., NiFe, and the like) 27 having the high permeability is formed in a thickness of about 50 nm on the conductive material. Thereafter, the PEP and RIE methods are used to etch the yoke material 27, conductive material, and barrier metal 56 to form the data selection line (read/write bit line) 24.

By the above-described steps, the magnetic random access memory according to Example 3 (FIGS. 20 and 21) is completed.

It is to be noted that in the manufacturing method of the present example, the metal wiring 24 is formed by the RIE process. However, for example, the damascene process may also be used to form the metal wiring 24.

Moreover, in the manufacturing method of the present example, after forming the yoke materials 25A, 25B, the barrier metal 54 is formed. Instead, for example, after forming the barrier metal 54, the yoke materials 25A, 25B may also be formed.

(3) Manufacturing Method of Device Structure According to Examples 4 to 12

Reference Example 2 relates to the device structure in which the lower and side surfaces of the write word line are coated with the yoke material, and the upper and side surfaces of the data selection line are coated with the yoke material.

On the other hand, in Example 4, only the side surface of the write word line is coated with the yoke material. In Example 5, only the side surface of the data selection line is coated with the yoke material. In Example 6, only the side surface of the write word line and only the side surface of the data selection line are coated with the yoke material. Moreover, Examples 7 to 12 relate to the modification examples of Examples 4 to 6. The other respects of Examples 4 to 6 are the same as those of Examples 2.

Therefore, when the manufacturing method of the device structure according to Example 6 is described, the device structures according to Examples 4, 5, further Examples 7 to 12 can easily be formed by the combination of the manufacturing method of the device structure according to Reference Example 2 with that according to Example 6.

The manufacturing method of the device structure according to Example 6 will therefore be described hereinafter.

Figure 62:
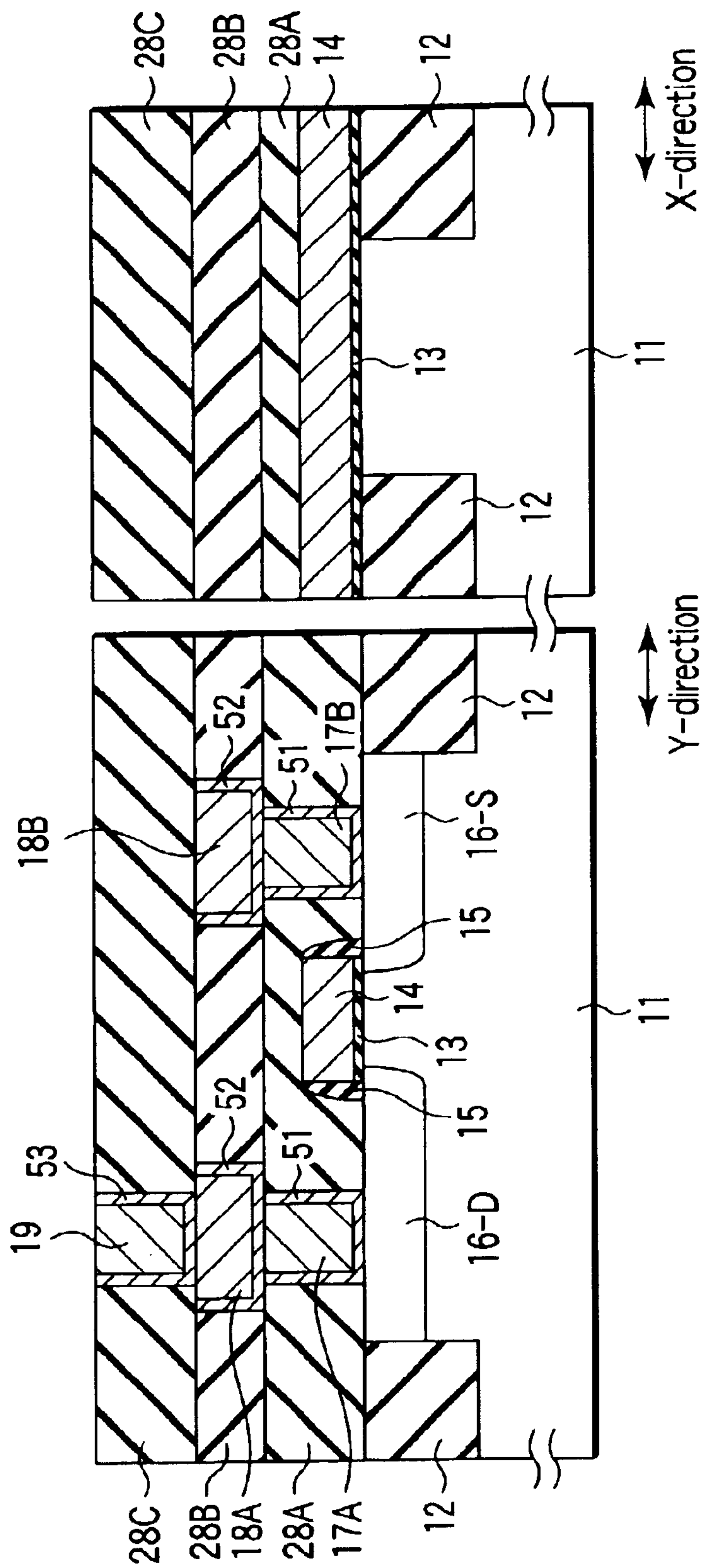
FIG. 62 is a sectional view showing one step of the manufacturing method of the device structure of Example 6 of the first invention.

First, as shown in FIG. 62, the known methods such as the photo engraving process (PEP) method, chemical vapor deposition (CVD) method, and chemical mechanical polishing (CMP) method are used to form the element isolation insulating layer 12 including the STI structure in the semiconductor substrate 11.

Moreover, the MOS transistor is formed as the read selection switch in the element region surrounded by the element isolation insulating layer 12.

The MOS transistor can easily be formed by forming the gate insulating layer 13 and gate electrode (read word line) 14 by the CVD, PEP, and reactive ion etching (RIE) methods, and subsequently forming the source region 16-S and drain region 16-D by the ion implantation method. It is to be noted that the side wall insulating layer 15 may also be formed on the side wall portion of the gate electrode 14 by the CVD and RIE methods.

Thereafter, the insulating layer 28A with which the MOS transistor is completely coated is formed by the CVD method. Moreover, the CMP method is used to flatten the surface of the insulating layer 28A. The PEP and RIE methods are used to form the contact hole which reaches the source diffused layer 16-S and drain diffused layer 16-D of the MOS transistor in the insulating layer 28A.

On the insulating layer 28A and on the inner surface of the contact hole, the sputter method is used to form the barrier metal (e.g., Ti, TiN or the lamination of these) 51. Subsequently, by the sputter method, the conductive material (e.g., the impurity-containing conductive polysilicon film, metal film, and the like) with which the contact hole is completely filled is formed on the insulating layer 28A. Subsequently, by the CMP method, the conductive material and barrier metal 51 are polished to form the contact plugs 17A, 17B.

The CVD method is used to form the insulating layer 28B on the insulating layer 28A. The PEP and RIE methods are used to form the wiring trench in the insulating layer 28B. By the sputter method, the barrier metal (e.g., Ti, TiN or the lamination of these) 52 is formed on the insulating layer 28B and on the inner surface of the wiring trench. Subsequently, by the sputter method, the conductive material (e.g., the metal films such as aluminum and copper) with which the wiring trench is completely filled is formed on the insulating layer 28B. Thereafter, the conductive material and barrier metal 52 are polished by the CMP to form the intermediate layer 18A and source line 18B.

Subsequently, the CVD method is used to form the insulating layer 28C on the insulating layer 28B. The PEP and RIE methods are used to form the via hole in the insulating layer 28C. By the sputter method, the barrier metal (e.g., Ti, TiN or the lamination of these) 53 is formed on the insulating layer 28C and the inner surface of the via hole. Subsequently, by the sputter method, the conductive material (e.g., the metal films such as aluminum and copper) with which the via hole is completely filled is formed on the insulating layer 28C. Thereafter, the conductive material and barrier metal 53 are polished by the CMP method to form the via plug 19.

Figure 63:
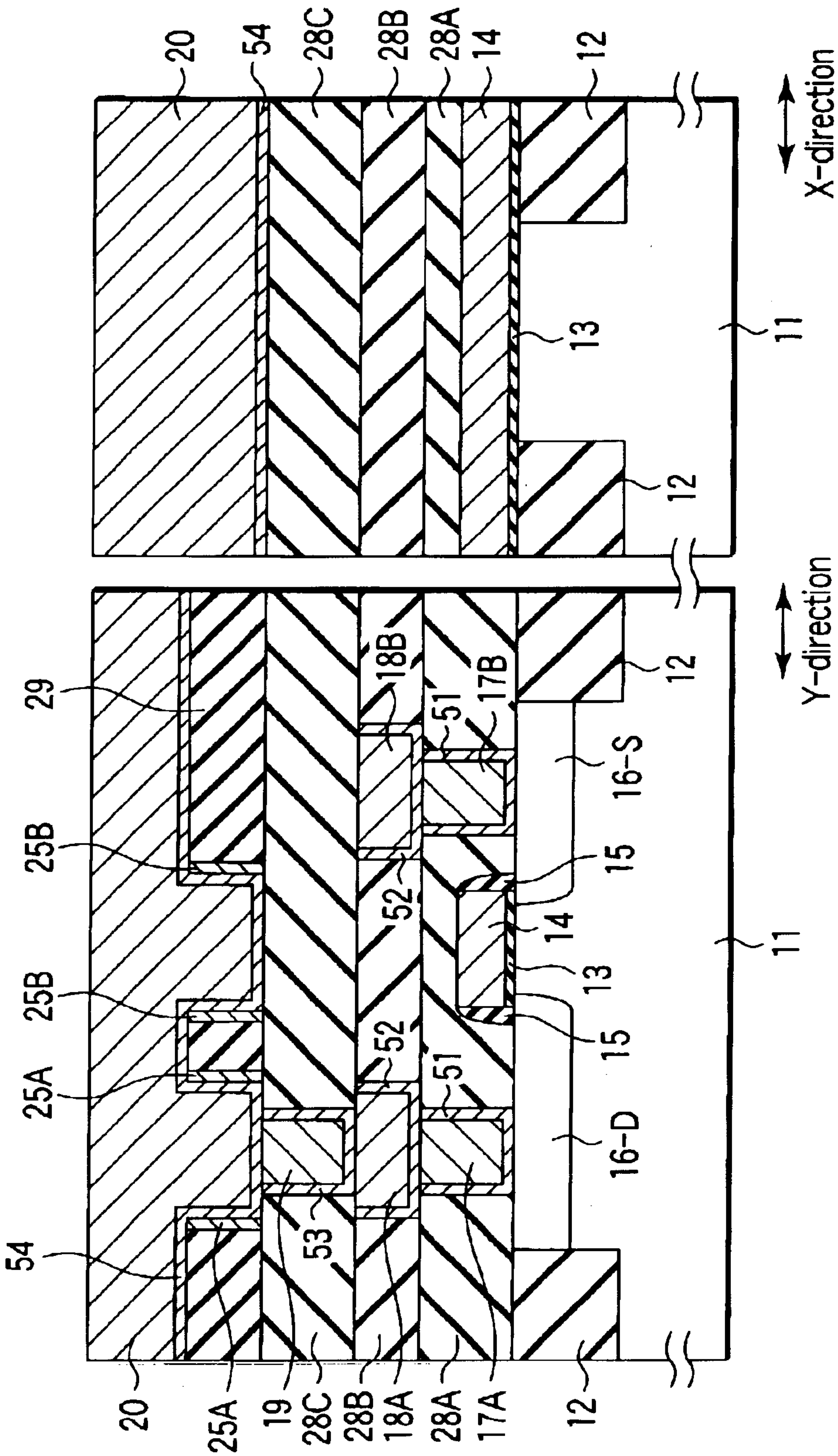
FIG. 63 is a sectional view showing one step of the manufacturing method of the device structure of Example 6 of the first invention.

Next, as shown in FIG. 63, the CVD method is used to form the insulating layer 29 on the 28C. The PEP and RIE methods are used to form the wiring trench in the insulating layer 29. The sputter method is used to form the yoke materials (e.g., NiFe) 25A, 25B having the high permeability in a thickness of about 20 nm on the insulating layer 29 and in the wiring trench. Subsequently, when the RIE method is used to etch the yoke materials 25A, 25B, the yoke materials 25A, 25B remain only in the side wall portion of the wiring trench.

Moreover, the sputter method is used to form the barrier metal (e.g., Ti, TiN, or the lamination of these) 54 on the insulating layer 29 and on the inner surface of the wiring trench. Subsequently, the sputter method is used to form the conductive material (e.g., the metal films such as aluminum and copper) 20 with which the wiring trench is completely filled. Thereafter, when the conductive material 20 and barrier metal 54 are polished by CMP, the intermediate layer 20A and write word line 20B are formed (see FIG. 64).

Figure 64:
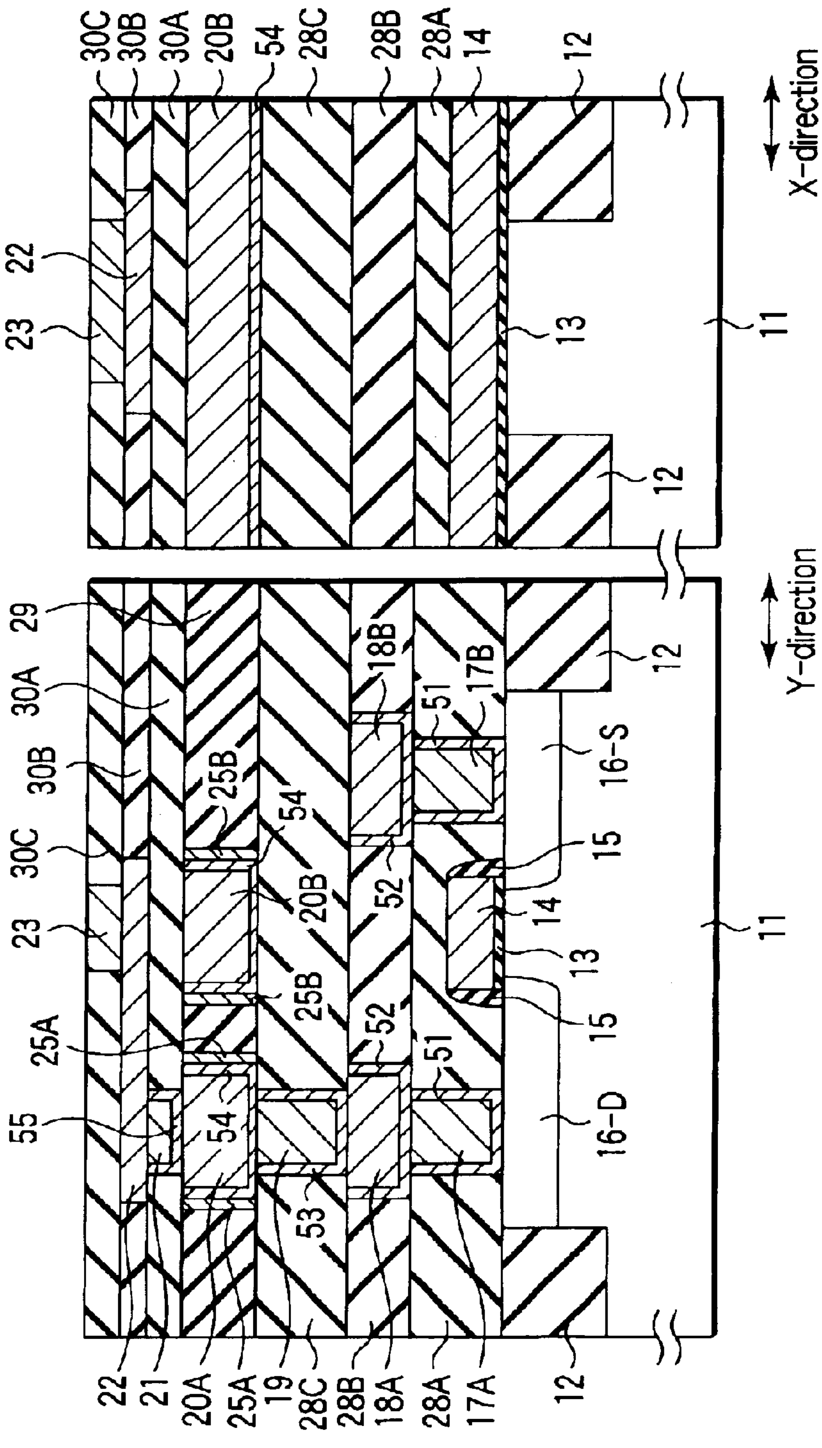
FIG. 64 is a sectional view showing one step of the manufacturing method of the device structure of Example 6 of the first invention.

Next, as shown in FIG. 64, the CVD method is used to form the insulating layer 30A on the insulating layer 29. The PEP and RIE methods are used to form the via hole in the insulating layer 30A. By the sputter method, the barrier metal (e.g., TiN) 55 is formed in a thickness of about 10 nm on the insulating layer 30A and on the inner surface of the via hole. Subsequently, by the CVD method, the conductive material (e.g., the metal films such as tungsten) with which the via hole is completely filled is formed on the insulating layer 30A. Thereafter, the conductive material and barrier metal 55 are polished by the CMP method to form the via plug 21.

Here, the thickness of the insulating layer 30A (or the height of the via plug 21) determines the distance between the write word line 20B and MTJ element 23. The intensity of the magnetic field decreases in inverse proportion to the distance, therefore the MTJ element is brought as close as possible toward the write word line 20B, and the data is preferably rewritten by the small driving current. Therefore, the thickness of the insulating layer 30A is set to be as thin as possible.

The CVD method is used to form the insulating layer 30B on the insulating layer 30A. The PEP and RIE methods are used to form the wiring trench in the insulating layer 30B. By the sputter method, on the insulating layer 30B, the conductive material (e.g., the metal films such as tantalum) with which the wiring trench is completely filled is formed. Thereafter, the conductive material is polished by the CMP to form the local interconnect lines (lower electrodes of the MTJ elements) 22.

The CVD method is used to successively form, for example, NiFe (about 5 nm), IrMn (about 12 nm), CoFe (about 3 nm), AlOx (about 1.2 nm), CoFe (about 5 nm), and NiFe (about 15 nm) on the local interconnect lines 22. Thereafter, these stacked films are patterned to form the MTJ elements 23.

Moreover, after using the CVD method to form the insulating layer 30C with which the MTJ elements 23 are coated, for example, the insulating layer 30C on the MTJ elements 23 is removed by the CMP method, so that only the side surfaces of the MTJ elements 23 are coated with the insulating layer 30C.

Figure 65:
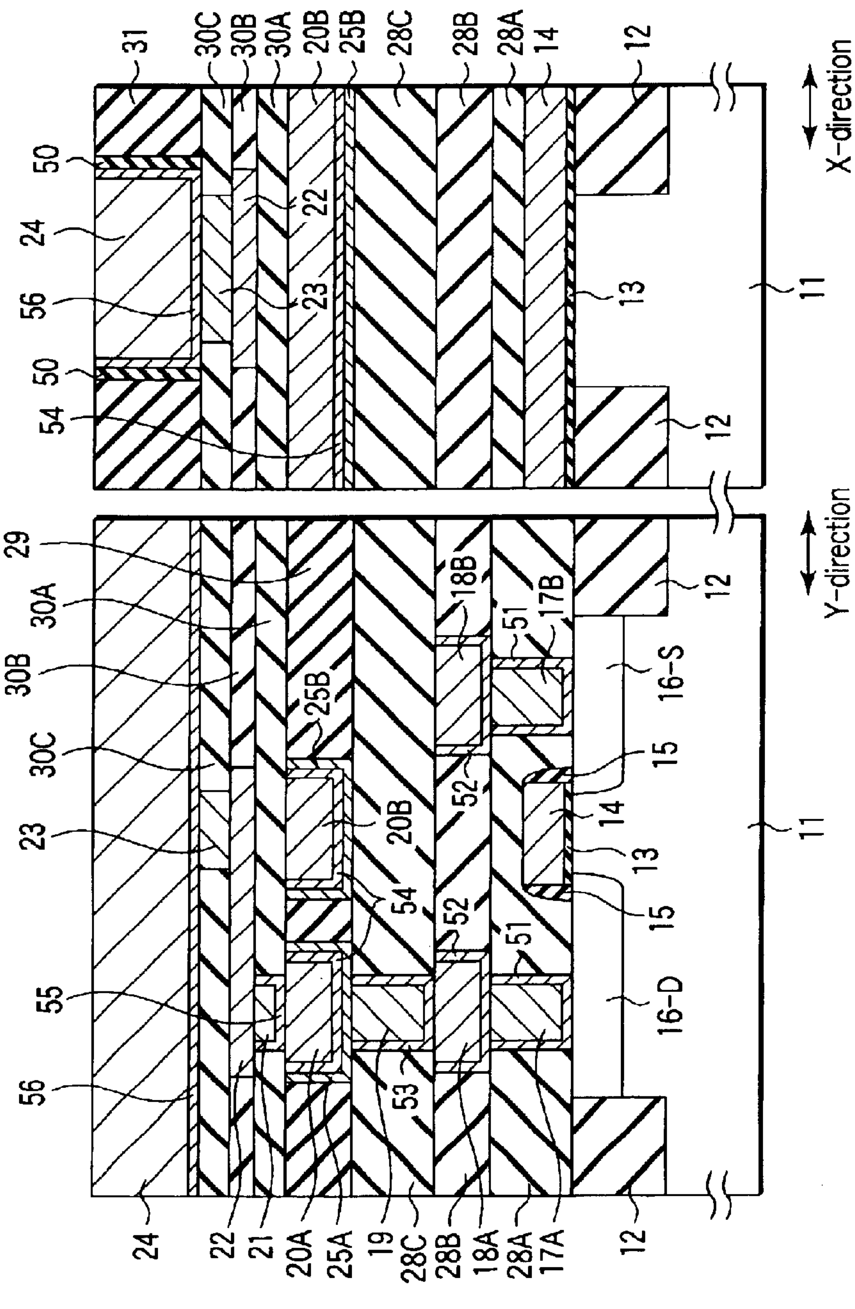
FIG. 65 is a sectional view showing one step of the manufacturing method of the device structure of Example 6 of the first invention.

Next, as shown in FIG. 65, the CVD method is used to form the insulating layer 31 on the insulating layer 30C. The PEP and RIE methods are used to form the wiring trench in the insulating layer 31. The sputter and RIE methods are used to form the yoke material (e.g., NiFe) 26 having the high permeability in a thickness of about 50 nm on the side wall portion of the wiring trench of the insulating layer 31.

By the sputter method, the barrier metal (e.g., the lamination of Ti (25 nm) and TiN (25 nm)) 55 is formed on the insulating layer 31 and on the inner surface of the wiring trench. Subsequently, the conductive material (e.g., AlCu) with which the wiring trench is completely filled is formed in a thickness of about 650 nm on the insulating layer 31. Thereafter, the conductive material and barrier metal 56 are polished by the CMP to form the data selection line (read/write bit line) 24.

By the above-described steps, the magnetic random access memory according to Example 6 (FIGS. 32 and 33) is completed.

It is to be noted that in the manufacturing method of the present example, the metal wirings 20A, 20B, 24 are formed by the damascene process. However, for example, the RIE process may also be used to form the metal wirings 20A, 20B, 24.

Moreover, in the manufacturing method of the present example, after forming the yoke materials 25A, 25B, the barrier metal 54 is formed. Instead, for example, after forming the barrier metal 54, the yoke materials 25A, 25B may also be formed.

10. Others

In the description of the manufacturing methods according to Reference Examples 1, 2 and Examples 1 to 6, the examples of the magnetic random access memory in which one MTJ element and one read selection switch (MOS transistor) constitute the memory cell and which includes the write word line and data selection line (read/write bit line) have been described.

However, naturally the present invention is not limited to the magnetic random access memory including this cell array structure, and can also be applied to all the magnetic random access memories, for example, including the device structures as described in Examples 7 to 12.

The present invention can also be applied, for example, to a magnetic random access memory (cross point type) which does not include the read selection switch, magnetic random access memory in which the read bit line and write bit line are disposed separately from each other, magnetic random access memory in which the bits are stored in one MTJ element, and the like.

Moreover, the yoke material which has the high permeability may exist in a part of the surface of the write word line and write bit line. The material may also be disposed in patterns other than the patterns of Examples 1 to 6, such as i. the lower surface of the write word line (lower write line) and the side surface of the data selection line (upper write line), ii. the side surface of the write word line (lower write line) and the upper surface of the data selection line (upper write line), and iii. the lower and side surfaces of the write word line (lower write line) and the upper and side surfaces of the data selection line (upper write line).

As described above, according to the magnetic random access memory according to the examples of the first invention of the present application, the yoke material having the high permeability is disposed in a part of the write word line and write bit line, and thereby the synthesized magnetic field can be allowed to act on the MTJ element with good efficiency at the write operation time.

[Second Invention]

The magnetic random access memory according to the examples of the second invention of the present application will be described hereinafter in detail with reference to the drawings.

1. Example 1

Figure 66:
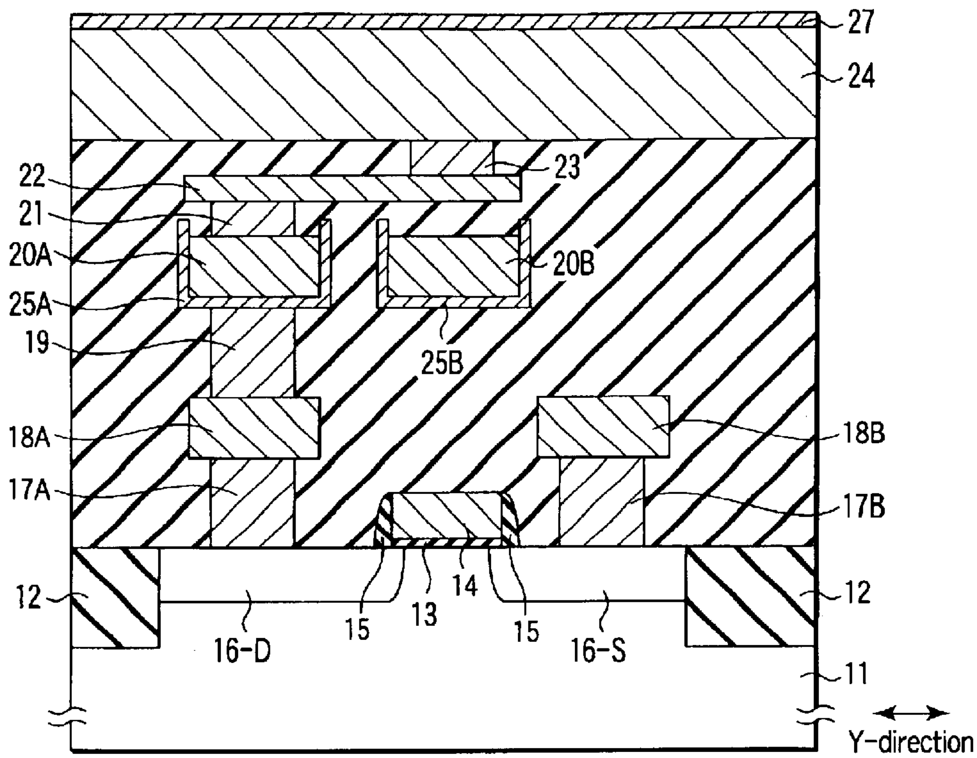
FIG. 66 is a sectional view showing the magnetic random access memory of Example 1 of the second invention.
Figure 67:
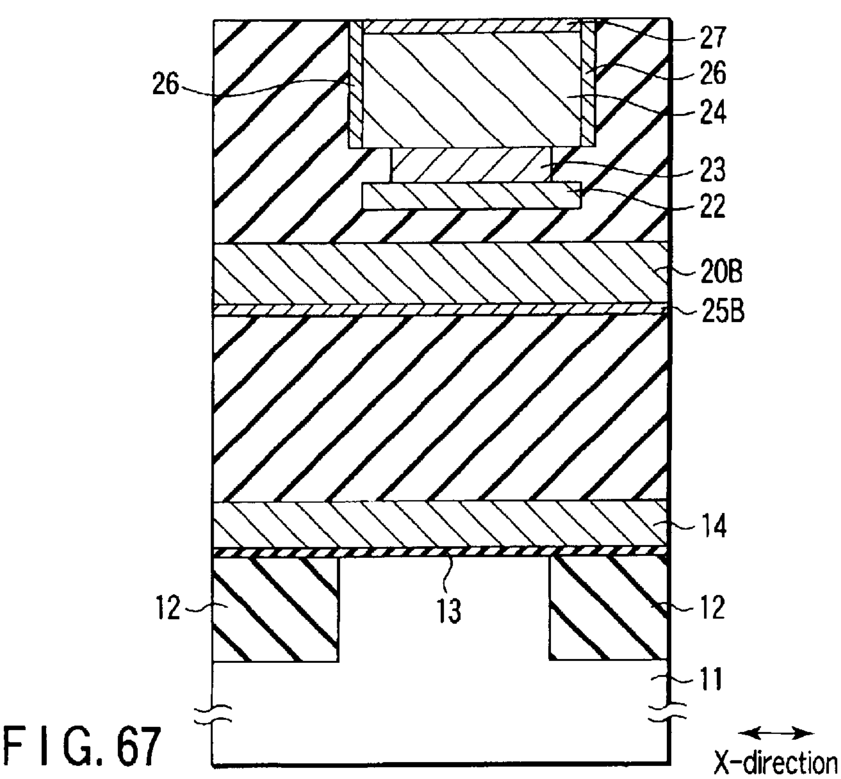
FIG. 67 is a sectional view showing the magnetic random access memory of Example 1 of the second invention.
Figure 68:
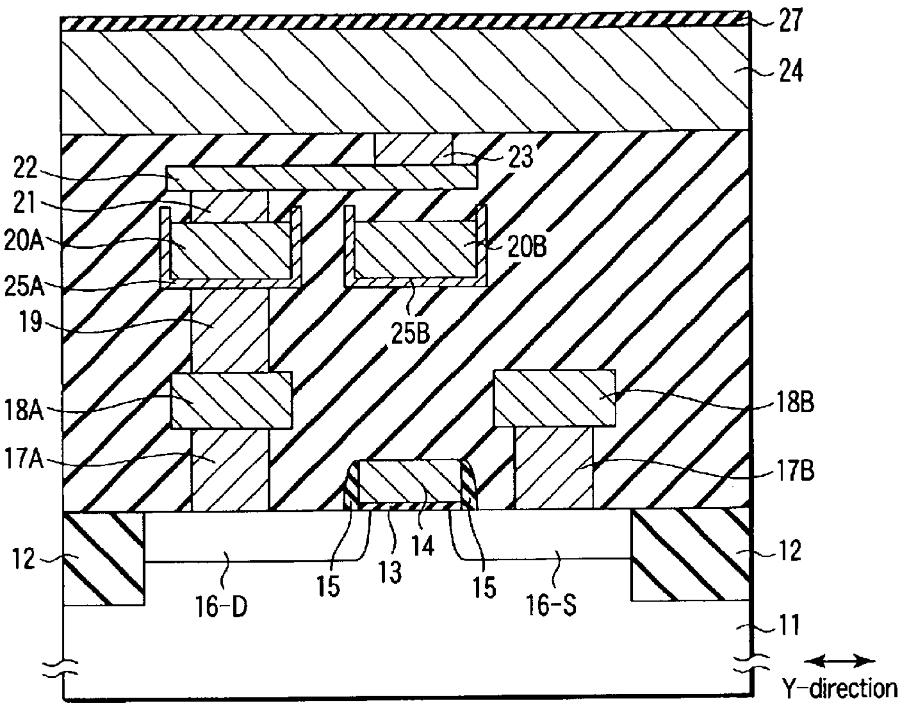
FIG. 68 is a sectional view showing the magnetic random access memory of Example 1 of the second invention.
Figure 69:
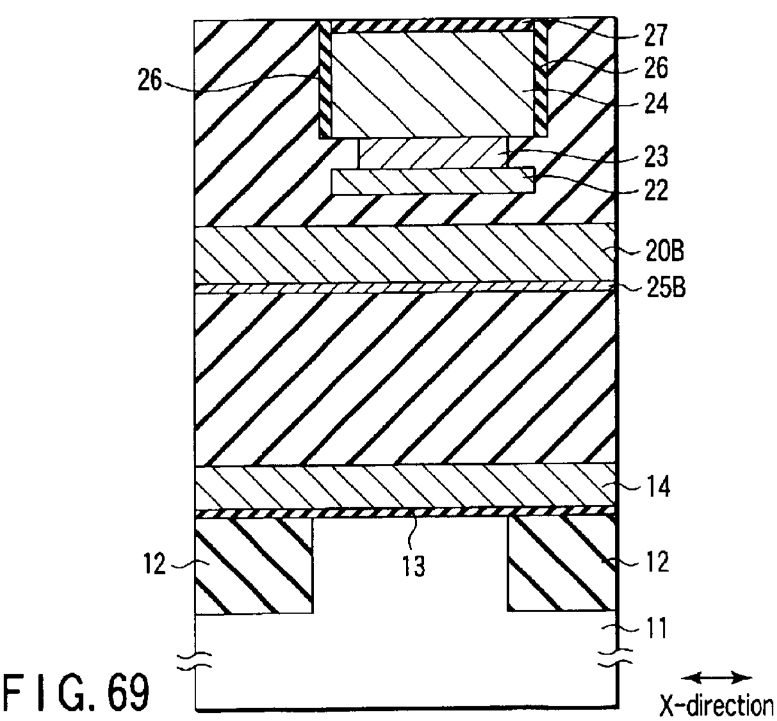
FIG. 69 is a sectional view showing the magnetic random access memory of Example 1 of the second invention.
Figure 70:
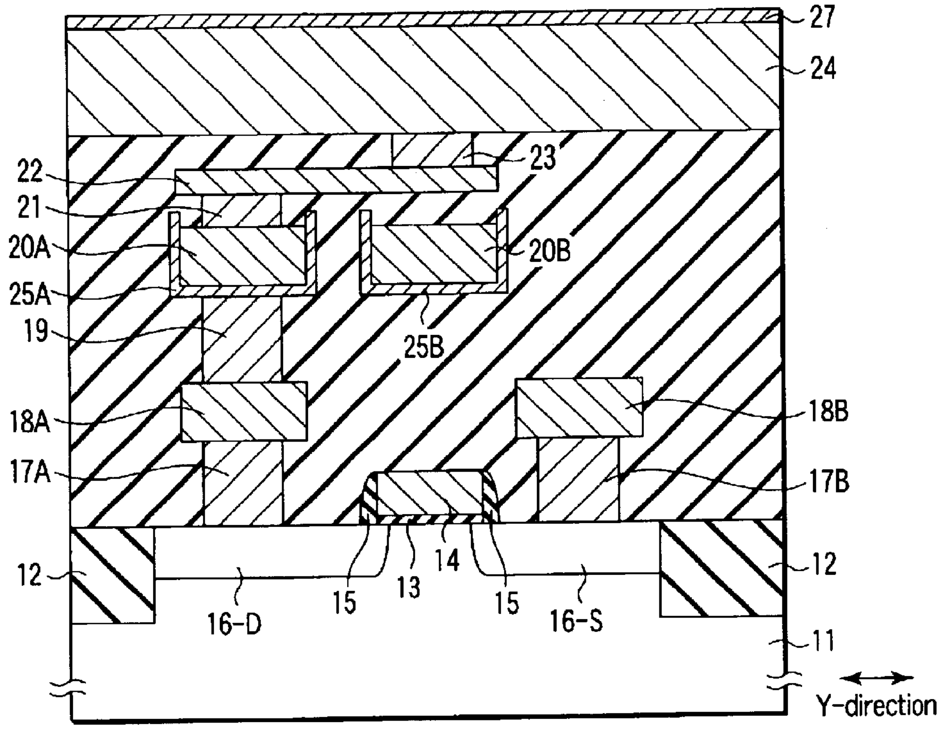
FIG. 70 is a sectional view showing a modification example of Example 1 of the second invention.
Figure 71:
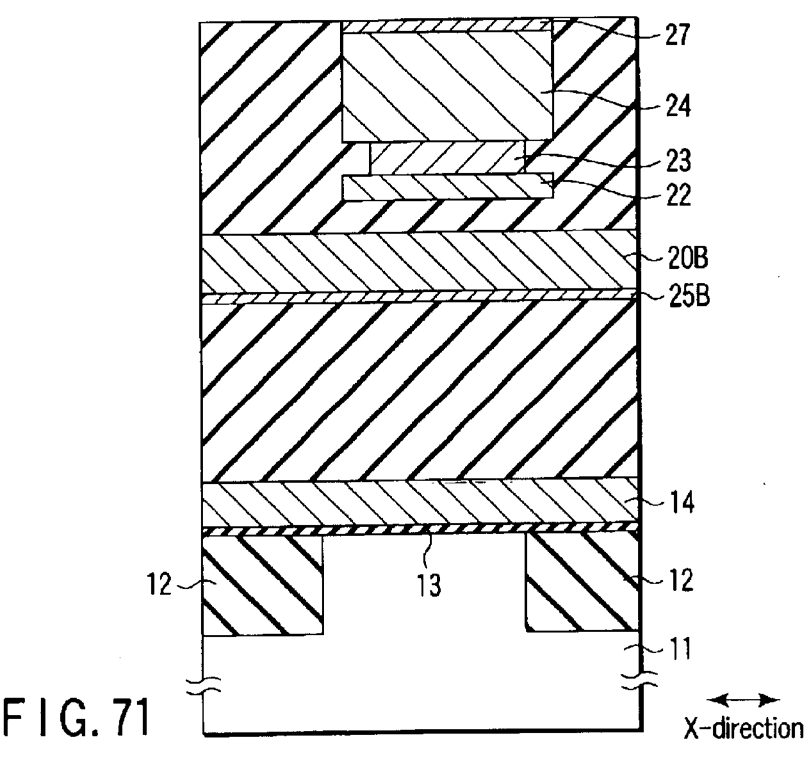
FIG. 71 is a sectional view showing the modification example of Example 1 of the second invention.
Figure 74:
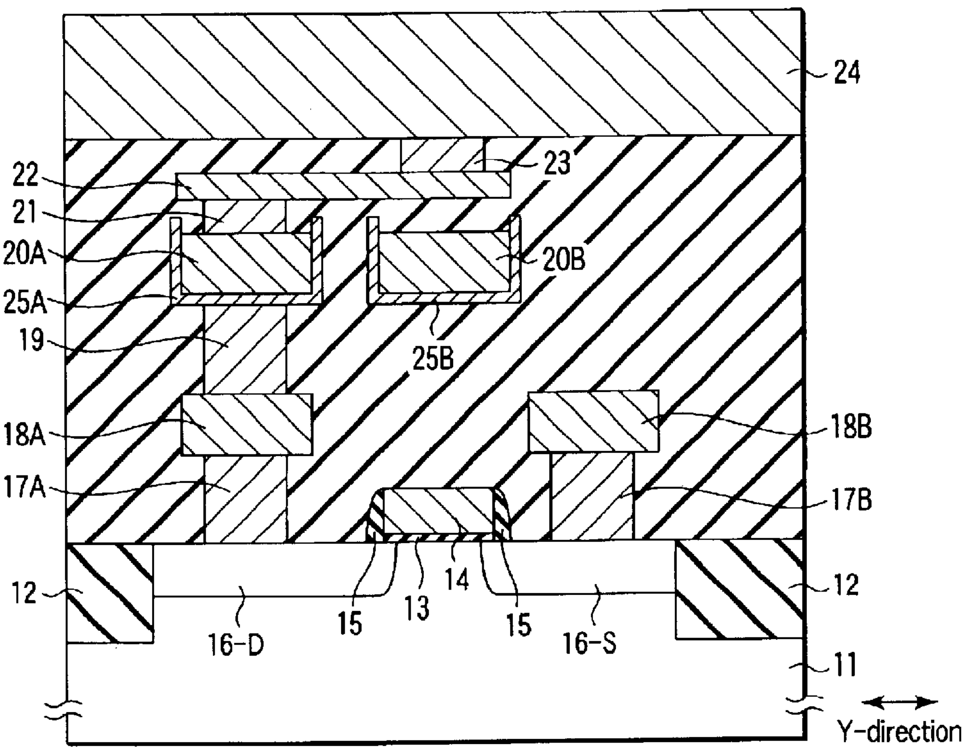
FIG. 74 is a sectional view showing the modification example of Example 1 of the second invention.
Figure 75:
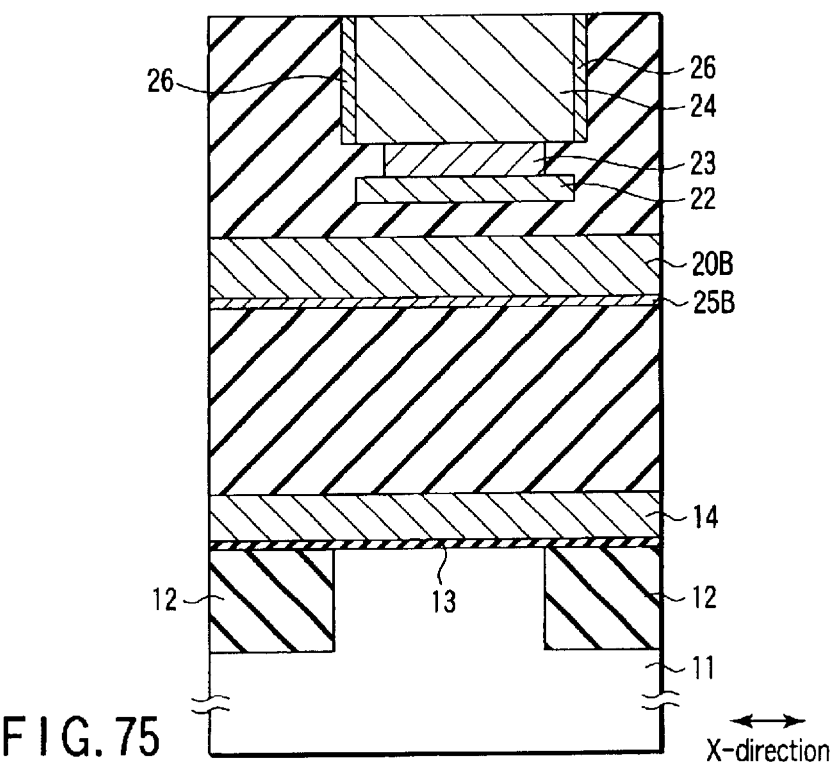
FIG. 75 is a sectional view showing the modification example of Example 1 of the second invention.
Figure 76:
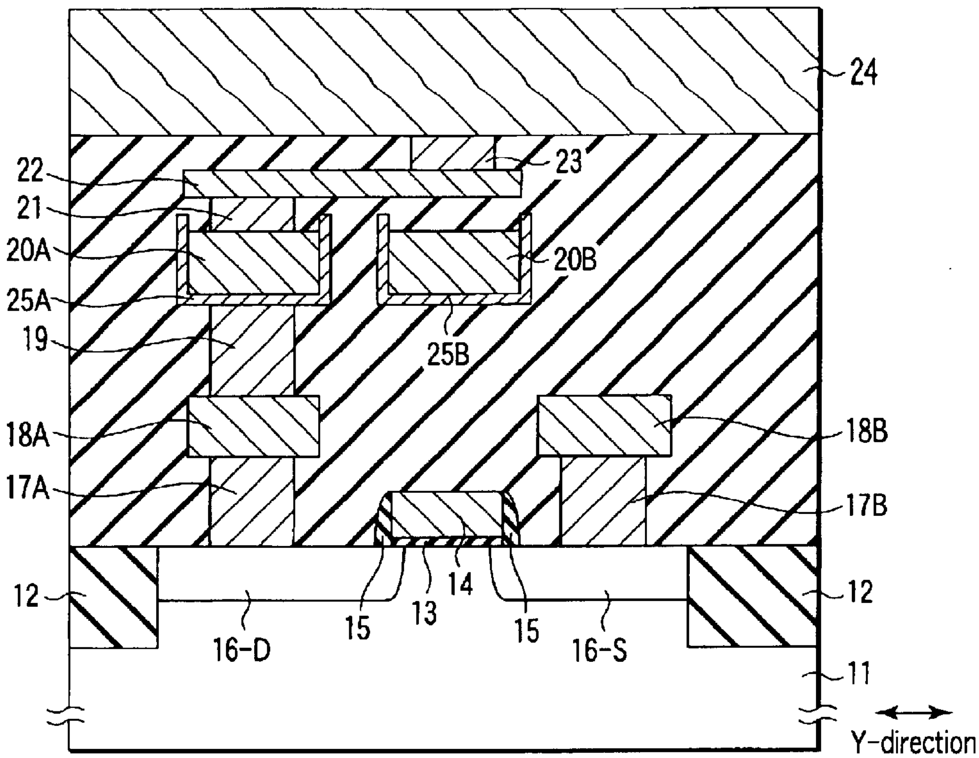
FIG. 76 is a sectional view showing the modification example of Example 1 of the second invention.
Figure 77:
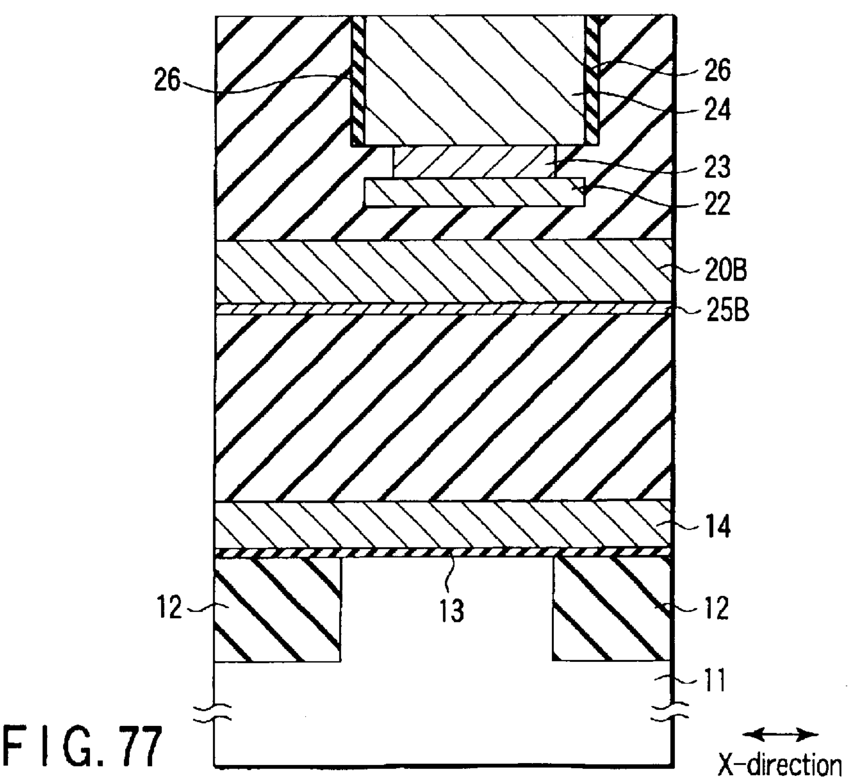
FIG. 77 is a sectional view showing the modification example of Example 1 of the second invention.

FIGS. 66 to 69 show the device structure of the magnetic random access memory according to Example 1. It is to be noted that FIGS. 66 and 68 show the sections in the Y direction, FIG. 67 shows the section of the MTJ element portion of FIG. 66 in the X direction, and FIG. 69 shows the section of the MTJ element portion of FIG. 68 in the X direction. The X direction crosses at right angles to the Y direction.

The characteristics of the device structure of the present example lie in that the lower and side surfaces of the write word line 20B disposed right under the MTJ element 23 are coated with the yoke material 25B and that the upper and side surfaces of the data selection line (read/write bit line) 24 disposed right on the MTJ element 23 are coated with the yoke materials 26, 27.

Furthermore, the characteristic of the yoke material 25B disposed in the side surface of the write word line 20B disposed right under the MTJ element 23 lies in a structure projecting upwards from the upper surface of the write word line 20B.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the device structure of the present example, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the device structure of the present example, the lower and side surfaces of the intermediate layer 20A and write word line 20B are coated with the materials having high permeability, that is, the yoke materials 25A, 25B. The yoke materials 25A, 25B for use herein are limited to the materials which have the conductivity.

Moreover, the yoke materials 25A, 25B disposed in the side surfaces of the intermediate layer 20A and write word line 20B project upwards from the upper surfaces of the intermediate layer 20A and write word line 20B. That is, the projecting portions of the yoke materials 25A, 25B can be brought close to the MTJ element 23.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the lower and side surfaces of the write word line 20B with the yoke material. Additionally, in actual, the yoke material is also formed in the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the device structure of the present example, the upper and side surfaces of the data selection line 24 are coated with the materials having the high permeability, that is, the yoke materials 26, 27. The yoke materials 26, 27 for use herein can be constituted of the materials which have conductivity as shown in FIGS. 66 and 67, or can also be constituted of the materials which have the insulating properties as shown in FIGS. 68 and 69.

It is to be noted that, as described above, the magnetic flux has the property of being concentrated on the material which has the high permeability. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed on the lower and side surfaces of the write word line 20B disposed right under the MTJ element 23. Moreover, the yoke materials 26, 27 are formed on the upper and side surfaces of the data selection line (read/write bit line) 24 disposed right on the MTJ element 23. Furthermore, the yoke material 25B in the side surface of the write word line 20B projects upwards from the upper surface of the write word line 20B.

Therefore, the magnetic field generated by the write current flowing through the write word line 20B and data selection line 24 can be applied to the MTJ element 23 with good efficiency.

It is to be noted that the yoke materials 26, 27 are formed on the upper and side surfaces of the data selection line 24, but this is not limited, and the following structure may also be used.

For example, the yoke material 27 may also be formed only in the upper surface of the data selection line 24 as shown in FIGS. 70 to 73, or the yoke material 26 may also be formed in the side surface of the line as shown in FIGS. 74 to 77.

Moreover, it is convenient to form the write word line 20B and yoke material 25B using the damascene process. Conversely, when the write word line 20B and yoke material 25B are formed using the reactive ion etching (RIE) process, the process becomes very complicated, and this is realistically impossible.

Furthermore, the data selection line 24 and yoke materials 26, 27 may be formed using either one of the damascene and RIE processes.

2. Example 2

Figure 78:
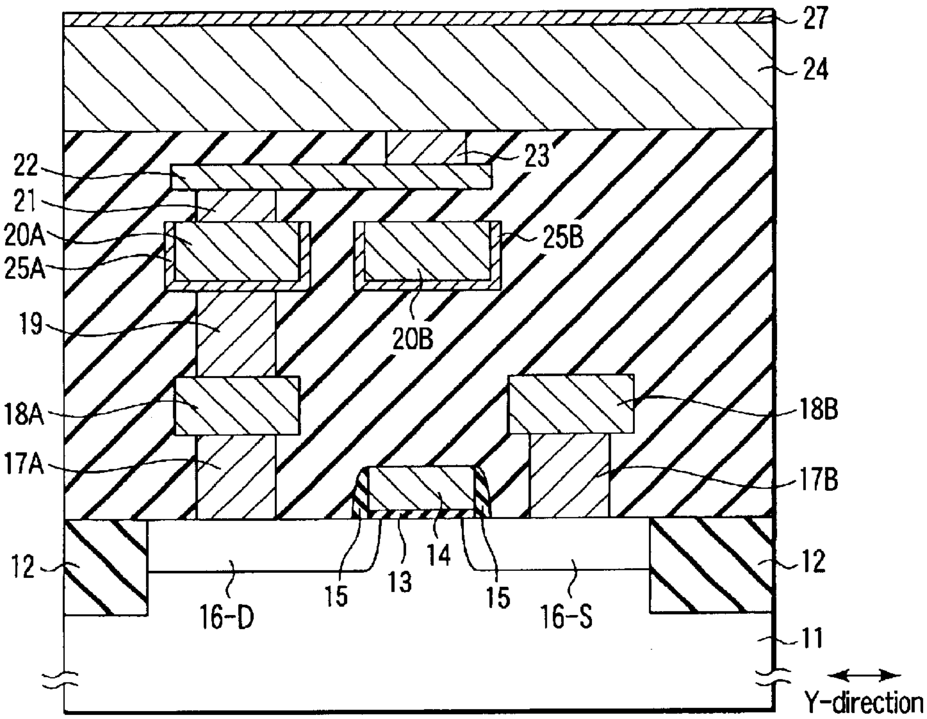
FIG. 78 is a sectional view showing the magnetic random access memory of Example 2 of the second invention.
Figure 79:
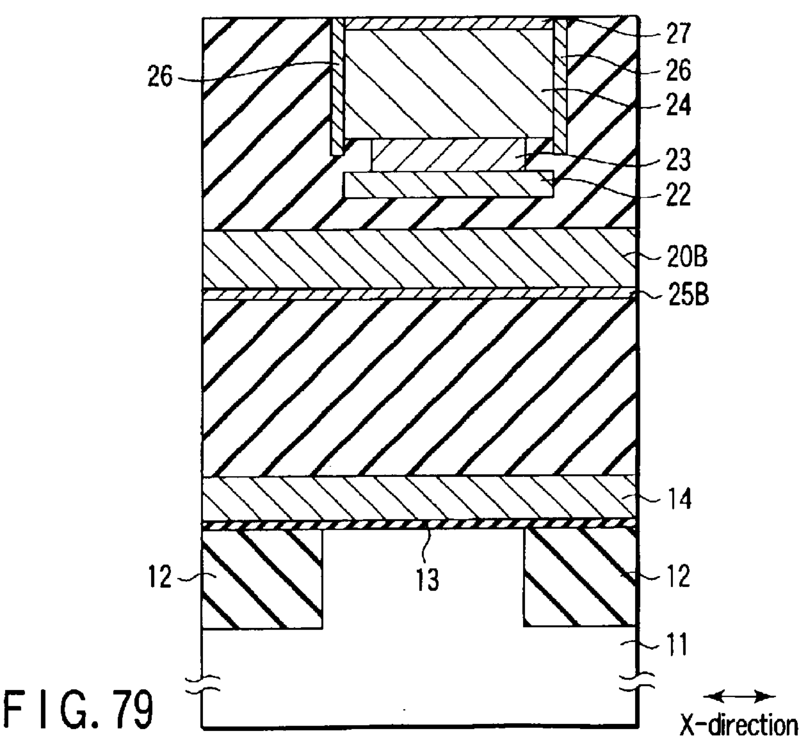
FIG. 79 is a sectional view showing the magnetic random access memory of Example 2 of the second invention.
Figure 80:
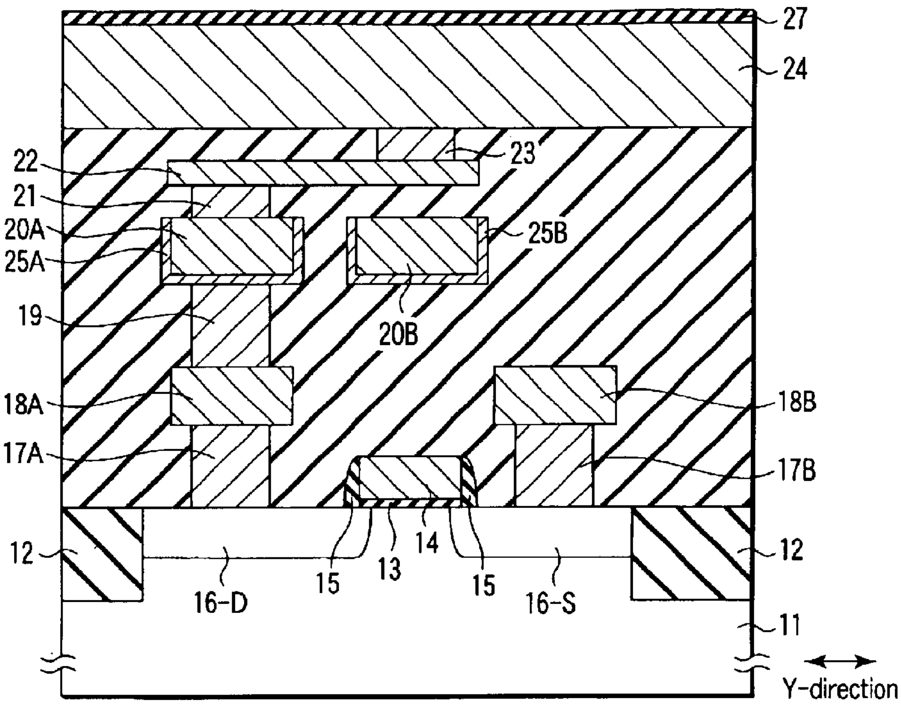
FIG. 80 is a sectional view showing the magnetic random access memory of Example 2 of the second invention.
Figure 81:
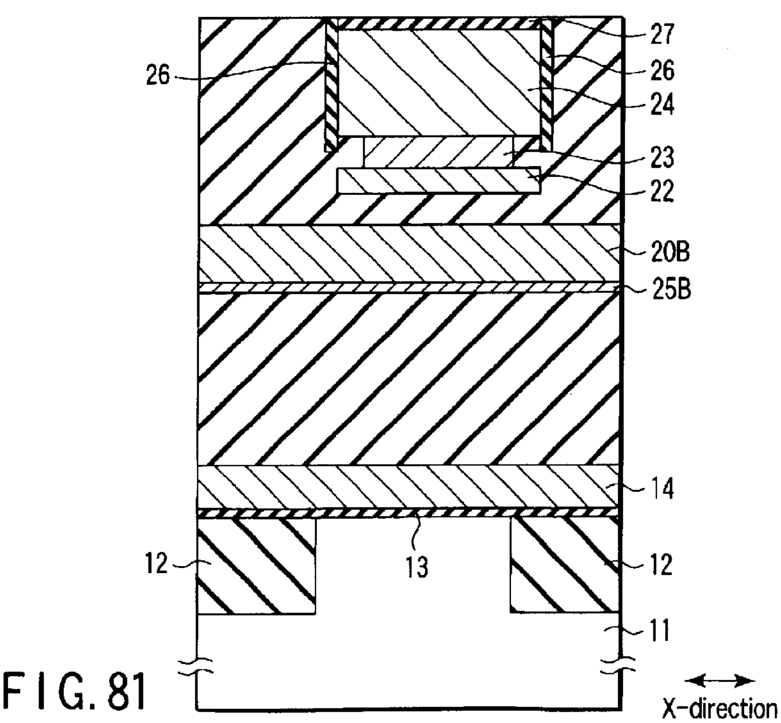
FIG. 81 is a sectional view showing the magnetic random access memory of Example 2 of the second invention.
Figure 82:
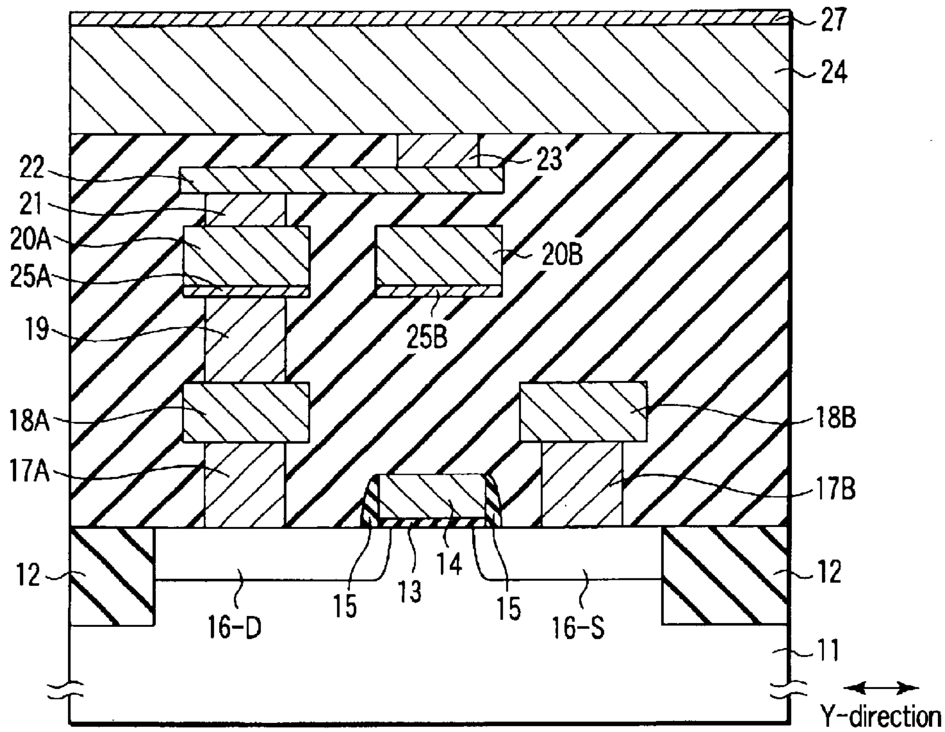
FIG. 82 is a sectional view showing the modification example of Example 2 of the second invention.
Figure 83:
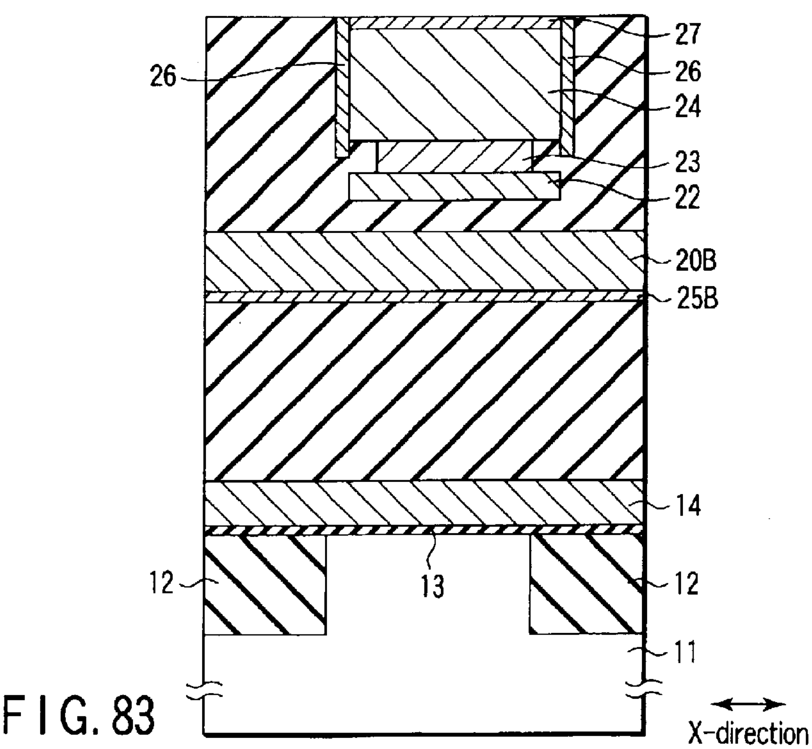
FIG. 83 is a sectional view showing the modification example of Example 2 of the second invention.
Figure 84:
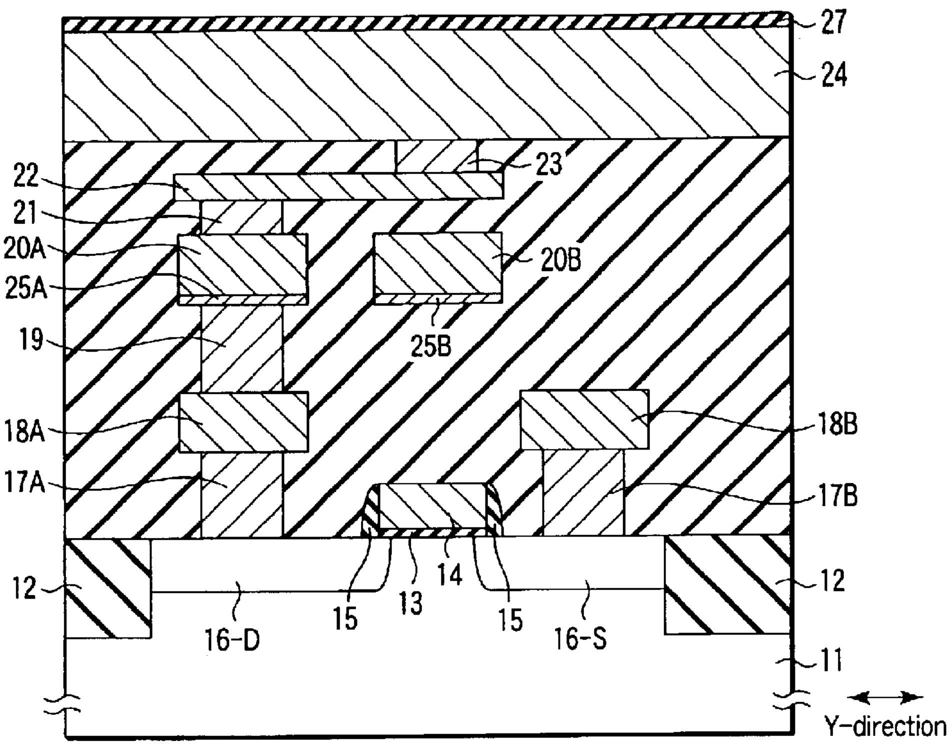
FIG. 84 is a sectional view showing the modification example of Example 2 of the second invention.
Figure 85:
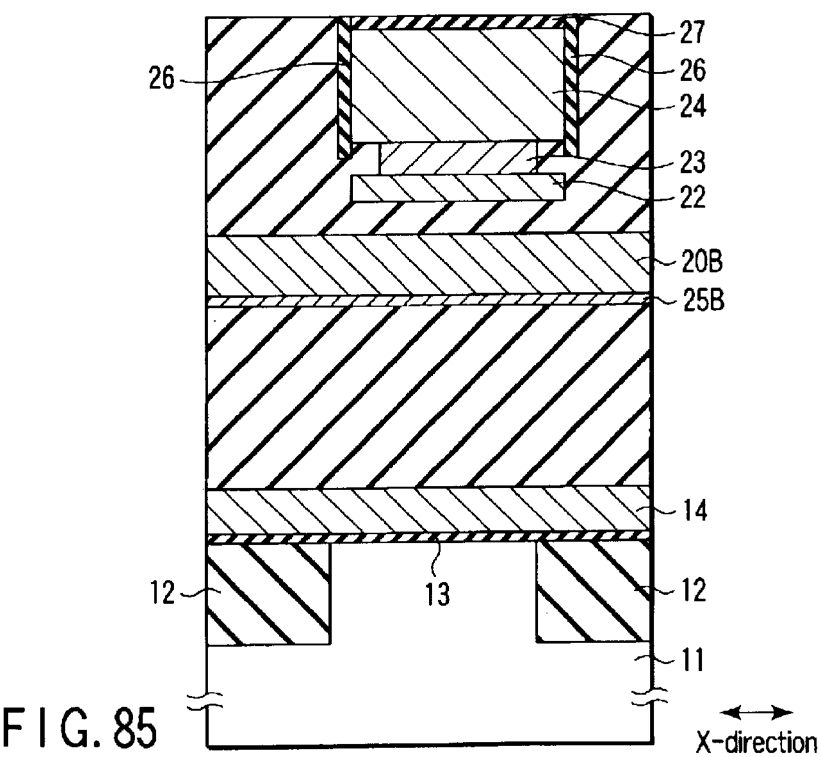
FIG. 85 is a sectional view showing the modification example of Example 2 of the second invention.
Figure 86:
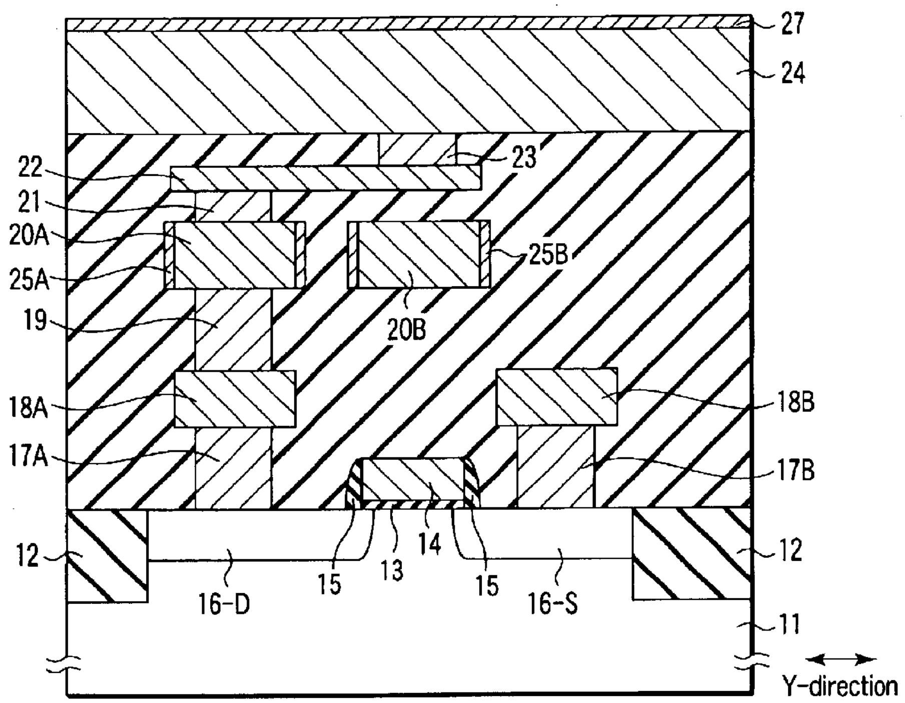
FIG. 86 is a sectional view showing the modification example of Example 2 of the second invention.
Figure 87:
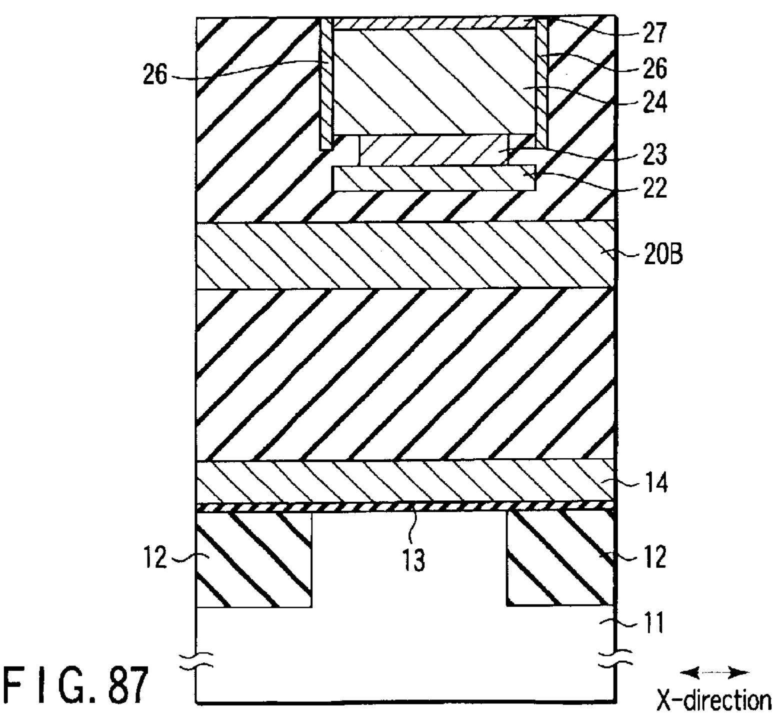
FIG. 87 is a sectional view showing the modification example of Example 2 of the second invention.
Figure 88:
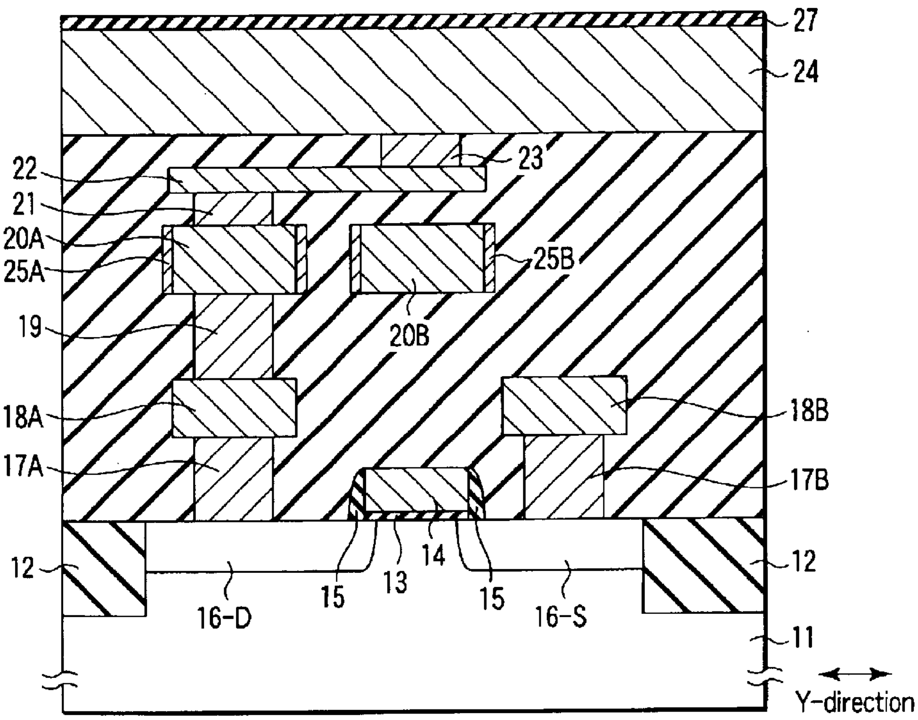
FIG. 88 is a sectional view showing the modification example of Example 2 of the second invention.
Figure 89:
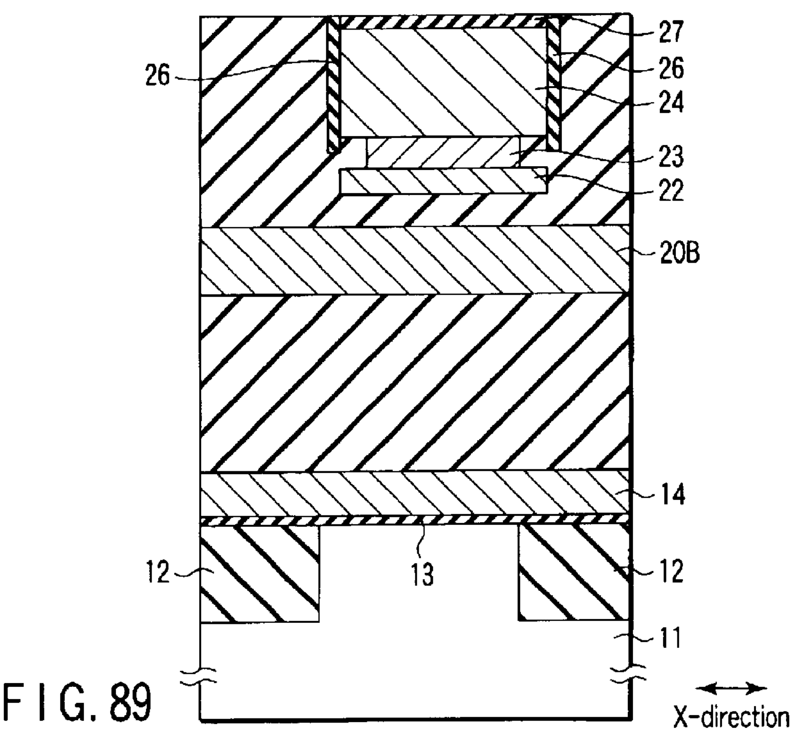
FIG. 89 is a sectional view showing the modification example of Example 2 of the second invention.

FIGS. 78 to 81 show the device structure of the magnetic random access memory according to Example 2. It is to be noted that FIGS. 78 and 80 show the sections in the Y direction, FIG. 79 shows the section of the MTJ element portion of FIG. 78 in the X direction, and FIG. 81 shows the section of the MTJ element portion of FIG. 80 in the X direction. The X direction crosses at right angles to the Y direction.

The characteristic of the device structure of the present example lies in that the lower and side surfaces of the write word line 20B disposed right under the MTJ element 23 are coated with the yoke material 25B and that the upper and side surfaces of the data selection line (read/write bit line) 24 disposed right on the MTJ element 23 are coated with the yoke materials 26, 27.

Furthermore, the characteristic of the yoke material 26 disposed in the side surface of the data selection line 24 disposed right under the MTJ element 23 lies in a structure projecting downwards from the lower surface of the data selection line 24.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the device structure of the present example, the lower and side surfaces of the intermediate layer 20A and write word line 20B are coated with the materials having the high permeability, that is, the yoke materials 25A, 25B. The yoke materials 25A, 25B for use herein are limited to the materials which have conductivity.

The magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the lower and side surfaces of the write word line 20B with the yoke material. Additionally, in actual, the yoke material is also formed on the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the device structure of the present example, the upper and side surfaces of the data selection line 24 are coated with the material having the high permeability, that is, the yoke materials 26, 27. The yoke materials 26, 27 for use herein can be constituted of the material which has the conductivity as shown in FIGS. 78 and 79, or can also be constituted of the material which has the insulating property as shown in FIGS. 80 and 81.

It is to be noted that the yoke material 26 disposed in the side surface of the data selection line 24 projects downwards from the lower surface of the data selection line 24. That is, the projecting portion of the yoke material 26 can be brought close to the MTJ element 23.

It is to be noted that the magnetic flux has the property of being concentrated on the material which has the high permeability. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed on the lower and side surfaces of the write word line 20B disposed right under the MTJ element 23. Moreover, the yoke materials 26, 27 are formed on the upper and side surfaces of the data selection line (read/write bit line) 24 disposed right on the MTJ element 23. Furthermore, the yoke material 26 in the side surface of the data selection line 24 projects downwards from the lower surface of the data selection line 24.

Therefore, the magnetic field generated by the write current flowing through the write word line 20B and data selection line 24 can be applied to the MTJ element 23 with good efficiency.

It is to be noted that in the present example the yoke material 25B is formed on the lower and side surfaces of the write word line 20B, but this is not limited, and the following structure may also be used.

For example, the yoke material 25B may also be formed only in the lower surface of the write word line 20B as shown in FIGS. 82 to 85, or the yoke material 25B may also be formed only in the side surface of the line as shown in FIGS. 86 to 89.

Moreover, it is convenient to form the write word line 20B and yoke material 25B using the damascene process. Conversely, when the write word line 20B and yoke material 25B are formed using the reactive ion etching (RIE) process, the process becomes very complicated, and this is realistically impossible.

Furthermore, it is convenient to form the data selection line 24 and yoke materials 26, 27 using the RIE process. Conversely, when the data selection line 24 and yoke materials 26, 27 are formed using the damascene process, the process becomes very complicated, and this is realistically impossible.

That is, for the manufacturing method for realizing the device structure shown in FIGS. 78 to 81, the manufacturing method is employed comprising: forming the write word line 20B and yoke material 25B in the damascene process; and forming the data selection line 24 and yoke materials 26, 27 in the RIE process.

3. Example 3

Figure 90:
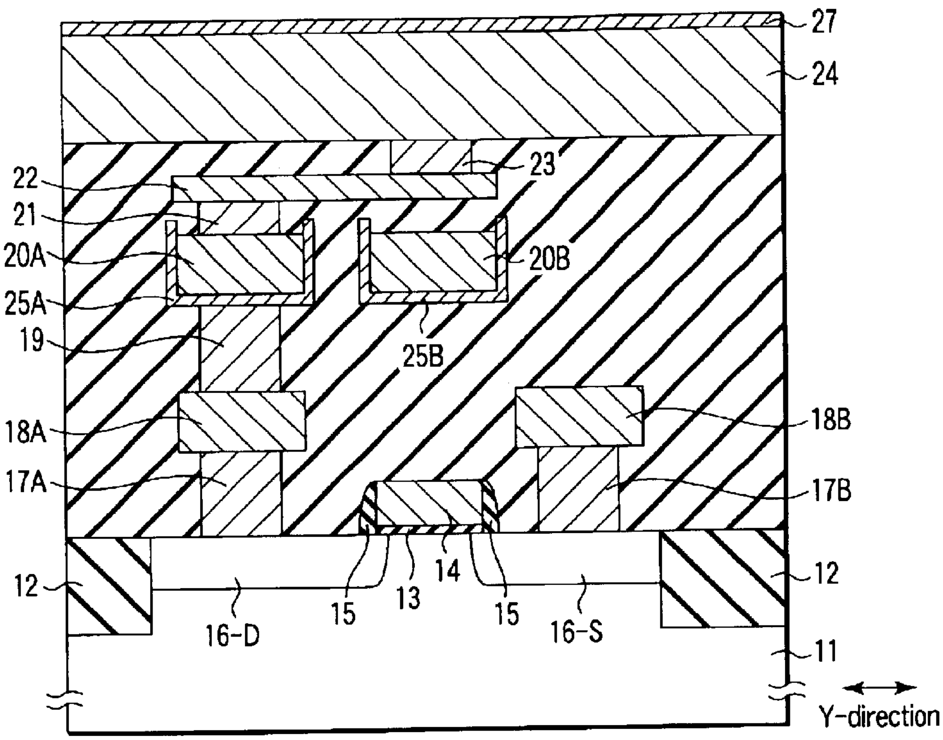
FIG. 90 is a sectional view showing the magnetic random access memory of Example 3 of the second invention.
Figure 91:
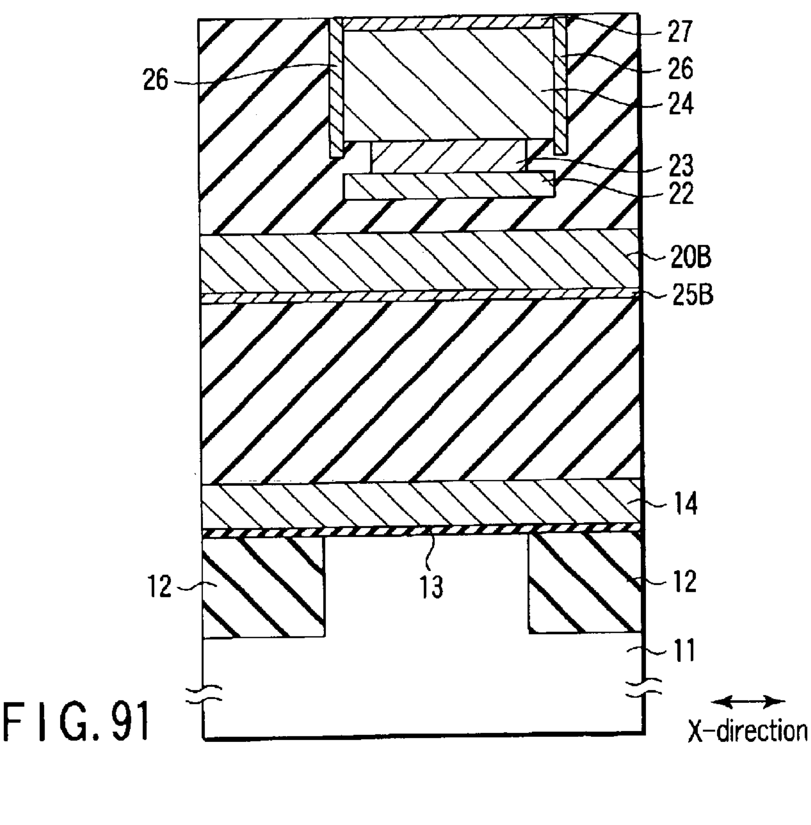
FIG. 91 is a sectional view showing the magnetic random access memory of Example 3 of the second invention.
Figure 92:
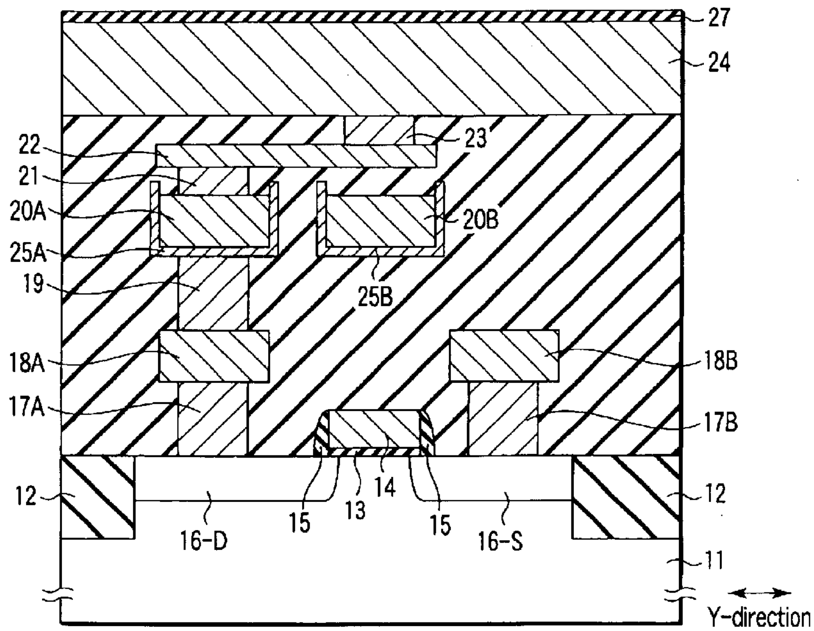
FIG. 92 is a sectional view showing the magnetic random access memory of Example 3 of the second invention.
Figure 93:
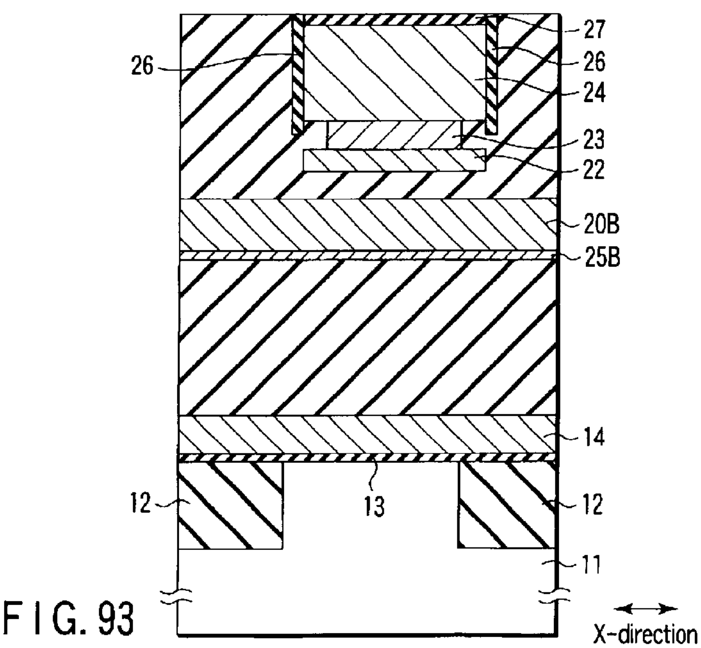
FIG. 93 is a sectional view showing the magnetic random access memory of Example 3 of the second invention.

FIGS. 90 to 93 show the device structure of the magnetic random access memory according to Example 3. It is to be noted that FIGS. 90 and 92 show the sections in the Y direction, FIG. 91 shows the section of the MTJ element portion of FIG. 90 in the X direction, and FIG. 93 shows the section of the MTJ element portion of FIG. 92 in the X direction. The X direction crosses at right angles to the Y direction.

The characteristic of the device structure of the present example lies in that the lower and side surfaces of the write word line 20B disposed right under the MTJ element 23 are coated with the yoke material 25B and that the upper and side surfaces of the data selection line (read/write bit line) 24 disposed right on the MTJ element 23 are coated with the yoke materials 26, 27.

Furthermore, the characteristic of the yoke material 25B disposed in the side surface of the write word line 20B disposed right under the MTJ element 23 lies in the structure projecting upwards from the upper surface of the write word line 20B. Additionally, the characteristic of the yoke material 26 disposed in the side surface of the data selection line 24 disposed right on the MTJ element 23 lies in the structure projecting downwards from the lower surface of the data selection line 24.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the device structure of the present example, the lower and side surfaces of the intermediate layer 20A and write word line 20B are coated with the materials having the high permeability, that is, the yoke materials 25A, 25B. The yoke materials 25A, 25B for use herein are limited to the materials which have conductivity.

Moreover, the yoke materials 25A, 25B disposed in the side surfaces of the intermediate layer 20A and write word line 20B project upwards from the upper surfaces of the intermediate layer 20A and write word line 20B. That is, the projecting portions of the yoke materials 25A, 25B can be brought close to the MTJ element 23.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the lower and side surfaces of the write word line 20B with the yoke material. Additionally, in actual, the yoke material is also formed on the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the device structure of the present example, the upper and side surfaces of the data selection line 24 are coated with the material having the high permeability, that is, the yoke materials 26, 27. The yoke materials 26, 27 for use herein can be constituted of the material which has the conductivity as shown in FIGS. 90 and 91, or can also be constituted of the material which has the insulating property as shown in FIGS. 92 and 93.

Moreover, the yoke material 26 disposed in the side surface of the data selection line 24 projects downwards from the lower surface of the data selection line 24. That is, the projecting portion of the yoke material 26 can be brought close to the MTJ element 23.

It is to be noted that the magnetic flux has the property of being concentrated on the material which has the high permeability as described above. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed on the lower and side surfaces of the write word line 20B disposed right under the MTJ element 23. Moreover, the yoke materials 26, 27 are formed on the upper and side surfaces of the data selection line (read/write bit line) 24 disposed right on the MTJ element 23. Furthermore, the yoke material 25B in the side surface of the write word line 20B projects upwards from the upper surface of the write word line 20B. The yoke material 26 of the side surface of the data selection line 24 projects downwards from the lower surface of the data selection line 24.

Therefore, the magnetic field generated by the write current flowing through the write word line 20B and data selection line 24 can be applied to the MTJ element 23 with good efficiency.

It is to be noted that it is convenient to form the write word line 20B and yoke material 25B using the damascene process. Conversely, when the write word line 20B and yoke material 25B are formed using the reactive ion etching (RIE) process, the process becomes very complicated, and this is realistically impossible.

Furthermore, it is convenient to form the data selection line 24 and yoke materials 26, 27 using the RIE process. Conversely, when the data selection line 24 and yoke materials 26, 27 are formed using the damascene process, the process becomes very complicated, and this is realistically impossible.

That is, for the manufacturing method for realizing the device structure shown in FIGS. 90 to 93, the manufacturing method is employed comprising: forming the write word line 20B and yoke material 25B in the damascene process; and forming the data selection line 24 and yoke materials 26, 27 in the RIE process.

4. Example 4

Figure 94:
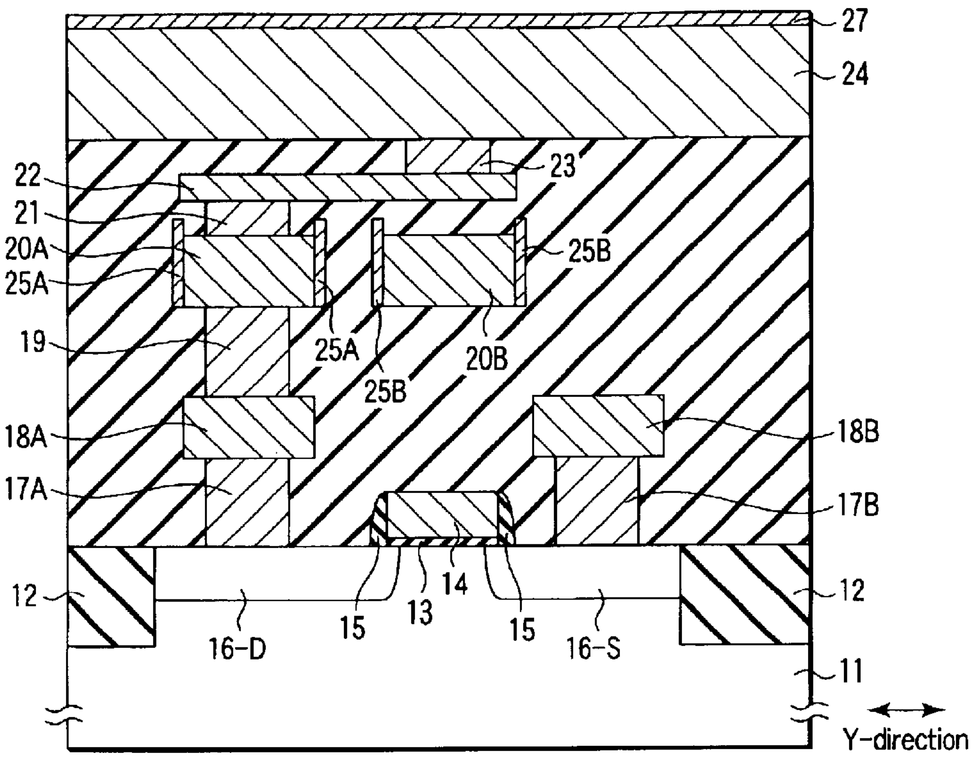
FIG. 94 is a sectional view showing the magnetic random access memory of Example 4 of the second invention.
Figure 95:
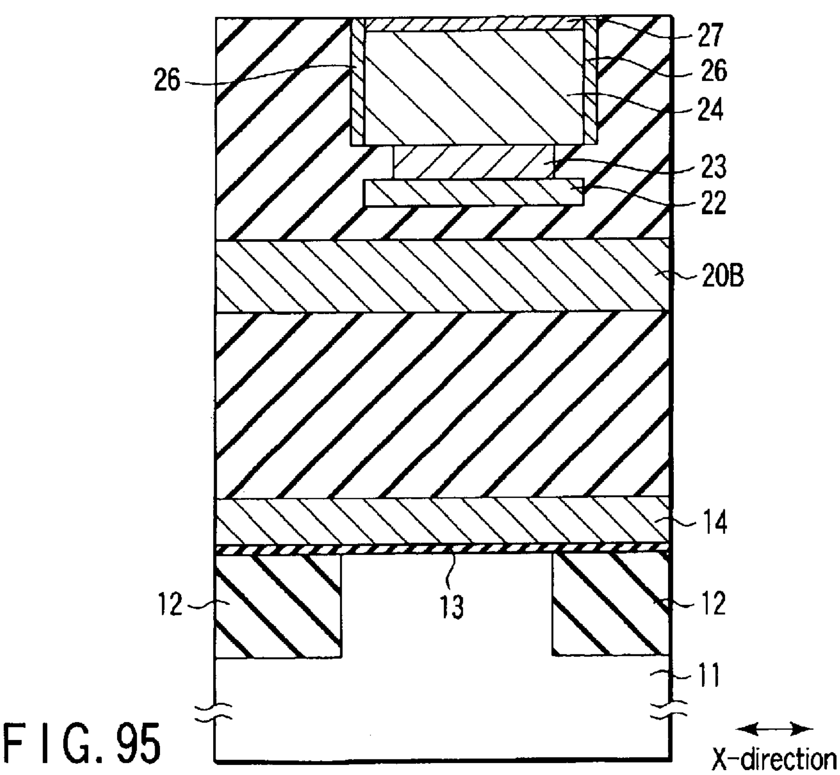
FIG. 95 is a sectional view showing the magnetic random access memory of Example 4 of the second invention.
Figure 96:
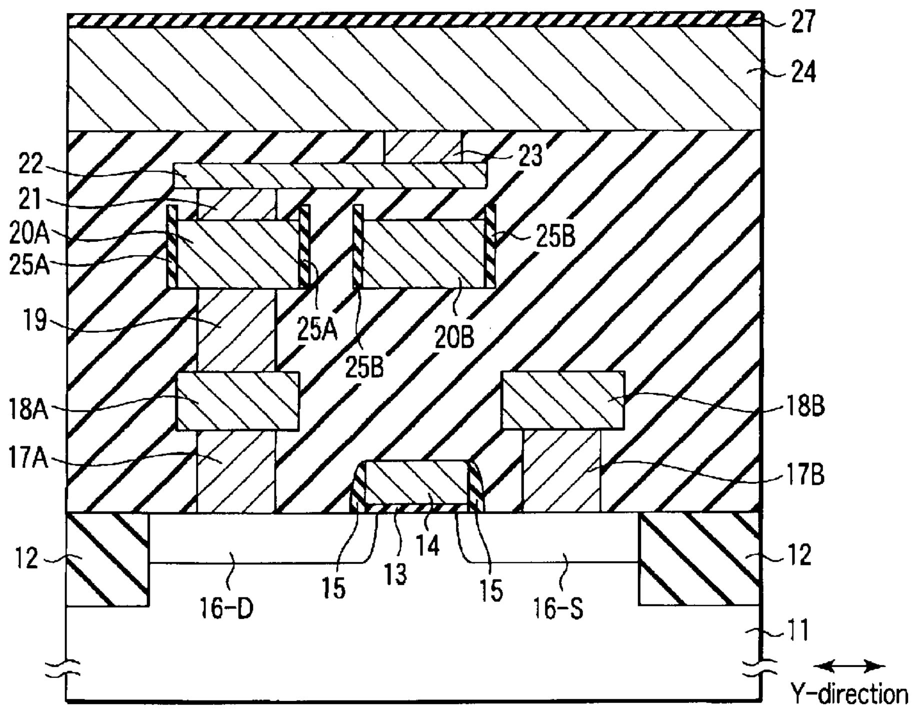
FIG. 96 is a sectional view showing the magnetic random access memory of Example 4 of the second invention.
Figure 97:
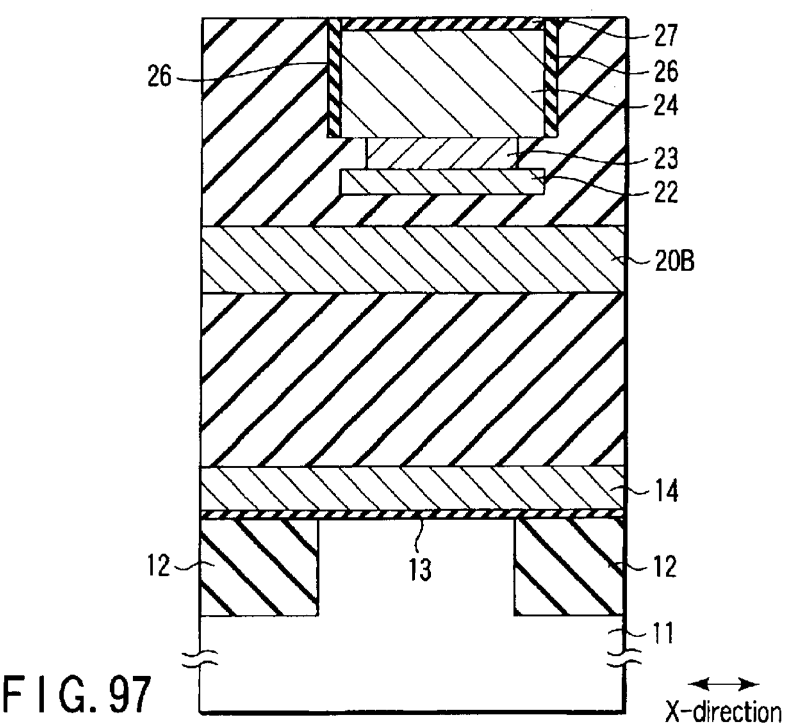
FIG. 97 is a sectional view showing the magnetic random access memory of Example 4 of the second invention.
Figure 98:
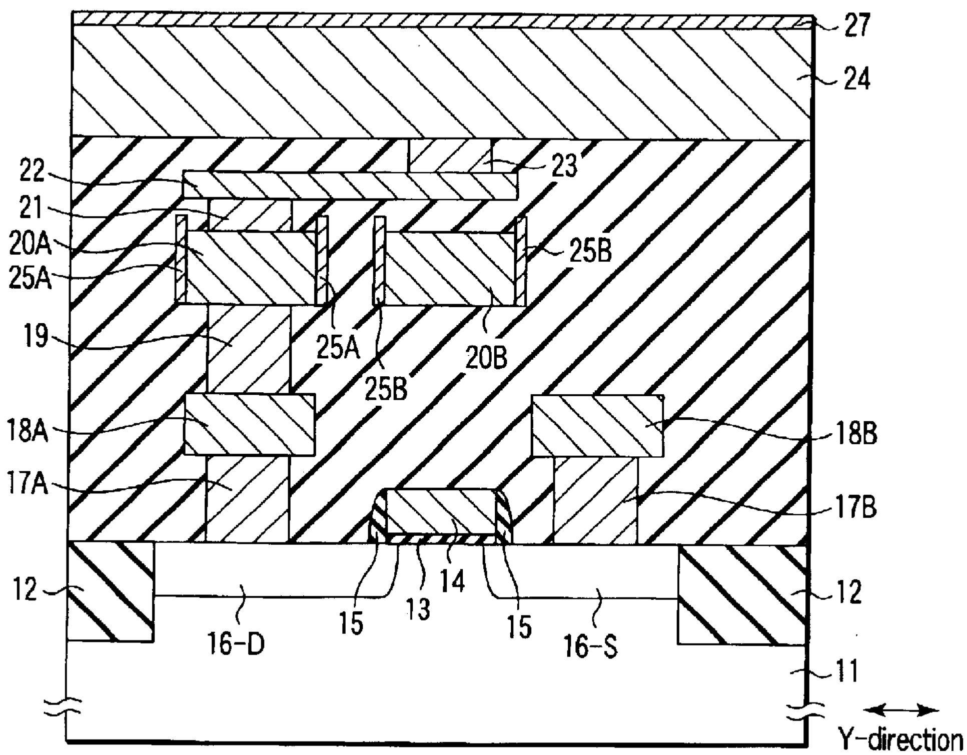
FIG. 98 is a sectional view showing the modification example of Example 4 of the second invention.
Figure 99:
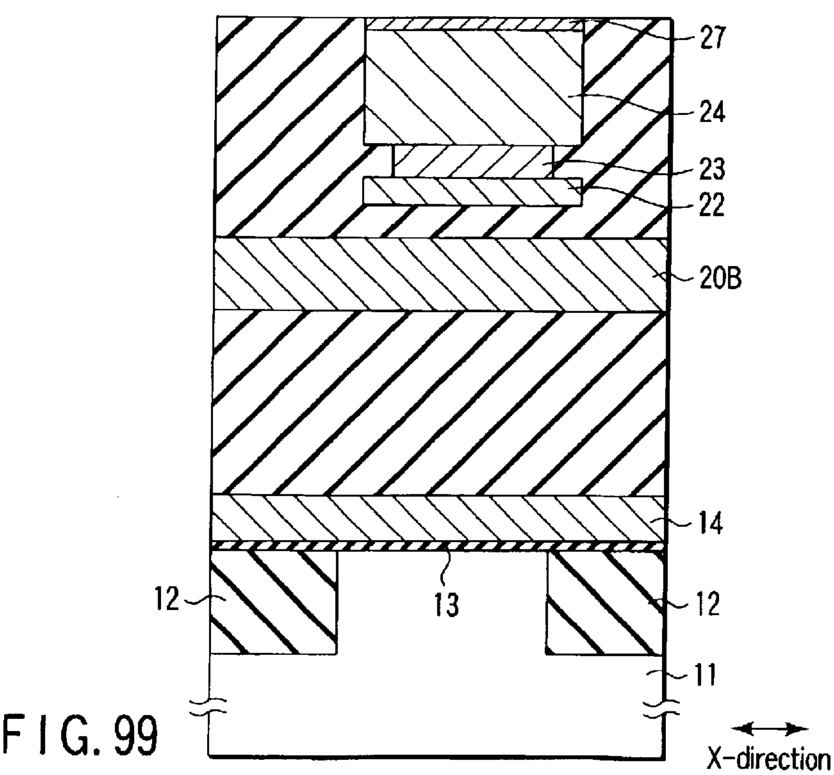
FIG. 99 is a sectional view showing the modification example of Example 4 of the second invention.
Figure 100:
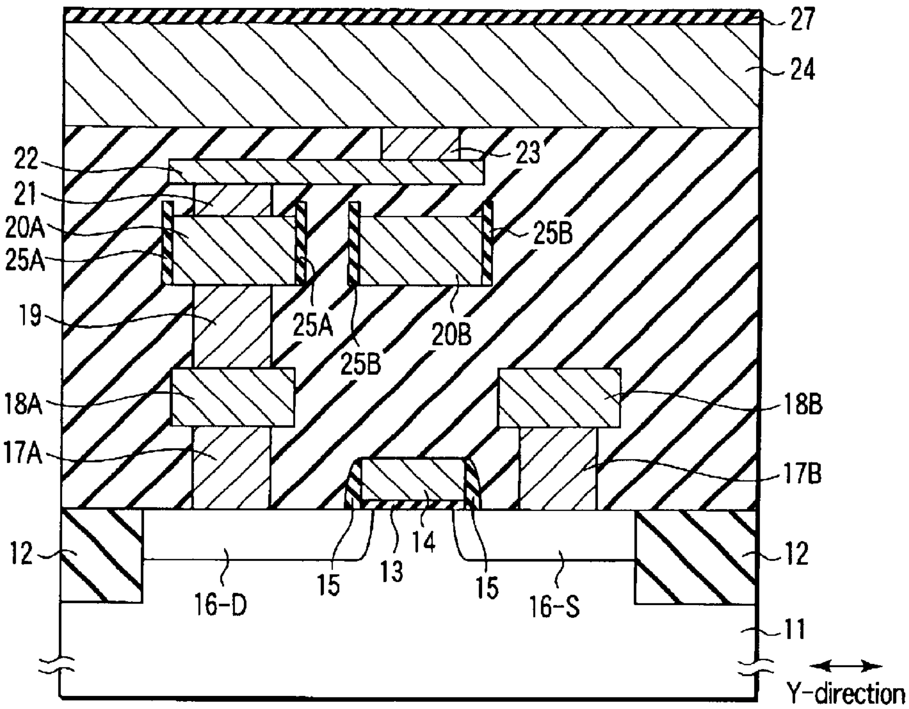
FIG. 100 is a sectional view showing the modification example of Example 4 of the second invention.
Figure 101:
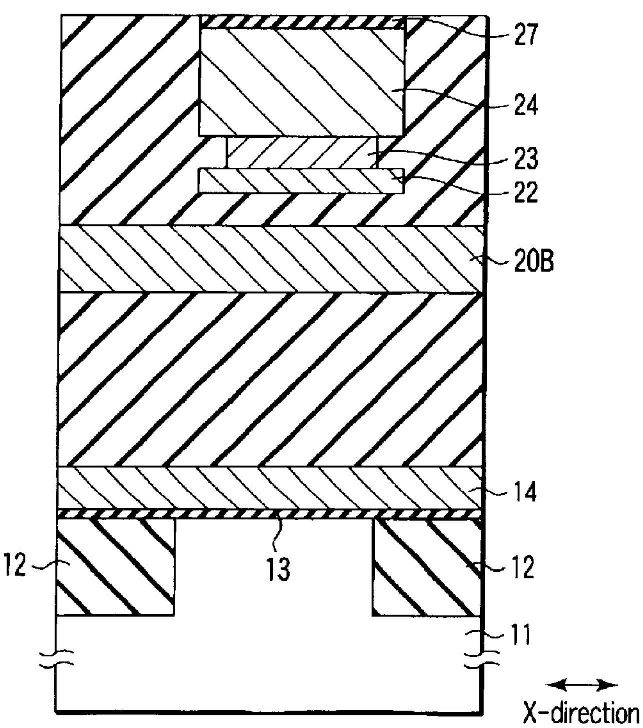
FIG. 101 is a sectional view showing the modification example of Example 4 of the second invention.
Figure 104:
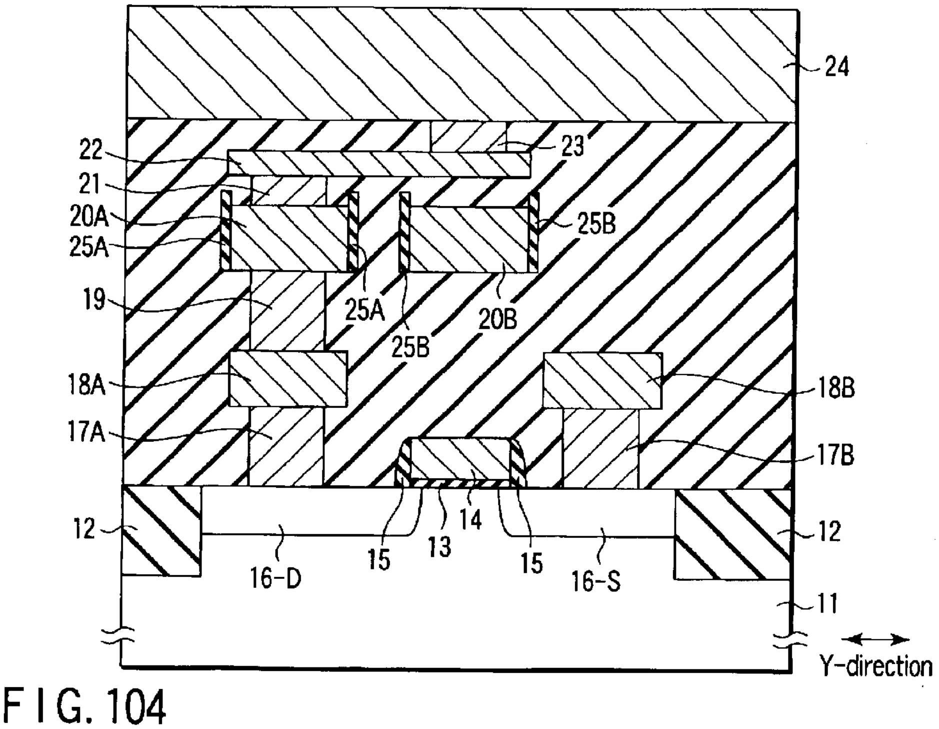
FIG. 104 is a sectional view showing the modification example of Example 4 of the second invention.
Figure 105:
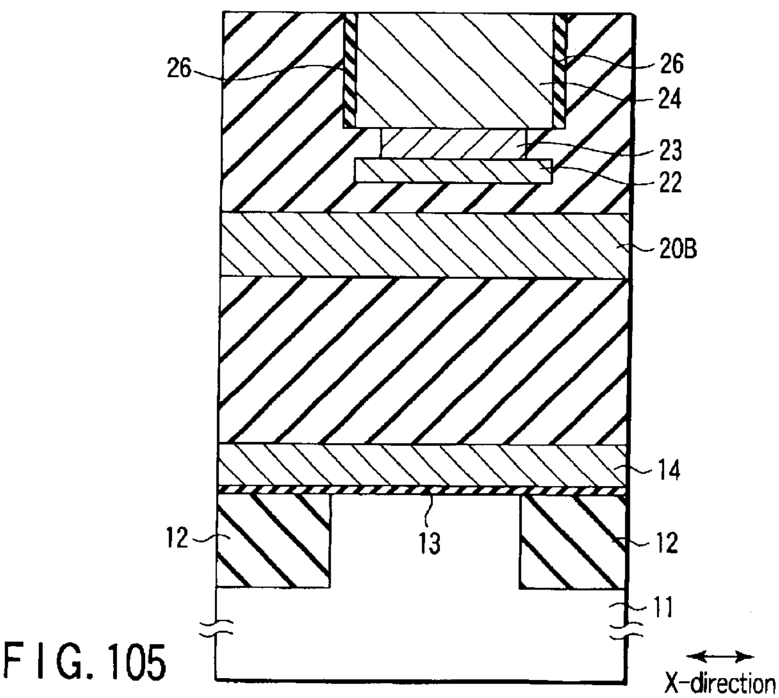
FIG. 105 is a sectional view showing the modification example of Example 4 of the second invention.

FIGS. 94 to 97 show the device structure of the magnetic random access memory according to Example 4. It is to be noted that FIGS. 94 and 96 show the sections in the Y direction, FIG. 95 shows the section of the MTJ element portion of FIG. 94 in the X direction, and FIG. 97 shows the section of the MTJ element portion of FIG. 96 in the X direction. The X direction crosses at right angles to the Y direction.

The characteristic of the device structure of the present example lies in that only the side surface of the write word line 20B disposed right under the MTJ element 23 is coated with the yoke material 25B and that the upper and side surfaces of the data selection line (read/write bit line) 24 disposed right on the MTJ element 23 are coated with the yoke materials 26, 27.

Furthermore, the characteristic of the yoke material 25B disposed in the side surface of the write word line 20B disposed right under the MTJ element 23 lies in the structure projecting upwards from the upper surface of the write word line 20B.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the device structure of the present example, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the device structure of the present example, the side surfaces of the intermediate layer 20A and write word line 20B are coated with the materials having the high permeability, that is, the yoke materials 25A, 25B. The yoke materials 25A, 25B for use herein can be constituted of the material which has the conductivity as shown in FIGS. 94 and 95, or can also be constituted of the material which has the insulating property as shown in FIGS. 96 and 97.

Moreover, the yoke materials 25A, 25B disposed in the side surfaces of the intermediate layer 20A and write word line 20B project upwards from the upper surfaces of the intermediate layer 20A and write word line 20B. That is, the projecting portions of the yoke materials 25A, 25B can be brought close to the MTJ element 23.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the side surface of the write word line 20B with the yoke material. Additionally, in actual, the yoke material is also formed on the side surface of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the device structure of the present example, the upper and side surfaces of the data selection line 24 are coated with the material having the high permeability, that is, the yoke materials 26, 27. The yoke materials 26, 27 for use herein can be constituted of the material which has the conductivity as shown in FIGS. 94 and 95, or can also be constituted of the material which has the insulating property as shown in FIGS. 96 and 97.

It is to be noted that the magnetic flux has the property of being concentrated on the material which has the high permeability as described above. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed in the side surface of the write word line 20B disposed right under the MTJ element 23. Moreover, the yoke materials 26, 27 are formed in the upper and side surfaces of the data selection line (read/write bit line) 24 disposed right on the MTJ element 23. Furthermore, the yoke material 25B in the side surface of the write word line 20B projects upwards from the upper surface of the write word line 20B.

Therefore, the magnetic field generated by the write current flowing through the write word line 20B and data selection line 24 can be applied to the MTJ element 23 with good efficiency.

It is to be noted that in the present example the yoke materials 26, 27 are formed in the upper and side surfaces of the data selection line 24, but this is not limited, and the following structure may also be used.

For example, the yoke material 27 may also be formed only in the upper surface of the data selection line 24 as shown in FIGS. 98 to 101, or the yoke material 26 may also be formed only in the side surface of the line as shown in FIGS. 102 to 105.

Moreover, it is convenient to form the write word line 20B and yoke material 25B using the damascene process. Conversely, when the write word line 20B and yoke material 25B are formed using the reactive ion etching (RIE) process, the process becomes very complicated, and this is realistically impossible.

Furthermore, it is convenient to form the data selection line 24 and yoke materials 26, 27 using either the damascene process or the RIE process.

5. Example 5

Figure 106:
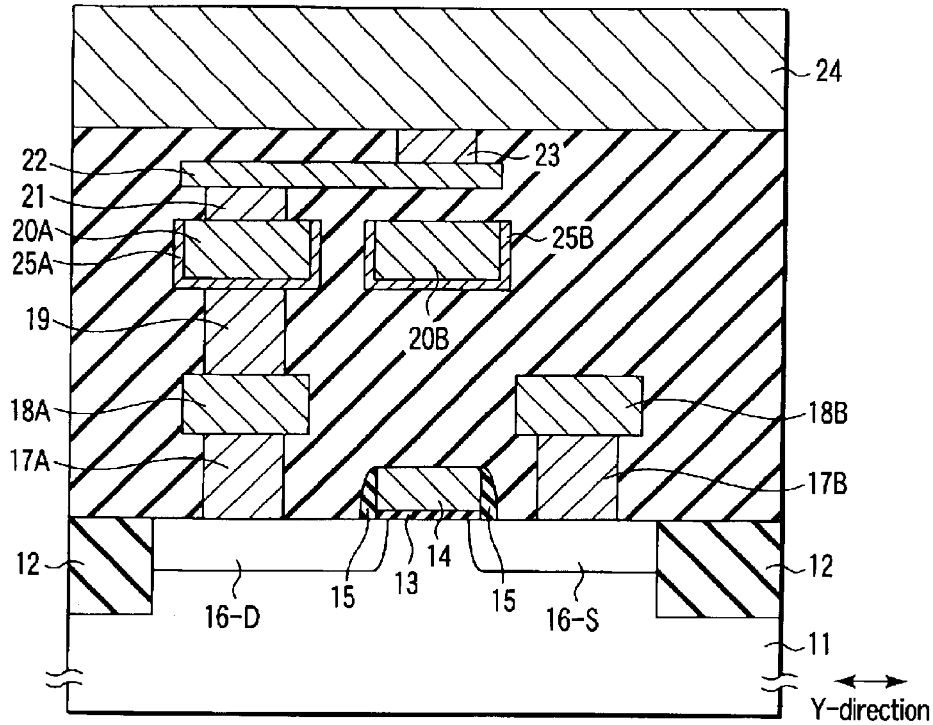
FIG. 106 is a sectional view showing the magnetic random access memory of Example 5 of the second invention.
Figure 107:
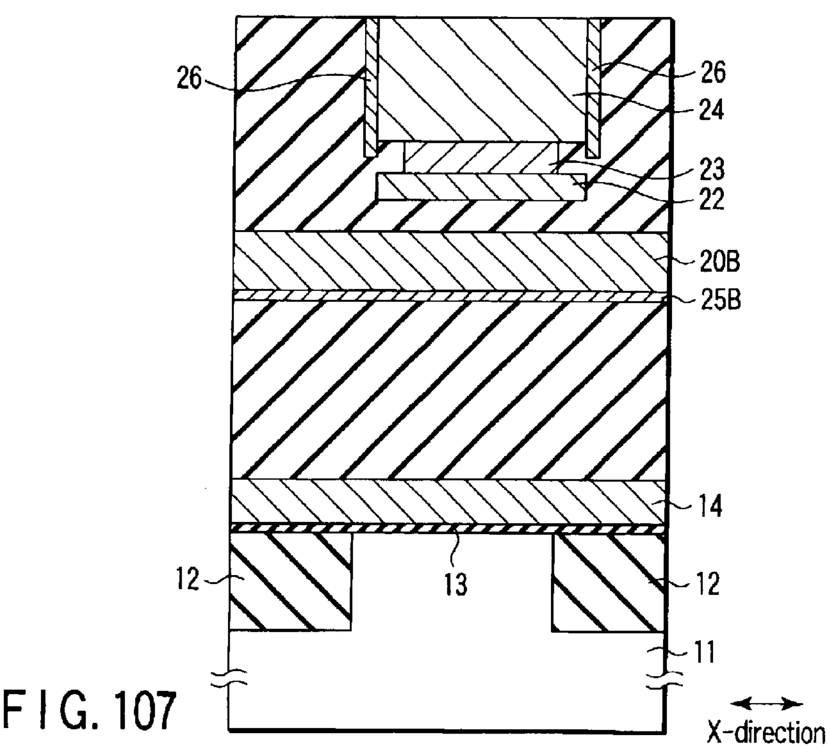
FIG. 107 is a sectional view showing the magnetic random access memory of Example 5 of the second invention.
Figure 108:
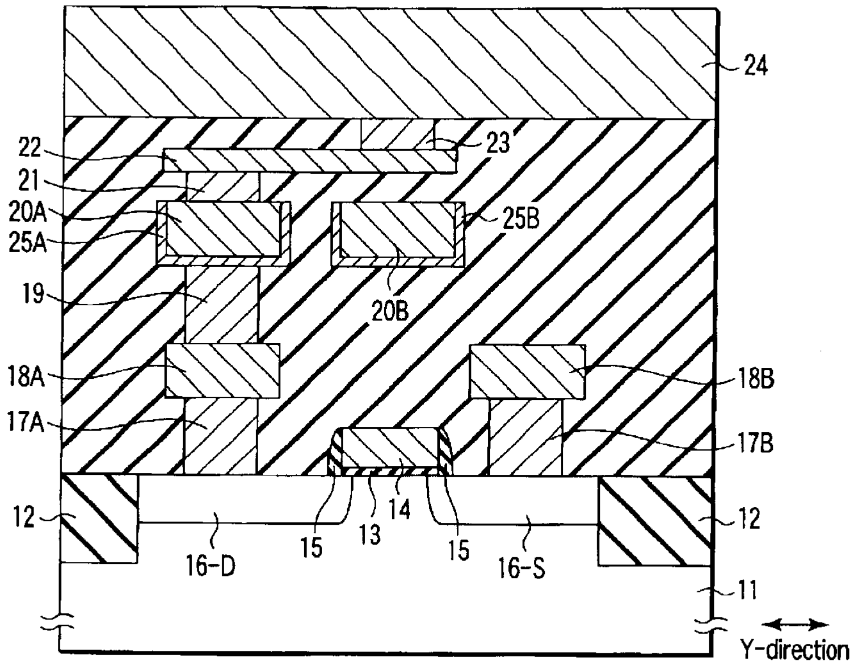
FIG. 108 is a sectional view showing the magnetic random access memory of Example 5 of the second invention.
Figure 109:
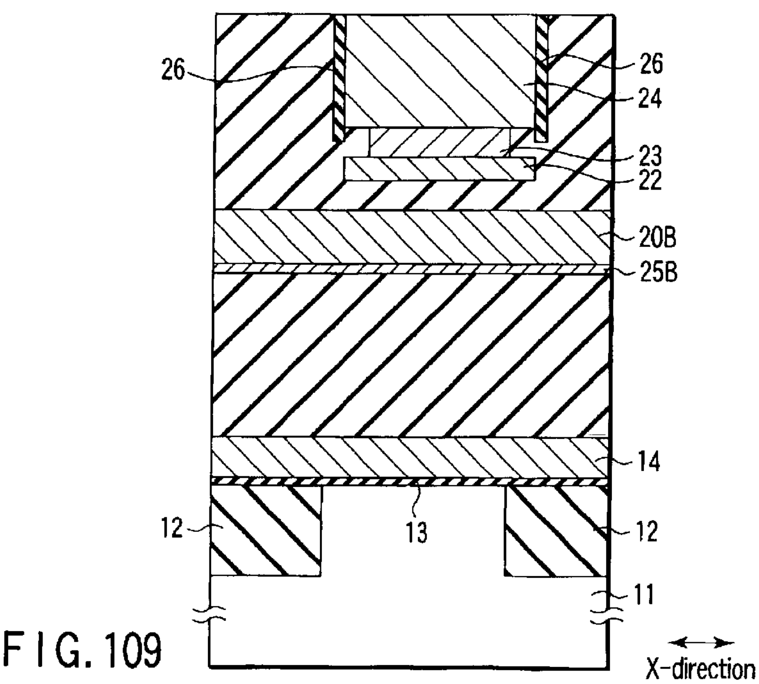
FIG. 109 is a sectional view showing the magnetic random access memory of Example 5 of the second invention.
Figure 110:
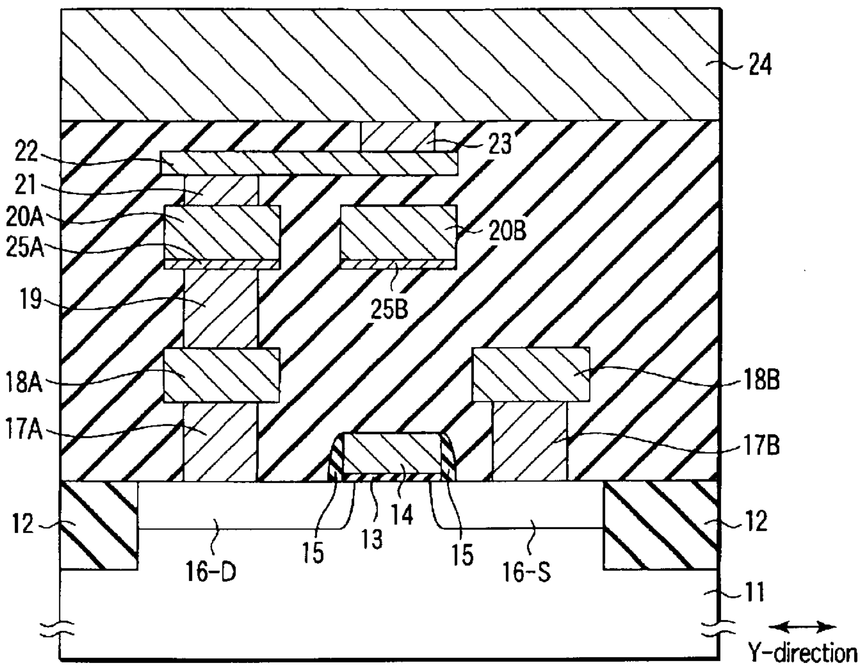
FIG. 110 is a sectional view showing the modification example of Example 5 of the second invention.
Figure 111:
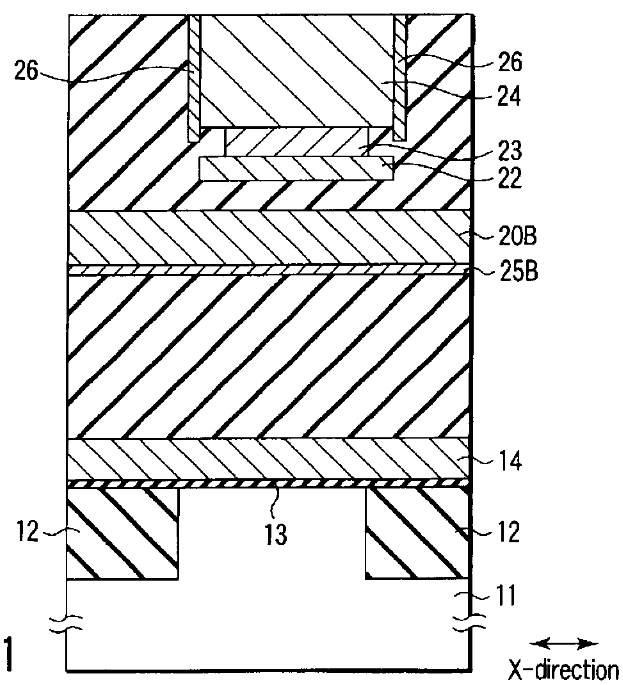
FIG. 111 is a sectional view showing the modification example of Example 5 of the second invention.
Figure 112:
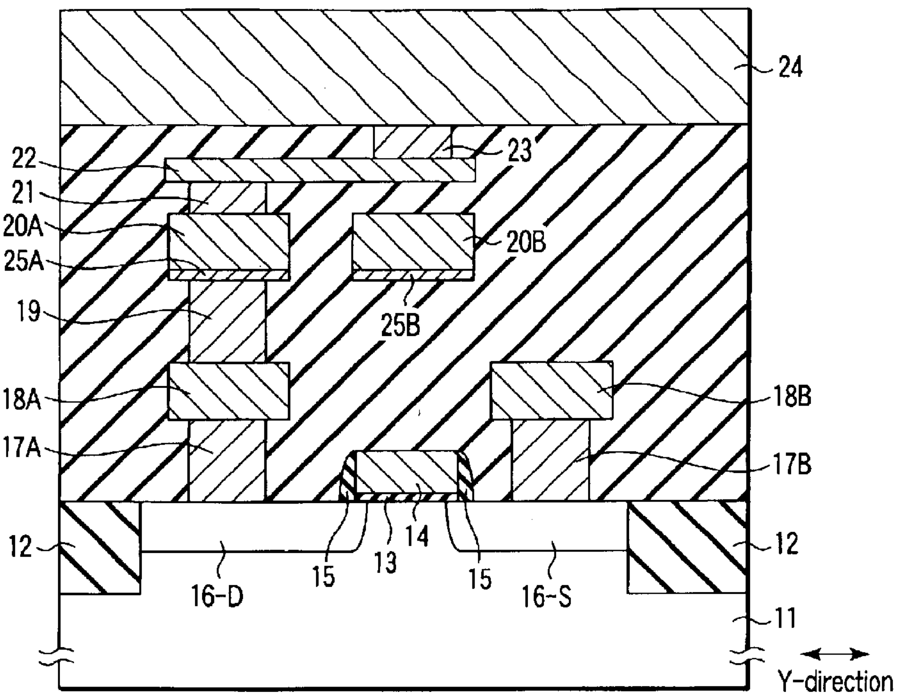
FIG. 112 is a sectional view showing the modification example of Example 5 of the second invention.
Figure 113:
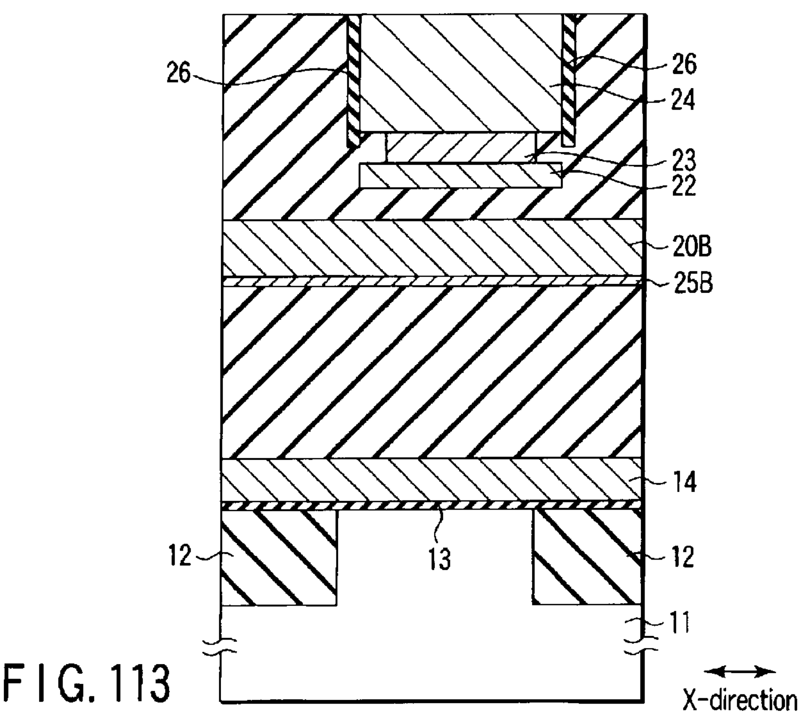
FIG. 113 is a sectional view showing the modification example of Example 5 of the second invention.
Figure 114:
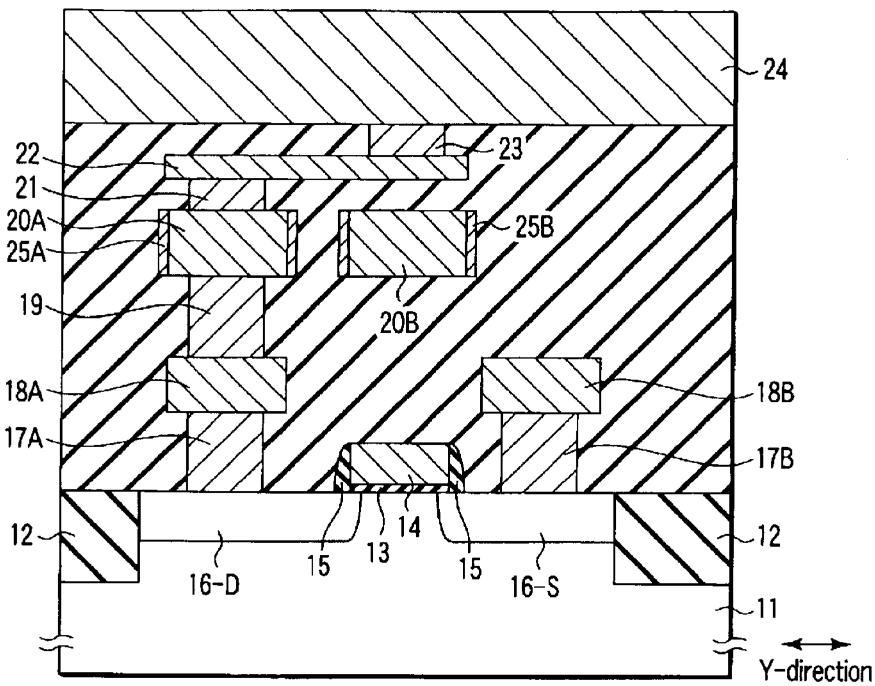
FIG. 114 is a sectional view showing the modification example of Example 5 of the second invention.
Figure 115:
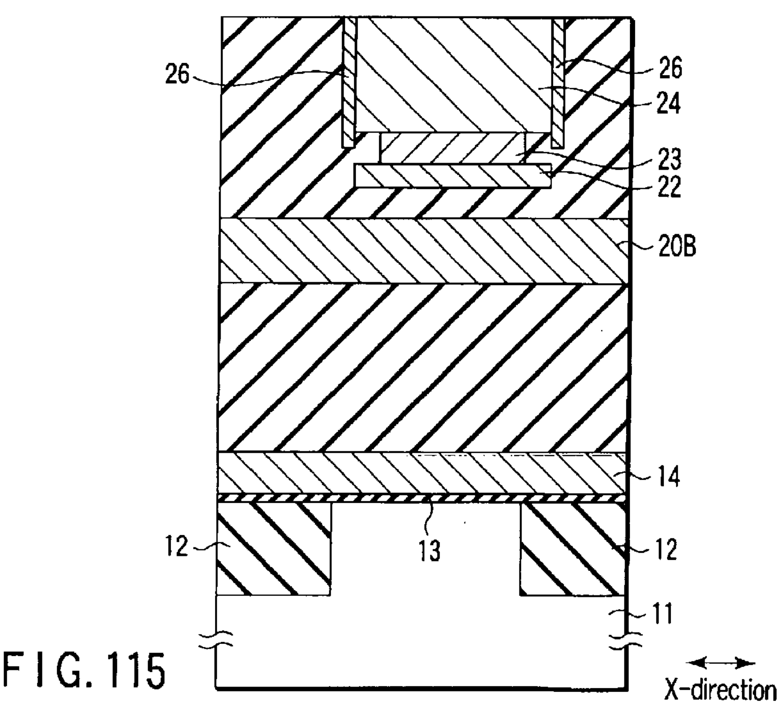
FIG. 115 is a sectional view showing the modification example of Example 5 of the second invention.
Figure 116:
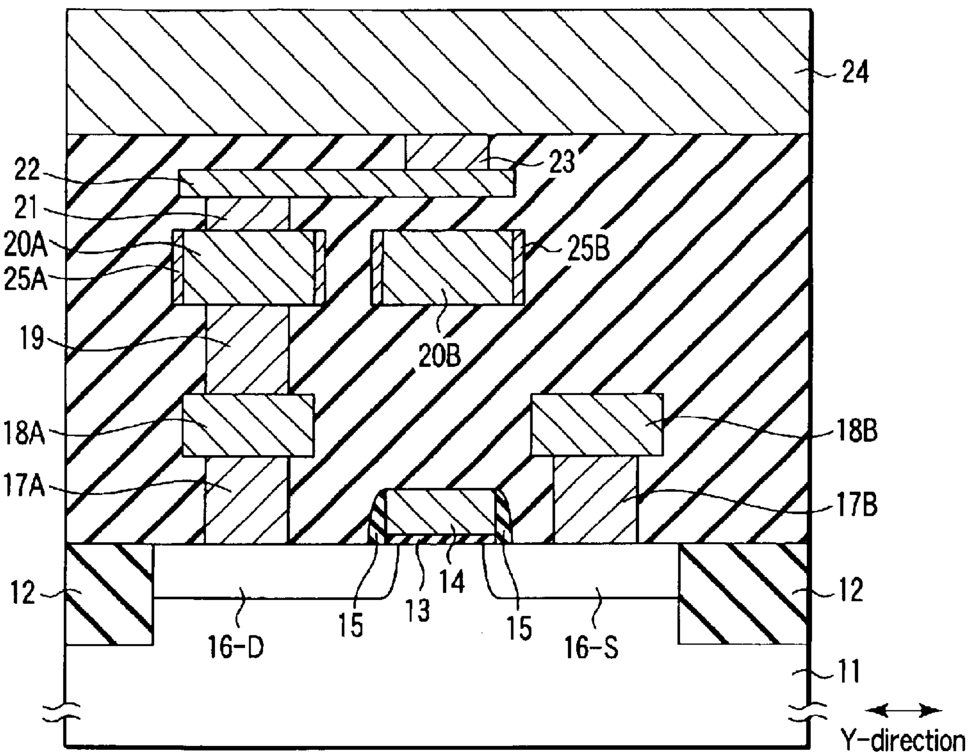
FIG. 116 is a sectional view showing the modification example of Example 5 of the second invention.
Figure 117:
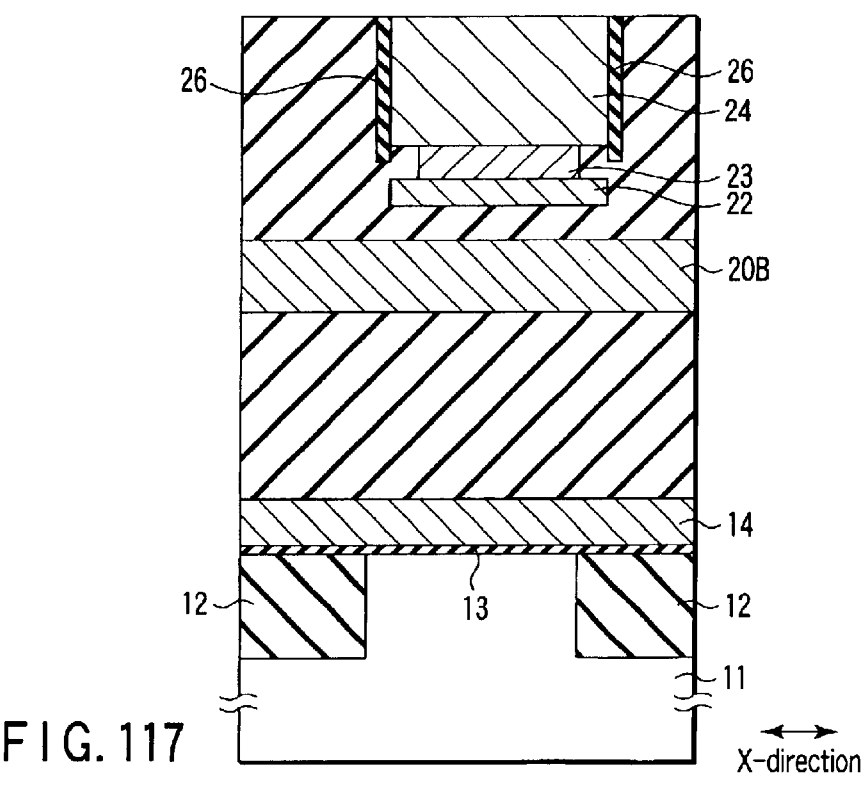
FIG. 117 is a sectional view showing the modification example of Example 5 of the second invention.

FIGS. 106 to 109 show the device structure of the magnetic random access memory according to Example 5. It is to be noted that FIGS. 106 and 108 show the sections in the Y direction, FIG. 107 shows the section of the MTJ element portion of FIG. 106 in the X direction, and FIG. 109 shows the section of the MTJ element portion of FIG. 108 in the X direction. The X direction crosses at right angles to the Y direction.

The characteristic of the device structure of the present example lies in that the lower and side surfaces of the write word line 20B disposed right under the MTJ element 23 are coated with the yoke material 25B and that only the side surface of the data selection line (read/write bit line) 24 disposed right on the MTJ element 23 is coated with the yoke materials 26.

Furthermore, the characteristic of the yoke material 26 disposed in the side surface of the data selection line 24 disposed right on the MTJ element 23 lies in the structure projecting downwards from the lower surface of the data selection line 24.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the device structure of the present example, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the device structure of the present example, the lower and side surfaces of the intermediate layer 20A and write word line 20B are coated with the materials having the high permeability, that is, the yoke materials 25A, 25B. The yoke materials 25A, 25B for use herein are limited to the material which has the conductivity.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the lower and side surfaces of the write word line 20B with the yoke material. Additionally, in actual, the yoke material is also formed on the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the device structure of the present example, the side surface of the data selection line 24 is coated with the material having the high permeability, that is, the yoke material 26. The yoke material 26 for use herein can be constituted of the material which has the conductivity as shown in FIGS. 106 and 107, or can also be constituted of the material which has the insulating property as shown in FIGS. 108 and 109.

Moreover, the yoke material 26 disposed in the side surface of the data selection line 24 projects downwards from the lower surfaces of the data selection line 24. That is, the projecting portions of the yoke material 26 can be brought close to the MTJ element 23.

It is to be noted that the magnetic flux has the property of being concentrated on the material which has the high permeability as described above. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed in the lower and side surfaces of the write word line 20B disposed right under the MTJ element 23. Moreover, the yoke material 26 is formed only in the side surface of the data selection line (read/write bit line) 24 disposed right on the MTJ element 23. Furthermore, the yoke material 26 in the side surface of the data selection line 24 projects downwards from the lower surface of the data selection line 24.

Therefore, the magnetic field generated by the write current flowing through the write word line 20B and data selection line 24 can be applied to the MTJ element 23 with good efficiency.

It is to be noted that in the present example the yoke material 25B is formed in the lower and side surfaces of the write word line 20B, but this is not limited, and the following structure may also be used.

For example, the yoke material 25B may also be formed only in the lower surface of the write word line 20B as shown in FIGS. 110 to 113, or the yoke material 25B may also be formed only in the side surface of the line as shown in FIGS. 114 to 117.

Moreover, it is convenient to form the write word line 20B and yoke material 25B using the damascene process. Conversely, when the write word line 20B and yoke material 25B are formed using the reactive ion etching (RIE) process, the process becomes very complicated, and this is realistically impossible.

Furthermore, it is convenient to form the data selection line 24 and yoke material 26 using the RIE process. Conversely, when the data selection line 24 and yoke material 26 are formed using the damascene process, the process becomes very complicated, and this is realistically impossible.

That is, for the manufacturing method for realizing the device structure shown in FIGS. 106 to 109, the manufacturing method is mainly employed comprising: forming the write word line 20B and yoke material 25B in the damascene process; and forming the data selection line 24 and yoke material 26 in the RIE process.

6. Example 6

Figure 118:
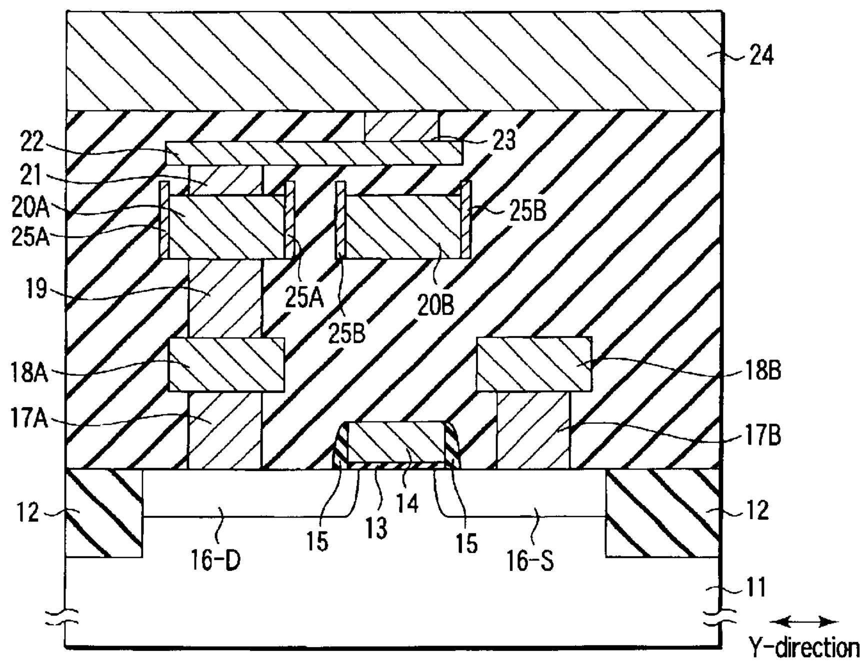
FIG. 118 is a sectional view showing the magnetic random access memory of Example 6 of the second invention.
Figure 119:
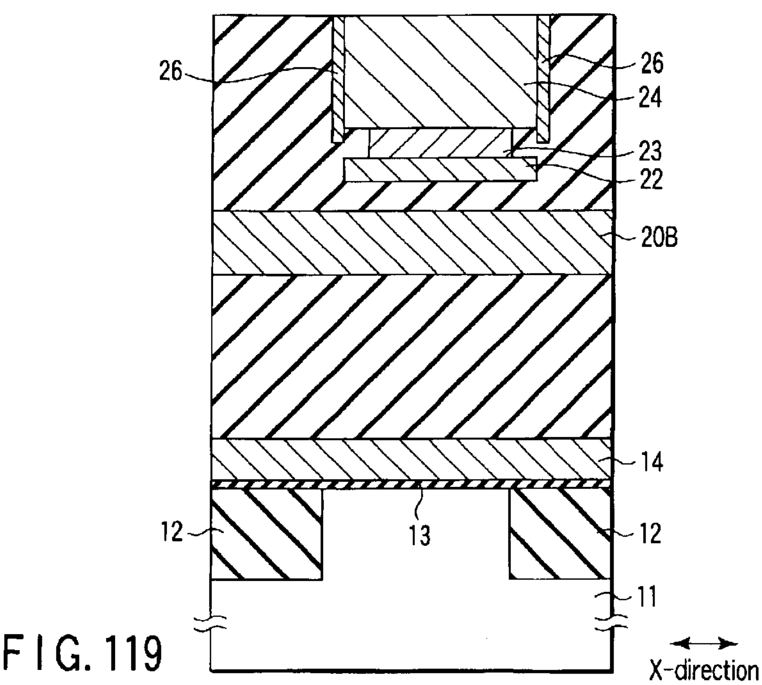
FIG. 119 is a sectional view showing the magnetic random access memory of Example 6 of the second invention.
Figure 120:
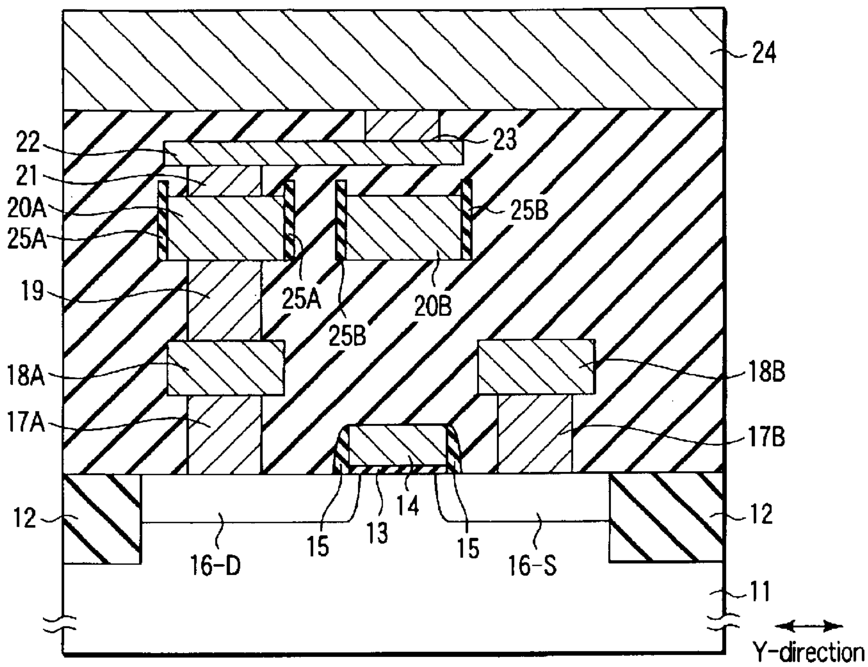
Figure 121:
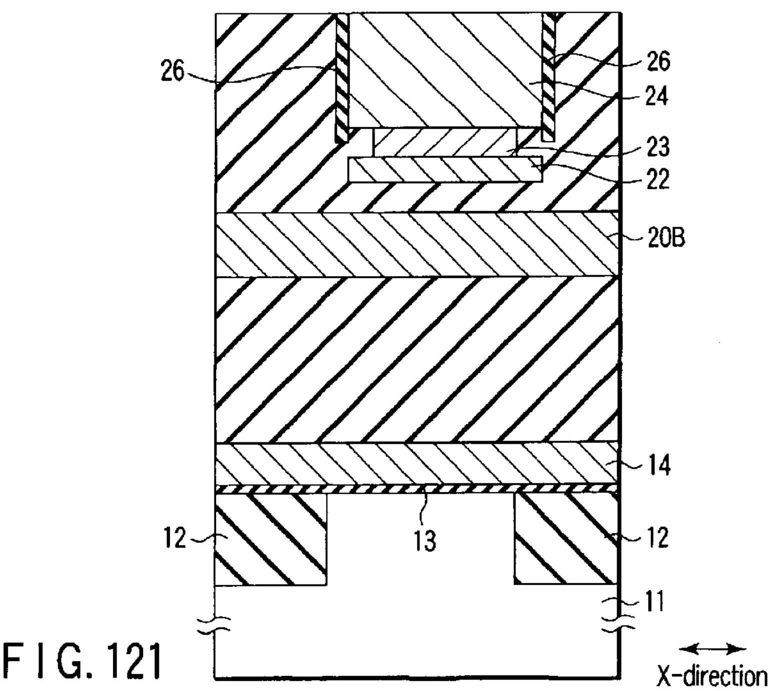

FIGS. 118 to 121 show the device structure of the magnetic random access memory according to Example 6. It is to be noted that FIGS. 118 and 120 show the sections in the Y direction, FIG. 119 shows the section of the MTJ element portion of FIG. 118 in the X direction, and FIG. 121 shows the section of the MTJ element portion of FIG. 120 in the X direction. The X direction crosses at right angles to the Y direction.

The characteristic of the device structure of the present example lies in that only the side surface of the write word line 20B disposed right under the MTJ element 23 is coated with the yoke material 25B and that only the side surface of the data selection line (read/write bit line) 24 disposed right on the MTJ element 23 is coated with the yoke material 26.

Furthermore, the characteristic of the yoke material 25B disposed in the side surface of the write word line 20B disposed right under the MTJ element 23 lies in the structure projecting upwards from the upper surface of the write word line 20B. Additionally, the characteristic of the yoke material 26 disposed in the side surface of the data selection line 24 disposed right on the MTJ element 23 lies in the structure projecting downwards from the lower surface of the data selection line 24.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the device structure of the present example, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the device structure of the present example, the side surfaces of the intermediate layer 20A and write word line 2OB are coated with the materials having the high permeability, that is, the yoke materials 25A, 25B. The yoke materials 25A, 25B for use herein can be constituted of the material which has the conductivity as shown in FIGS. 118 and 119, or can also be constituted of the material which has the insulating property as shown in FIGS. 120 and 121.

Moreover, the yoke materials 25A, 25B disposed in the side surfaces of the intermediate layer 20A and write word line 20B project upwards from the upper surfaces of the intermediate layer 20A and write word line 20B. That is, the projecting portions of the yoke materials 25A, 25B can be brought close to the MTJ element 23.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the side surface of the write word line 20B with the yoke material. Additionally, in actual, the yoke material is also formed on the side surface of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the device structure of the present example, the side surface of the data selection line 24 is coated with the material having the high permeability, that is, the yoke material 26. The yoke material 26 for use herein can be constituted of the material which has the conductivity as shown in FIGS. 118 and 119, or can also be constituted of the material which has the insulating property as shown in FIGS. 120 and 121.

Moreover, the yoke material 26 disposed in the side surface of the data selection line 24 projects downwards from the lower surfaces of the data selection line 24. That is, the projecting portion of the yoke material 26 can be brought close to the MTJ element 23.

It is to be noted that the magnetic flux has the property of being concentrated on the material which has the high permeability as described above. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed only in the side surface of the write word line 20B disposed right under the MTJ element 23. Moreover, the yoke material 26 is formed only in the side surface of the data selection line (read/write bit line) 24 disposed right on the MTJ element 23. Furthermore, the yoke material 25B in the side surface of the write word line 20B projects upwards from the upper surface of the write word line 20B, and the yoke material 26 in the side surface of the data selection line 24 projects downwards from the lower surface of the data selection line 24.

Therefore, the magnetic field generated by the write current flowing through the write word line 20B and data selection line 24 can be applied to the MTJ element 23 with good efficiency.

It is to be noted that it is convenient to form the write word line 20B and yoke material 25B using the damascene process. Conversely, when the write word line 20B and yoke material 25B are formed using the reactive ion etching (RIE)

process, the process becomes very complicated, and this is realistically impossible.

Furthermore, it is convenient to form the data selection line 24 and yoke material 26 using the RIE process. Conversely, when the data selection line 24 and yoke material 26 are formed using the damascene process, the process becomes very complicated, and this is realistically impossible.

That is, for the manufacturing method for realizing the device structure shown in FIGS. 118 to 121, the manufacturing method is mainly employed comprising: forming the write word line 20B and yoke material 25B in the damascene process; and forming the data selection line 24 and yoke material 26 in the RIE process.

7. Examples 7 to 12

Next, Examples 7 to 12 will be described which are modification examples of the device structure according to Examples 4 to 6.

The characteristics of the device structures of Examples 7 to 12 lie in that when the MTJ elements are stacked in a plurality of stages (Examples 7 to 10) or the MTJ elements are arranged in the lateral direction (Examples 11, 12), the MTJ elements share one write line, and the side surface of the write line is coated with the yoke material having the high permeability.

(1) Example 7

Figure 122:
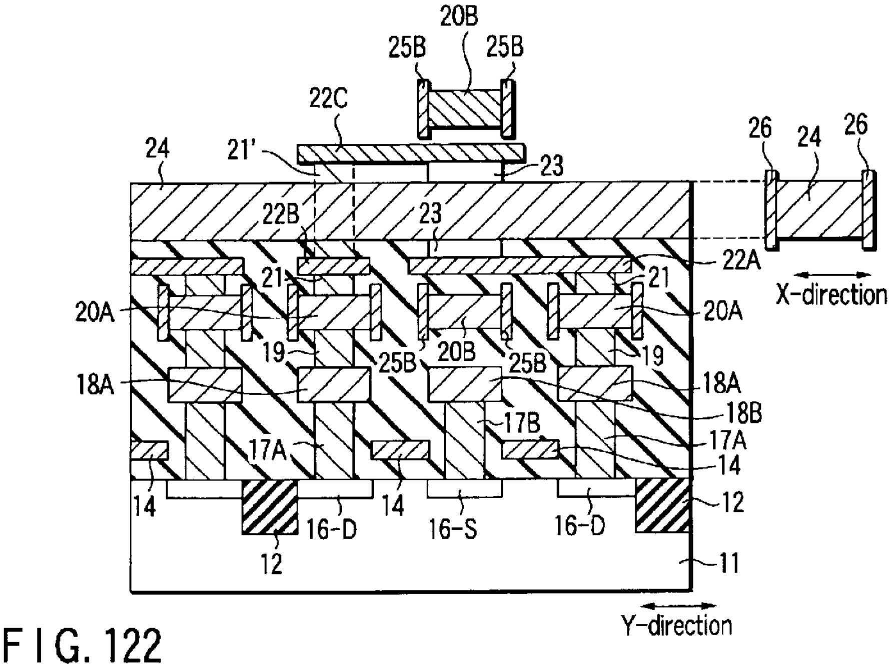
Figure 123:
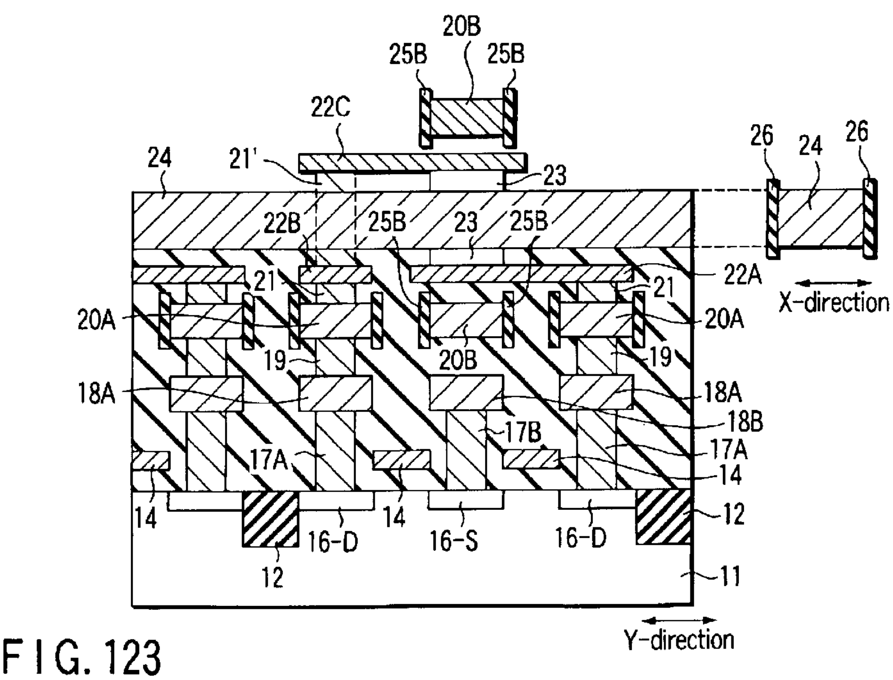

FIGS. 122 and 123 show the device structure of the magnetic random access memory according to Example 7.

In the device structure of the present example, on the semiconductor substrate 11, two MTJ elements 23 are stacked, and these two MTJ elements 23 share one data selection line (read/write bit line) 24.

The data selection line 24 is disposed between two MTJ elements, and extends in the Y direction. Moreover, one MTJ element 23 contacts the lower surface of the data selection line 24, and the other MTJ element 23 contacts the upper surface of the data selection line 24. The side surface of the data selection line 24 is coated with the yoke material 26 which has the high permeability.

The yoke material 26 projects upwards from the upper surface of the data selection line 24, and projects downwards from the lower surface of the data selection line 24.

The write current flows through the data selection line 24 at the write operation time. The magnetic field generated by the write current is applied to the MTJ element 23 by the yoke material 26 with good efficiency.

The write word line 20B extending in the X direction crossing at right angles to the Y direction is disposed right under or on the MTJ element 23. The side surface of the write word line 20B is coated with the yoke material 25B which has the high permeability.

The yoke material 25B projects upwards from the upper surface of the write word line 20B, and projects downwards from the lower surface of the write word line 20B.

The write current flows through the write word line 20B at the write operation time. The magnetic field generated by the write current is applied to the MTJ element 23 by the yoke material 25B with good efficiency.

It is to be noted that the yoke materials 25B, 26 may be constituted of the conductive material as shown in FIG. 122, or constituted of the insulating material as shown in FIG. 123.

(2) Example 8

Figure 124:
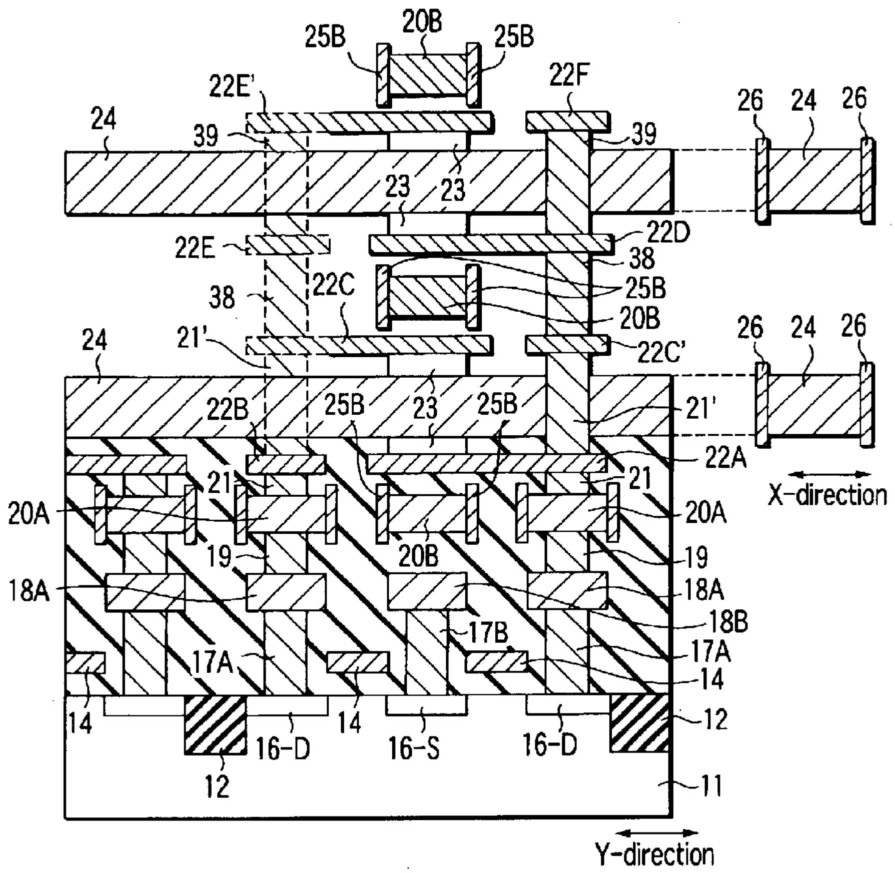
Figure 125:
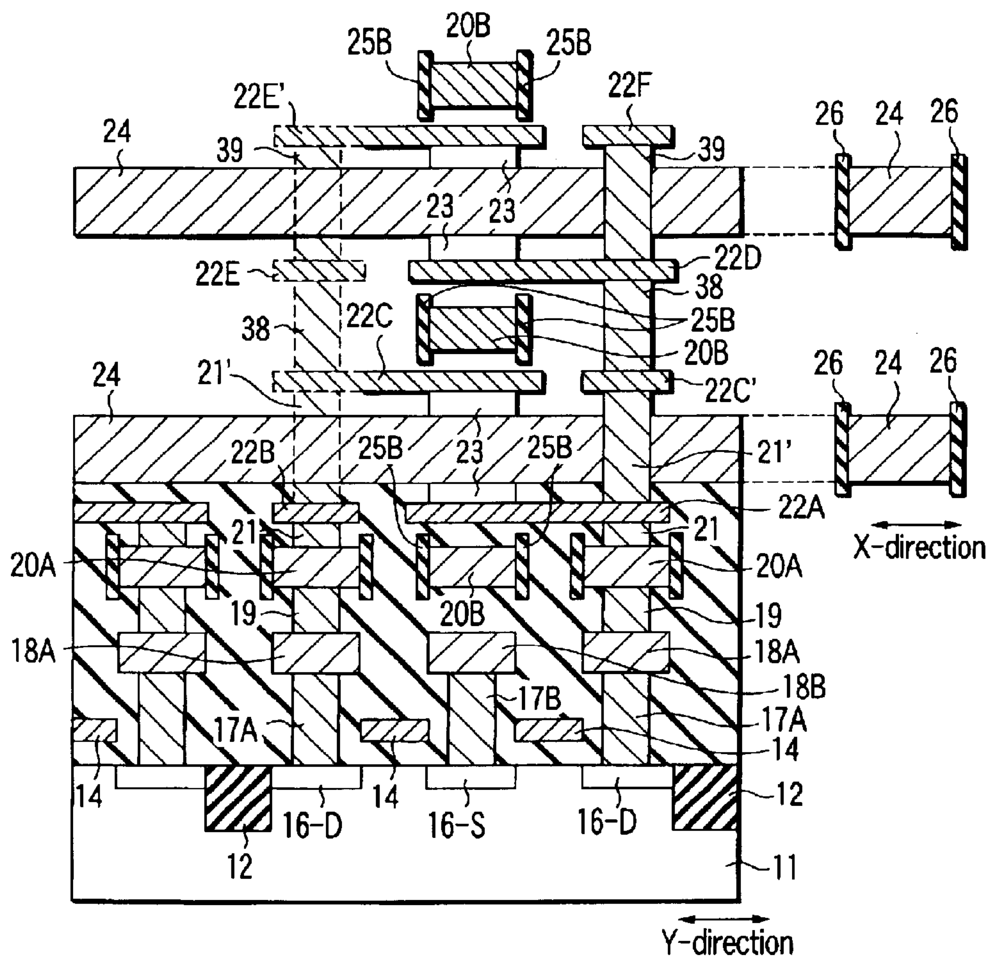

FIGS. 124 and 125 show the device structure of the magnetic random access memory according to Example 8.

In the device structure of the present example, four MTJ elements 23 are stacked on the semiconductor substrate 11. Two of these MTJ elements 23 share one write word line 20B or one data selection line (read/write bit line) 24.

The data selection line 24 is disposed between two MTJ elements 23, and extends in the Y direction. Moreover, one MTJ element 23 contacts the lower surface of the data selection line 24, and the other MTJ element 23 contacts the upper surface of the data selection line 24. The side surface of the data selection line 24 is coated with the yoke material 26 which has the high permeability.

The yoke material 26 projects upwards from the upper surface of the data selection line 24, and projects downwards from the lower surface of the data selection line 24.

At the write operation time, the write current flows through the data selection line 24. The magnetic field generated by the write current is applied to the MTJ element 23 by the yoke material 26 with good efficiency.

One write word line 20B extending in the X direction crossing at right angles to the Y direction is disposed between the MTJ element which contacts the lower surface of the upper data selection line 24 and the MTJ element 23 which contacts the upper surface of the lower data selection line 24. This write word line 20B is shared by these two MTJ elements. The side surface of the write word line 20B is coated with the yoke material 25B which has the high permeability.

Moreover, the write word lines 20B extending in the X direction are arranged right on the MTJ element 23 which contacts the upper surface of the upper data selection line 24 and right under the MTJ element 23 which contacts the lower surface of the lower data selection line 24. The side surface of the write word line 20B is coated with the yoke material 25B which has the high permeability.

The yoke material 25B projects upwards from the upper surface of the write word line 20B, and projects downwards from the lower surface of the write word line 20B.

At the write operation time, the write current flows through the write word line 20B. The magnetic field generated by the write current is applied to the MTJ element 23 by the yoke material 25B with good efficiency.

It is to be noted that the yoke materials 25B, 26 may be constituted of the conductive material as shown in FIG. 124, or may also be constituted of the insulating material as shown in FIG. 125.

(3) Example 9

FIGS. 126 to 129 show the device structure of the magnetic random access memory according to Example 9.

In the device structure of the present example, four MTJ elements 23 connected in series are stacked on the semiconductor substrate 11. One end of these MTJ elements 23 connected in series is connected to the read selection switch RSW, and the other end is connected to the read bit line BL. Two of these MTJ elements 23 share one write word line 20B or one write bit line 24.

The write bit line 24 is disposed between two MTJ elements 23, and extends in the Y direction. The side surface of the write bit line 24 is coated with the yoke material 26 which has the high permeability. The yoke material 26 projects upwards from the upper surface of the write bit line 24, and projects downwards from the lower surface of the write bit line 24.

At the write operation time, the write current flows through the write bit line 24. The magnetic field generated by the write current is applied to the MTJ element 23 by the yoke material 26 with good efficiency.

The write word line 20B is disposed between two MTJ elements 23, and extends in the X direction crossing at right angles to the Y direction. The side surface of the write word line 20B is coated with the yoke material 25B which has the high permeability. Moreover, the write word line 20B is disposed right under or on the MTJ element 23, and extends in the X direction. The side surface of the write word line 20B is coated with the yoke material 25B which has the high permeability.

The yoke material 25B projects upwards from the upper surface of the write word line 20B, and projects downwards from the lower surface of the write word line 20B.

At the write operation time, the write current flows through the write word line 20B. The magnetic field generated by the write current is applied to the MTJ element 23 by the yoke material 25B with good efficiency.

Figure 126:
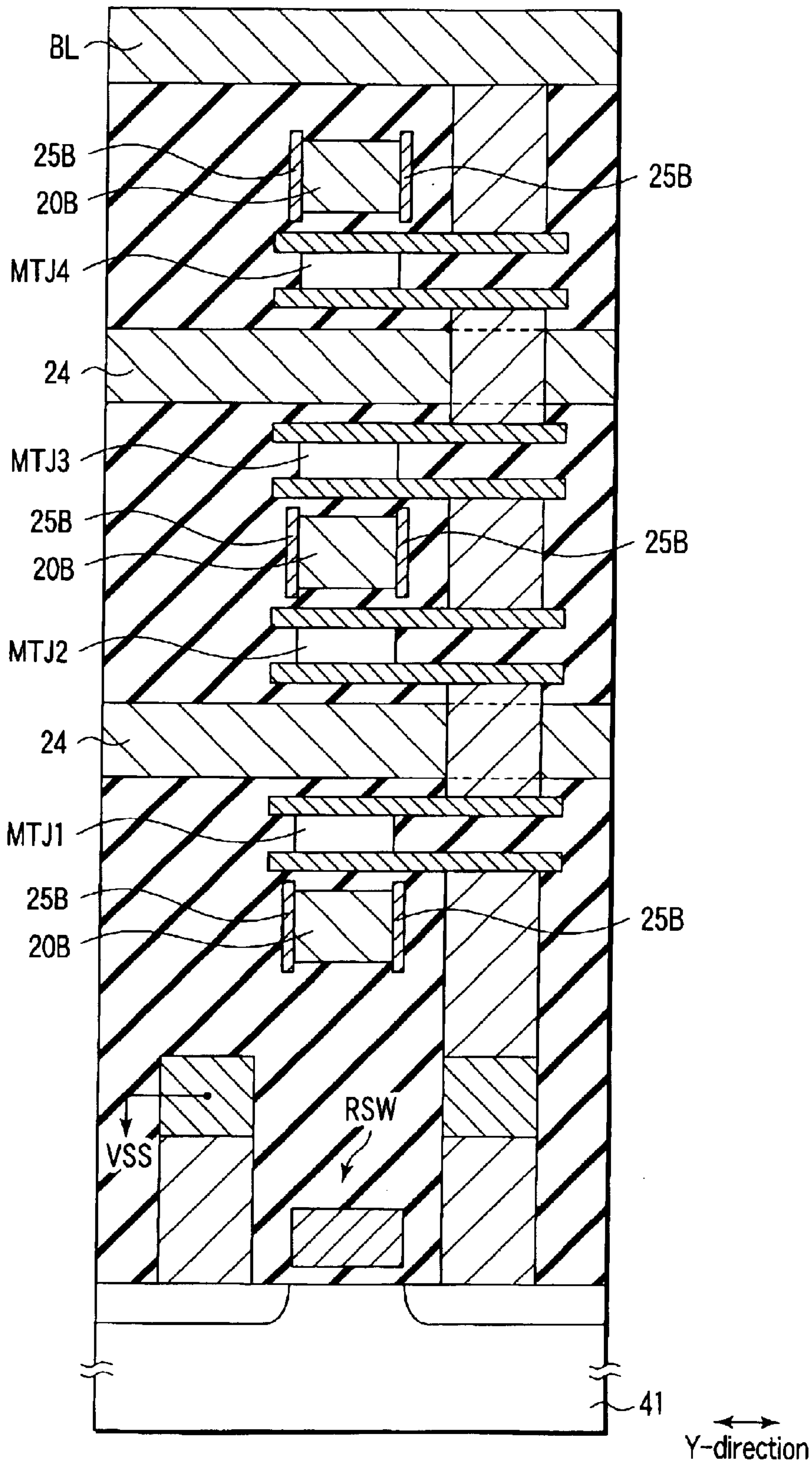

It is to be noted that the yoke materials 25B, 26 may be constituted of the conductive material as shown in FIGS. 126 and 127, or may also be constituted of the insulating material as shown in FIGS. 128 and 129.

(4) Example 10

FIGS. 130 to 133 show the device structure of the magnetic random access memory according to Example 10.

In the device structure of the present example, four MTJ elements 23 connected in parallel to one another are stacked on the semiconductor substrate 11. One end of these MTJ elements 23 connected in parallel to one another is connected to the read selection switch RSW, and the other end is connected to the read bit line BL. Two of these MTJ elements 23 share one write word line 20B or one write bit line 24.

The write bit line 24 is disposed between two MTJ elements 23, and extends in the Y direction. The side surface of the write bit line 24 is coated with the yoke material 26 which has the high permeability. The yoke material 26 projects upwards from the upper surface of the write bit line 24, and projects downwards from the lower surface of the write bit line 24.

At the write operation time, the write current flows through the write bit line 24. The magnetic field generated by the write current is applied to the MTJ element 23 by the yoke material 26 with good efficiency.

The write word line 20B is disposed between two MTJ elements 23, and extends in the X direction crossing at right angles to the Y direction. The side surface of the write word line 20B is coated with the yoke material 25B which has the high permeability. Moreover, the write word line 20B is disposed right under or on the MTJ element 23, and extends in the X direction. The side surface of the write word line 20B is coated with the yoke material 25B which has the high permeability.

The yoke material 25B projects upwards from the upper surface of the write word line 20B, and projects downwards from the lower surface of the write word line 20B.

At the write operation time, the write current flows through the write word line 20B. The magnetic field generated by the write current is applied to the MTJ element 23 by the yoke material 25B with good efficiency.

Figure 130:
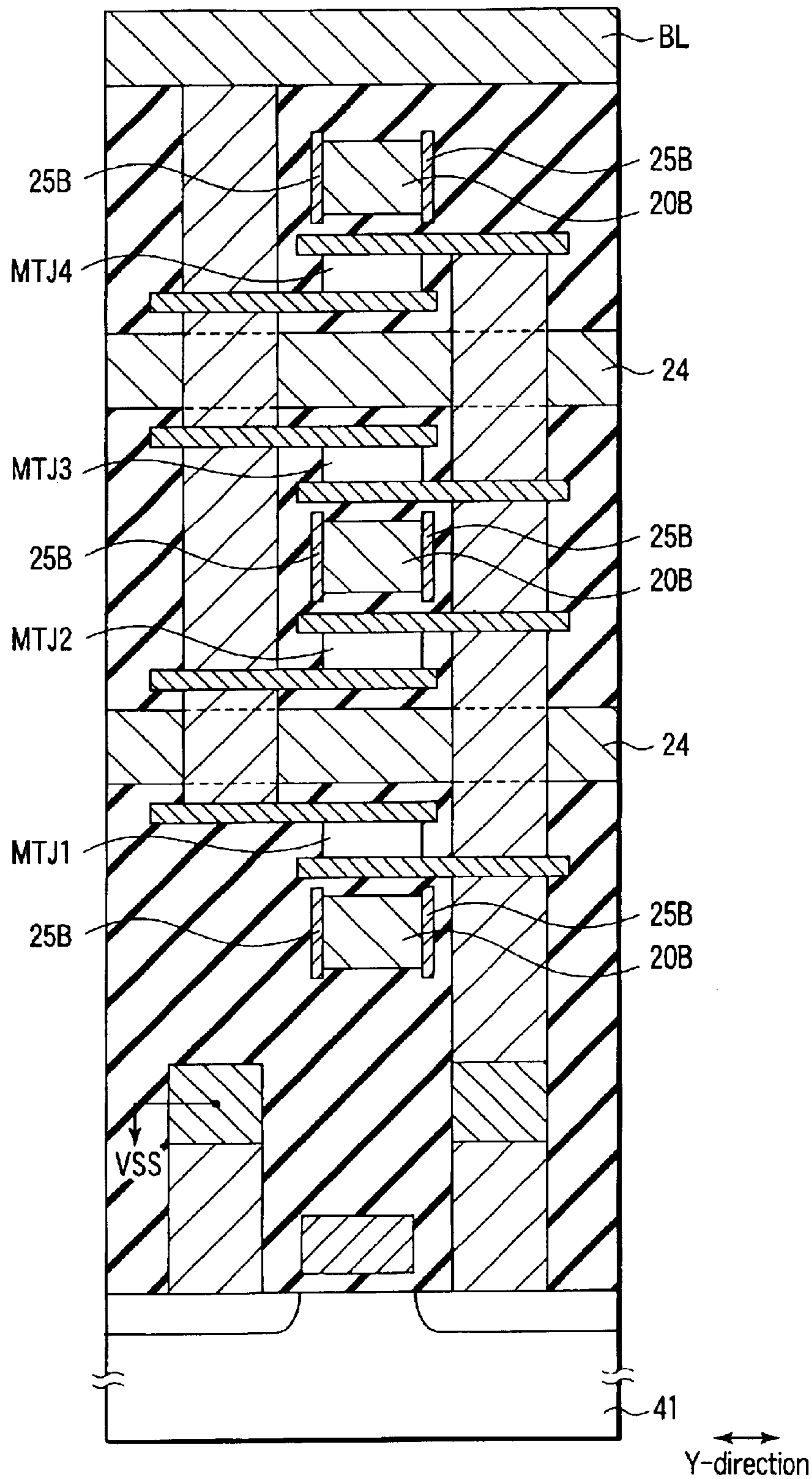

It is to be noted that the yoke materials 25B, 26 may be constituted of the conductive material as shown in FIGS. 130 and 131, or may also be constituted of the insulating material as shown in FIGS. 132 and 133.

(5) Example 11

FIGS. 134 and 135 show the device structure of the magnetic random access memory according to Example 11.

In the device structure of the present example, on the semiconductor substrate 11, a plurality of (four in the present example) MTJ elements 23 are arranged in the lateral direction (in the direction parallel to the surface of the semiconductor substrate). One end of these MTJ elements 23 is connected in common to the read selection switch RSW, and the other end is connected in common to the data selection line (read/write bit line) 24. These MTJ elements 23 share one data selection line (read/write bit line) 24.

The data selection line 24 is disposed right on the MTJ elements 23, and extends in the Y direction. The side surface of the data selection line 24 is coated with the yoke material 26 which has the high permeability. The yoke material 26 projects downwards from the lower surface of the data selection line 24. At the write operation time, the write current flows through the data selection line 24. The magnetic field generated by the write current is applied to the MTJ element 23 by the yoke material 26 with good efficiency.

The write word line 20B is disposed right under the MTJ element 23, and extends in the X direction crossing at right angles to the Y direction. The side surface of the write word line 20B is coated with the yoke material 25B which has the high permeability. The yoke material 25B projects upwards from the upper surface of the write word line 20B.

At the write operation time, the write current flows through the write word line 20B. The magnetic field generated by the write current is applied to the MTJ element 23 by the yoke material 25B with good efficiency.

It is to be noted that the yoke materials 25B, 26 may be constituted of the conductive material as shown in FIG. 134, or may also be constituted of the insulating material as shown in FIG. 135.

(6) Example 12

FIGS. 136 and 137 show the device structure of the magnetic random access memory according to Example 12.

In the device structure of the present example, on the semiconductor substrate 11, a plurality of (four in the present example) MTJ elements 23 are arranged in the lateral direction (in the direction parallel to the surface of the semiconductor substrate). One end of each of these MTJ elements 23 is connected in common to the read selection switch RSW, and the other end thereof is independently connected to the data selection line (read bit line/write word line) 20B.

These MTJ elements 23 share one write bit line 24. The write bit line 24 is disposed right on the MTJ elements 23, and extends in the Y direction. The side surface of the write bit line 24 is coated with the yoke material 26 which has the high permeability. The yoke material 26 projects downwards from the lower surface of the data selection line 24. At the write operation time, the write current flows through the write bit line 24. The magnetic field generated by the write current is applied to the MTJ element 23 by the yoke material 26 with good efficiency.

The data selection line 20B is disposed right under the MTJ element 23, and extends in the X direction crossing at right angles to the Y direction. The side surface of the data selection line 20B is coated with the yoke material 25B which has the high permeability. The yoke material 25B projects upwards from the upper surface of the write word line 20B.

At the write operation time, the write current flows through the data selection line 20B. The magnetic field generated by the write current is applied to the MTJ element 23 by the yoke material 25B with good efficiency.

It is to be noted that the yoke materials 25B, 26 may be constituted of the conductive material as shown in FIG. 136, or may also be constituted of the insulating material as shown in FIG. 137.

8. Memory Cell Array Structure

The examples of the memory cell array structure (circuit structure) realized by the device structures according to Reference Examples 1, 2, and Examples 1 to 12 will be described.

FIG. 138 shows a main part of the memory cell array structure of the magnetic random access memory.

In the cell array structure, it is assumed that the magnetization easy axis of the MTJ element is directed in the Y direction, and the direction of the write current flowing through the write word line therefore changes in accordance with write data.

The control signals φ1, φ31, φ32, φ33 control and turn on/off the N-channel MOS transistors QN1, QN31, QN32, QN33 to determine whether or not the currents are passed through the data selection lines (read/write bit lines) BL1, BL2, BL3. One end (the side of the N-channel MOS transistor QN1) of the data selection lines BL1, BL2, BL3 is connected to the current driving power supply 40. The current driving power supply 40 sets the potential of one end of the data selection lines BL1, BL2, BL3 to Vy.

The N-channel MOS transistors QN31, QN32, QN33 are connected between the other ends of the data selection lines BL1, BL2, BL3 and ground points Vss.

At the write operation time, the control signal φ1 turns to the "H" level, and one of the control signals φ31, φ32, φ33 turns to the "H" level. For example, when the data is written into the MTJ element of the memory cell MC1, as shown in the timing chart of FIG. 139, the control signals φ1, φ31 turn to the "H" level, and the current therefore flows through the data selection line BL1. At this time, the control signals φ41, φ42, φ43 turn to the "L" level.

Moreover, Vx1 indicates the current driving power supply potential for "1"-write, and Vx2 indicates the current driving power supply potential for "0"-write.

For example, at the "1"-write time, as shown in FIG. 139, the control signals φ5, φ11 turn to the "H" level. At this time, the control signals φ6, φ12 turn to the "L" level. For this, the current flows through the write word line WWL1 to the right from the left (to the ground point from the current driving power supply 41). Therefore, "1"-data is written in the MTJ element of the memory cell MC1 disposed in the intersection of the data selection line BL1 and write word line WWL1.

Moreover, at the "0"-write time, as shown in FIG. 139, the control signals φ6, φ11 turn to the "H" level. At this time, the control signals φ5, φ12 turn to the "L" level. For this, the current flows through the write word line WWL1 to the left from the right (to the current driving power supply 42 from the ground point Vss). Therefore, "0"-data is written in the MTJ element of the memory cell MC1 disposed in the intersection of the data selection line BL1 and write word line WWL1.

In this manner, at the write operation time, the control signal φ1 is used to supply the driving current to all the data selection lines, and the control signals φ31, φ32, φ33 are used to select the data selection line through which the driving current is passed. It is to be noted that in the present example the direction of the driving current flowing through the data selection line is constant. The control signals φ5, φ6 are used to control the direction of the current flowing through the write word line (corresponding to the write data). The control signals φ11, φ12 are used to select the write word line through which the driving current is passed.

In the present example, to simplify the description, the 3×2 memory cell array is assumed. The memory cells (MTJ elements) are disposed in the intersections of the write word lines WWL1, WWL2, and data selection lines BL1, BL2, BL3. Here, to read the data stored in the memory cell MC1, the control signals φ21, φ22, φ41, φ42, φ43 are controlled as follows.

That is, at the read operation time, the control signal φ21 given to the read word line RWL1 is set to the "H" level, and the N-channel MOS transistor connected to the read word line RWL1 is brought in the on state. At this time, the control signal φ22 given to another read word line RWL2 indicates the "L" level.

Moreover, when the control signal φ41 is set to the "H" level, and the other control signals φ42, φ43 are set to the "L" level, the driving current flows toward the ground point from the read power supply 43 via the memory cell MC1 (N-channel MOS transistor and MTJ element), data selection line BL1, N-channel MOS transistor QN41, and detection resistance Rs.

Therefore, the detection voltages Vo are generated in the opposite ends of the detection resistance Rs in accordance with the data value of the memory cell MC1. For example, when the detection voltages Vo are detected by the sense amplifier S/A, the data of the memory cell (MTJ element) can be read.

9. Manufacturing Method

Next, the manufacturing method of the main device structure will be described in detail among the device structures according to Reference Examples 1, 2 and Examples 1 to 12.

(1) Manufacturing Method of Device Structure According to Example 3

First, as shown in FIG. 140, the known methods such as the photo engraving process (PEP) method, chemical vapor deposition (CVD) method, and chemical mechanical polishing (CMP) method are used to form the element isolation insulating layer 12 including an STI structure in the semiconductor substrate 11.

Moreover, the MOS transistor is formed as the read selection switch in the element region surrounded by the element isolation insulating layer 12.

The MOS transistor can easily be formed by forming the gate insulating layer 13 and gate electrode (read word line) 14 by the CVD, PEP, and reactive ion etching (RIE) methods, and subsequently forming the source region 16-S and drain region 16-D by the ion implantation method. It is to be noted that the side wall insulating layer 15 may also be formed on the side wall portion of the gate electrode 14 by the CVD and RIE methods.

Thereafter, the insulating layer 28A with which the MOS transistor is completely coated is formed by the CVD method. Moreover, the CMP method is used to flatten the surface of the insulating layer 28A. The PEP and RIE methods are used to form the contact hole reaching the source diffused layer 16-S and drain diffused layer 16-D of the MOS transistor in the insulating layer 28A.

On the insulating layer 28A and on the inner surface of the contact hole, the sputter method is used to form the barrier metal (e.g., Ti, TiN or the lamination of these) 51. Subsequently, the conductive material (e.g., the impurity-containing conductive polysilicon film, metal film, and the like) with which the contact hole is completely filled is formed on the insulating layer 28A. Subsequently, by the CMP method, the conductive material and barrier metal 51 are polished to form the contact plugs 17A, 17B.

The CVD method is used to form the insulating layer 28B on the insulating layer 28A. The PEP and RIE methods are used to form the wiring trench in the insulating layer 28B. By the sputter method, the barrier metal (e.g., Ti, TiN or the lamination of these) 52 is formed on the insulating layer 28B and on the inner surface of the wiring trench. Subsequently, by the sputter method, the conductive material (e.g., the metal films such as aluminum and copper) with which the wiring trench is completely filled is formed on the insulating layer 28B. Thereafter, the conductive material and barrier metal 52 are polished by the CMP to form the intermediate layer 18A and source line 18B.

Subsequently, the CVD method is used to form the insulating layer 28C on the insulating layer 28B. The PEP and RIE methods are used to form the via hole in the insulating layer 28C. By the sputter method, the barrier metal (e.g., Ti, TiN, or the lamination of these) 53 is formed on the insulating layer 28C and the inner surface of the via hole. Subsequently, by the sputter method, the conductive material (e.g., the metal films such as aluminum and copper) with which the via hole is completely filled is formed on the insulating layer 28C. Thereafter, the conductive material and barrier metal 53 are polished by the CMP method to form the via plug 19.

Next, as shown in FIG. 141, the CVD method is used to form the insulating layer 29 on the insulating layer 28C. The PEP and RIE methods are used to form the wiring trench in the insulating layer 29. The sputter method is used to form the yoke material (e.g., NiFe) 25 having the high permeability in a thickness of about 20 nm on the insulating layer 29 and in the wiring trench.

By the sputter method, the barrier metal (e.g., Ti, TiN, or the lamination of these) 54 is formed on the insulating layer 29 and in the wiring trench. Subsequently, the sputter method is used to form the conductive material (e.g., the metal films such as aluminum and copper) 20 with which the wiring trench is completely filled.

Thereafter, when the conductive material 20 and barrier metal 54 are polished by the CMP, the intermediate layer 20A and write word line 20B are formed (see FIG. 142).

Here, in the present example, as shown in FIG. 142, the conductive materials 20A, 20B are polished on a condition that the upper surfaces of the materials are disposed below the upper surface of the insulating layer 29. That is, for example, on a condition that a yoke material 25 forms a mask, the conductive material 20 of FIG. 141 is polished. Thereafter, the yoke material 25 on the insulating layer 29 is removed. Through this step, the yoke material 25 is formed which projects upwards from the upper surface of the write word line 20B.

Next, as shown in FIG. 142, the CVD method is used to form the insulating layer 30A on the insulating layer 29. The PEP and RIE methods are used to form the via hole in the insulating layer 30A. By the sputter method, the barrier metal (e.g., Ti (10 nm)) 55 is formed on the insulating layer 30A and on the inner surface of the via hole. Subsequently, by the CVD method, the conductive material (e.g., the metal films such as tungsten) with which the via hole is completely filled is formed on the insulating layer 30A. Thereafter, the conductive material and barrier metal 55 are polished by the CMP method to form the via plug 21.

Here, the thickness of the insulating layer 30A (or the height of the via plug 21) determines the distance between the write word line 20B and MTJ element 23. The intensity of the magnetic field decreases in inverse proportion to the distance, therefore the MTJ element is brought as close as possible toward the write word line 20B, and the data is preferably rewritten by the small driving current. Therefore, the thickness of the insulating layer 30A is set to be as thin as possible.

The CVD method is used to form the insulating layer 30B on the insulating layer 30A. The PEP and RIE methods are used to form the wiring trench in the insulating layer 30B. By the sputter method, on the insulating layer 30B, the conductive material (e.g., the metal films such as Ta) with which the wiring trench is completely filled is formed in a thickness of about 50 nm. Thereafter, the conductive material is polished by the CMP to form the local interconnect lines (lower electrodes of the MTJ elements) 22.

The CVD method is used to successively form, for example, NiFe (about 5 nm), IrMn (about 12 nm), CoFe (about 3 nm), AlOx (about 1.2 nm), CoFe (about 5 nm), and NiFe (about 15 nm) on the local interconnect lines 22. Thereafter, these stacked films are patterned to form the MTJ elements 23.

Moreover, after using the CVD method to form the insulating layer 30C with which the MTJ elements 23 are coated, for example, the insulating layer 30C on the MTJ elements 23 is removed by the CMP method, so that only the side surfaces of the MTJ elements 23 are coated with the insulating layer 30C.

Next, as shown in FIG. 143, by the sputter method, the barrier metal (e.g., Ti, TiN, or the lamination of these) 56 is formed on the insulating layer 30C. Subsequently, the sputter method is used to form the conductive material on the barrier metal 56. Furthermore, for example, by the CVD method, the yoke material (e.g., NiFe) 27 is formed in a thickness of about 50 nm on the conductive material.

Thereafter, the PEP and RIE methods are used to pattern the yoke material 27, conductive material, and barrier metal 56, and the data selection line (read/write bit line) 24 is formed.

Here, after etching the conductive material by RIE, the upper surface of the insulating layer 30C is successively etched by a predetermined amount, for example, by RIE. As a result, a concave portion (side wall of the insulating layer 30C continued to the side surface of the data selection line 24) is formed in the insulating layer 30C.

Thereafter, by the CVD method, the yoke material (e.g., NiFe) 26 is formed in a thickness of about 50 nm on the insulating layer 30C, side surface of the data selection line 24, and yoke material 27. Subsequently, the RIE method is used to etch the yoke material 26, and the yoke material 26 is left only on the side surface of the data selection line 24 and on the side wall of the insulating layer 30C. Through this step, the yoke material 26 is formed which projects downwards from the lower surface of the data selection line 24.

By the above-described steps, the magnetic random access memory according to Example 3 (FIGS. 74 and 75) is completed.

It is to be noted that in the manufacturing method of the present example, the metal wirings 20A, 20B are formed by the damascene process. However, for example, the RIE process may also be used to form the metal wirings 20A, 20B.

Moreover, in the manufacturing method of the present example, after forming the yoke materials 25A, 25B, the barrier metal 54 is formed. Instead, for example, after forming the barrier metal 54, the yoke materials 25A, 25B may also be formed.

(2) Manufacturing Method of Device Structure According to Example 6

First, as shown in FIG. 144, the known methods such as the photo engraving process (PEP) method, chemical vapor deposition (CVD) method, and chemical mechanical polishing (CMP) method are used to form the element isolation insulating layer 12 including the STI structure in the semiconductor substrate 11.

Moreover, the MOS transistor is formed as the read selection switch in the element region surrounded by the element isolation insulating layer 12.

The MOS transistor can easily be formed by forming the gate insulating layer 13 and gate electrode (read word line) 14 by the CVD, PEP, and reactive ion etching (RIE) methods, and subsequently forming the source region 16-S and drain region 16-D by the ion implantation method. It is to be noted that the side wall insulating layer 15 may also be formed on the side wall portion of the gate electrode 14 by the CVD and RIE methods.

Thereafter, the insulating layer 28A with which the MOS transistor is completely coated is formed by the CVD method. Moreover, the CMP method is used to flatten the surface of the insulating layer 28A. The PEP and RIE methods are used to form the contact hole reaching the source diffused layer 16-S and drain diffused layer 16-D of the MOS transistor in the insulating layer 28A.

On the insulating layer 28A and on the inner surface of the contact hole, the sputter method is used to form the barrier metal (e.g., Ti, TiN, or the lamination of these) 51. Subsequently, the conductive material (e.g., the impurity-containing conductive polysilicon film, metal film, and the like) with which the contact hole is completely filled is formed on the insulating layer 28A. Subsequently, by the CMP method, the conductive material and barrier metal 51 are polished to form the contact plugs 17A, 17B.

The CVD method is used to form the insulating layer 28B on the insulating layer 28A. The PEP and RIE methods are used to form the wiring trench in the insulating layer 28B. By the sputter method, the barrier metal (e.g., Ti, TiN, or the lamination of these) 52 is formed on the insulating layer 28B and on the inner surface of the wiring trench. Subsequently, by the sputter method, the conductive material (e.g., the metal films such as aluminum and copper) with which the wiring trench is completely filled is formed on the insulating layer 28B. Thereafter, the conductive material and barrier metal 52 are polished by the CMP to form the intermediate layer 18A and source line 18B.

Subsequently, the CVD method is used to form the insulating layer 28C on the insulating layer 28B. The PEP and RIE methods are used to form the via hole in the insulating layer 28C. By the sputter method, the barrier metal (e.g., Ti, TiN, or the lamination of these) 53 is formed on the insulating layer 28C and the inner surface of the via hole. Subsequently, by the sputter method, the conductive material (e.g., the metal films such as aluminum and copper) with which the via hole is completely filled is formed on the insulating layer 28C. Thereafter, the conductive material and barrier metal 53 are polished by the CMP method to form the via plug 19.

Next, as shown in FIG. 145, the CVD method is used to form the insulating layer 29 on the insulating layer 28C. The PEP and RIE methods are used to form the wiring trench in the insulating layer 29. The sputter method is used to form the yoke materials (e.g., NiFe) 25A, 25B having the high permeability in a thickness of about 20 nm on the insulating layer 29 and in the wiring trench. Thereafter, the RIE method is used to etch the yoke materials 25A, 25B, and the yoke materials 25A, 25B remain only in the side wall portion of the wiring trench.

Moreover, the sputter method is used to form the barrier metal (e.g., the lamination of Ti (10 nm) and TiN (10 nm)) 54 on the insulating layer 29 and in the wiring trench. Subsequently, the sputter method is used to form the conductive material (e.g., AlCu) 20 with which the wiring trench is completely filled. Thereafter, when the conductive material 20 and barrier metal 54 are polished by the CMP, the intermediate layer 20A and write word line 20B are formed (see FIG. 146).

Here, in the present example, as shown in FIG. 146, the conductive materials 20A, 20B are polished on the condition that the upper surfaces of the materials are disposed in the lower part from the upper surface of the insulating layer 29. That is, for example, on the condition that the insulating layer 29 forms the mask, the conductive material 20 of FIG. 145 is polished. Through this step, the yoke material 25 is formed which projects upwards from the upper surface of the write word line 20B.

Next, as shown in FIG. 146, the CVD method is used to form the insulating layer 30A on the insulating layer 29. The PEP and RIE methods are used to form the via hole in the insulating layer 30A. By the sputter method, the barrier metal (e.g., TiN (10 nm)) 55 is formed on the insulating layer 30A and on the inner surface of the via hole. Subsequently, by the CVD method, the conductive material (e.g., the metal films such as tungsten) with which the via hole is completely filled is formed on the insulating layer 30A. Thereafter, the conductive material and barrier metal 55 are polished by the CMP method to form the via plug 21.

Here, the thickness of the insulating layer 30A (or the height of the via plug 21) determines the distance between the write word line 20B and MTJ element 23. The intensity of the magnetic field decreases in inverse proportion to the distance, therefore the MTJ element is brought as close as possible toward the write word line 20B, and the data is preferably rewritten by the small driving current. Therefore, the thickness of the insulating layer 30A is set to be as thin as possible.

The CVD method is used to form the insulating layer 30B on the insulating layer 30A. The PEP and RIE methods are used to form the wiring trench in the insulating layer 30B. By the sputter method, on the insulating layer 30B, the conductive material (e.g., the metal films such as Ta) with which the wiring trench is completely filled is formed in a thickness of about 50 nm. Thereafter, the conductive material is polished by the CMP to form the local interconnect lines (lower electrodes of the MTJ elements) 22.

The CVD method is used to successively form, for example, NiFe (about 5 nm), IrMn (about 12 nm), CoFe (about 3 nm), AlOx (about 1.2 nm), CoFe (about 5 nm), and NiFe (about 15 nm) on the local interconnect lines 22. Thereafter, these stacked films are patterned to form the MTJ elements 23.

Moreover, after using the CVD method to form the insulating layer 30C with which the MTJ elements 23 are coated, for example, the insulating layer 30C on the MTJ elements 23 is removed by the CMP method, so that only the side surfaces of the MTJ elements 23 are coated with the insulating layer 30C.

Next, as shown in FIG. 147, the sputter method is used to form the barrier metal (e.g., the lamination of Ti (25 nm) and TiN (25 nm)) 56 on the insulating layer 30C. Subsequently, the sputter method is used to form the conductive material on the barrier metal 56. The PEP and RIE methods are used to pattern the conductive material and barrier metal 56, and the data selection line (read/write bit line) 24 is formed.

Here, after etching the conductive material and barrier metal 56 by RIE, the upper surface of the insulating layer 30C is successively etched by a predetermined amount, for example, by RIE. As a result, the concave portion (side wall of the insulating layer 30C continued to the side surface of the data selection line 24) is formed in the insulating layer 30C.

Thereafter, by the CVD method, the yoke material (e.g., NiFe) 26 is formed in a thickness of about 20 nm on the insulating layer 30C and on the side surface of the data selection line 24. Subsequently, the RIE method is used to etch the yoke material 26, and the yoke material 26 is left only on the side surface of the data selection line 24 and on the side wall of the insulating layer 30C. Through this step, the yoke material 26 is formed which projects downwards from the lower surface of the data selection line 24.

By the above-described steps, the magnetic random access memory according to Example 6 (FIGS. 118 and 119) is completed.

It is to be noted that in the manufacturing method of the present example, the metal wirings 20A, 20B are formed by the damascene process. However, for example, the RIE process may also be used to form the metal wirings 20A, 20B.

Moreover, in the manufacturing method of the present example, after forming the yoke materials 25A, 25B, the barrier metal 54 is formed. Instead, for example, after forming the barrier metal 54, the yoke materials 25A, 25B may also be formed.

10. Others

In the description of Reference Examples 1, 2, Examples 1 to 6, and manufacturing methods, the examples of the magnetic random access memory in which one MTJ element and one read selection switch (MOS transistor) constitute the memory cell and which includes the write word line and data selection line (read/write bit line) have been described.

However, naturally the present invention is not limited to the magnetic random access memory including this cell array structure, and can also be applied to all the magnetic random access memories, for example, including the device structures as described in Examples 7 to 12.

The present invention can also be applied, for example, to the magnetic random access memory which does not include the read selection switch, magnetic random access memory in which the read bit line and write bit line are disposed separately from each other, magnetic random access memory in which the bits are stored in one MTJ element, and the like.

As described above, according to the magnetic random access memory according to the second invention of the present application, the yoke material having the high permeability is disposed in a part of the write word line and write bit line, and the yoke material is depressed on an MTJ element side. Accordingly, generation of a reverse current can be inhibited, and the synthesized magnetic field can be allowed to act on the MTJ element with good efficiency at the write operation time.

[Third Invention]

The magnetic random access memory according to the examples of the third invention of the present application will be described hereinafter in detail with reference to the drawings.

3. Example 1

FIGS. 148 to 151 show the device structure of the magnetic random access memory according to Example 1. It is to be noted that FIGS. 148 and 150 show the sections in the Y direction, FIG. 149 shows the section of the MTJ element portion of FIG. 148 in the X direction, and FIG. 151 shows the section of the MTJ element portion of FIG. 150 in the X direction. The X direction crosses at right angles to the Y direction.

The characteristics of the device structure of the present example lie in that the lower and side surfaces of the write word line 20B disposed right under the MTJ element 23 are coated with the yoke material 25B and that the upper and side surfaces of the data selection line (read/write bit line) 24 disposed right on the MTJ element 23 are coated with the yoke materials 26, 27.

Furthermore, the characteristic of the yoke material 25B disposed in the side surface of the write word line 20B disposed right under the MTJ element 23 lies in the structure projecting downwards from the upper surface of the write word line 20B.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the device structure of the present example, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the device structure of the present example, the lower and side surfaces of the intermediate layer 20A and write word line 20B are coated with the materials having high permeability, that is, the yoke materials 25A, 25B. The yoke materials 25A, 25B for use herein are limited to the materials which have the conductivity.

Moreover, the yoke materials 25A, 25B disposed in the side surfaces of the intermediate layer 20A and write word line 20B are depressed below the upper surfaces of the intermediate layer 20A and write word line 20B. That is, since the yoke materials 25A, 25B are not excessively close to the MTJ element 23, a possibility of short-circuit between the write word line 20B and MTJ element 23 can be reduced.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the lower and side surfaces of the write word line 20B with the yoke material. Additionally, in actual, the yoke material is also formed in the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the device structure of the present example, the upper and side surfaces of the data selection line 24 are coated with the materials having the high permeability, that is, the yoke materials 26, 27. The yoke materials 26, 27 for use herein can be constituted of the materials which have conductivity as shown in FIGS. 148 and 149, or can also be constituted of the materials which have the insulating properties as shown in FIGS. 150 and 151.

It is to be noted that, as described above, the magnetic flux has the property of being concentrated on the material which has the high permeability. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed on the lower and side surfaces of the write word line 20B disposed right under the MTJ element 23. Moreover, the yoke materials 26, 27 are formed on the upper and side surfaces of the data selection line (read/write bit line) 24 disposed right on the MTJ element 23. Furthermore, the yoke material 25B in the side surface of the write word line 20B is depressed below the upper surface of the write word line 20B.

Therefore, the magnetic field generated by the write current flowing through the write word line 20B and data selection line 24 can be applied to the MTJ element 23 with good efficiency.

It is to be noted that the yoke materials 26, 27 are formed on the upper and side surfaces of the data selection line 24, but this is not limited, and the following structure may also be used.

For example, the yoke material 27 may also be formed only in the upper surface of the data selection line 24 as shown in FIGS. 152 to 155, or the yoke material 26 may also be formed only in the side surface of the line as shown in FIGS. 156 to 159.

Moreover, it is convenient to form the write word line 20B and yoke material 25B using the damascene process. Conversely, when the write word line 20B and yoke material 25B are formed using the reactive ion etching (RIE) process, the process becomes very complicated, and this is realistically impossible.

Furthermore, the data selection line 24 and yoke materials 26, 27 may be formed using either one of the damascene and RIE processes.

2. Example 2

FIGS. 160 to 163 show the device structure of the magnetic random access memory according to Example 2. It is to be noted that FIGS. 160 and 162 show the sections in the Y direction, FIG. 161 shows the section of the MTJ element portion of FIG. 160 in the X direction, and FIG. 163 shows the section of the MTJ element portion of FIG. 162 in the X direction. The X direction crosses at right angles to the Y direction.

The characteristic of the device structure of the present example lies in that the lower and side surfaces of the write word line 20B disposed right under the MTJ element 23 are coated with the yoke material 25B and that the upper and side surfaces of the data selection line (read/write bit line) 24 disposed right on the MTJ element 23 are coated with the yoke materials 26, 27.

Furthermore, the characteristic of the yoke material 26 disposed in the side surface of the data selection line 24 disposed right on the MTJ element 23 lies in a structure depressed upwards from the lower surface of the data selection line 24.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the device structure of the present example, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the device structure of the present example, the lower and side surfaces of the intermediate layer 20A and write word line 20B are coated with the materials having the high permeability, that is, the yoke materials 25A, 25B. The yoke materials 25A, 25B for use herein are limited to the materials which have conductivity.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the lower and side surfaces of the write word line 20B with the yoke material. Additionally, in actual, the yoke material is also formed on the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the device structure of the present example, the upper and side surfaces of the data selection line 24 are coated with the material having the high permeability, that is, the yoke materials 26, 27. The yoke materials 26, 27 for use herein can be constituted of the material which has the conductivity as shown in FIGS. 160 and 161, or can also be constituted of the material which has the insulating property as shown in FIGS. 162 and 163.

Moreover, the yoke material 26 disposed in the side surface of the data selection line 24 is depressed upwards from the lower surface of the data selection line 24. That is, the yoke material 26 cannot excessively be brought close to the MTJ element 23.

It is to be noted that the magnetic flux has the property of being concentrated on the material which has the high permeability as described above. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed on the lower and side surfaces of the write word line 20B disposed right under the MTJ element 23. Moreover, the yoke materials 26, 27 are formed on the upper and side surfaces of the data selection line (read/write bit line) 24 disposed right on the MTJ element 23. Furthermore, the yoke material 26 in the side surface of the data selection line 24 is depressed upwards from the lower surface of the data selection line 24.

Therefore, the magnetic field generated by the write current flowing through the write word line 20B and data selection line 24 can be applied to the MTJ element 23 with good efficiency.

It is to be noted that in the present example the yoke material 25B is formed on the lower and side surfaces of the write word line 20B, but this is not limited, and the following structure may also be used.

For example, the yoke material 25B may also be formed only in the lower surface of the write word line 20B as shown in FIGS. 164 to 167, or the yoke material 25B may also be formed only in the side surface of the line as shown in FIGS. 168 to 171.

Moreover, it is convenient to form the write word line 20B and yoke material 25B using the damascene process. Conversely, when the write word line 20B and yoke material 25B are formed using the reactive ion etching (RIE) process, the process becomes very complicated, and this is realistically impossible.

Furthermore, it is convenient to form the data selection line 24 and yoke materials 26, 27 using the damascene process. Conversely, when the data selection line 24 and yoke materials 26, 27 are formed using the RIE process, the process becomes very complicated, and this is realistically impossible.

3. Example 3

FIGS. 172 to 175 show the device structure of the magnetic random access memory according to Example 3. It is to be noted that FIGS. 172 and 174 show the sections in the Y direction, FIG. 173 shows the section of the MTJ element portion of FIG. 172 in the X direction, and FIG. 175 shows the section of the MTJ element portion of FIG. 174 in the X direction. The X direction crosses at right angles to the Y direction.

The characteristic of the device structure of the present example lies in that the lower and side surfaces of the write word line 20B disposed right under the MTJ element 23 are coated with the yoke material 25B and that the upper and side surfaces of the data selection line (read/write bit line) 24 disposed right on the MTJ element 23 are coated with the yoke materials 26, 27.

Furthermore, the characteristic of the yoke material 25B disposed in the side surface of the write word line 20B disposed right under the MTJ element 23 lies in the structure depressed downwards from the upper surface of the write word line 20B. Additionally, the characteristic of the yoke material 26 disposed in the side surface of the data selection line 24 disposed right on the MTJ element 23 lies in the structure depressed upwards from the lower surface of the data selection line 24.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the device structure of the present example, the lower and side surfaces of the intermediate layer 20A and write word line 20B are coated with the materials having the high permeability, that is, the yoke materials 25A, 25B. The yoke materials 25A, 25B for use herein are limited to the materials which have conductivity.

Moreover, the yoke materials 25A, 25B disposed in the side surfaces of the intermediate layer 20A and write word line 20B are depressed downwards from the upper surfaces of the intermediate layer 20A and write word line 20B. That is, since the yoke materials 25A, 25B are not excessively close to the MTJ element 23, the possibility of short-circuit between the write word line 20B and MTJ element 23 can be lowered.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the lower and side surfaces of the write word line 20B with the yoke material. Additionally, in actual, the yoke material is also formed on the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the device structure of the present example, the upper and side surfaces of the data selection line 24 are coated with the material having the high permeability, that is, the yoke materials 26, 27. The yoke materials 26, 27 for use herein can be constituted of the material which has the conductivity as shown in FIGS. 172 and 173, or can also be constituted of the material which has the insulating property as shown in FIGS. 174 and 175.

Moreover, the yoke material 26 disposed in the side surface of the data selection line 24 is depressed upwards from the lower surface of the data selection line 24. That is, the yoke material 26 is not excessively close to the MTJ element 23.

It is to be noted that the magnetic flux has the property of being concentrated on the material which has the high permeability as described above. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed on the lower and side surfaces of the write word line 20B disposed right under the MTJ element 23. Moreover, the yoke materials 26, 27 are formed on the upper and side surfaces of the data selection line (read/write bit line) 24 disposed right on the MTJ element 23. Furthermore, the yoke material 25B in the side surface of the write word line 20B is depressed downwards from the upper surface of the write word line 20B. The yoke material 26 of the side surface of the data selection line 24 is depressed upwards from the lower surface of the data selection line 24.

Therefore, the magnetic field generated by the write current flowing through the write word line 20B and data selection line 24 can be applied to the MTJ element 23 with good efficiency.

It is to be noted that it is convenient to form the write word line 20B and yoke material 25B using the damascene process. Conversely, when the write word line 20B and yoke material 25B are formed using the reactive ion etching (RIE) process, the process becomes very complicated, and this is realistically impossible.

Furthermore, it is convenient to form the data selection line 24 and yoke materials 26, 27 using the damascene process. Conversely, when the data selection line 24 and yoke materials 26, 27 are formed using the RIE process, the process becomes very complicated, and this is realistically impossible.

4. Example 4

FIGS. 176 to 179 show the device structure of the magnetic random access memory according to Example 4. It is to be noted that FIGS. 176 and 178 show the sections in the Y direction, FIG. 177 shows the section of the MTJ element portion of FIG. 176 in the X direction, and FIG. 179 shows the section of the MTJ element portion of FIG. 178 in the X direction. The X direction crosses at right angles to the Y direction.

The characteristic of the device structure of the present example lies in that only the side surface of the write word line 20B disposed right under the MTJ element 23 is coated with the yoke material 25B and that the upper and side surfaces of the data selection line (read/write bit line) 24 disposed right on the MTJ element 23 are coated with the yoke materials 26, 27.

Furthermore, the characteristic of the yoke material 25B disposed in the side surface of the write word line 20B disposed right under the MTJ element 23 lies in the structure depressed downwards from the upper surface of the write word line 20B.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the device structure of the present example, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the device structure of the present example, the side surfaces of the intermediate layer 20A and write word line 20B are coated with the materials having the high permeability, that is, the yoke materials 25A, 25B. The yoke materials 25A, 25B for use herein can be constituted of the material which has the conductivity as shown in FIGS. 176 and 177, or can also be constituted of the material which has the insulating property as shown in FIGS. 178 and 179.

Moreover, the yoke materials 25A, 25B disposed in the side surfaces of the intermediate layer 20A and write word line 20B are depressed downwards from the upper surfaces of the intermediate layer 20A and write word line 20B. That is, since the yoke materials 25A, 25B are not excessively close to the MTJ element 23, the possibility of short-circuit between the write word line 20B and MTJ element 23 can be lowered.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the side surface of the write word line 20B with the yoke material. Additionally, in actual, the yoke material is also formed on the side surface of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the device structure of the present example, the upper and side surfaces of the data selection line 24 are coated with the material having the high permeability, that is, the yoke materials 26, 27. The yoke materials 26, 27 for use herein can be constituted of the material which has the conductivity as shown in FIGS. 176 and 177, or can also be constituted of the material which has the insulating property as shown in FIGS. 178 and 179.

It is to be noted that the magnetic flux has the property of being concentrated on the material which has the high permeability as described above. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed in the side surface of the write word line 20B disposed right under the MTJ element 23. Moreover, the yoke materials 26, 27 are formed in the upper and side surfaces of the data selection line (read/write bit line) 24 disposed right on the MTJ element 23. Furthermore, the yoke material 25B in the side surface of the write word line 20B is depressed downwards from the upper surface of the write word line 20B.

Therefore, the magnetic field generated by the write current flowing through the write word line 20B and data selection line 24 can be applied to the MTJ element 23 with good efficiency.

It is to be noted that in the present example the yoke materials 26, 27 are formed in the upper and side surfaces of the data selection line 24, but this is not limited, and the following structure may also be used.

For example, the yoke material 27 may also be formed only in the upper surface of the data selection line 24 as shown in FIGS. 180 to 183, or the yoke material 26 may also be formed only in the side surface of the line as shown in FIGS. 184 to 187.

Moreover, it is convenient to form the write word line 20B and yoke material 25B using the damascene process. Conversely, when the write word line 20B and yoke material 25B are formed using the reactive ion etching (RIE) process, the process becomes very complicated, and this is realistically impossible.

Furthermore, for the data selection line 24 and yoke materials 26, 27, either the damascene process or the RIE process may be used.

5. Example 5

FIGS. 188 to 191 show the device structure of the magnetic random access memory according to Example 5. It is to be noted that FIGS. 188 and 190 show the sections in the Y direction, FIG. 189 shows the section of the MTJ element portion of FIG. 188 in the X direction, and FIG. 191 shows the section of the MTJ element portion of FIG. 190 in the X direction. The X direction crosses at right angles to the Y direction.

The characteristic of the device structure of the present example lies in that the lower and side surfaces of the write word line 20B disposed right under the MTJ element 23 are coated with the yoke material 25B and that only the side surface of the data selection line (read/write bit line) 24 disposed right on the MTJ element 23 is coated with the yoke materials 26.

Furthermore, the characteristic of the yoke material 26 disposed in the side surface of the data selection line 24 disposed right on the MTJ element 23 lies in the structure depressed upwards from the lower surface of the data selection line 24.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the device structure of the present example, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the device structure of the present example, the lower and side surfaces of the intermediate layer 20A and write word line 20B are coated with the materials having the high permeability, that is, the yoke materials 25A, 25B. The yoke materials 25A, 25B for use herein are limited to the material which has the conductivity.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the lower and side surfaces of the write word line 20B with the yoke material. Additionally, in actual, the yoke material is also formed on the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the device structure of the present example, the side surface of the data selection line 24 is coated with the material having the high permeability, that is, the yoke material 26. The yoke material 26 for use herein can be constituted of the material which has the conductivity as shown in FIGS. 188 and 189, or can also be constituted of the material which has the insulating property as shown in FIGS. 190 and 191.

Moreover, the yoke material 26 disposed in the side surface of the data selection line 24 is depressed upwards from the lower surfaces of the data selection line 24. That is, the yoke material 26 cannot excessively be close to the MTJ element 23.

It is to be noted that the magnetic flux has the property of being concentrated on the material which has the high permeability as described above. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed in the lower and side surfaces of the write word line 20B disposed right under the MTJ element 23. Moreover, the yoke material 26 is formed only in the side surface of the data selection line (read/write bit line) 24 disposed right on the MTJ element 23. Furthermore, the yoke material 26 in the side surface of the data selection line 24 is depressed upwards from the lower surface of the data selection line 24.

Therefore, the magnetic field generated by the write current flowing through the write word line 20B and data selection line 24 can be applied to the MTJ element 23 with good efficiency.

It is to be noted that in the present example the yoke material 25B is formed in the lower and side surfaces of the write word line 20B, but this is not limited, and the following structure may also be used.

For example, the yoke material 25B may also be formed only in the lower surface of the write word line 20B as shown in FIGS. 192 to 195, or the yoke material 25B may also be formed only in the side surface of the line as shown in FIGS. 196 to 199.

Moreover, it is convenient to form the write word line 20B and yoke material 25B using the damascene process. Conversely, when the write word line 20B and yoke material 25B are formed using the reactive ion etching (RIE) process, the process becomes very complicated, and this is realistically impossible.

Furthermore, it is convenient to form the data selection line 24 and yoke material 26 using the damascene process. Conversely, when the data selection line 24 and yoke material 26 are formed using the RIE process, the process becomes very complicated, and this is realistically impossible.

6. Example 6

FIGS. 200 to 203 show the device structure of the magnetic random access memory according to Example 6. It is to be noted that FIGS. 200 and 202 show the sections in the Y direction, FIG. 201 shows the section of the MTJ element portion of FIG. 200 in the X direction, and FIG. 203 shows the section of the MTJ element portion of FIG. 202 in the X direction. The X direction crosses at right angles to the Y direction.

The characteristic of the device structure of the present example lies in that only the side surface of the write word line 20B disposed right under the MTJ element 23 is coated with the yoke material 25B and that only the side surface of the data selection line (read/write bit line) 24 disposed right on the MTJ element 23 is coated with the yoke material 26.

Furthermore, the characteristic of the yoke material 25B disposed in the side surface of the write word line 20B disposed right under the MTJ element 23 lies in the structure depressed downwards from the upper surface of the write word line 20B. Additionally, the characteristic of the yoke material 26 disposed in the side surface of the data selection line 24 disposed right on the MTJ element 23 lies in the structure depressed upwards from the lower surface of the data selection line 24.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the device structure of the present example, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the device structure of the present example, the side surfaces of the intermediate layer 20A and write word line 20B are coated with the materials having the high permeability, that is, the yoke materials 25A, 25B. The yoke materials 25A, 25B for use herein can be constituted of the material which has the conductivity as shown in FIGS. 200 and 201, or can also be constituted of the material which has the insulating property as shown in FIGS. 202 and 203.

Moreover, the yoke materials 25A, 25B disposed in the side surfaces of the intermediate layer 20A and write word line 20B are depressed downwards from the upper surfaces of the intermediate layer 20A and write word line 20B. That is, since the yoke materials 25A, 25B are not excessively close to the MTJ element 23, the possibility of short-circuit between the write word line 20B and MTJ element 23 can be lowered.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

To achieve the object of the present application, it is sufficient to coat the side surface of the write word line 20B with the yoke material. Additionally, in actual, the yoke material is also formed on the side surface of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the device structure of the present example, the side surface of the data selection line 24 is coated with the material having the high permeability, that is, the yoke material 26. The yoke material 26 for use herein can be constituted of the material which has the conductivity as shown in FIGS. 200 and 201, or can also be constituted of the material which has the insulating property as shown in FIGS. 202 and 203.

Moreover, the yoke material 26 disposed in the side surface of the data selection line 24 is depressed upwards from the lower surface of the data selection line 24. That is, the yoke material 26 is not excessively close to the MTJ element 23.

It is to be noted that the magnetic flux has the property of being concentrated on the material which has the high permeability as described above. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

In this device structure, the yoke material 25B is formed only in the side surface of the write word line 20B disposed right under the MTJ element 23. Moreover, the yoke material 26 is formed only in the side surface of the data selection line (read/write bit line) 24 disposed right on the MTJ element 23. Furthermore, the yoke material 25B in the side surface of the write word line 20B is depressed downwards from the upper surface of the write word line 20B, and the yoke material 26 in the side surface of the data selection line 24 is depressed upwards from the lower surface of the data selection line 24.

Therefore, the magnetic field generated by the write current flowing through the write word line 20B and data selection line 24 can be applied to the MTJ element 23 with good efficiency.

It is to be noted that it is convenient to form the write word line 20B and yoke material 25B using the damascene process. Conversely, when the write word line 20B and yoke material 25B are formed using the reactive ion etching (RIE) process, the process becomes very complicated, and this is realistically impossible.

Furthermore, it is convenient to form the data selection line 24 and yoke material 26 using the damascene process. Conversely, when the data selection line 24 and yoke material 26 are formed using the RIE process, the process becomes very complicated, and this is realistically impossible.

7. Examples 7 to 12

Next, Examples 7 to 12 will be described which are the modification examples of the device structure according to Examples 4 to 6.

The characteristics of the device structures of Examples 7 to 12 lie in that when the MTJ elements are stacked in a plurality of stages (Examples 7 to 10) or the MTJ elements are arranged in the lateral direction (Examples 11, 12), the MTJ elements share one write line, and the side surface of the write line is coated with the yoke material having the high permeability.

(1) Example 7

FIGS. 204 and 205 show the device structure of the magnetic random access memory according to Example 7.

In the device structure of the present example, on the semiconductor substrate 11, two MTJ elements 23 are stacked, and these two MTJ elements 23 share one data selection line (read/write bit line) 24.

The data selection line 24 is disposed between two MTJ elements, and extends in the Y direction. Moreover, one MTJ element 23 contacts the lower surface of the data selection line 24, and the other MTJ element 23 contacts the upper surface of the data selection line 24. The side surface of the data selection line 24 is coated with the yoke material 26 which has the high permeability.

The yoke material 26 is depressed below the upper surface of the data selection line 24, and depressed in the upper part from the lower surface of the data selection line 24.

The write current flows through the data selection line 24 at the write operation time. The magnetic field generated by the write current is applied to the MTJ element 23 by the yoke material 26 with good efficiency.

The write word line 20B extending in the X direction crossing at right angles to the Y direction is disposed right under or on the MTJ element 23. The side surface of the write word line 20B is coated with the yoke material 25B which has the high permeability.

The yoke material 25B is depressed below the upper surface of the write word line 20B, and depressed in the upper part from the lower surface of the write word line 20B.

The write current flows through the write word line 20B at the write operation time. The magnetic field generated by the write current is applied to the MTJ element 23 by the yoke material 25B with good efficiency.

It is to be noted that the yoke materials 25B, 26 may be constituted of the conductive material as shown in FIG. 204, or constituted of the insulating material as shown in FIG. 205.

(2) Example 8

FIGS. 206 and 207 show the device structure of the magnetic random access memory according to Example 8.

In the device structure of the present example, four MTJ elements 23 are stacked on the semiconductor substrate 11. Two of these MTJ elements 23 share one write word line 20B or one data selection line (read/write bit line) 24.

The data selection line 24 is disposed between two MTJ elements 23, and extends in the Y direction. Moreover, one MTJ element 23 contacts the lower surface of the data selection line 24, and the other MTJ element 23 contacts the upper surface of the data selection line 24. The side surface of the data selection line 24 is coated with the yoke material 26 which has the high permeability.

The yoke material 26 is depressed below the upper surface of the data selection line 24, and depressed in the upper part from the lower surface of the data selection line 24.

At the write operation time, the write current flows through the data selection line 24. The magnetic field generated by the write current is applied to the MTJ element 23 by the yoke material 26 with good efficiency.

One write word line 20B extending in the X direction crossing at right angles to the Y direction is disposed between the MTJ element 23 which contacts the lower surface of the upper data selection line 24 and the MTJ element 23 which contacts the upper surface of the lower data selection line 24. This write word line 20B is shared by these two MTJ elements. The side surface of the write word line 20B is coated with the yoke material 25B which has the high permeability.

Moreover, the write word lines 20B extending in the X direction are arranged right on the MTJ element 23 which contacts the upper surface of the upper data selection line 24 and right under the MTJ element 23 which contacts the lower surface of the lower data selection line 24. The side surface of the write word line 20B is coated with the yoke material 25B which has the high permeability.

The yoke material 25B is depressed below the upper surface of the write word line 20B, and depressed in the upper part from the lower surface of the write word line 20B.

At the write operation time, the write current flows through the write word line 20B. The magnetic field generated by the write current is applied to the MTJ element 23 by the yoke material 25B with good efficiency.

It is to be noted that the yoke materials 25B, 26 may be constituted of the conductive material as shown in FIG. 206, or may also be constituted of the insulating material as shown in FIG. 207.

(3) Example 9

FIGS. 208 to 211 show the device structure of the magnetic random access memory according to Example 9.

In the device structure of the present example, four MTJ elements 23 connected in series are stacked on the semiconductor substrate 11. One end of these MTJ elements 23 connected in series is connected to the read selection switch RSW, and the other end is connected to the read bit line BL. Two of these MTJ elements 23 share one write word line 20B or one write bit line 24.

The write bit line 24 is disposed between two MTJ elements 23, and extends in the Y direction. The side surface of the write bit line 24 is coated with the yoke material 26 which has the high permeability. The yoke material 26 is depressed below the upper surface of the write bit line 24, and depressed upwards from the lower surface of the write bit line 24.

At the write operation time, the write current flows through the write bit line 24. The magnetic field generated by the write current is applied to the MTJ element 23 by the yoke material 26 with good efficiency.

The write word line 20B is disposed between two MTJ elements 23, and extends in the X direction crossing at right angles to the Y direction. The side surface of the write word line 20B is coated with the yoke material 25B which has the high permeability. Moreover, the write word line 20B is disposed right under or on the MTJ element 23, and extends in the X direction. The side surface of the write word line 20B is coated with the yoke material 25B which has the high permeability.

The yoke material 25B is depressed below the upper surface of the write word line 20B, and depressed in the upper part from the lower surface of the write word line 20B.

At the write operation time, the write current flows through the write word line 20B. The magnetic field generated by the write current is applied to the MTJ element 23 by the yoke material 25B with good efficiency.

It is to be noted that the yoke materials 25B, 26 may be constituted of the conductive material as shown in FIGS. 208 and 209, or may also be constituted of the insulating material as shown in FIGS. 210 and 211.

(4) Example 10

FIGS. 212 to 215 show the device structure of the magnetic random access memory according to Example 10.

In the device structure of the present example, four MTJ elements 23 connected in parallel to one another are stacked on the semiconductor substrate 11. One end of these MTJ elements 23 connected in parallel to one another is connected to the read selection switch RSW, and the other end is connected to the read bit line BL. Two of these MTJ elements 23 share one write word line 20B or one write bit line 24.

The write bit line 24 is disposed between two MTJ elements 23, and extends in the Y direction. The side surface of the write bit line 24 is coated with the yoke material 26 which has the high permeability. The yoke material 26 is depressed below the upper surface of the write bit line 24, and depressed in the upper part from the lower surface of the write bit line 24.

At the write operation time, the write current flows through the write bit line 24. The magnetic field generated by the write current is applied to the MTJ element 23 by the yoke material 26 with good efficiency.

The write word line 20B is disposed between two MTJ elements 23, and extends in the X direction crossing at right angles to the Y direction. The side surface of the write word line 20B is coated with the yoke material 25B which has the high permeability. Moreover, the write word line 20B is disposed right under or on the MTJ element 23, and extends in the X direction. The side surface of the write word line 20B is coated with the yoke material 25B which has the high permeability.

The yoke material 25B is depressed below the upper surface of the write word line 20B, and depressed in the upper part from the lower surface of the write word line 20B.

At the write operation time, the write current flows through the write word line 20B. The magnetic field generated by the write current is applied to the MTJ element 23 by the yoke material 25B with good efficiency.

It is to be noted that the yoke materials 25B, 26 may be constituted of the conductive material as shown in FIGS. 212 and 213, or may also be constituted of the insulating material as shown in FIGS. 214 and 215.

(5) Example 11

FIGS. 216 and 217 show the device structure of the magnetic random access memory according to Example 11.

In the device structure of the present example, on the semiconductor substrate 11, a plurality of (four in the present example) MTJ elements 23 are arranged in the lateral direction (in the direction parallel to the surface of the semiconductor substrate). One end of these MTJ elements 23 is connected in common to the read selection switch RSW, and the other end is connected in common to the data selection line (read/write bit line) 24. These MTJ elements 23 share one data selection line (read/write bit line) 24.

The data selection line 24 is disposed right on the MTJ elements 23, and extends in the Y direction. The side surface of the data selection line 24 is coated with the yoke material 26 which has the high permeability. The yoke material 26 is depressed in the upper part from the lower surface of the data selection line 24. At the write operation time, the write current flows through the data selection line 24. The magnetic field generated by the write current is applied to the MTJ element 23 by the yoke material 26 with good efficiency.

The write word line 20B is disposed right under the MTJ element 23, and extends in the X direction crossing at right angles to the Y direction. The side surface of the write word line 20B is coated with the yoke material 25B which has the high permeability. The yoke material 25B is depressed below the upper surface of the write word line 20B.

At the write operation time, the write current flows through the write word line 20B. The magnetic field generated by the write current is applied to the MTJ element 23 by the yoke material 25B with good efficiency.

It is to be noted that the yoke materials 25B, 26 may be constituted of the conductive material as shown in FIG. 216, or may also be constituted of the insulating material as shown in FIG. 217.

(6) Example 12

FIGS. 218 and 219 show the device structure of the magnetic random access memory according to Example 12.

In the device structure of the present example, on the semiconductor substrate 11, a plurality of (four in the present example) MTJ elements 23 are arranged in the lateral direction (in the direction parallel to the surface of the semiconductor substrate). One end of each of these MTJ elements 23 is connected in common to the read selection switch RSW, and the other end thereof is independently connected to the data selection line (read bit line/write word line) 20B.

These MTJ elements 23 share one write bit line 24. The write bit line 24 is disposed right on the MTJ elements 23, and extends in the Y direction. The side surface of the write bit line 24 is coated with the yoke material 26 which has the high permeability. The yoke material 26 is depressed in the upper part from the lower surface of the data selection line 24. At the write operation time, the write current flows through the write bit line 24. The magnetic field generated by the write current is applied to the MTJ element 23 by the yoke material 26 with good efficiency.

The data selection line 20B is disposed right under the MTJ element 23, and extends in the X direction crossing at right angles to the Y direction. The side surface of the data selection line 20B is coated with the yoke material 25B which has the high permeability. The yoke material 25B is depressed below the upper surface of the write word line 20B.

At the write operation time, the write current flows through the data selection line 20B. The magnetic field generated by the write current is applied to the MTJ element 23 by the yoke material 25B with good efficiency.

It is to be noted that the yoke materials 25B, 26 may be constituted of the conductive material as shown in FIG. 218, or may also be constituted of the insulating material as shown in FIG. 219.

8. Memory Cell Array Structure

The examples of the memory cell array structure (circuit structure) realized by the device structures according to Reference Examples 1, 2, and Examples 1 to 12 will be described.

FIG. 220 shows a main part of the memory cell array structure of the magnetic random access memory.

In the cell array structure, it is assumed that the magnetization easy axis of the MTJ element is directed in the Y direction, and the direction of the write current flowing through the write word line therefore changes in accordance with write data.

The control signals φ1, φ31, φ32, φ33 control and turn on/off the N-channel MOS transistors QN1, QN31, QN32, QN33 to determine whether or not the currents are passed through the data selection lines (read/write bit lines) BL1, BL2, BL3. One end (the side of the N-channel MOS transistor QN1) of the data selection lines BL1, BL2, BL3 is connected to the current driving power supply 40. The current driving power supply 40 sets the potential of one end of the data selection lines BL1, BL2, BL3 to Vy.

The N-channel MOS transistors QN31, QN32, QN33 are connected between the other ends of the data selection lines BL1, BL2, BL3 and ground points Vss.

At the write operation time, the control signal φ1 turns to the "H" level, and one of the control signals φ31, φ32, φ33 turns to the "H" level. For example, when the data is written into the MTJ element of the memory cell MC1, as shown in the timing chart of FIG. 221, the control signals φ1, φ31 turn to the "H" level, and the current therefore flows through the data selection line BL1. At this time, the control signals φ41, φ42, φ43 turn to the "L" level.

Moreover, Vx1 indicates the current driving power supply potential for "1"-write, and Vx2 indicates the current driving power supply potential for "0"-write.

For example, at the "1"-write time, as shown in FIG. 221, the control signals φ5, φ11 turn to the "H" level. At this time, the control signals φ6, φ12 turn to the "L" level. For this, the current flows through the write word line WWL1 to the right from the left (to the ground point from the current driving power supply 41). Therefore, "1"-data is written in the MTJ element of the memory cell MC1 disposed in the intersection of the data selection line BL1 and write word line WWL1.

Moreover, at the "0"-write time, as shown in FIG. 221, the control signals ϕ6, ϕ11 turn to the "H" level. At this time, the control signals ϕ5, ϕ12 turn to the "L" level. For this, the current flows through the write word line WWL1 to the left from the right (to the current driving power supply 42 from the ground point Vss). Therefore, the "0"-data is written in the MTJ element of the memory cell MC1 disposed in the intersection of the data selection line BL1 and write word line WWL1.

In this manner, at the write operation time, the control signal ϕ1 is used to supply the driving current to all the data selection lines, and the control signals ϕ31, ϕ32, ϕ33 are used to select the data selection line through which the driving current is passed. It is to be noted that in the present example the direction of the driving current flowing through the data selection line is constant. The control signals ϕ5, ϕ6 are used to control the direction of the current flowing through the write word line (corresponding to the write data). The control signals ϕ11, ϕ12 are used to select the write word line through which the driving current is passed.

In the present example, to simplify the description, the 3×2 memory cell array is assumed. The memory cells (MTJ elements) are disposed in the intersections of the write word lines WWL1, WWL2, and data selection lines BL1, BL2, BL3. Here, to read the data stored in the memory cell MC1, the control signals ϕ21, ϕ22, ϕ41, ϕ42, ϕ43 are controlled as follows.

That is, at the read operation time, the control signal ϕ21 given to the read word line RWL1 is set to the "H" level, and the N-channel MOS transistor connected to the read word line RWL1 is brought in the on state. At this time, the control signal ϕ22 given to another read word line RWL2 indicates the "L" level.

Moreover, when the control signal ϕ41 is set to the "H" level, and the other control signals ϕ42, ϕ43 are set to the "L" level, the driving current flows toward the ground point from the read power supply 43 via the memory cell MC1 (N-channel MOS transistor and MTJ element), data selection line BL1, N-channel MOS transistor QN41, and detection resistance Rs.

Therefore, the detection voltages Vo are generated in the opposite ends of the detection resistance Rs in accordance with the data value of the memory cell MC1. For example, when the detection voltages Vo are detected by the sense amplifier S/A, the data of the memory cell (MTJ element) can be read.

9. Manufacturing Method

Next, the manufacturing method of the main device structure will be described in detail among the device structures according to Reference Examples 1, 2 and Examples 1 to 12.

(1) Manufacturing Method of Device Structure According to Example 3

First, as shown in FIG. 222, the known methods such as the photo engraving process (PEP) method, chemical vapor deposition (CVD) method, and chemical mechanical polishing (CMP) method are used to form the element isolation insulating layer 12 including the STI structure in the semiconductor substrate 11.

Moreover, the MOS transistor is formed as the read selection switch in the element region surrounded by the element isolation insulating layer 12.

The MOS transistor can easily be formed by forming the gate insulating layer 13 and gate electrode (read word line) 14 by the CVD, PEP, and reactive ion etching (RIE) methods, and subsequently forming the source region 16-S and drain region 16-D by the ion implantation method. It is to be noted that the side wall insulating layer 15 may also be formed on the side wall portion of the gate electrode 14 by the CVD and RIE methods.

Thereafter, the insulating layer 28A with which the MOS transistor is completely coated is formed by the CVD method. Moreover, the CMP method is used to flatten the surface of the insulating layer 28A. The PEP and RIE methods are used to form the contact hole reaching the source diffused layer 16-S and drain diffused layer 16-D of the MOS transistor in the insulating layer 28A.

On the insulating layer 28A and on the inner surface of the contact hole, the sputter method is used to form the barrier metal (e.g., the lamination of Ta (15 nm) and TaN (15 nm)) 51. Subsequently, the conductive material (e.g., the impurity-containing conductive polysilicon film, metal film, and the like) with which the contact hole is completely filled is formed on the insulating layer 28A. Subsequently, by the CMP method, the conductive material and barrier metal 51 are polished to form the contact plugs 17A, 17B.

The CVD method is used to form the insulating layer 28B on the insulating layer 28A. The PEP and RIE methods are used to form the wiring trench in the insulating layer 28B. By the sputter method, the barrier metal (e.g., the lamination of Ta and TaN) 52 is formed on the insulating layer 28B and on the inner surface of the wiring trench. Subsequently, by the sputter method, the conductive material (e.g., the metal films such as aluminum and copper) with which the wiring trench is completely filled is formed on the insulating layer 28B. Thereafter, the conductive material and barrier metal 52 are polished by the CMP to form the intermediate layer 18A and source line 18B.

Subsequently, the CVD method is used to form the insulating layer 28C on the insulating layer 28B. The PEP and RIE methods are used to form the via hole in the insulating layer 28C. By the sputter method, the barrier metal (e.g., the lamination of Ta and TaN) 53 is formed on the insulating layer 28C and the inner surface of the via hole. Subsequently, by the sputter method, the conductive material (e.g., the metal films such as aluminum and copper) with which the via hole is completely filled is formed on the insulating layer 28C. Thereafter, the conductive material and barrier metal 53 are polished by the CMP method to form the via plug 19.

Next, as shown in FIG. 223, the CVD method is used to form the insulating layer 29 on the insulating layer 28C. The PEP and RIE methods are used to form the wiring trench in the insulating layer 29. The sputter method is used to form the yoke material (e.g., NiFe) 25 having the high permeability in a thickness of about 20 nm on the insulating layer 29 and in the wiring trench.

Moreover, by the sputter method, the barrier metal (e.g., the lamination of Ta and TaN) 54 is formed on the insulating layer 28C and on the inner surface of the via hole. Subsequently, the sputter method is used to form the conductive material (e.g., aluminum, copper, or alloy (AlCu)) 20 with which the wiring trench is completely filled.

It is to be noted that when the conductive material is constituted of copper (Cu), the conductive layer can be formed, for example, by the method comprising: first forming the Cu seed layer in about 80 nm; and stacking the sufficiently thick (e.g., about 800 nm) Cu layer on the Cu seed layer by the plating method.

Thereafter, when the conductive material 20 and barrier metal 54 are polished by the CMP, the intermediate layer 20A and write word line 20B are formed (see FIG. 224).

Here, in the present example, as shown in FIG. 224, the conductive materials 20A, 20B are left only in the wiring trench, and the yoke material 25 of FIG. 223 is polished by etching or CMP method. The yoke materials 25A, 25B are polished on the condition that the upper surfaces of the materials are disposed below the upper surface of the insulating layer 29 (or the upper surfaces of the conductive materials 20A, 20B). Through this step, the yoke material 25B is formed which is depressed in the lower part from the upper surface of the write word line 20B.

Next, as shown in FIG. 224, the CVD method is used to form the insulating layer 30A on the insulating layer 29. The PEP and RIE methods are used to form the via hole in the insulating layer 30A. By the sputter method, the barrier metal (e.g., TaN (10 nm)) 55 is formed on the insulating layer 30A and on the inner surface of the via hole. Subsequently, by the CVD method, the conductive material (e.g., the metal films such as tungsten) with which the via hole is completely filled is formed on the insulating layer 30A. Thereafter, the conductive material and barrier metal 55 are polished by the CMP method to form the via plug 21.

Here, the thickness of the insulating layer 30A (or the height of the via plug 21) determines the distance between the write word line 20B and MTJ element 23. The intensity of the magnetic field decreases in inverse proportion to the distance, therefore the MTJ element is brought as close as possible toward the write word line 20B, and the data is preferably rewritten by the small driving current. Therefore, the thickness of the insulating layer 30A is set to be as small as possible.

The CVD method is used to form the insulating layer 30B on the insulating layer 30A. The PEP and RIE methods are used to form the wiring trench in the insulating layer 30B. By the sputter method, on the insulating layer 30B, the conductive material (e.g., the metal films such as Ta) with which the wiring trench is completely filled is formed in a thickness of about 50 nm. Thereafter, the conductive material is polished by the CMP to form the local interconnect lines (lower electrodes of the MTJ elements) 22.

The sputter method is used to successively form, for example, NiFe (about 5 nm), IrMn (about 12 nm), CoFe (about 3 nm), AlOx (about 1.2 nm), CoFe (about 5 nm), and NiFe (about 15 nm) on the local interconnect lines 22. Thereafter, these stacked films are patterned to form the MTJ elements 23.

Moreover, after using the CVD method to form the insulating layer 30C with which the MTJ elements 23 are coated, for example, the insulating layer 30C on the MTJ elements 23 is removed by the CMP method, so that only the side surfaces of the MTJ elements 23 are coated with the insulating layer 30C.

Next, as shown in FIG. 225, the CVD method is used to form the insulating layer 31 on the insulating layer 30C. The PEP and RIE methods are used to form the wiring trench in the insulating layer 31 on the MTJ element 23.

The CVD and RIE methods are used to form an insulating layer 50, which is different from the insulating layer 31, in the side wall portion of the wiring trench of the insulating layer 31. Thereafter, by the sputter method, on the insulating layer 31 and on the inner surface of the wiring trench, the barrier metal (e.g., the lamination of Ti (25 nm) and TiN (25 nm) 56 is formed. Subsequently, by the sputter method, the conductive material (e.g., AlCu (650 nm)) with which the wiring trench is completely filled is formed on the insulating layer 31. Subsequently, the conductive material and barrier metal 56 are polished by the CMP to form the data selection line (read/write bit line) 24.

Next, as shown in FIG. 226, etching methods such as the RIE method are used to selectively etch only the insulating layer 50. The insulating layer 50 is left only in the vicinity of the lower surface of the data selection line 24. Thereafter, the CVD method is used to form the yoke material (e.g., NiFe) 26 in a thickness of about 50 nm and to fill a portion from which the insulating layer 50 has been removed. The yoke material 26 is also formed on the data selection line 24 and insulating layer 31.

Next, as shown in FIG. 227, the PEP and RIE methods are used to pattern the yoke material 26. As a result, the upper and side surfaces of the data selection line 24 are coated with the yoke material 26, and the structure is depressed in the upper part from the lower surface of the data selection line 24.

By the above-described steps, the magnetic random access memory according to Example 3 (FIGS. 156 and 157) is completed.

It is to be noted that in the manufacturing method of the present example, the metal wirings 20A, 20B, 24 are formed by the damascene process. However, for example, the RIE process can also be used to form the metal wirings 20A, 20B, 24.

Moreover, in the manufacturing method of the present example, after forming the yoke materials 25A, 25B, the barrier metal 54 is formed. Instead, for example, after forming the barrier metal 54, the yoke materials 25A, 25B may also be formed.

(2) Manufacturing Method of Device Structure According to Example 6

First, as shown in FIG. 228, the known methods such as the photo engraving process (PEP) method, chemical vapor deposition (CVD) method, and chemical mechanical polishing (CMP) method are used to form the element isolation insulating layer 12 including the STI structure in the semiconductor substrate 11.

Moreover, the MOS transistor is formed as the read selection switch in the element region surrounded by the element isolation insulating layer 12.

The MOS transistor can easily be formed by forming the gate insulating layer 13 and gate electrode (read word line) 14 by the CVD, PEP, and reactive ion etching (RIE) methods, and subsequently forming the source region 16-S and drain region 16-D by the ion implantation method. It is to be noted that the side wall insulating layer 15 may also be formed on the side wall portion of the gate electrode 14 by the CVD and RIE methods.

Thereafter, the insulating layer 28A with which the MOS transistor is completely coated is formed by the CVD method. Moreover, the CMP method is used to flatten the surface of the insulating layer 28A. The PEP and RIE methods are used to form the contact hole reaching the source diffused layer 16-S and drain diffused layer 16-D of the MOS transistor in the insulating layer 28A.

On the insulating layer 28A and on the inner surface of the contact hole, the sputter method is used to form the barrier metal (e.g., the lamination of Ta (15 nm) and TaN (15 nm)) 51. Subsequently, the conductive material (e.g., the impurity-containing conductive polysilicon film, metal film, and the like) with which the contact hole is completely filled is formed on the insulating layer 28A. Subsequently, by the CMP method, the conductive material and barrier metal 51 are polished to form the contact plugs 17A, 17B.

The CVD method is used to form the insulating layer 28B on the insulating layer 28A. The PEP and RIE methods are used to form the wiring trench in the insulating layer 28B. By the sputter method, the barrier metal (e.g., the lamination of Ta and TaN) 52 is formed on the insulating layer 28B and on the inner surface of the wiring trench. Subsequently, by the sputter method, the conductive material (e.g., the metal films such as aluminum and copper) with which the wiring trench is completely filled is formed on the insulating layer 28B. Thereafter, the conductive material and barrier metal 52 are polished by the CMP to form the intermediate layer 18A and source line 18B.

Subsequently, the CVD method is used to form the insulating layer 28C on the insulating layer 28B. The PEP and RIE methods are used to form the via hole in the insulating layer 28C. By the sputter method, the barrier metal (e.g., the lamination of Ta and TaN) 53 is formed on the insulating layer 28C and the inner surface of the via hole. Subsequently, by the sputter method, the conductive material (e.g., the metal films such as aluminum and copper) with which the via hole is completely filled is formed on the insulating layer 28C. Thereafter, the conductive material and barrier metal 53 are polished by the CMP method to form the via plug 19.

Next, as shown in FIG. 229, the CVD method is used to form the insulating layer 29 on the insulating layer 28C. The PEP and RIE methods are used to form the wiring trench in the insulating layer 29. The sputter method is used to form the yoke materials (e.g., NiFe) 25A, 25B having the high permeability in a thickness of about 20 nm on the insulating layer 29 and in the wiring trench. Thereafter, the RIE method is used to etch the yoke materials 25A, 25B, and the yoke materials 25A, 25B remain only in the side wall portion of the wiring trench.

The sputter method is used to form the barrier metal (e.g., the lamination of Ta and TaN) 54 on the insulating layer 29 and on the inner surface of the wiring trench. Subsequently, the sputter method is used to form the conductive material (e.g., the metal films such as aluminum and copper) 20 with which the wiring trench is completely filled on the insulating layer 29. Thereafter, when the conductive material 20 and barrier metal 54 are polished by the CMP, the intermediate layer 20A and write word line 20B are formed (see FIG. 230).

Here, in the present example, as shown in FIG. 230, the conductive materials 20A, 20B are left only in the wiring trench, and the yoke materials 25A, 25B are etched or polished by the CMP method. The yoke materials 25A, 25B are polished on the condition that the upper surfaces of the materials are disposed below the upper surface of the insulating layer 29 (or the upper surfaces of the conductive materials 20A, 20B). Through this step, the yoke material 25 is formed which is depressed in the lower part from the upper surface of the write word line 20B.

Next, as shown in FIG. 230, the CVD method is used to form the insulating layer 30A on the insulating layer 29. The PEP and RIE methods are used to form the via hole in the insulating layer 30A. By the sputter method, the barrier metal (e.g., the lamination of Ta and TaN) 55 is formed on the insulating layer 30A and on the inner surface of the via hole. Subsequently, by the CVD method, the conductive material (e.g., the metal films such as tungsten) with which the via hole is completely filled is formed on the insulating layer 30A. Thereafter, the conductive material and barrier metal 55 are polished by the CMP method to form the via plug 21.

Here, the thickness of the insulating layer 30A (or the height of the via plug 21) determines the distance between the write word line 20B and MTJ element 23. The intensity of the magnetic field decreases in inverse proportion to the distance, therefore the MTJ element is brought as close as possible toward the write word line 20B, and the data is preferably rewritten by the small driving current. Therefore, the thickness of the insulating layer 30A is set to be as thin as possible.

The CVD method is used to form the insulating layer 30B on the insulating layer 30A. The PEP and RIE methods are used to form the wiring trench in the insulating layer 30B. By the sputter method, on the insulating layer 30B, the conductive material (e.g., the metal films such as Ta) with which the wiring trench is completely filled is formed. Thereafter, the conductive material is polished by the CMP to form the local interconnect lines (lower electrodes of the MTJ elements) 22.

The CVD method is used to successively form, for example, NiFe (about 5 nm), IrMn (about 12 nm), CoFe (about 3 nm), AlOx (about 1.2 nm), CoFe (about 5 nm), and NiFe (about 15 nm) on the local interconnect lines 22. Thereafter, these stacked films are patterned to form the MTJ elements 23.

Moreover, after using the CVD method to form the insulating layer 30C with which the MTJ elements 23 are coated, for example, the insulating layer 30C on the MTJ elements 23 is removed by the CMP method, so that only the side surfaces of the MTJ elements 23 are coated with the insulating layer 30C.

Next, as shown in FIG. 231, the CVD method is used to form the insulating layer 31 on the insulating layer 30C. The PEP and RIE methods are used to form the wiring trench in the insulating layer 31 on the MTJ element 23.

The CVD and RIE methods are used to form the insulating layer 50 different from the insulating layer 31 in the side wall portion of the wiring trench of the insulating layer 31. Thereafter, by the sputter method, the barrier metal (e.g., the lamination of Ti (25 nm) and TiN (25 nm)) 56 on the insulating layer 31 and on the inner surface of the wiring trench. Subsequently, by the sputter method, the conductive material (e.g., AlCu (650 nm)) with which the wiring trench is completely filled is formed on the insulating layer 31. Subsequently, the conductive material and barrier metal 56 are polished by the CMP to form the data selection line (read/write bit line) 24.

Next, as shown in FIG. 232, the etching methods such as the RIE method are used to selectively etch only the insulating layer 50. The insulating layer 50 is left only in the vicinity of the lower surface of the data selection line 24. Thereafter, the CVD method is used to form the yoke material 26 so as to fill the portion from which the insulating layer 50 has been removed. The yoke material 26 is also formed on the data selection line 24 and insulating layer 31.

Next, as shown in FIG. 233, the CMP and RIE methods are used to etch the yoke material 26. As a result, the yoke material 26 on the data selection line 24 and insulating layer 31 is removed. Only the side surface of the data selection line 24 is coated with the yoke material 26, and the yoke material is structured to be depressed in the upper part from the lower surface of the data selection line 24.

By the above-described steps, the magnetic random access memory according to Example 6 (FIGS. 200 and 201) is completed.

It is to be noted that in the manufacturing method of the present example, the metal wirings 20A, 20B, 24 are formed by the damascene process. However, for example, the RIE process can also be used to form the metal wirings 20A, 20B.

Moreover, in the manufacturing method of the present example, after forming the yoke materials 25A, 25B, the barrier metal 54 is formed. Instead, for example, after forming the barrier metal 54, the yoke materials 25A, 25B may also be formed.

Additionally, the yoke material 26 with which the data selection line 24 is coated can also be formed by the following method.

First, as shown in FIG. 234, the CVD method is used to form the insulating layer 31 on the insulating layer 30C. The PEP and RIE methods are used to form the wiring trench in the insulating layer 31 on the MTJ element 23. Thereafter, by the sputter method, the barrier metal (e.g., the lamination of Ti (25 nm) and TiN (25 nm)) 56 is formed on the insulating layer 31 and on the inner surface of the wiring trench. Subsequently, by the sputter method, the conductive material (e.g., AlCu (650 nm)) with which the wiring trench is completely filled is formed on the insulating layer 31. Subsequently, the conductive material and barrier metal 56 are polished by the CMP to form the data selection line (read/write bit line) 24.

Next, as shown in FIG. 235, the etching methods such as the RIE method are used to selectively etch only the insulating layer 31. The insulating layer 31 is left only in the vicinity of the lower surface of the data selection line 24.

Next, as shown in FIG. 236, the CVD method is used to form the yoke material (e.g., NiFe) 26 in a thickness of about 50 nm on the side and upper surfaces of the insulating layer 31 and data selection line 24. Subsequently, when the yoke material 26 is etched by the RIE method, the yoke material 26 on the data selection line 24 and insulating layer 31 is removed, only the side surface of the data selection line 24 is coated with the yoke material 26, and the yoke material is structured to be depressed in the upper part from the lower surface of the data selection line 24.

By the above-described steps, the magnetic random access memory according to Example 6 (FIGS. 200 and 201) is completed.

10. Others

In the description of Reference Examples 1, 2, Examples 1 to 6, and manufacturing methods, the examples of the magnetic random access memory have been described in which one MTJ element and one read selection switch (MOS transistor) constitute the memory cell and which includes the write word line and data selection line (read/write bit line).

However, naturally the present invention is not limited to the magnetic random access memory including this cell array structure, and can also be applied to all the magnetic random access memories, for example, including the device structures as described in Examples 7 to 12.

The present invention can also be applied, for example, to the magnetic random access memory which does not include the read selection switch, magnetic random access memory in which the read bit line and write bit line are disposed separately from each other, magnetic random access memory in which the bits are stored in one MTJ element, and the like.

As described above, according to the magnetic random access memory according to the third invention of the present application, the yoke material having the high permeability is disposed in a part of the write word line and write bit line, and the yoke material is depressed on a side opposite to the MTJ element side. Accordingly, the possibility of the short-circuit between the write word line and MTJ element can be lowered. At the write operation time, the synthesized magnetic field can be allowed to function on the MTJ element with good efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetic random access memory comprising:

a memory cell which is formed on a semiconductor substrate and in which a magneto resistive effect is used;

a first write line which is disposed right under the memory cell and which extends in a first direction;

a second write line which is disposed right on the memory cell and which extends in a second direction intersecting with the first direction; and a first yoke material with which only a side surface of the first write line is coated.

2. The magnetic random access memory according to claim 1, further comprising:

a second yoke material with which upper and side surfaces of the second write line are coated.

3. The magnetic random access memory according to claim 1, further comprising:

a second yoke material with which only an upper surface of the second write line is coated.

4. The magnetic random access memory according to claim 1, further comprising:

a second yoke material with which only a side surface of the second write line is coated.

5. The magnetic random access memory according to claim 1, wherein one of the first and second write lines is electrically connected to the memory cell, and also functions as a read bit line.

6. A magnetic random access memory comprising:

first and second memory cells which are stacked on a semiconductor substrate and in which a magneto resistive effect is used;

a first write line which is disposed between the first and second memory cells and which extends in a first direction; and a first yoke material with which only a side surface of the first write line is coated.

7. The magnetic random access memory according to claim 6, wherein the second memory cell is disposed above the first memory cell.

8. The magnetic random access memory according to claim 7, further comprising:

a second write line which is disposed right under the first memory cell and which extends in a second direction intersecting with the first direction; and a third write line which is disposed right on the second memory cell and which extends in the second direction.

9. The magnetic random access memory according to claim 8, further comprising:

a second yoke material with which only a side surface of the second write line is coated; and a third yoke material with which only a side surface of the third write line is coated.

10. The magnetic random access memory according to claim 6, wherein the first write line is apart from the first and second memory cells.

11. The magnetic random access memory according to claim 6, wherein the first write line contacts the first and second memory cells.

12. A magnetic random access memory comprising:

a memory cell which is formed on a semiconductor substrate and in which a magneto resistive effect is used;

a first write line which is disposed right under the memory cell and which extends in a first direction;

a second write line which is disposed right on the memory cell and which extends in a second direction intersecting with the first direction; and a first yoke material with which a side surface of the first write line is coated and which projects upwards from an upper surface of the first write line.

13. The magnetic random access memory according to claim 12, wherein only a side surface of the first write line is coated with the first yoke material.

14. The magnetic random access memory according to claim 12, wherein only a lower surface of the first write line is coated with the first yoke material.

15. The magnetic random access memory according to claim 12, further comprising:

a second yoke material with which a part of the surface of the second write line is coated.

16. The magnetic random access memory according to claim 15, wherein upper and side surfaces of the second write line are coated with the second yoke material.

17. The magnetic random access memory according to claim 15, wherein only an upper surface of the second write line is coated with the second yoke material.

18. The magnetic random access memory according to claim 15, wherein only a side surface of the second write line is coated with the second yoke material.

19. The magnetic random access memory according to claim 12, wherein one of the first and second write lines is electrically connected to the memory cell, and also functions as a read bit line.

20. A magnetic random access memory comprising:

a memory cell which is formed on a semiconductor substrate and in which a magneto resistive effect is used;

a first write line which is disposed right under the memory cell and which extends in a first direction;

a second write line which is disposed right on the memory cell and which extends in a second direction intersecting with the first direction; and a first yoke material with which a side surface of the second write line is coated and which projects downwards from a lower surface of the second write line.

21. The magnetic random access memory according to claim 20, wherein only a side surface of the second write line is coated with the first yoke material.

22. The magnetic random access memory according to claim 20, wherein only an upper surface of the second write line is coated with the first yoke material.

23. The magnetic random access memory according to claim 20, further comprising:

a second yoke material with which a part of the surface of the first write line is coated.

24. The magnetic random access memory according to claim 23, wherein lower and side surfaces of the first write line are coated with the second yoke material.

25. The magnetic random access memory according to claim 23, wherein only a lower surface of the first write line is coated with the second yoke material.

26. The magnetic random access memory according to claim 23, wherein only a side surface of the first write line is coated with the second yoke material.

27. The magnetic random access memory according to claim 20, wherein one of the first and second write lines is electrically connected to the memory cell, and also functions as a read bit line.

28. A magnetic random access memory comprising:

first and second memory cells which are stacked on a semiconductor substrate and in which a magneto resistive effect is used;

a first write line which is disposed between the first and second memory cells and which extends in a first direction; and a first yoke material with which only a side surface of the first write line is coated and which projects upwards from an upper surface of the first write line and which projects downwards from a lower surface of the first write line.

29. The magnetic random access memory according to claim 28, wherein the second memory cell is disposed above the first memory cell.

30. The magnetic random access memory according to claim 28, further comprising:

a second write line which is disposed right under the first memory cell and which extends in a second direction intersecting with the first direction; and a third write line which is disposed right on the second memory cell and which extends in the second direction.

31. The magnetic random access memory according to claim 30, further comprising:

a second yoke material with which only a side surface of the second write line is coated and which projects upwards from an upper surface of the second write line; and a third yoke material with which only a side surface of the third write line is coated and which projects downwards from the lower surface of the third write line.

32. The magnetic random access memory according to claim 28, wherein the first write line is apart from the first and second memory cells.

33. The magnetic random access memory according to claim 28, wherein the first write line contacts the first and second memory cells.

34. A magnetic random access memory comprising:

a plurality of memory cells which are arranged in a direction parallel to the surface of a semiconductor substrate on the semiconductor substrate and in which a magneto resistive effect is used;

a first write line which is shared by the plurality of memory cells and which extends in a first direction;

a plurality of second write lines which are individually disposed in the plurality of memory cells and which extend in a second direction intersecting with the first direction;

a first yoke material with which only a side surface of the first write line is coated and which projects toward the plurality of memory cells from the surface of the first write line on a side of the plurality of memory cells; and a second yoke material with which only side surfaces of the plurality of second write lines are coated and which projects toward the plurality of memory cells from the surface of the second write line on the side of the plurality of memory cells.

35. The magnetic random access memory according to claim 34, wherein the first write line is disposed right on the plurality of memory cells and contacts one end of the plurality of memory cells.

36. The magnetic random access memory according to claim 35, wherein the other ends of the plurality of memory cells are connected in common.

37. The magnetic random access memory according to claim 34, wherein the plurality of second write lines are disposed right under the plurality of memory cells and are apart from the plurality of memory cells.

38. The magnetic random access memory according to claim 34, wherein the first write line is disposed right on the plurality of memory cells and is apart from the plurality of memory cells.

39. The magnetic random access memory according to claim 34, wherein the plurality of second write lines are disposed right under the plurality of memory cells and contact one end of the plurality of memory cells.

40. The magnetic random access memory according to claim 39, wherein the other ends of the plurality of memory cells are connected in common.

41. A magnetic random access memory comprising:

a memory cell which is formed on a semiconductor substrate and in which a magneto resistive effect is used;

a first write line which is disposed right under the memory cell and which extends in a first direction;

a second write line which is disposed right on the memory cell and which extends in a second direction intersecting with the first direction; and a first yoke material with which a side surface of the first write line is coated and which is depressed in a lower part from the upper surface of the first write line.

42. The magnetic random access memory according to claim 41, wherein only the side surface of the first write line is coated with the first yoke material.

43. The magnetic random access memory according to claim 41, wherein only the lower surface of the first write line is coated with the first yoke material.

44. The magnetic random access memory according to claim 41, further comprising:

a second yoke material with which a part of the surface of the second write line is coated.

45. The magnetic random access memory according to claim 44, wherein upper and side surfaces of the second write line are coated with the second yoke material.

46. The magnetic random access memory according to claim 44, wherein only an upper surface of the second write line is coated with the second yoke material.

47. The magnetic random access memory according to claim 44, wherein only a side surface of the second write line is coated with the second yoke material.

48. The magnetic random access memory according to claim 41, wherein one of the first and second write lines is electrically connected to the memory cell, and also functions as a read bit line.

49. A magnetic random access memory comprising:

a memory cell which is formed on a semiconductor substrate and in which a magneto resistive effect is used;

a first write line which is disposed right under the memory cell and which extends in a first direction;

a second write line which is disposed right on the memory cell and which extends in a second direction intersecting with the first direction; and a first yoke material with which a side surface of the second write line is coated and which is depressed in an upper part from a lower surface of the second write line.

50. The magnetic random access memory according to claim 49, wherein only the side surface of the second write line is coated with the first yoke material.

51. The magnetic random access memory according to claim 49, wherein the upper surface of the second write line is coated with the first yoke material.

52. The magnetic random access memory according to claim 49, further comprising:

a second yoke material with which a part of the surface of the first write line is coated.

53. The magnetic random access memory according to claim 52, wherein the lower and side surfaces of the first write line are coated with the second yoke material.

54. The magnetic random access memory according to claim 52, wherein only the lower surface of the first write line is coated with the second yoke material.

55. The magnetic random access memory according to claim 52, wherein only the side surface of the first write line is coated with the second yoke material.

56. The magnetic random access memory according to claim 49, wherein one of the first and second write lines is electrically connected to the memory cell, and also functions as a read bit line.

57. A magnetic random access memory comprising:

first and second memory cells which are stacked on a semiconductor substrate and in which a magneto resistive effect is used;

a first write line which is disposed between the first and second memory cells and which extends in a first direction; and a first yoke material with which only a side surface of the first write line is coated and which is depressed in a lower part from an upper surface of the first write line and which is depressed in an upper part from a lower surface of the first write line.

58. The magnetic random access memory according to claim 57, wherein the second memory cell is disposed above the first memory cell.

59. The magnetic random access memory according to claim 58, further comprising:

a second write line which is disposed right under the first memory cell and which extends in a second direction intersecting with the first direction; and a third write line which is disposed right on the second memory cell and which extends in the second direction.

60. The magnetic random access memory according to claim 59, further comprising:

a second yoke material with which only a side surface of the second write line is coated and which is depressed in a lower part from an upper surface of the second write line; and a third yoke material with which only a side surface of the third write line is coated and which is depressed in an upper part from the lower surface of the third write line.

61. The magnetic random access memory according to claim 57, wherein the first write line is apart from the first and second memory cells.

62. The magnetic random access memory according to claim 57, wherein the first write line contacts the first and second memory cells.

63. A magnetic random access memory comprising:

a plurality of memory cells which are arranged in a direction parallel to the surface of a semiconductor substrate on the semiconductor substrate and in which a magneto resistive effect is used;

a first write line which is shared by the plurality of memory cells and which extends in a first direction;

a plurality of second write lines which are individually disposed in the plurality of memory cells and which extend in a second direction intersecting with the first direction;

a first yoke material with which only a side surface of the first write line is coated and which is depressed on a side opposite to the plurality of memory cells from the surface of the first write line on the side of the plurality of memory cells; and a second yoke material with which only side surfaces of the plurality of second write lines are coated and which is depressed on a side opposite to the plurality of memory cells from the surface of the second write line on the side of the plurality of memory cells.

64. The magnetic random access memory according to claim 53, wherein the first write line is disposed right on the plurality of memory cells and contacts one end of the plurality of memory cells.

65. The magnetic random access memory according to claim 54, wherein the other ends of the plurality of memory cells are connected in common.

66. The magnetic random access memory according to claim 63, wherein the plurality of second write lines are disposed right under the plurality of memory cells and are apart from the plurality of memory cells.

67. The magnetic random access memory according to claim 63, wherein the first write line is disposed right on the plurality of memory cells and is apart from the plurality of memory cells.

68. The magnetic random access memory according to claim 63, wherein the plurality of second write lines are disposed right under the plurality of memory cells and contact one end of the plurality of memory cells.

69. The magnetic random access memory according to claim 68, wherein the other ends of the plurality of memory cells are connected in common.

* * * * *